(12) United States Patent
Rubinstein et al.

(10) Patent No.: US 8,566,515 B2
(45) Date of Patent: Oct. 22, 2013

(54) MEMORY SUBSYSTEM

(75) Inventors: Jorge Rubinstein, Newton, MA (US); Albert Rooyakkers, Scotts Valley, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 582 days.

(21) Appl. No.: 12/380,410

(22) Filed: Feb. 26, 2009

(65) Prior Publication Data

US 2010/0177585 A1 Jul. 15, 2010

Related U.S. Application Data

(63) Continuation-in-part of application No. 12/322,571, filed on Feb. 4, 2009, which is a continuation-in-part of application No. 12/319,750, filed on Jan. 12, 2009, now abandoned.

(51) Int. Cl.
*G09G 5/36* (2006.01)

(52) U.S. Cl.
USPC .............. 711/104; 345/531; 345/24; 345/547

(58) Field of Classification Search
USPC ........................................................ 711/167
See application file for complete search history.

(56) References Cited

U.S. PATENT DOCUMENTS

| | | | | |
|---|---|---|---|---|
| 5,809,538 A | * | 9/1998 | Pollmann et al. | 711/151 |
| 6,297,857 B1 | * | 10/2001 | Jones et al. | 348/714 |
| 6,381,659 B2 | * | 4/2002 | Proch et al. | 710/57 |
| 2002/0023238 A1 | * | 2/2002 | Yamada et al. | 713/400 |
| 2002/0194448 A1 | * | 12/2002 | Yu | 711/173 |
| 2009/0083315 A1 | * | 3/2009 | Ishizaki et al. | 707/103 R |

* cited by examiner

*Primary Examiner* — Reginald Bragdon
*Assistant Examiner* — Hamdy S Ahmed
(74) *Attorney, Agent, or Firm* — North Weber & Baugh LLP

(57) ABSTRACT

Embodiments of the present invention are directed to memory subsystems implemented within, or connected to and accessed by, parallel, pipelined, integrated-circuit implementations of computational engines designed to solve complex computational problems. Additional embodiments of the present invention are directed to memory subsystems implemented within, or connected to and accessed by, a variety of different types of electronic devices. One embodiment of the present invention comprises a memory controller implemented in a first integrated circuit or other electronic system and one or more separate memory devices. Alternative embodiments of the present invention incorporate the memory controller within one or more memory devices that are connected to, and accessed by, an integrated-circuit-implemented computational engine or another electronic device. In alternative embodiments of the present invention, the memory controller and memory are together integrated within a computational engine or another electronic device. Alternative embodiments of the present invention include a multi-access memory that interfaces to a simpler memory controller for connection to, or integration within, a computational engine or other electronic device.

27 Claims, 97 Drawing Sheets

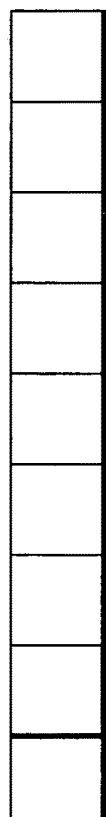
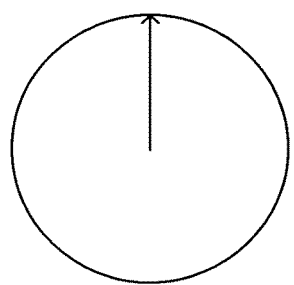
Figure 10B

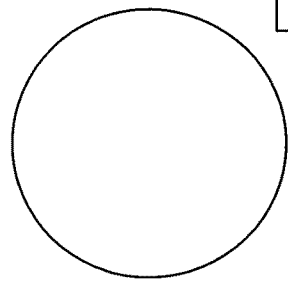
Figure 11C  MODE 2

$h = I - G + 2(J-F) + 3(K-E) + 4(L-D) + 5(M-C) + 6(N-B) + 7(O-A)$ $v = I' - G' + 2(J'-F') + 3(K'-E') + 4(L'-D') + 5(M'-C') + 6(N'-B') + 7(O'-A')$ $a = 16*(P'+P)$ $b = \dfrac{(5*H+32)}{64}$ $c = \dfrac{5*V+32}{64}$ $z_{x,y} = \dfrac{a + b*(x-7) + c*(y-7) + 6}{32}$ if $(z_{x,y} < 0)$ $Z_{x,y} = 0$ else if $(2^{bit\_depth} < z_{x,y})$ $Z_{x,y} = 2^{bit\_depth}$ else $Z_{x,y} = z_{x,y}$

MODE 4

1802

X = 4 x 4 residual block

DCT(X)→Y= transformed 4 x 4 block of coefficients $Y = A \times A^T$ where $A = \begin{bmatrix} a & a & a & a \\ b & c & -c & -b \\ a & -a & -a & a \\ c & -b & b & -c \end{bmatrix}$

1806

$a = \frac{1}{2}$ $b = \left(\sqrt{\frac{1}{2}}\right)\cos\frac{\Pi}{8}$ $c = \left(\sqrt{\frac{1}{2}}\right)\cos\left(\frac{3\Pi}{8}\right)$

1804

$Y = C \times C^T \otimes E$ where $C = \begin{bmatrix} 1 & 1 & 1 & 1 \\ 1 & d & -d & -1 \\ 1 & -1 & -1 & 1 \\ d & -1 & 1 & -d \end{bmatrix}$ and $E = \begin{bmatrix} a^2 & ab & a^2 & ab \\ ab & b^2 & ab & b^2 \\ a^2 & ab & a^2 & ab \\ ab & b^2 & ab & b^2 \end{bmatrix}$

1808

$d = \frac{c}{b} = 0.414$

1810

1812 approximation: $a = \frac{1}{2}$ $b = \sqrt{\frac{2}{5}}$ $d = \frac{1}{2}$

1814

$Y = C^* \times X \times C^{*T} \otimes E^*$ where $C^* = \begin{bmatrix} 1 & 1 & 1 & 1 \\ 2 & 1 & -1 & -2 \\ 1 & -1 & -1 & 1 \\ 1 & -2 & 2 & 1 \end{bmatrix}$ and $E^* = \begin{bmatrix} a^2 & \frac{ab}{2} & a^2 & \frac{ab}{2} \\ \frac{ab}{2} & \frac{b^2}{4} & \frac{ab}{2} & \frac{b^2}{4} \\ a^2 & \frac{ab}{2} & a^2 & \frac{ab}{2} \\ \frac{ab}{2} & \frac{b^2}{4} & \frac{ab}{2} & \frac{b^2}{4} \end{bmatrix}$

1818

$X = C'^T (Y \otimes E')C'$ where $C' = \begin{bmatrix} 1 & 1 & 1 & 1 \\ 1 & \frac{1}{2} & -\frac{1}{2} & -1 \\ 1 & -1 & -1 & 1 \\ \frac{1}{2} & -1 & 1 & -\frac{1}{2} \end{bmatrix}$ and $E' = \begin{bmatrix} a^2 & ab & a^2 & ab \\ ab & b^2 & ab & b^2 \\ a^2 & ab & a^2 & ab \\ ab & b^2 & ab & b^2 \end{bmatrix}$

| TYPE OF BLOCK OBJECT | CLASSIFICATION | DIMENSION | DETAIL |
|---|---|---|---|
| Video object | Luma objects | One dimensional | Horizontal and vertical luma pixel vector |
| | | Two dimensional | 16x16 macroblock object |
| | | | 4x4 luma object |
| | | | 4x8 luma object |
| | | | 8x4 luma object |
| | | | 8x8 luma object |
| | | | 8x16 luma object |
| | | | 16x8 luma object |
| | | | Quarter Pel Object[1] |
| | Chroma objects | One dimension | Horizontal and vertical chroma pixel vector |
| | | Two dimensional | 8x8 chroma object |
| | Motion vector objects | | x,y motion vector |
| Data object | Structural | | Slice, nearest neighbor information |
| | Parametric | | Quantization, prediction mode, etc |

Figure 35

| PROCESSING ELEMENT | ARITHMETIC OPERATIONS PER MACROBLOCK (ONE PIPELINE CYCLE) | PE MINOR CLOCK CYCLES | COMMENTS |
|---|---|---|---|
| INTRA PREDICTION | 1,407 | 15 | 16X16 DC : 34 addit. 16x16 Plane 22 + 3x256 addit 22 mult 8x8 Chroma 12 + 3x64 addit + 12 mult 4x4 DC 9 addit 4x4 6 modes ~16x3.5= 6x56. Total 1,373 addit 34 mult. Needs 15 minor clock cycles to compute macroblock. |
| INTER PREDICTION | 11,776 | 16 | 72 FIR instances: 4 mult + 6 addit each = 720. 16 addit. Total for 4x4 block = 736. |
| RESIDUAL | 256 | 1 | |
| DIRECT INTEGER TRANSFORM | 5,120 | 16 | 320 addit/subtract/shift per 4x4 luma. Needs 16 minor clock cycles to compute macroblock. |
| QUANTIZE AND SCALE | 48 | 16 | |
| DEQUANTIZE AND SCALE | 32 | 16 | |
| INVERSE INTEGER TRANSFORM | 5,120 | 16 | 320 addit/subtract/shift per 4x4 luma. Needs 16 minor clock cycles to compute macroblock. |

VHDL Object definitions

```
CONSTANT   nMBmax      : NATURAL := 8160; -- Maximum number of macroblocks
SUBTYPE    pixelTYPE       IS std_logic_vector ( 7 DOWNTO 0) ;
SUBTYPE    mvTYPE          IS std_logic_vector ( 14 DOWNTO 0) ;
TYPE       Luma16x16ARRAY  IS ARRAY (0 TO 15, 0 TO 15)    OF pixelTYPE;
TYPE       Luma4x4ARRAY    IS ARRAY (0 TO  3, 0 TO  3)    OF pixelTYPE;
TYPE       Luma9x9ARRAY    IS ARRAY (0 TO  8, 0 TO  8)    OF pixelTYPE;
TYPE       Luma21x21ARRAY  IS ARRAY (0 TO 20, 0 TO 20)    OF pixelTYPE;
TYPE       Chroma8x8ARRAY  IS ARRAY (0 TO  7, 0 TO  7)    OF pixelTYPE;
TYPE       pixel1DARRAY    IS ARRAY (NATURAL RANGE <>) OF pixelTYPE;

TYPE       MotionVectorRCD IS RECORD
                 x     : mvTYPE;
                 y     : mvTYPE;
                 ref   : NATURAL 0 TO 15; -- Ref frame index
              END RECORD;

TYPE       ParameterRCD    IS RECORD
                 MajorMode   : NATURAL 0 TO 2; -- I16x16, I4x4, P
                 MinorMode   : NATURAL 0 TO 8; -- Up to 9 modes
                 MBAddress   : NATURAL 0 TO nMBmax – 1;
                 etc, etc, etc
              END RECORD;
```

4404

Motion Estimation

```
ENTITY MotionEstimation IS PORT (                              4408
         reset        : IN std_logic;      -- Reset circuit
         clk          : IN std_logic;      -- Short clock       4406      4410
         pclk         : IN std_logic;      -- Long clock
         start        : IN std_logic;      -- Start signal
         InterLumaBlk : IN pixel16x16TYPE  -- Current frame luma from cache
         ReferLumaBlk : IN pixel16x16TYPE; -- Reference frame luma from cache
         skip         : OUT std_logic;     -- Skip macroblock result      4412
         invalidvec   : OUT std_logic;     -- Motion estimation failed
         MVector      : OUT MotionVectorRCD;-- Output motion vector to cache  4413
         done         : OUT std_logic;     -- Done signal
    END  MotionEstimation;                                          1414   1416
```

Figure 44A

Intra Prediction

```
ENTITY IntraPrediction IS PORT (
    reset       : IN std_logic;              -- Reset circuit
    clk         : IN std_logic;              -- Short clock
    pclk        : IN std_logic;              -- Long clock
    start       : IN std_logic;              -- Start signal
    rawLuma     : IN pixel16x16TYPE          -- Raw frame luma from cache for opt
    rawChroma   : IN pixel8x8TYPE;           -- Raw frame chroma from cache for opt
    paramAbove  : IN ParameterRCD;           -- Parameter data, above MB from cache
    paramLeft   : IN ParameterRCD;           -- Parameter data, left MB from cache
    vertvec     : IN pixel1DARRAY (0 TO 16); -- Vertical left neighbor from cache
    horivec     : IN pixel1DARRAY (0 TO 15); -- Horizontal above neighbor from cache
    intraout    : OUT pixel16x16TYPE;        -- Intra predicted luma MB result
    intraout    : OUT pixel8x8TYPE;          -- Intra predicted chroma MB result
    paramout    : OUT ParameterRCD;          -- Parameter result out to cache
    done        : OUT std_logic);            -- Done signal
END IntraPrediction;
```

Inter Prediction

Note: In order to calculate the quarter and eighth pel interpolations, the inter prediction processing element requires additional pixels around the central macroblock or chroma block pixel arrays. In the case of luma, three additional pixels are required left and above, and two additional pixels are required right and below. In the case of chroma, one additional pixel is required right and below. This adds up to a 21x21 pixel matrix for a 16x16 luma block, and a 9x9 pixel matrix for an 8x8 chroma block.

```
ENTITY InterPrediction IS PORT (
    reset       : IN std_logic;              -- Reset circuit
    clk         : IN std_logic;              -- Short clock
    pclk        : IN std_logic;              -- Long clock
    start       : IN std_logic;              -- Start signal
    ReferLuma   : IN pixel21x21TYPE          -- Reference frame luma from cache
    ReferChroma : IN pixel19x9TYPE;          -- Reference frame chroma from cache
    Mvector     : IN MotionVectorRCD;        -- Input motion vector from motion est
    paramAbove  : IN ParameterRCD;           -- Parameter data, above MB from cache
    paramLeft   : IN ParameterRCD;           -- Parameter data, left MB from cache
    interout    : OUT pixel16x16TYPE;        -- Inter predicted luma MB result
    interaout   : OUT pixel8x8TYPE;          -- Inter predicted chroma MB result
    paramout    : OUT ParameterRCD;          -- Parameter result out to cache
    done        : OUT std_logic);            -- Done signal
END InterPrediction;
```

Figure 44B

Residual

```
ENTITY Residual IS PORT (
    reset           : IN std_logic;           -- Reset circuit
    pclk            : IN std_logic;           -- Long clock
    start           : IN std_logic;           -- Start signal
    RawLuma         : IN pixel16x16TYPE       -- Raw luma from cache
    RawChroma       : IN pixel8x8TYPE;        -- Raw chroma from cache
    PredictLuma     : IN pixel16x16TYPE;      -- Predicted luma
    PredictChroma   : IN pixel8x8TYPE;        -- Predicted chroma
    ResidLumaout    : OUT pixel16x16TYPE;     -- Residual luma out
    ResidChromaout  : OUT pixel8x8TYPE;       -- Residual chroma out
    done            : OUT std_logic);         -- Done signal
END Residual;
```

Direct Integer Transform

```
ENTITY DirectIntegerTransform IS PORT (
    reset      : IN std_logic;            -- Reset circuit
    pclk       : IN std_logic;            -- Long clock
    start      : IN std_logic;            -- Start signal
    LumaIn     : IN pixel16x16TYPE        -- Luma input
    ChromaIn   : IN pixel8x8TYPE;         -- Chroma input
    paramIn    : IN ParameterRCD;         -- Parameter data
    LumaOut    : OUT pixel16x16TYPE;      -- Transformed luma out
    ChromaOut  : OUT pixel8x8TYPE;        -- Transformed chroma out
    done       : OUT std_logic);          -- Done signal
END DirectIntegerTransform;
```

Inverse Integer Transform

```
ENTITY InverseIntegerTransform IS PORT (
    reset      : IN std_logic;            -- Reset circuit
    pclk       : IN std_logic;            -- Long clock
    start      : IN std_logic;            -- Start signal
    LumaIn     : IN pixel16x16TYPE        -- Dequantized luma input
    ChromaIn   : IN pixel8x8TYPE;         -- Dequantized chroma input
    LumaPred   : IN pixel16x16TYPE;       -- Predicted luma input
    ChromaPred : IN pixel8x8TYPE;         -- Predicted chroma input
    paramIn    : IN ParameterRCD;         -- Parameter data
    LumaOut    : OUT pixel16x16TYPE       -- Inverse transformed luma out
    ChromaOut  : OUT pixel8x8TYPE;        -- Inverse transformed chroma out
    done       : OUT std_logic);          -- Done signal
END InverseIntegerTransform;
```

Figure 44C

Quantize and Scale

```
ENTITY QuantizeScale IS PORT (
        reset       :   IN std_logic;           -- Reset circuit
        pclk        :   IN std_logic;           -- Long clock
        start       :   IN std_logic;           -- Start signal
        LumaIn      :   IN pixel16x16TYPE;      -- Luma input
        ChromaIn    :   IN pixel8x8TYPE;        -- Chroma input
        paramIn     :   IN ParameterRCD;        -- Parameter data
        LumaOut     :   OUT pixel16x16TYPE;     -- Scaled luma out
        ChromaOut   :   IN pixel8x8TYPE;        -- Scaled chroma out
        done        :   OUT std_logic);         -- Done signal
END     QuantizeScale;
```

Dequantize and Descale

```
ENTITY DeQuantizeDeScale IS PORT (
        reset       :   IN std_logic;           -- Reset circuit
        pclk        :   IN std_logic;           -- Long clock
        start       :   IN std_logic;           -- Start signal
        LumaIn      :   IN pixel16x16TYPE;      -- Luma input
        ChromaIn    :   IN pixel8x8TYPE;        -- Chroma input
        paramIn     :   IN ParameterRCD;        -- Parameter data
        LumaOut     :   OUT pixel16x16TYPE;     -- Descaled luma out
        ChromaOut   :   OUT pixel8x8TYPE;       -- Descaled chroma out
        done        :   OUT std_logic);         -- Done signal
END     DeQuantizeDeScale;
```

Deblocking Filter

```
ENTITY DeBlockingFilter IS PORT (
        reset       :   IN std_logic;           -- Reset circuit
        clk         :   IN std_logic;           -- Short clock
        pclk        :   IN std_logic;           -- Long clock
        start       :   IN std_logic;           -- Start signal
        LumaThis    :   IN pixel16x16TYPE;      -- Luma input from cache
        ChromaThis  :   IN pixel8x8TYPE;        -- Chroma input from cache
        LumaAbove   :   IN pixel16x16TYPE;      -- Luma above from cache
        ChromaAbove :   IN pixel8x8TYPE;        --Chroma above from cache
        LumaLeft    :   IN pixel16x16TYPE;      -- Luma left from cache
        ChromaLeft  :   IN pixel8x8TYPE;        -- Chroma left from cache
        paramThis   :   IN ParameterRCD;        -- Parameter data, from cache
        LumaOut     :   OUT pixel16x16TYPE;     -- Filtered luma result to cache
        ChromaOut   :   OUT pixel8x8TYPE;       -- Filtered chroma result to cache
        done        :   OUT std_logic);         -- Done signal
END     DeBlockingFilter;
```

Figure 44D

Entropy Encoder

```
ENTITY  EntropyEncoder IS PORT (
        reset       :   IN std_logic;                          -- Reset circuit
        clk         :   IN std_logic;                          -- Short clock
        pclk        :   IN std_logic;                          -- Long clock
        dataclk     :   IN std_logic;                          -- Data clock (to bring out NAL units)
        start       :   IN std_logic;                          -- Start signal
        LumaThis    :   IN pixel16x16TYPE;                     -- Transformed Quantized luma input
        ChromaThis  :   IN pixel8x8TYPE;                       -- Transformed Quantized chroma input
        Mvector     :   IN MotionVectorRCD;                    -- Input motion vector from cache
        paramThis   :   IN ParameterRCD;                       -- Parameter data, from cache
        NALByteOut  :   OUT std_logic_vector (15 DOWNTO 0);    -- NAL byte data out
        done        :   OUT std_logic);                        -- Done signal
END     EntropyEncoder;
```

Entropy Decoder

```
ENTITY  EntropyDecoder IS PORT (
        reset       :   IN std_logic;                          -- Reset circuit
        clk         :   IN std_logic;                          -- Short clock
        pclk        :   IN std_logic;                          -- Long clock
        dataclk     :   IN std_logic;                          -- Data clock (to bring in NAL units)
        start       :   IN std_logic;                          -- Start signal
        NALByteIn   :   IN std_logic_vector (15 DOWNTO 0);     -- NAL byte data input
        LumaThis    :   OUT pixel16x16TYPE;                    -- Transformed Quantized luma output
        ChromaThis  :   OUT pixel8x8TYPE;                      -- Transformed Quantized chroma output
        Mvector     :   OUT MotionVectorRCD;                   -- Motion vector out
        paramThis   :   OUT ParameterRCD;                      -- Parameter data out
        done        :   OUT std_logic);                        -- Done signal
END     EntropyDecoder;
```

Figure 44E

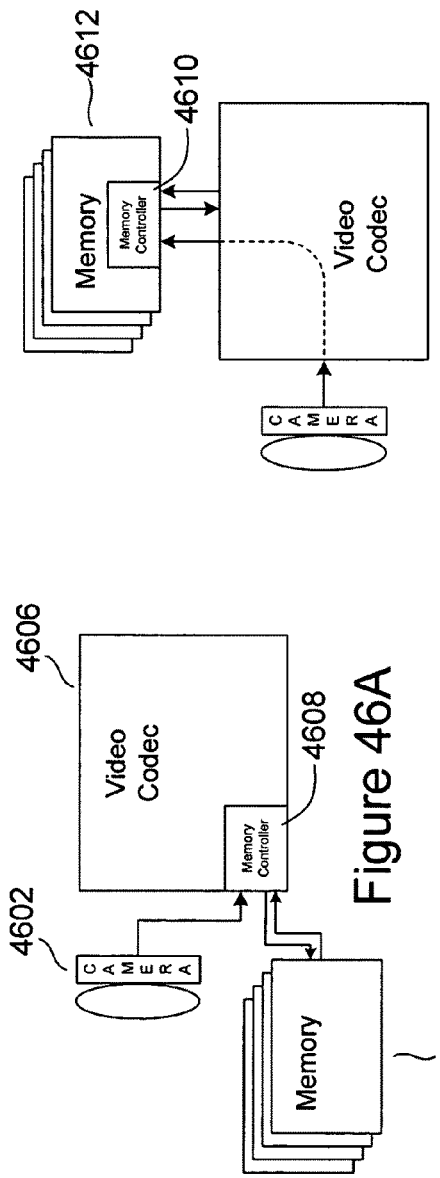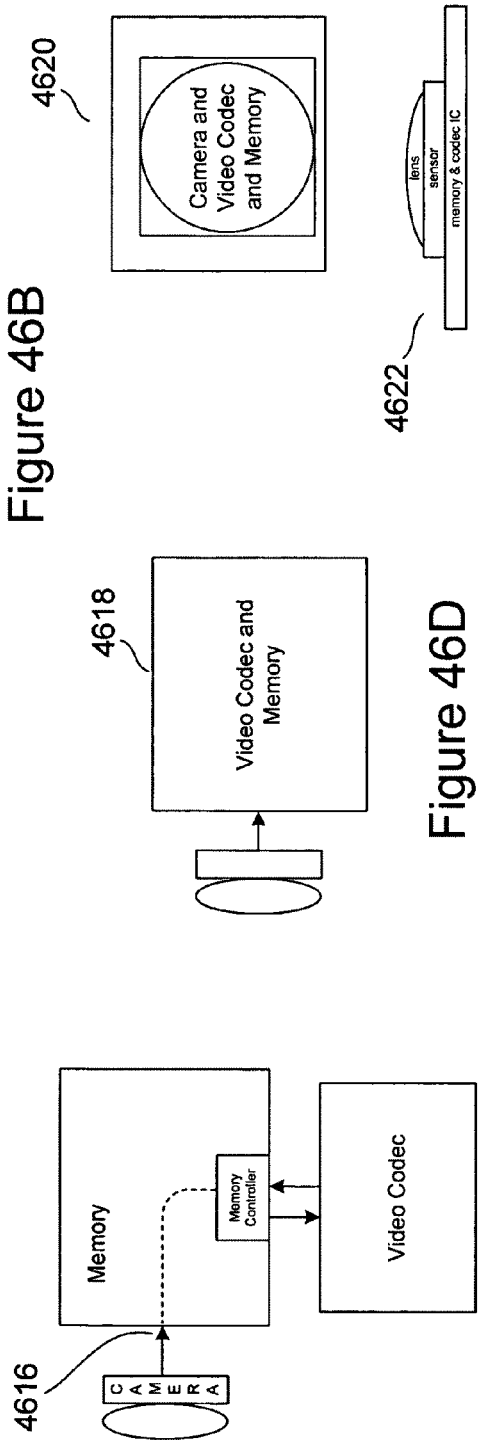

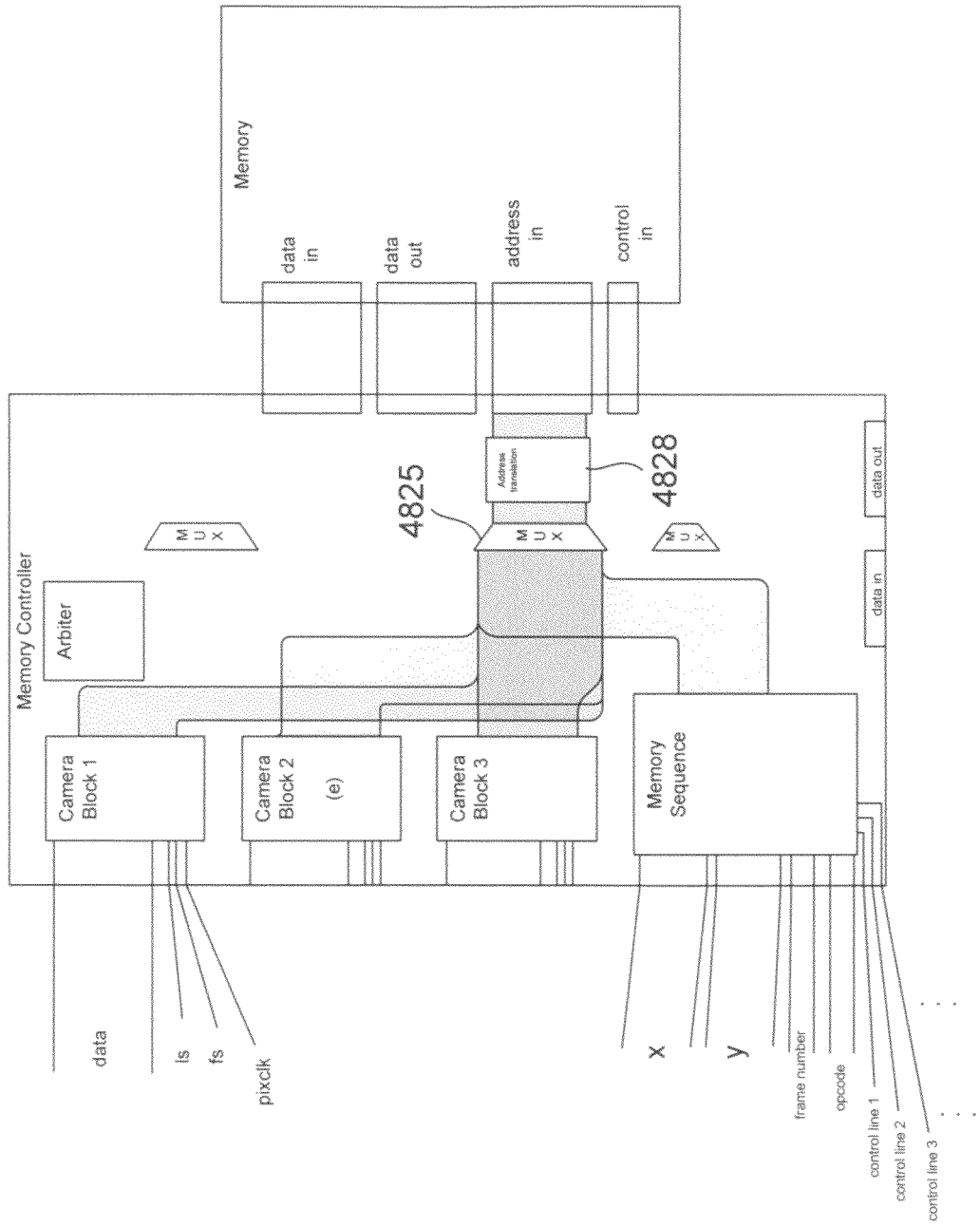

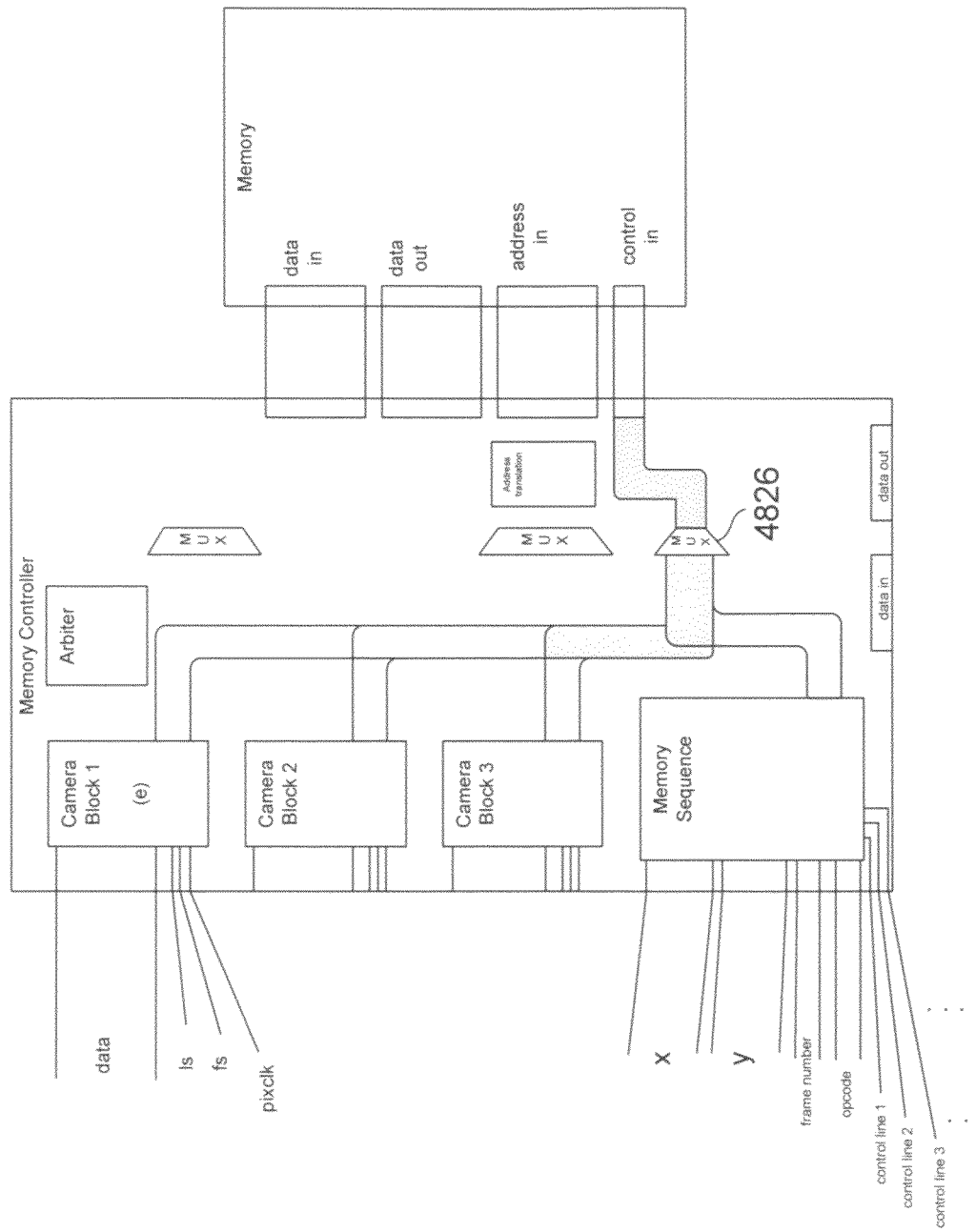

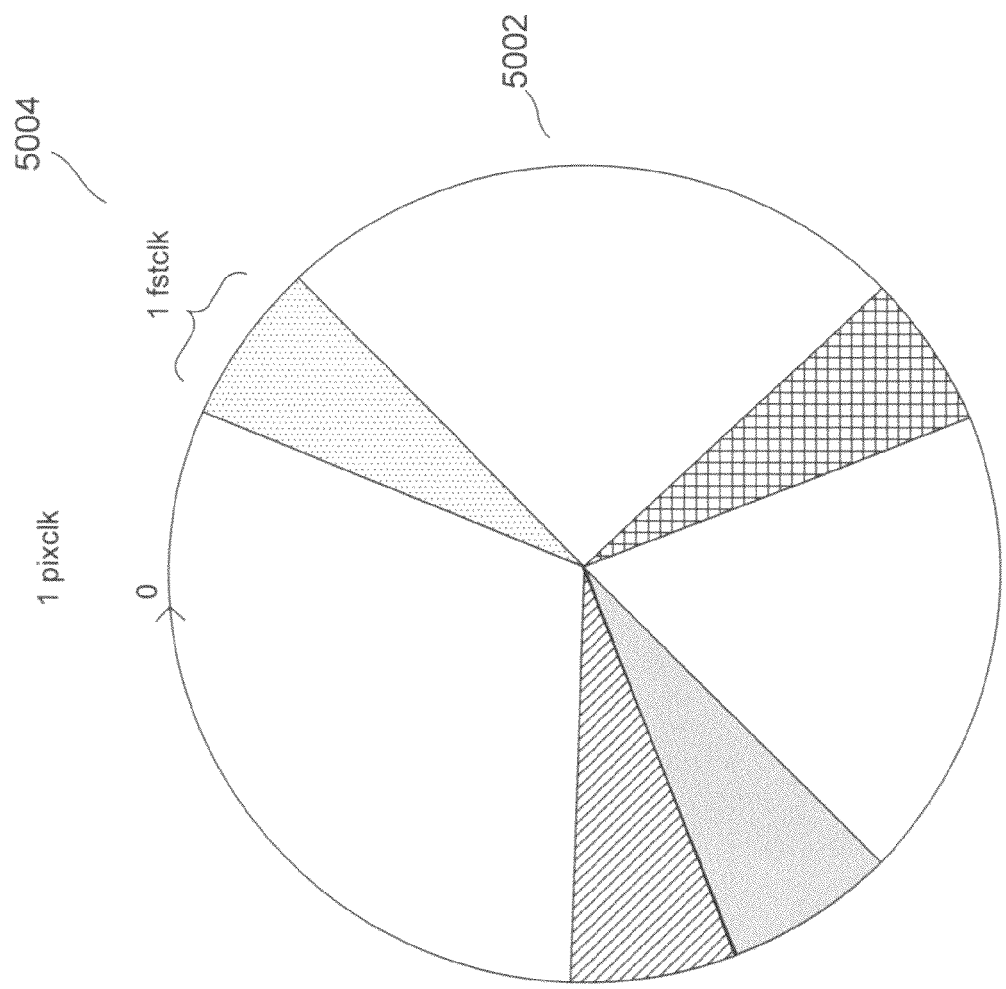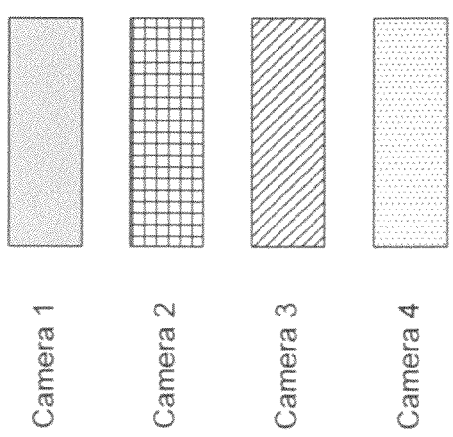
Figure 50

MEMORY SUBSYSTEM

CROSS-REFERENCE TO RELATED APPLICATIONS

This application is a continuation-in-part of U.S. application Ser. No. 12/322,571, filed Feb. 4, 2009, which is continuation-in-part of U.S. application Ser. No. 12/319,750, filed Jan. 12, 2009 now abandoned.

TECHNICAL FIELD

The present invention is related to electronic memories and, in particular, to a memory subsystem within, or accessed by, a highly parallel, pipelined, integrated-circuit computational engine, or used within, or accessed by, any of a variety of different types of electronic devices.

BACKGROUND OF THE INVENTION

Computing machinery is undergoing rapid evolution. Early electronic computers were generally entirely sequential processing machines, executing a stream of instructions, one-by-one, that together compose a computer program. For many years, electronic computers generally included a single main processor which was capable of rapidly executing a relatively small set of simple instructions, including memory-fetch, memory-store, arithmetic, and logical instructions. A computational task was addressed by programming a solution to the task as a set of instructions and then executing the program on a single-processor computer system.

Relatively early in the evolution of electronic computers, various ancillary and support tasks began to be moved, away from the main processor, to specialized auxiliary processing components. As one example, separate I/O controllers were developed for off-loading much of the repetitive and computational-bandwidth-consuming tasks associated with exchanging information between main memory and various external devices, including mass-storage devices, communications devices, display devices, and user-input devices. This incorporation of multiple processing elements into single-main-processor computer system was the beginning of a trend towards increasing parallelism in computing.

Parallel computation is currently a dominant trend in the design of modern computational machinery. At one extreme, individual processor cores often provide for concurrent, parallel execution of multiple instruction streams, and provide for assembly-line-like, concurrent execution of multiple instructions. Most computers, including personal computers, now incorporate at least two, and often many more, processor cores within each single integrated circuit. Each processor core can relatively independently execute multiple instruction streams. Electronic computer systems may contain multiple multi-core processors, and may be aggregated together into vast distributed computing networks comprising tens to thousands to hundreds of thousands of discrete computer systems that intercommunicate with one another and that each executes one or more separable portions of a large, distributed computational task.

As computers have evolved towards parallel and massively parallel computational systems, many of the most difficult and vexing problems associated with parallel computing have been found to be associated with decomposing large computational tasks into relatively independent subtasks, each of which can be carried out by a different processing entity. When problems are not properly decomposed, or when problems cannot be decomposed, for parallel execution, then employing parallel computer machinery often provides little or no benefit, and, in worst cases, may actually result in slower execution than can be obtained by a traditional software implementation executed on a single-processor computer system. When multiple computational entities contend for shared resources, or depend on computational results generated concurrently by other processing entities, enormous computational and communications resources may be expended to manage the parallel operation of the multiple computational entities. Often, the communications and computational overheads may far outweigh the benefits of a parallel-computing approach carried out on multiple processors or other computational entities. Furthermore, there may be significant financial costs involved with parallel computing, and also significant costs in power consumption and in heat dissipation.

Thus, although parallel computation appears to be the logical approach to efficient computing of many computational tasks, judging from biological systems and the evolutionary trends already encountered in the short time span of the evolution of electronic computers, parallel computing is also associated with many complexities, costs, and disadvantages. While many problems may theoretically benefit from a parallel-computing approach, the techniques and hardware for parallel computing that are currently available often cannot provide cost-effective solutions for many computational problems, particularly for complex computations that need to be carried out in real time within devices constrained by size constraints, heat-dissipation constraints, power-consumption constraints, and cost constraints. For this reason, computer scientists, electrical engineers, researchers and developers in many computationally oriented fields, manufacturers and vendors of electronic devices and electronic computers, and, ultimately, users of electronic devices and electronic computers all recognize the need for continued development of new approaches to efficient implementation of parallel computation engines for solving practical problems. In particular, computer scientists, electrical engineers, researchers and developers in many computationally oriented fields, manufacturers and vendors of electronic devices and electronic computers, and others seek efficient, low-power, and cost-effective subsystems that can be used within, or associated with, the parallel computation engines, including efficient, low-power, and cost-effective memory subsystems.

SUMMARY OF THE INVENTION

Embodiments of the present invention are directed to memory subsystems implemented within, or connected to and accessed by, parallel, pipelined, integrated-circuit implementations of computational engines designed to solve complex computational problems. Additional embodiments of the present invention are directed to memory subsystems implemented within, or connected to and accessed by, a variety of different types of electronic devices. One embodiment of the present invention comprises a memory controller implemented in a first integrated circuit or other electronic system and one or more separate memory devices. Alternative embodiments of the present invention incorporate the memory controller within one or more memory devices that are connected to, and accessed by, an integrated-circuit-implemented computational engine or another electronic device. In alternative embodiments of the present invention, the memory controller and memory are together integrated within a computational engine or another electronic device. Alternative embodiments of the present invention include a multi-access memory that interfaces to a simpler memory controller for connection to, or integration within, a computational engine or other electronic device.

BRIEF DESCRIPTION OF THE DRAWINGS

FIGS. 10A-I illustrate the nine 4×4 luma-block intra-prediction modes.

FIGS. 11A-11D illustrate, using similar illustration conventions as used in FIGS. 10A-I, the four modes for intra prediction of 16×16 luma blocks.

FIG. 18 provides derivation of the integer transform and inverse integer transform employed in H.264 video compression and video decompression, respectively.

FIG. 35 provides a table of the various types of objects transferred from video cache memory along the data object bus to processing elements in the single-integrated-circuit implementation of a video codec according to the present invention.

FIG. 43 provides a table that indicates an example of the overall computational processing carried out by each of certain of the processing elements of a video codec that represents one embodiment of the present invention.

FIGS. 44A-E provide high-level VHDL definitions of the various processing elements in the single-integrated-circuit implementation of a video codec, according to one embodiment of the present invention, as shown in FIG. 33A.

FIGS. 46A-E illustrate a series of video systems that represent embodiments of the present invention and that represent a path of increasing integration between subsystems of the video systems.

FIGS. 48A-H illustrate the components, and operation of the components, of a memory controller that represents one embodiment of the present invention.

FIG. 50 provides a simple illustration of timing considerations for a memory-controller arbiter implemented within a memory controller that represents one embodiment of the present invention.

DETAILED DESCRIPTION OF THE INVENTION

Figure 1:
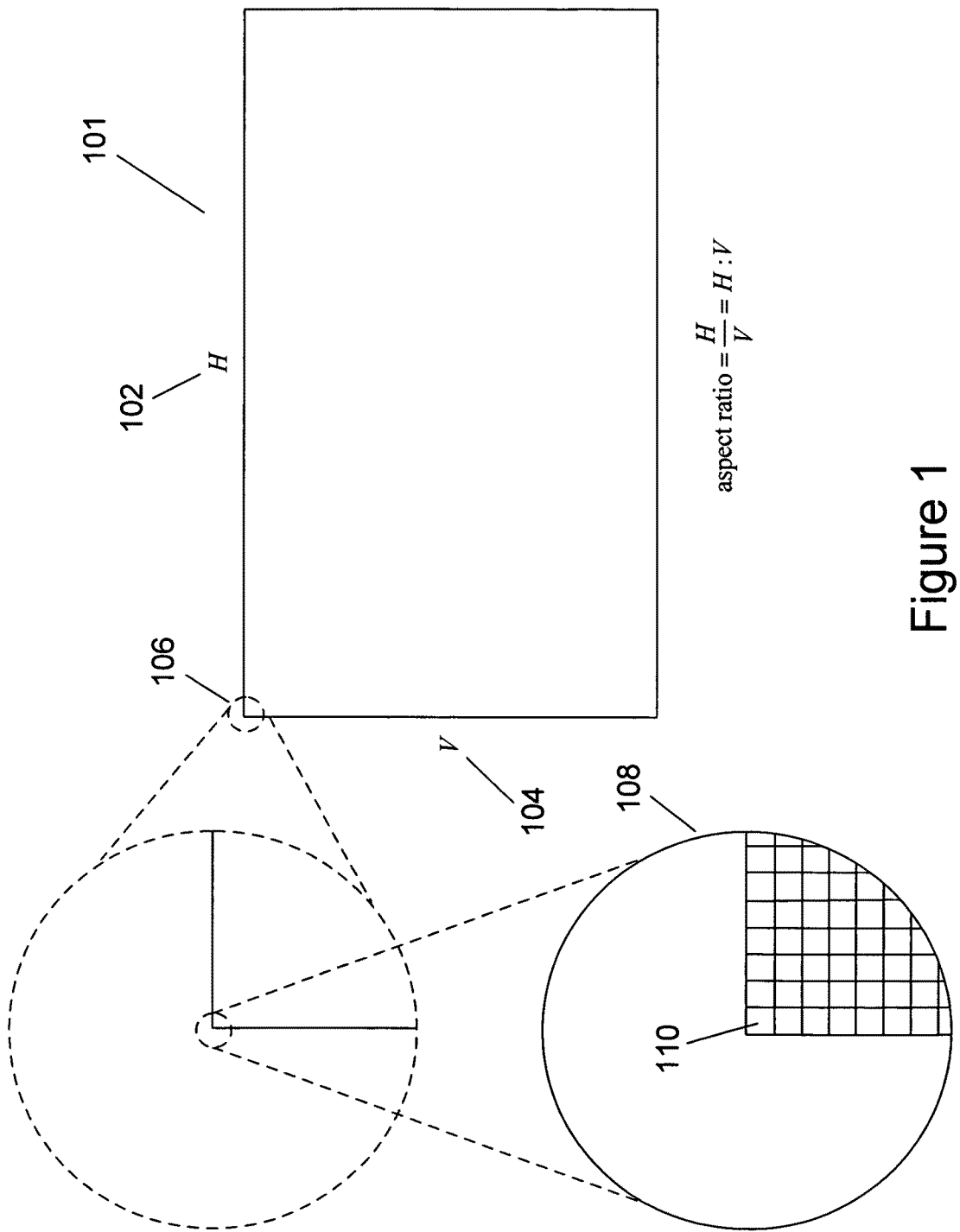
FIG. 1 illustrates a digitally-encoded image.

Embodiments of the present invention are directed to memory subsystems that may be implemented within, or connected to, computational engines that carry out complex computational tasks with low power consumption, low heat-dissipation, large computational bandwidths, and low latency for task execution. Computational engines are implemented as individual integrated circuits, or chips, that feature highly parallel computation provided by many concurrently operating processing elements according to the present invention. Effective use of the currently executing processing elements is made possible by a suitable decomposition of a complex computational task, efficient access to shared information and data objects within the integrated circuit, and efficient, hierarchical control of processing tasks and subtasks.

The processing elements access computational objects on which they operate via an object bus that interconnects processing elements with an on-board object cache. The on-board object cache is, in many embodiments, connected or coupled through an object memory controller to a larger object memory that, in certain embodiments of the present invention, may be implemented as an external component. Control of the computation implemented by the computational engines of the present invention is provided, in certain embodiments of the present invention, by a micro-processor controller, according to a relatively low-frequency clock, with one or more higher-frequency clock signals controlling processing within processing elements. The processing elements are logically arranged, in certain embodiments of the present invention, into an assembly-line-like pipeline, with computational objects generally processed sequentially by the processing elements along the pipeline, moving between processing elements and/or back and forth from the object cache. Processing-element computation, cache access, memory access, and data transfer are organized around computational objects, rather than arbitrarily-sized data units, such as bytes or words.

A large number of different computational tasks may be addressed by the design and development of highly parallel integrated-circuit implementations of computational engines according to embodiments of the present invention. As one specific embodiment of the present invention, a parallel, pipelined, integrated-circuit implementation of a video codec is discussed, below. Various alternative embodiments of the integrated-circuit implementation of the video codec may be employed in a wide variety of electronic devices, including mobile phones equipped with video cameras, digital video cameras, personal computers, surveillance equipment, remote sensors, aircraft and spacecraft, and a wide variety of other types of equipment. It is emphasized here, and throughout the following discussion, that the video-codec implementations are specific examples of the many different parallel, pipelined, integrated-circuit computational engines that represent embodiments of the present invention.

The described parallel integrated-circuit implementation of a video codec is designed to carry out a complex computational task. The following discussion is organized as six subsections: (1) The H.264 Compressed-Video-Signal-Decompression Standard; (2) Principles of Parallel Integrated-Circuit Design for Addressing Complex Computational Tasks According to the Present Invention; (3) An H.264 Video Codec Implemented as a Single Integrated Circuit According to the Present Invention; (4) Video-System Implementations Featuring Increased Integration with the Memory-Subsystem Integration According to the Present Invention; (5) A First Family of Memory Subsystems That Represents One Set of Embodiments of the Present Invention; and (6) Family of Memory Subsystems That Represents A Second Set of Embodiments of the Present Invention. It should be noted that while the examples are primarily presented in the context of the H.264 standard, these are merely examples and that the invention is in no way restricted to H.264-based implementations. In the first subsection, below, the computational task carried out by a specific example of a parallel, pipelined, integrated-circuit computational engine is described, in overview. The described embodiment is a video-codec that compresses raw video signals and decompresses compressed video signals according to the H.264, or MPEG-4 AVC, compressed-video-signal decompression standard. For those readers already familiar with the H.264 compressed-video-signal-decomposition standard, the first subsection can be skipped. In the second subsection, principles of parallel integrated-circuit design according to embodiments of the present invention, which can be applied to any of many numerous complex computational tasks, are described. In the third subsection, an H.264 video codec implemented as a single integrated circuit is described in detail. In the fourth subsection, various implementations of a single-integrated-circuit video codec is discussed, providing a pathway towards increased integration of memory subsystems with the video codec and, ultimately, with an imaging system. In the fifth subsection, a first family of RAM-based memory subsystems that represent embodiments of the present invention is discussed. Finally, in a sixth subsection, a second family of efficient memory systems that represent embodiments of the present invention is discussed.

Subsection I: The H.264
Compressed-Video-Signal-Decompression Standard

This first subsection provides an overview of the H.264 compressed-video-signal decompression standard. This subsection provides a description of the computational problem addressed by a specific embodiment of a parallel, pipelined, integrated-circuit computational engine that represents an embodiment of the present invention. Those readers familiar with H.264 may skip this first subsection, and continue with the second subsection, below.

FIG. 1 illustrates a digitally-encoded image. A digitally-encoded image can be a still photograph, a video frame, or any of various graphical objects. In general, a digitally-encoded image comprises a sequence of digitally encoded numbers that together describe a rectangular image 101. The rectangular image has a horizontal dimension 102 and a vertical dimension 104, the ratio of which is referred to as the "aspect ratio" of the image.

A digitally-encoded image is decomposed into tiny display units, referred to as "pixels." In FIG. 1, a small portion 106 of the left, upper corner of a displayed image is shown twice magnified. Each magnification step is a 12-fold magnification, producing a final 144-fold magnification of a tiny portion of the left upper corner of the digitally-encoded image 108. At 144-fold magnification, the small portion of the displayed image is seen to be divided into small squares by a rectilinear coordinate grid, each small square, such as square 110, corresponding to, or representing, a pixel. A video image is digitally encoded as a series of data units, each data unit describing the light-emission characteristics of one pixel within the displayed image. The pixels can be thought of as cells within a matrix, with each pixel location described by a horizontal coordinate and a vertical coordinate. The pixels can alternatively be considered to be one long linear sequence of pixels, produced in raster-scan order, or in some other predefined order. In general, a logical pixel in a digitally-encoded image is translated into light emission from one or several tiny display elements of a display device. The number that digitally encodes the value of each pixel is translated into one or more electronic voltage signals to control the display unit to emit light of a proper hue and intensity so that, when all of the display units are controlled according to the pixel values encoded in a digitally-encoded image, the display device faithfully reproduces the encoded image for viewing by a human viewer. Digitally-encoded images may be displayed on cathode-ray-tube, LCD, or plasma display devices incorporated within televisions, computer display monitors, and other such light-emitting display devices, may be printed onto paper or synthetic films by computer printers, may be transmitted through digital communications media to remote devices, may be stored on mass-storage devices and in computer memories, and may be processed by various image-processing application programs.

Figure 2:
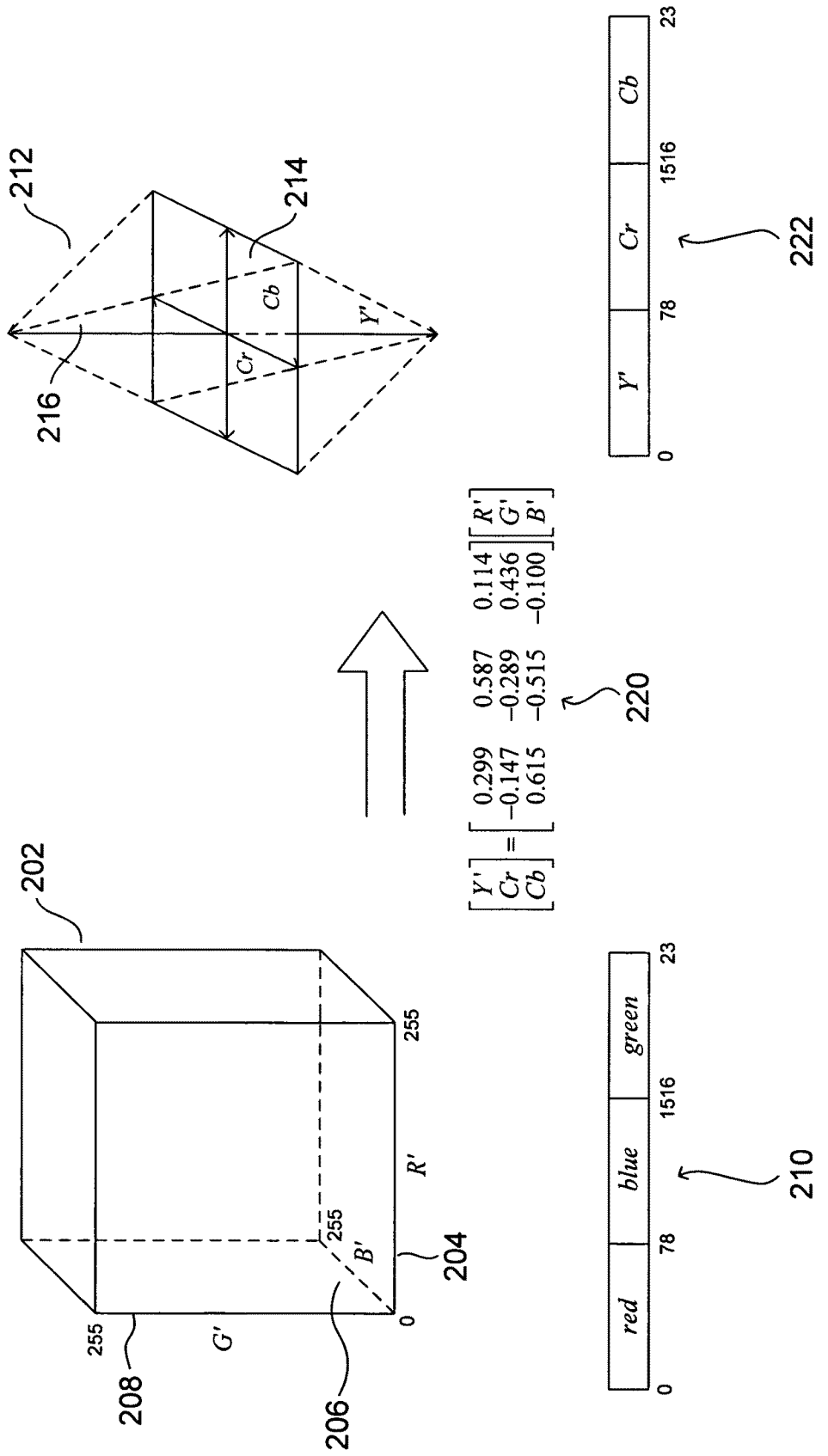
FIG. 2 illustrates two different pixel-value encoding methods according to two different color-and-brightness models.

There are various different methods and standards for encoding color and emission-intensity information into a data unit. FIG. 2 illustrates two different pixel-value encoding methods according to two different color-and-brightness models. A first color model 202 is represented by a cube. The volume within the cube is indexed by three orthogonal axes, the R' axis 204, the B' axis 206, and the G' axis 208. In this example, each axis is incremented in 256 increments, corresponding to all possible numeric values of an eight-bit byte, with alternative R'G'B' models using a fewer or greater number of increments. The volume of the cube represents all possible color-and-brightness combinations that can be displayed by a pixel of a display device. The R', B', and G' axes correspond to red, blue, and green components of the colored light emitted by a pixel. The intensity of light emission by a display unit is generally a non-linear function of the voltage supplied to the data unit. In the RGB color model, a G-component value of 127 in a byte-encoded G component would direct one-half of the maximum voltage that can be applied to a display unit to be applied to a particular display unit. However, when one-half of the maximum voltage is applied to a display unit, the brightness of emission may significantly exceed one-half of the maximum brightness emitted at full voltage. For this reason, a non-linear transformation is applied to the increments of the RGB color model to produce increments of the R'G'B' color model, so that the scaling is linear with respect to perceived brightness. The encoding for a particular pixel 210 may include three eight-bit bytes, for a total of 24 bits, when up to 256 brightness levels can be specified for each of the red, blue, and green components of the light emitted by a pixel. When a larger number of brightness levels can be specified, a larger number of bits is used to represent each pixel, and when a lower number of brightness levels are specified, a smaller number of bits may be used to encode each pixel.

Although the R'G'B' color model is relatively easy to understand, particularly in view of the red-emitting-phosphor, green-emitting-phosphor, and blue-emitting-phosphor construction of display units in CRT screens, a variety of related, but different, color models are more useful for video-signal compression and decompression. One such alternative color model is the Y'CrCb color model. The Y'CrCb color model can be abstractly represented as a bi-pyramidal volume 212 with a central, horizontal plane 214 containing orthogonal Cb and Cr axes, with the long, vertical axis of the bi-pyramid 216 corresponding to the Y' axis. In this color model, the Cr and Cb axes are color-specifying axes, with the horizontal mid-plane 214 representing all possible hues that can be displayed, and the Y' axis represents the brightness or intensity at which the hues are displayed. The numeric values that specify the red, blue, and green components in the R'G'B' color model can be directly transformed to equivalent Y'CrCb values by a simple matrix transformation 220. Thus, when eight-bit quantities are used to encode the Y', Cr, and Cb components of display-unit emission according to the Y'CrCb color model, a 24-bit data unit 222 can be used to encode the value for a single pixel.

Figure 3:
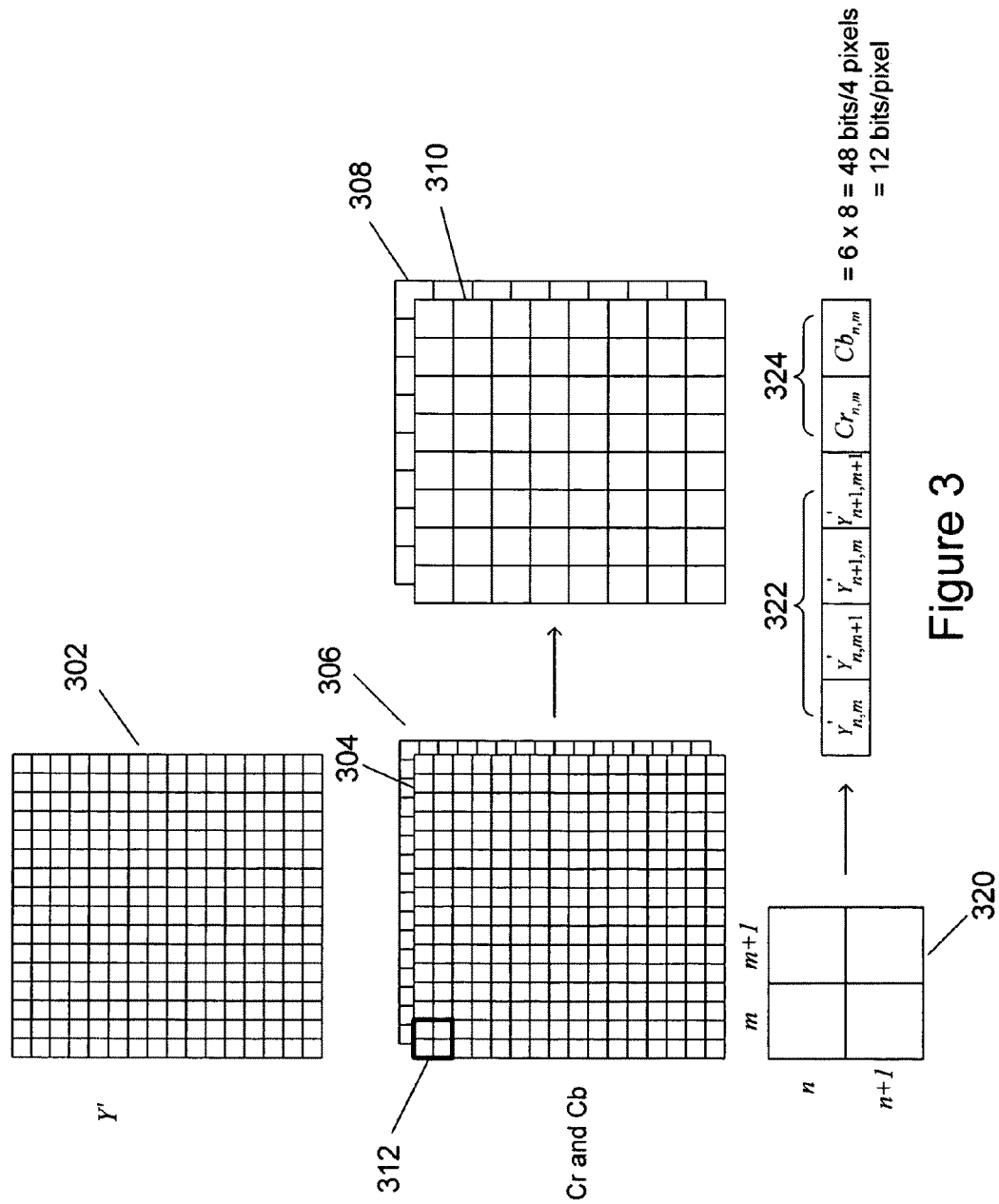
FIG. 3 illustrates digital encoding using the Y'CrCb color model.

For image processing, when the Y'CrCb color model is employed, a digitally-encoded image can be thought of as three separate pixilated planes, superimposed one over the other. FIG. 3 illustrates digital encoding using the Y'CrCb color model. A digitally-encoded image, as shown in FIG. 3, can be considered to be a Y' image 302 and two chroma images 304 and 306. The Y' plane 302 essentially encodes the brightness values of the image, and is equivalent to a monochrome representation of the digitally-encoded image. The two chroma planes 304 and 306 together represent the hue, or color, at each point in the digitally-encoded image. For many video-processing and video-image-storage purposes, it is convenient to decimate the Cr and Cb planes to produce Cr and Cb planes 308 and 310 with one-half resolution. In other words, rather than storing an intensity and two chroma values for each pixel, an intensity value is stored for each pixel, but a pair chroma values is stored for each 2×2 square containing four pixels. Thus, all four pixels in the left upper corner of the image 312 are encoded to have the same Cr value and Cb value. For each 2×2 region of the image 320, the region can be digitally encoded by four intensity values 322 and two chroma values 324, 48 bits in total, or, in other words, by using 12 bits per pixel.

Figure 4:
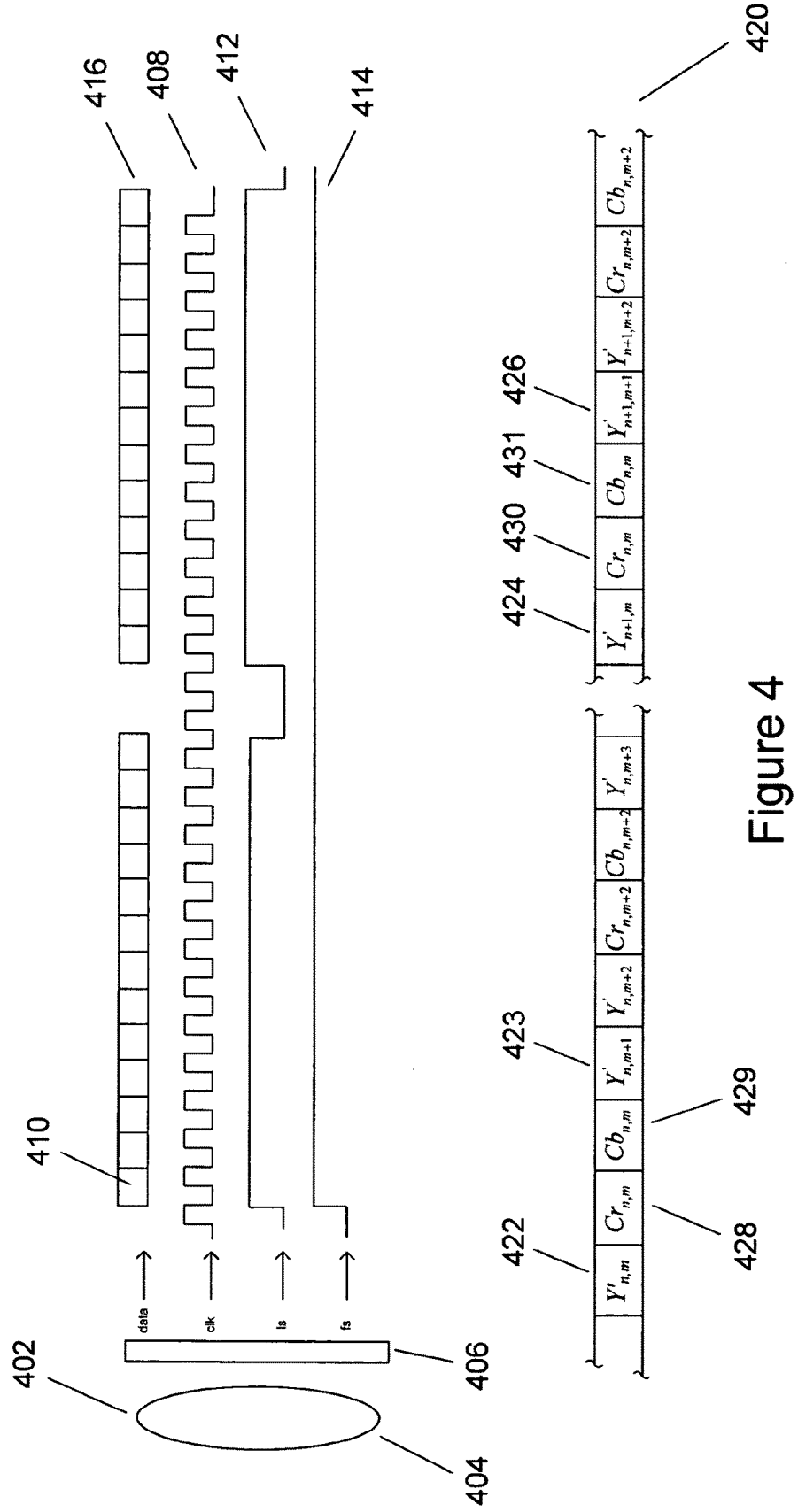
FIG. 4 illustrates the output of a video camera.

FIG. 4 illustrates the output of a video camera. The video camera 402 is represented as a lens 404 and an electronic, output-generating sensor 406. The video camera produces a clock signal 408, the rising edges of each pulse of which correspond to the beginning of a next data packet, such as data packet 410. In the example shown in FIG. 4, each data packet contains an eight-bit intensity or chroma value. The digital camera also produces a line, or row signal 412, with the signal high over a period of time corresponding to output of an entire row of a digitally-encoded image. The digital camera additionally outputs a frame signal 414, which is high over a period of time during which one digital image, or frame, is output. The clock, row, and frame output signals together specify the times for the output of each intensity or chroma value, the output of each row of a frame, and the output of each frame in a video signal. The data output 416 of the video camera is shown, in greater detail, as the sequence of packets 420 at the bottom of FIG. 4. Referring to the 2×2 pixel region (320 in FIG. 3) shown in FIG. 3, and using the same indexing conventions as used with respect to that region for the encoded intensity and chroma values 322 and 324 in FIG. 3, the contents of the stream of data 420 in FIG. 4 can be understood. Two intensity values for a 2×2 square region of pixels 422-426 are transmitted, along with a first set of two chroma values 428-429 for the 2×2 square region of pixels, as part of a first row of pixel values, with the two chroma values 428-429 transmitted in between the first two intensity values 422-423. Subsequently, the chroma values are repeated 430-431 between the second pair of intensity values 424 and 426 as part of a next row of pixel intensities. The repetition of chroma values facilitates certain types of real-time video-data-stream processing. However, the second pair of chroma values 430-431 is redundant. As discussed with respect to FIG. 3, the chroma planes are decimated, so that only two chroma values are associated with each 2×2 region containing four pixels.

Figure 5:
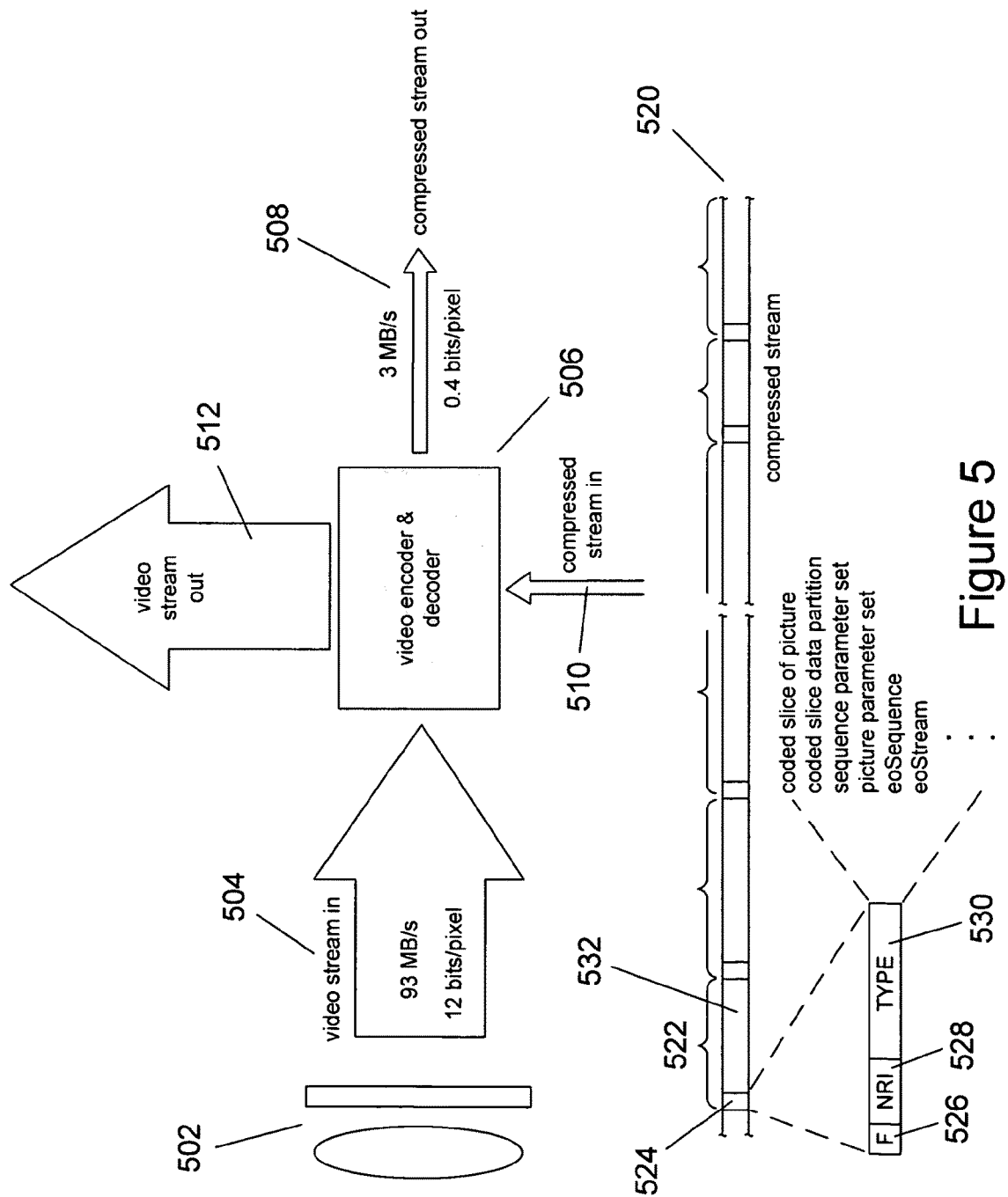
FIG. 5 illustrates the function of a video codec.

FIG. 5 illustrates the function of a video codec. As discussed above, with reference to FIGS. 1-4, a video camera 502 produces a stream of digitally encoded video frames 504. At 30 frames per second, assuming frames of 1920×1080 pixels, and assuming an encoding that uses 12 bits per pixel, the video camera produces 93 megabytes of data per second. One minute of sustained video capture would produce 5.5 gigabytes of data. Small, hand-held electronic devices manufactured according to currently-available designs and technologies cannot process, store, and/or transmit data at this rate. In order to produce manageable data-transfer rates, a video codec 506 is employed to compress the data stream output from the camera. The H.264 standard provides for video compression ratios of about 30:1. The incoming 93 MB/s data stream from the camera is thus compressed, by the video codec 506, to produce a compressed video data stream of about 3 MB/s 508. By contrast to the raw video-data stream produced by the camera, the compressed video-data stream is output by the video codec at a data rate that can be processed for storage or transmission by a hand-held device. A video codec can also receive a compressed video-data stream 510 and decompress the compressed data to produce an output raw video-data stream 512 for consumption by a video-display device.

The 30:1 compression ratio can be achieved by a video codec because video signals generally contain relatively large amounts of redundant information. As one example, a video signal generated by filming two children throwing a ball back and forth contains a relatively small amount of rapidly changing information, namely the images of the children and the ball, and a relatively large amount of static or slowly changing objects, including the background landscape and lawn upon which the children are playing. While the children's figures and the image of the ball may significantly change, from frame to frame, over the course of the filming, background objects may remain relatively constant throughout the filming, or at least for relatively long periods of time. In this case, much of the information encoded in frames subsequent to the first frame may be quite redundant. Video compression techniques are used to identify and efficiently encode the redundant information, and to therefore greatly decrease the total amount of information that is included in a compressed video signal.

The compressed video stream 508 is shown, in greater detail 520 in the lower portion of FIG. 5. According to the H.264 standard, the compressed video stream comprises a sequence of network-abstraction-layer ("NAL") packets, such as NAL packet 522. Each NAL packet includes an 8-bit header, such as header 524 of NAL packet 522. A first bit must always be zero 526, the next two bits 528 indicate whether or not the data contained in the packet are associated with a reference frame, and the final five bits 530 together compose a type field, which indicates the type of packet and the nature of its data payload. Packet types include packets that contain encoded pixel data and encoded metadata that describes how portions of the data have been encoded, and also include packets that represent various types of delimiters, including end-of-sequence end-of-stream delimiters. The body of a NAL packet 532 generally contains encoded data.

Figure 6:
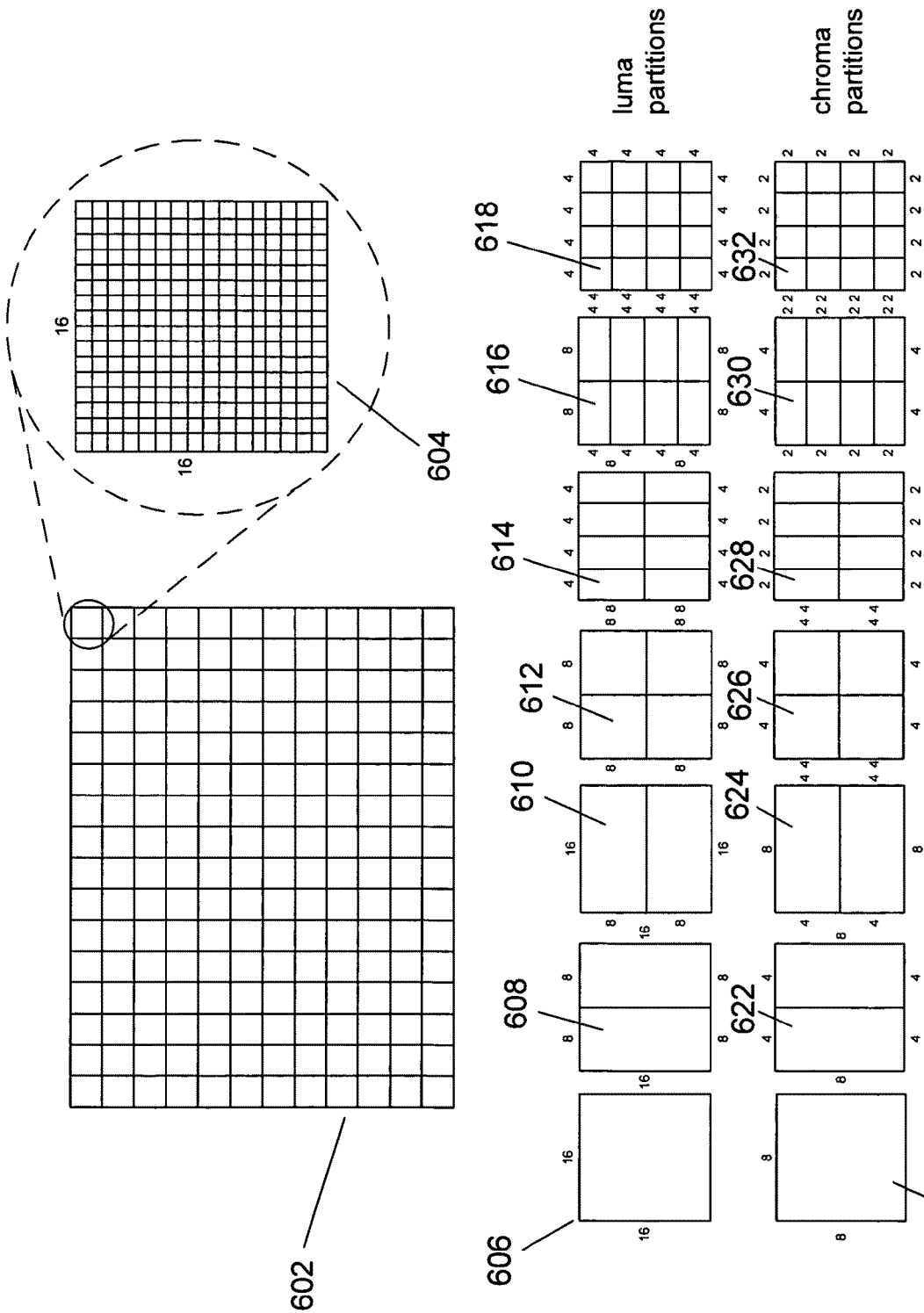
FIG. 6 illustrates various data objects upon which video-encoding operations are carried out during video-data-stream compression and compressed-video-data-stream decompression.

FIG. 6 illustrates various data objects upon which video-encoding operations are carried out during video-data-stream compression and compressed-video-data-stream decompression. From the standpoint of video processing, a video frame 602 is considered to be composed of a two-dimensional array of macroblocks 604, each macroblock comprising a 16×16 array of data values. As discussed above, video compression and decompression generally operate independently on Y' frames containing intensity values and chroma frames containing chroma values. The human eye is generally far more sensitive to variations in brightness than to spatial variation in color. Therefore, a first useful compression is obtained simply by decimating two chroma planes, as discussed above. Prior to decimation, a 2×2 square of pixels can be represented by 12 bytes of encoded data, assuming eight-bit representations of intensity and chroma values. Following decimation, the same 2×2 square of four pixels can be represented by only six bytes of data. Thus, by decreasing the spatial resolution of the color signal, a compression ratio of 2:1 is achieved. While macroblocks are the basic unit on which compression and decompression operations are carried out, macroblocks may be further partitioned for certain compression and decompression operations. The intensity, or luma, macroblocks each contain 256 pixels 606, but can be partitioned to produce 16×8 partitions 608, 8×16 partitions, 8×8 partitions 612, 8×4 partitions 614, 4×8 partitions 616, and 4×4 partitions 618. Similarly, chroma macroblocks each contain 64 encoded chroma values 620, but can be further partitioned to produce 8×4 partitions 622, 4×8 partitions 624, 4×4 partitions 626, 4×2 partitions 628, 2×4 partitions 630, and 2×2 partitions 632. In addition, 1×4, 1×8, and 1×16 pixel vectors may be employed in certain operations.

Figure 7:
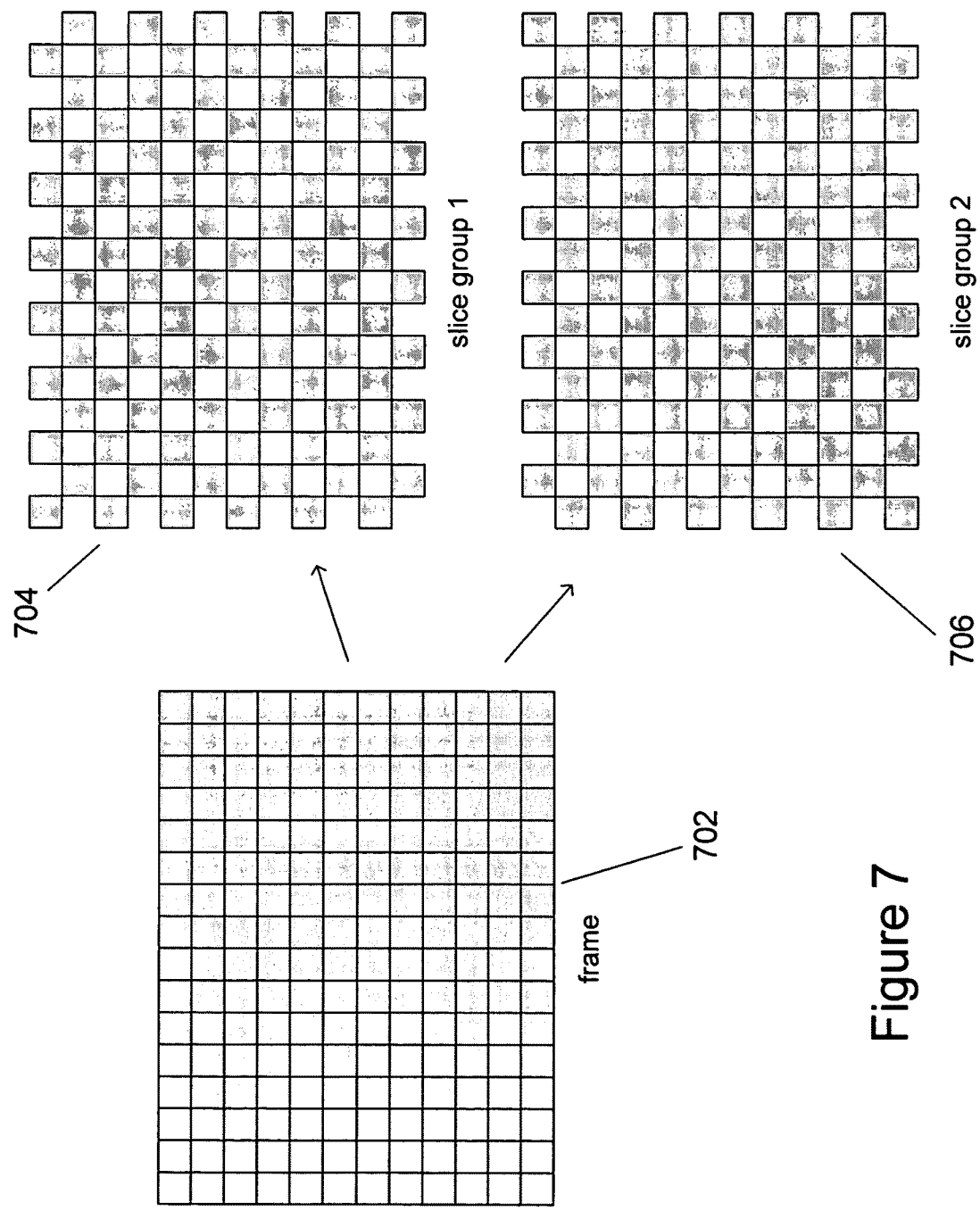
FIG. 7 illustrates partitioning of a video frame into two slice groups.

According to the H.264 standard, each video frame can be logically partitioned into slice groups, with the partitioning specified by a slice-group map. Many different types of slice-group partitioning can be specified by an appropriate slice-group map. FIG. 7 illustrates partitioning of a video frame into two slice groups. The video frame 702 is partitioned into a first, checkerboard-like slice group 704 and a complementary checkerboard-like slice group 706. The first slice group and the second slice group both contain an equal number of pixel values, and each contains one-half of the total number of pixel values in the frame. The frame can be partitioned into an essentially arbitrary number of slice groups, each including an essentially arbitrary fraction of the total pixels, according to essentially arbitrary mapping functions.

Figure 8:
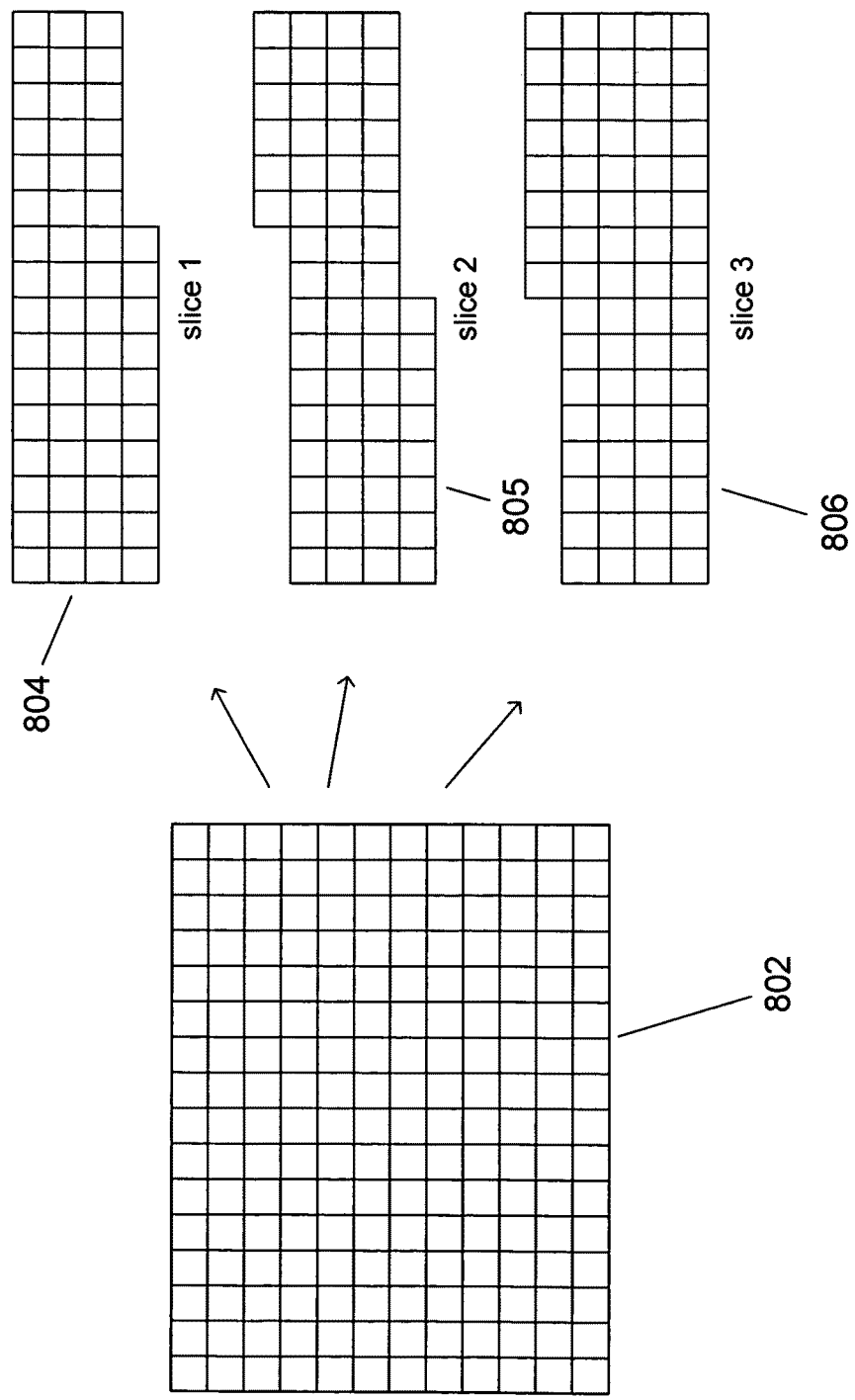
FIG. 8 illustrates a second level of video-frame partitioning.

FIG. 8 illustrates a second level of video-frame partitioning. Each slice group, such as slice group 802, can be partitioned into a number of slices 804-806. Each slice contains a number of contiguous pixels (contiguous within the slice group, but not necessarily within a frame) in raster-scan order. The slice group 802 may be an entire video frame or may be a partition of the frame according to an arbitrary slice-group-partitioning function. Certain of the compression and decompression operations are carried out on a slice-by-slice basis.

To summarize, video compression and decompression techniques are carried out on video frames and various subsets of video frames, including slices, macroblocks, and macroblock partitions. In general, intensity-plane or luma-plane objects are operated on independently from chroma-plane objects. Because chroma planes are decimated by a factor of two in each dimension, with an overall 4:1 compression, the dimensions of chroma macroblocks and macroblock partitions are generally one-half those of the luma macroblocks and luma-macroblock partitions.

A first step in video compression, as implied by the H.264 standard, is to employ one of two different general prediction techniques in order to predict the pixel values of a currently considered macroblock or macroblock partition from, in one case, neighboring macroblocks or macroblock partitions in the same frame and, in the other case, spatially neighboring macroblocks or macroblock partitions that occur in frames that precede or follow the frame of the macroblock or macroblock partition that is being predicted. The first type of prediction is spatial prediction, referred to as "intra prediction." A second type of prediction is temporal prediction, referred to as "inter prediction." Intra prediction is the only type of prediction that can be used for certain frames, referred to as "reference frames." Intra prediction is also the default prediction used when encoding macroblocks. For a macroblock of a non-reference frame, inter prediction is first attempted. When inter prediction succeeds, then intra prediction is not used for the macroblock. However, when inter prediction fails, then intra prediction may be employed as the default prediction method.

Figure 9:
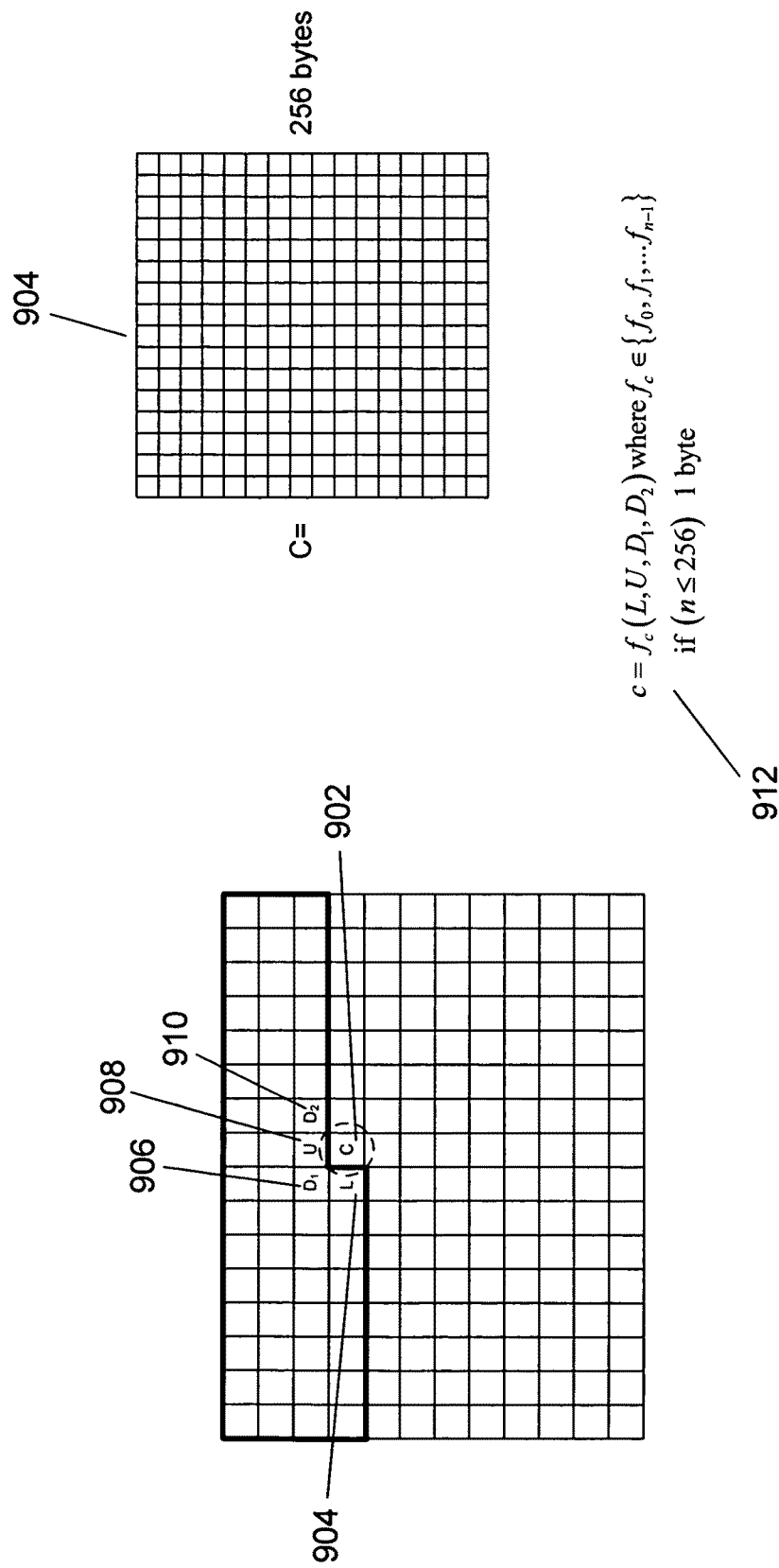
FIG. 9 illustrates the general concept of intra prediction.
Figure 10A:
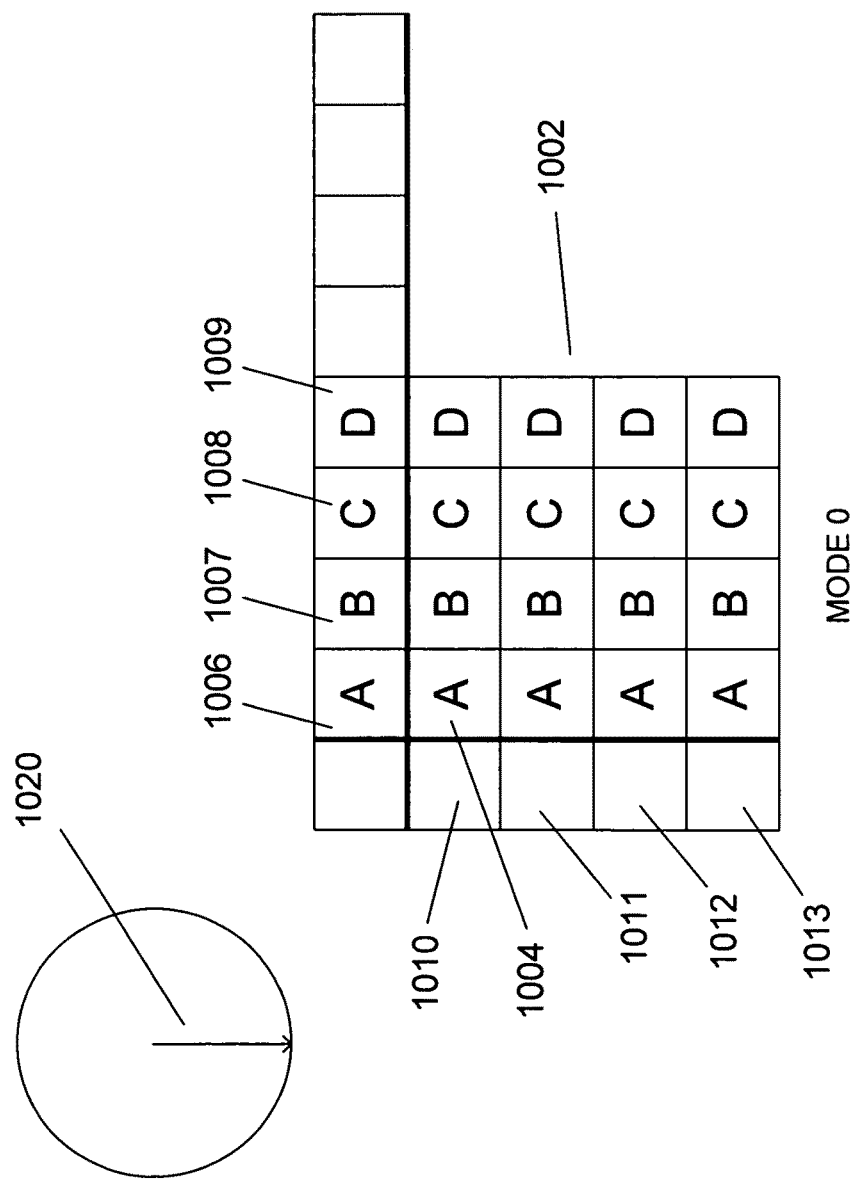
Figure 10C:
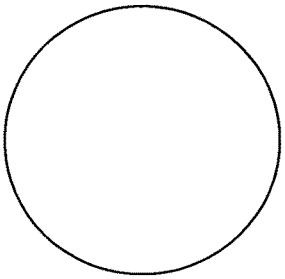
Figure 10D:
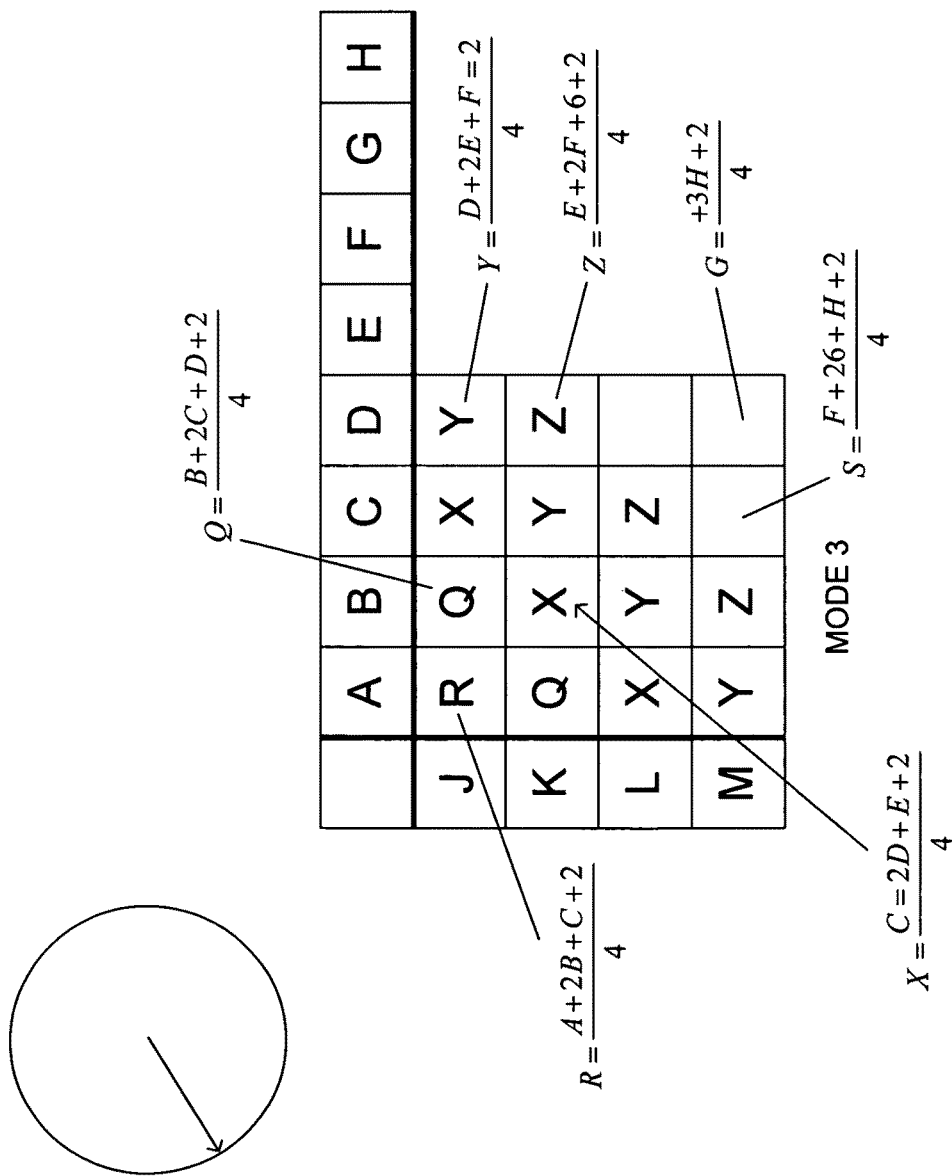
Figure 10E:
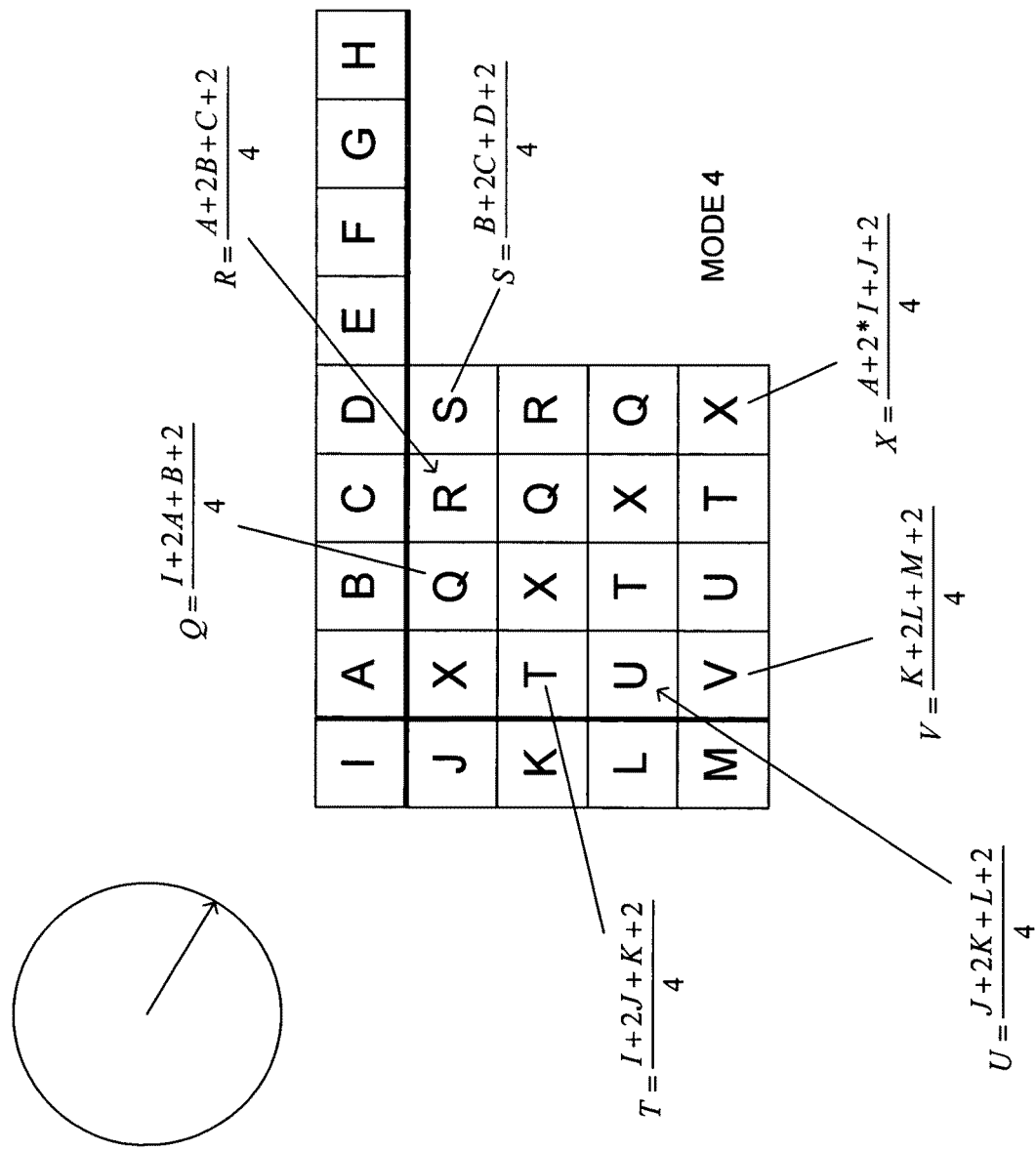
Figure 10F:
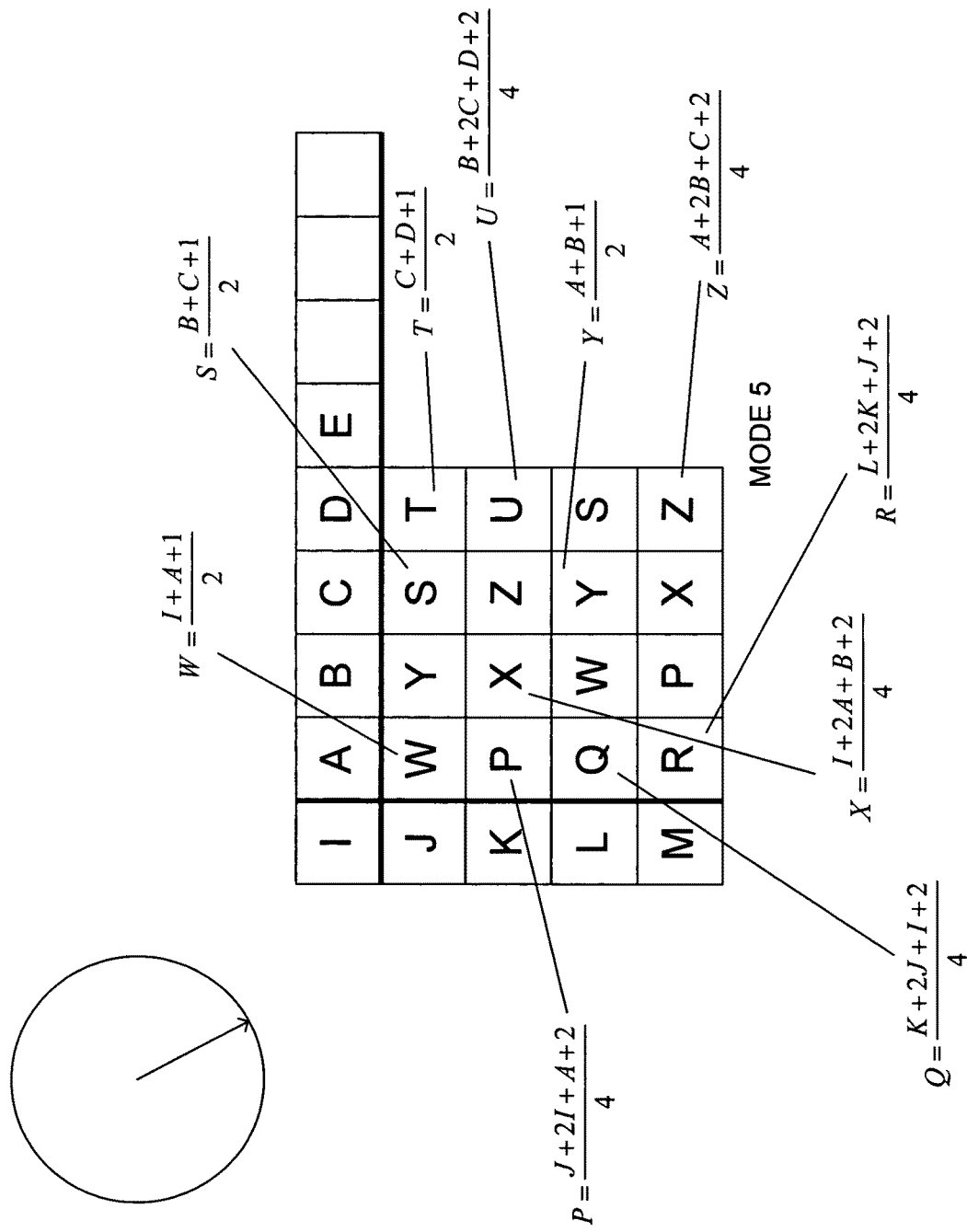
Figure 10G:
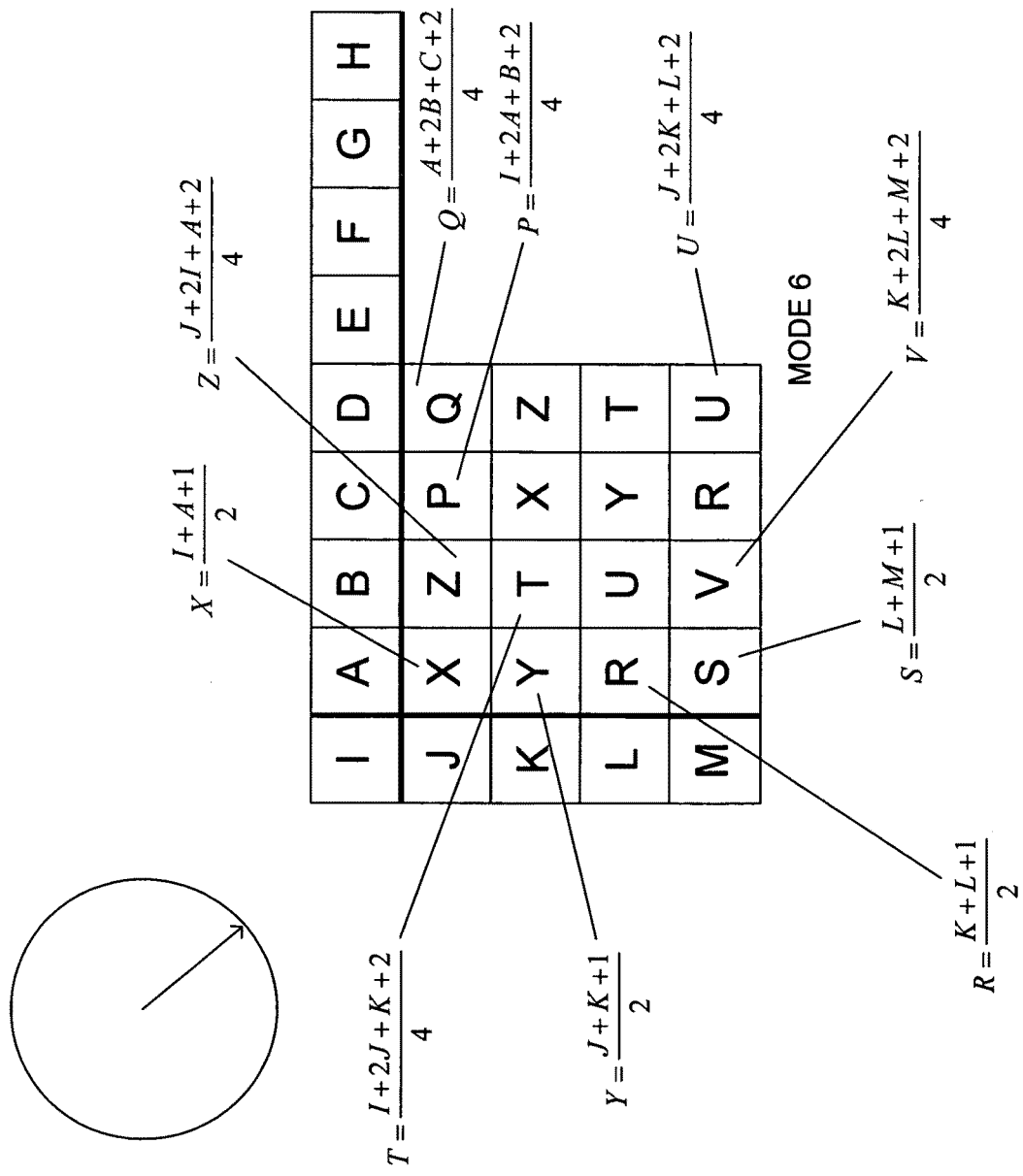
Figure 10H:
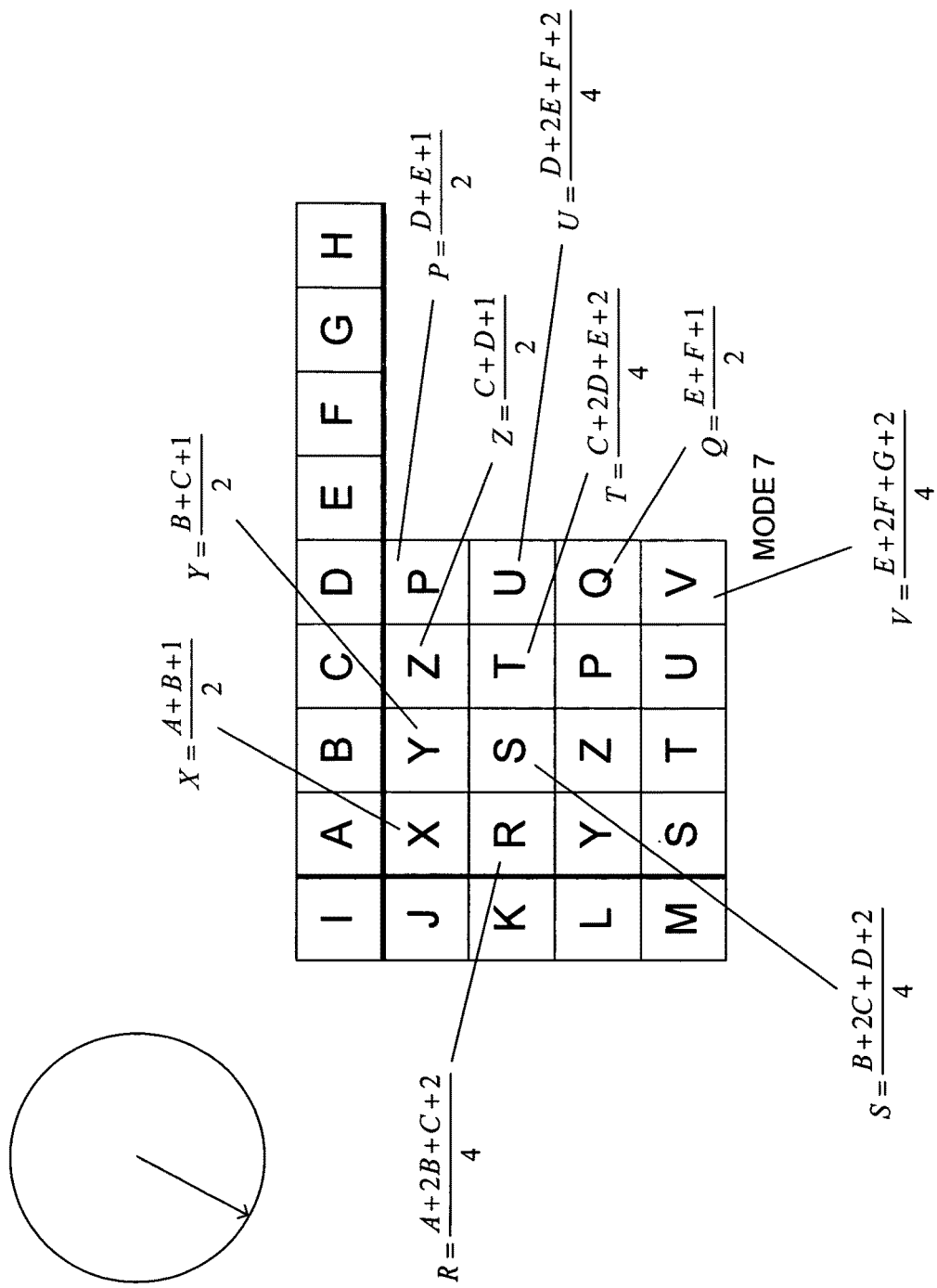
Figure 10I:
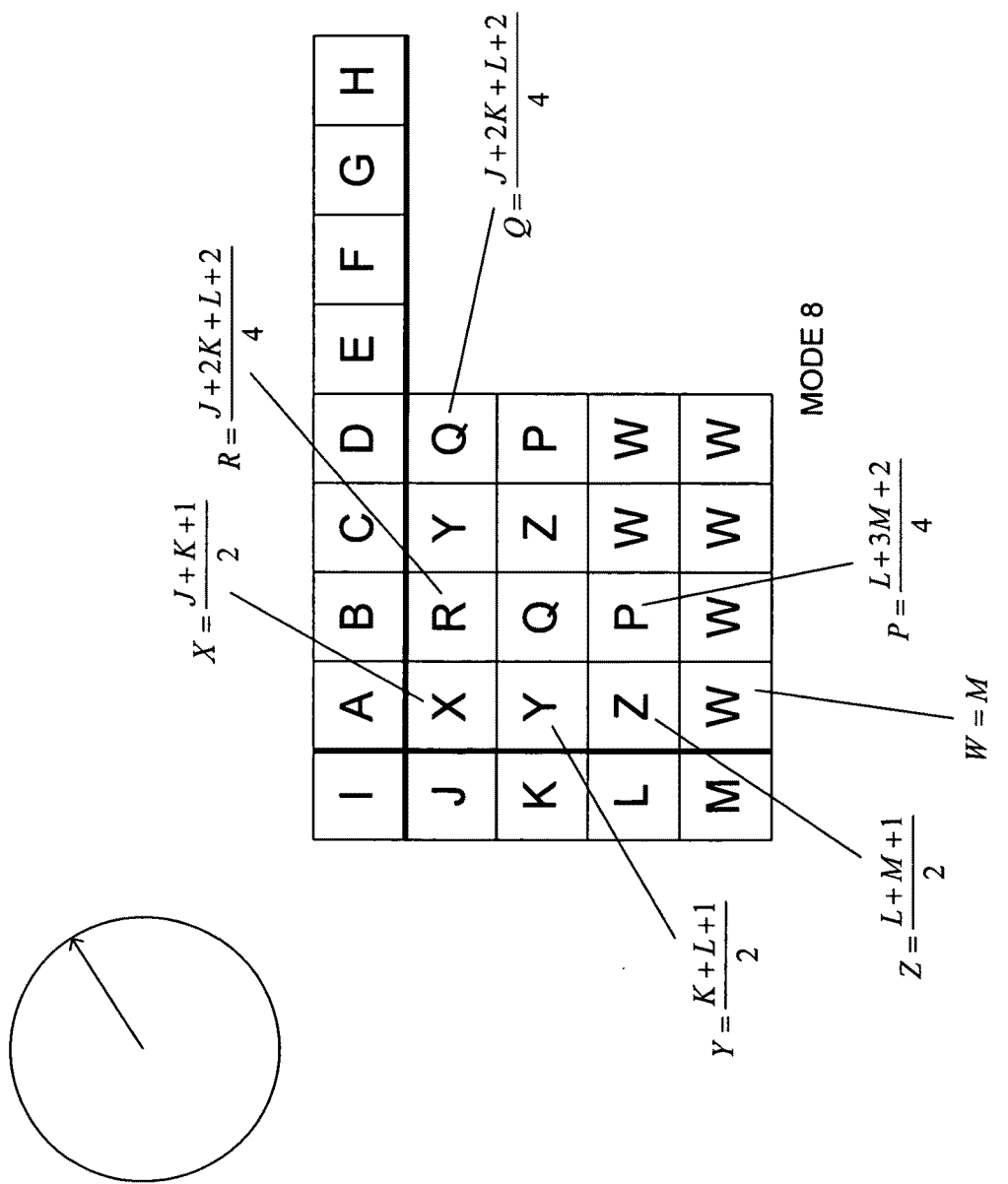
Figure 11A:
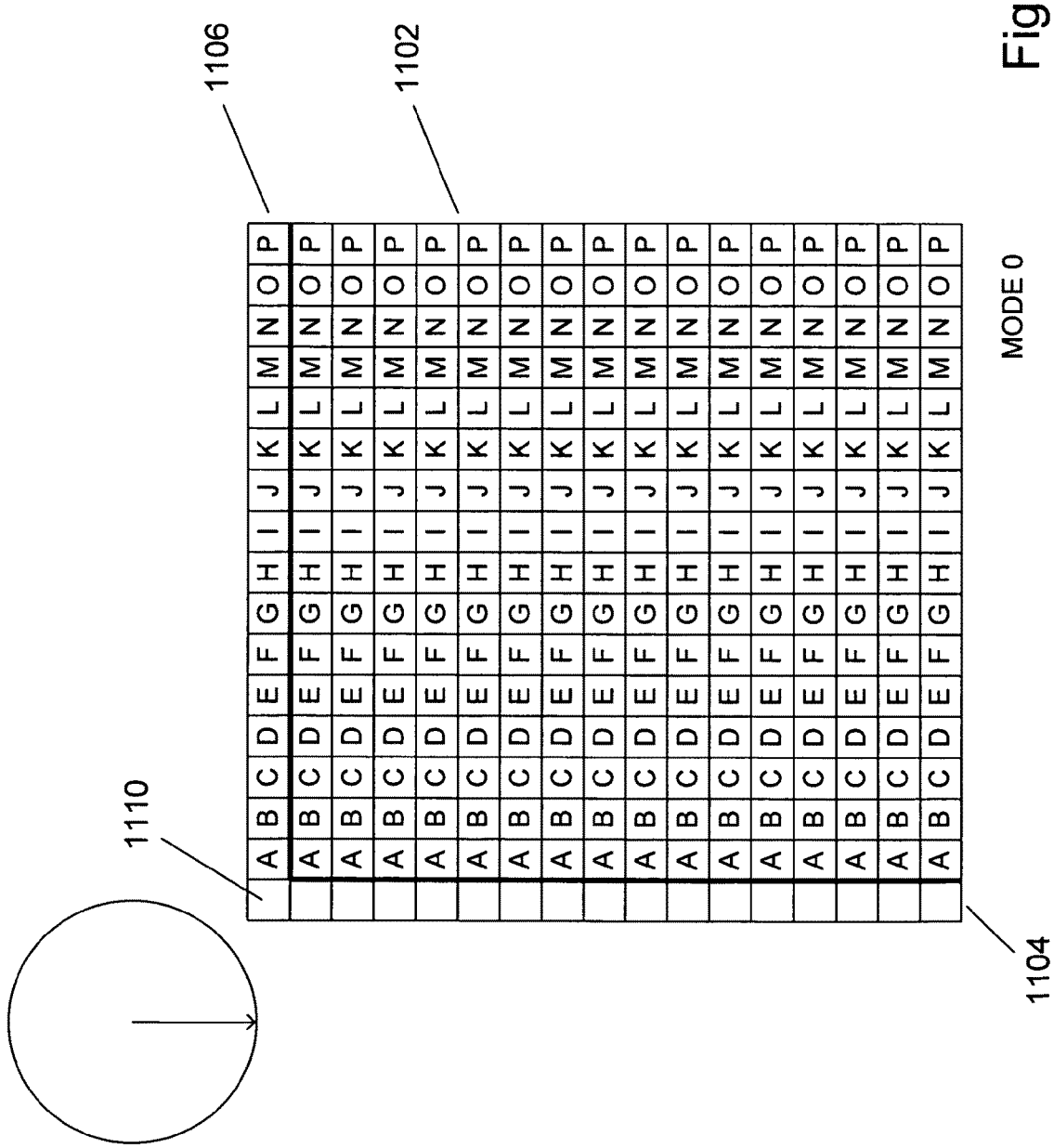
Figure 11B:
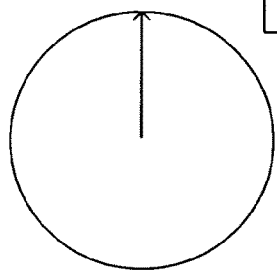
Figure 11D:
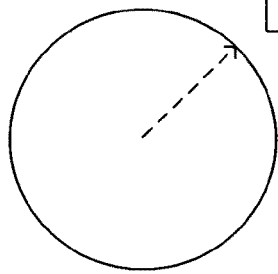

FIG. 9 illustrates the general concept of intra prediction. Consider a macroblock C 902 encountered during macroblock-by-macroblock compression of a video frame. As discussed above, a 16×16 luma macroblock 904 can be encoded using 256 bytes. However, were it possible to compute the contents of the macroblock from adjacent macroblocks in the image, then a rather large amount of compression is theoretically possible. For example, consider four adjacent macroblocks to the currently considered macroblock C 902. These four macroblocks include a left macroblock 904, an upper left diagonal macroblock 906, an upper macroblock 908, and an upper right diagonal macroblock 910. Were it possible to compute the pixel values in C as a function of one or more of these adjacent macroblocks, using one of some number of different prediction functions $f_c$ 912, then the contents of the macroblock could be encoded simply as a numeric designator or specifier for the prediction function. Were the number of prediction functions less than or equal to 256, for example, then the designator or specifier for the selected prediction function could be encoded in a single byte of information. Thus, were it possible to exactly compute the contents of a macroblock from its neighbors using a selected one of 256 possible prediction functions, the rather spectacular compression ratio of 256:1 could be achieved. Unfortunately, compression ratios of this magnitude are not generally achieved by the spatial-prediction methods employed for H.264 compression, because there are far too many possible macroblocks to allow for accurate prediction by only 256 prediction functions. For example, when each pixel is encoded by 12 bits, there are $2^{12}=4096$ different possible pixel values and $4096^{256}$ different possible macroblocks. However, intra prediction can significantly contribute to the overall compression ratio for H.264 video compression, particularly for relatively static video signals with large image regions that do not quickly change and that are relatively homogeneous in intensity and color.

H.264 intra prediction can be carried out according to nine different modes for 4×4 luma macroblocks or according to four different modes for 16×16 luma macroblocks. FIGS. 10A-I illustrate the nine 4×4 luma-block intra-prediction modes. Illustration conventions used in all of these figures are similar, and are described with reference to FIG. 10A. The 4×4 luma macroblock that is being predicted is represented, in the figures, by the 4×4 matrix 1002 to the lower right of the diagram. Thus, the uppermost left-hand pixel value 1004 in the 4×4 matrix being predicted, in FIG. 10A, contains the value "A." The cells adjacent to the 4×4 luma block represent pixel values in neighboring 4×4 luma blocks within the image. For example, in FIG. 10A, the values "A" 1006, "B" 1007, "C" 1008, and "D" 1009 are data values contained in the 4×4 luma block directly above the 4×4 luma block being predicted 1002. Similarly, the cells 1010-1013 represent pixel values within a last vertical column of the 4×4 luma block to the left of the 4×4 luma block being predicted. In the case of mode-0 prediction, illustrated in FIG. 10A, the values in the last row of the upper, adjacent 4×4 luma block are copied vertically downward into the columns of the currently considered 4×4 luma block 1002. Thus, in FIG. 10A, mode-0 prediction constitutes a downward, vertical prediction represented by the downward directional arrow 1020 shown in FIG. 10A. The remaining eight intra prediction modes for predicting 4×4 luma blocks are shown in FIGS. 10B-10I, using the same illustration conventions as used in FIG. 10A, and are therefore completely self-contained and self-explanatory. Each mode, with the exception of mode 2, can be thought of as a spatial vector, indicating a direction in which pixel values in neighboring 4×4 blocks are translated into the block being predicted.

FIGS. 11A-11D illustrate, using similar illustration conventions as used in FIGS. 10A-I, the four modes for intra prediction of 16×16 luma blocks. In FIGS. 11A-D, the block being predicted is the 16×16 block in the lower right-hand portion of the matrix 1102, the leftmost vertical column 1104 is the rightmost vertical column of the left adjoining 16×16 luma block and the top horizontal row 1106 is the bottom row of the upper adjoining 16×16 luma block. The upper leftmost cell 1110 is the lower right-hand-corner cell of an upper, left diagonal 16×16 luma block. The 16×16 prediction modes are similar to a subset of the 4×4 intra prediction modes, with the exception of mode 4, shown in FIG. 11D, which is a relatively complex plane prediction mode that computes predicted values for each pixel from all of the pixels in the lower row of the upper, adjacent 16×16 luma block and the rightmost vertical column of the left adjacent 16×16 luma block. In general, the mode which produces a closest approximation to a current block that is being intra predicted is chosen as the intra-prediction mode to apply to the currently considered block. Predicted pixel values can be compared to actual; pixel values using any of various comparison metrics, including mean pixel-value differences between the predicted and considered block, the mean of squared errors in pixel values, sun of squared errors, and other such metrics.

Figure 12:
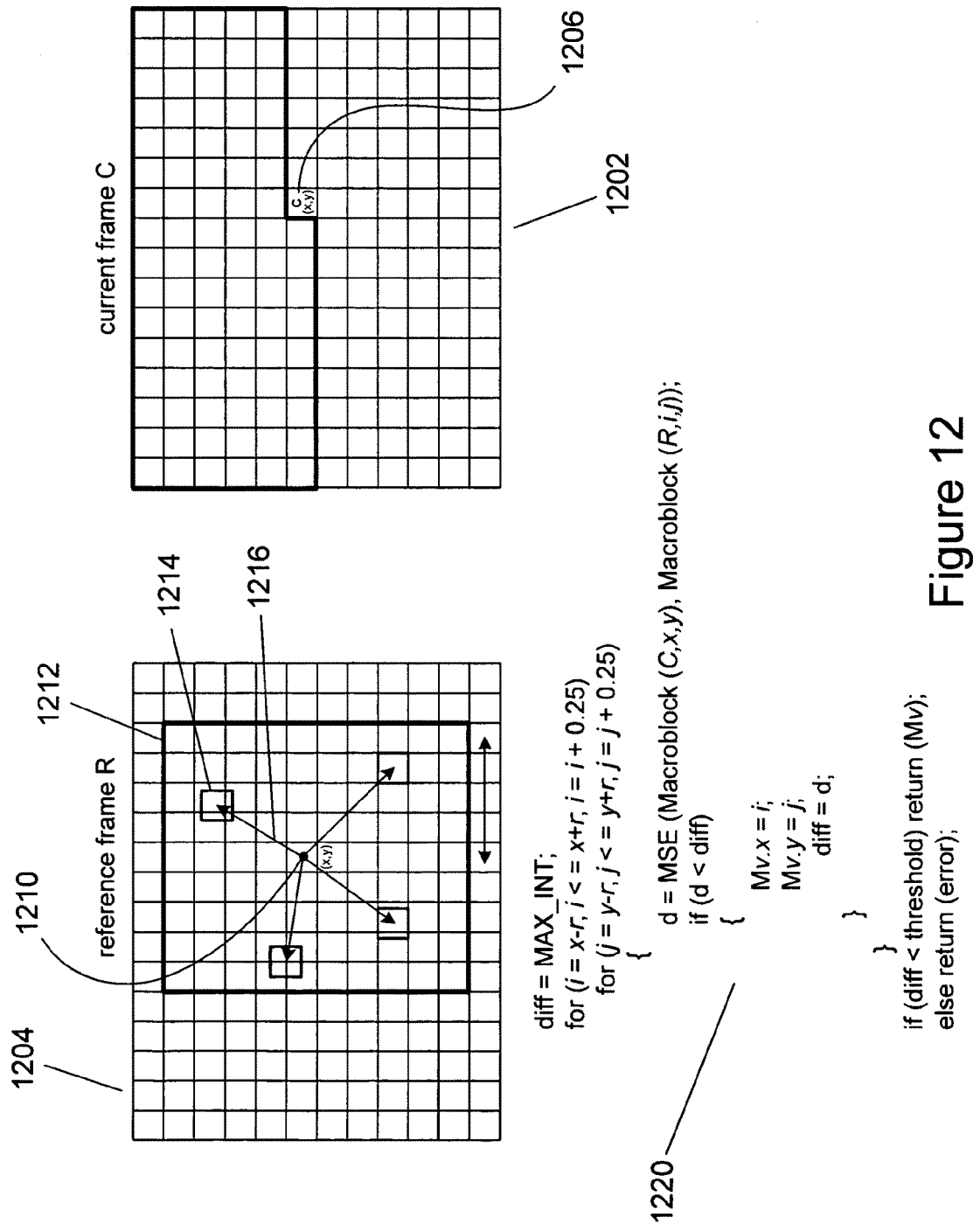
FIG. 12 illustrates the concept of inter prediction.

FIG. 12 illustrates the concept of inter prediction. Inter prediction, as discussed above, is temporal prediction, and can be thought of as motion-based prediction. For illustration purposes, consider a current frame 1202 and a reference frame that occurs, in the video signal, either before or after the current frame 1204. At a current point in video compression, a current macroblock 1206 needs to be predicted from the contents of the reference frame. An example of the process is illustrated in FIG. 12. In the reference frame, a reference point 1210 is chosen as the coordinates of the currently considered block 1206, with respect to the current frame, applied to the reference frame. In other words, the process begins at the equivalent position, in the reference frame, of the currently-considered block in the current frame. Then, within a bounded search space, indicated in FIG. 12 by a heavy-lined 1212 square, each block within the search area is compared to the currently considered block in the current frame in order to identify a block in the search area 1212 of the reference frame 1204 most similar to the currently considered block. If the difference between the contents of the closest block, in pixel values, within the search area to the currently considered block is below a threshold value, then the closest block selected from the search area predicts the contents of the currently considered block. The selected block from the search area may be an actual block, or may be an estimated block at fractional coordinates with respect to the rectilinear pixel grid, with pixel values in the estimated block interpolated from actual pixel values in the reference frame. Thus, using inter prediction, rather than encoding the currently considered macroblock 1206 as 256 pixel values, the currently considered macroblock 1206 can be encoded as an identifier of the reference frame and a numerical representation of the vector that points from the reference point 1210 to a macroblock selected from the search area 1212. For example, if the selected interpolated block 1214 is found to most closely match the currently considered block 1206, then the currently considered block can be encoded as an identifier for the reference frame 1204, such as an offset, in frames, within the video signal from the current frame, and a numerical representation of the vector 1216 that represents the spatial displacement of the selected block 1214 from the reference point 1210.

Various different metrics can be used to compare the contents of actual or interpolated blocks within the search area of the reference frame 1212 to the contents of the currently considered block 1206, including a mean absolute pixel-value difference or a mean squared difference between pixel values. C++-like pseudocode 1220 is provided in FIG. 12 as an alternative description of the inter-prediction process described above. An encoded displacement vector is referred to as a motion vector. The spatial displacement of the selected block from the reference point in the reference frame corresponds to a temporal displacement of the currently considered macroblock in the video stream, which often corresponds to actual motion of objects in a video image.

Figure 13A:
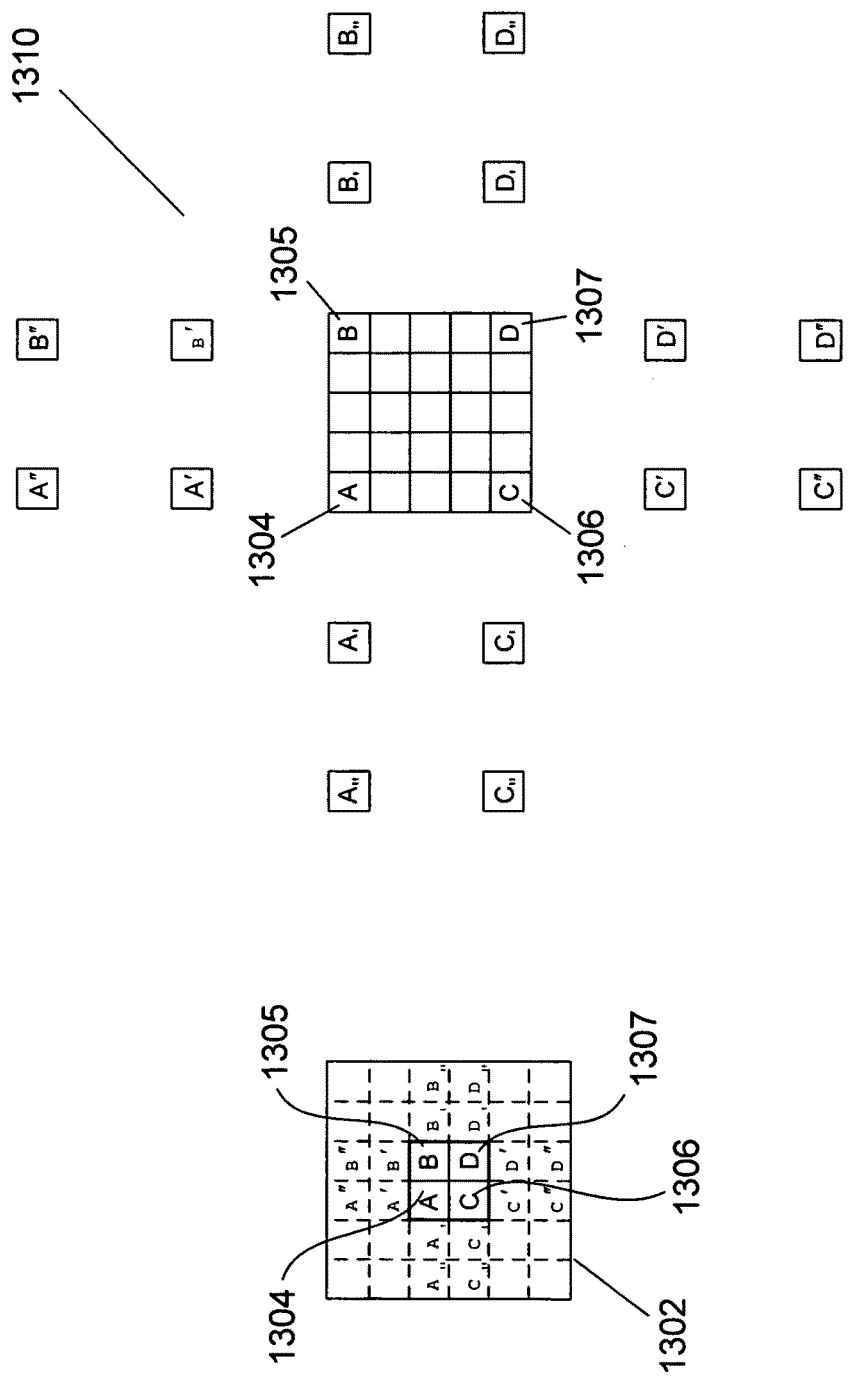
FIGS. 13A-D illustrate the interpolation process used to compute pixel values for blocks, within a search space of a reference frame, that can be thought of as occurring at fractional coordinates.
Figure 13B:
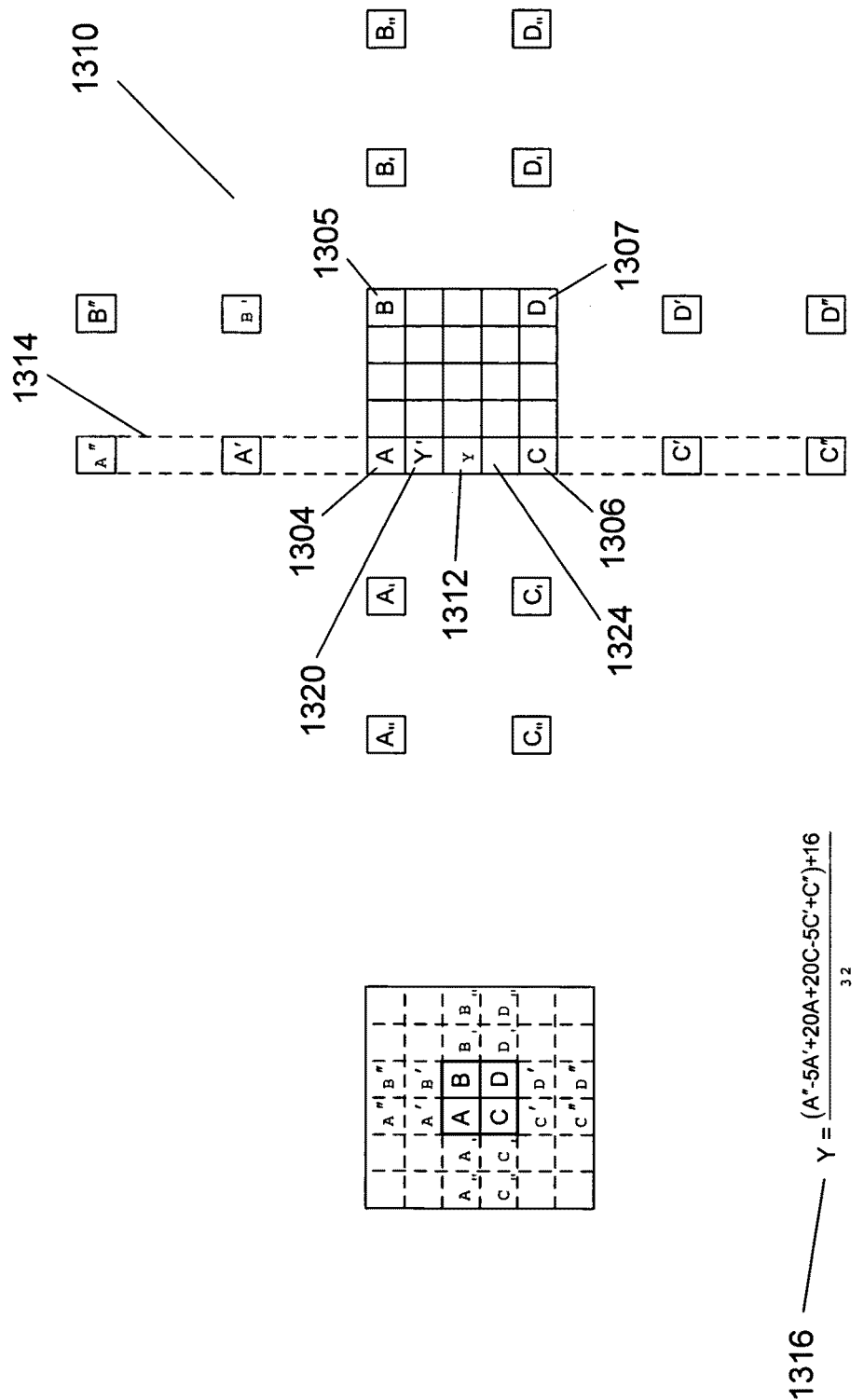
Figure 13C:
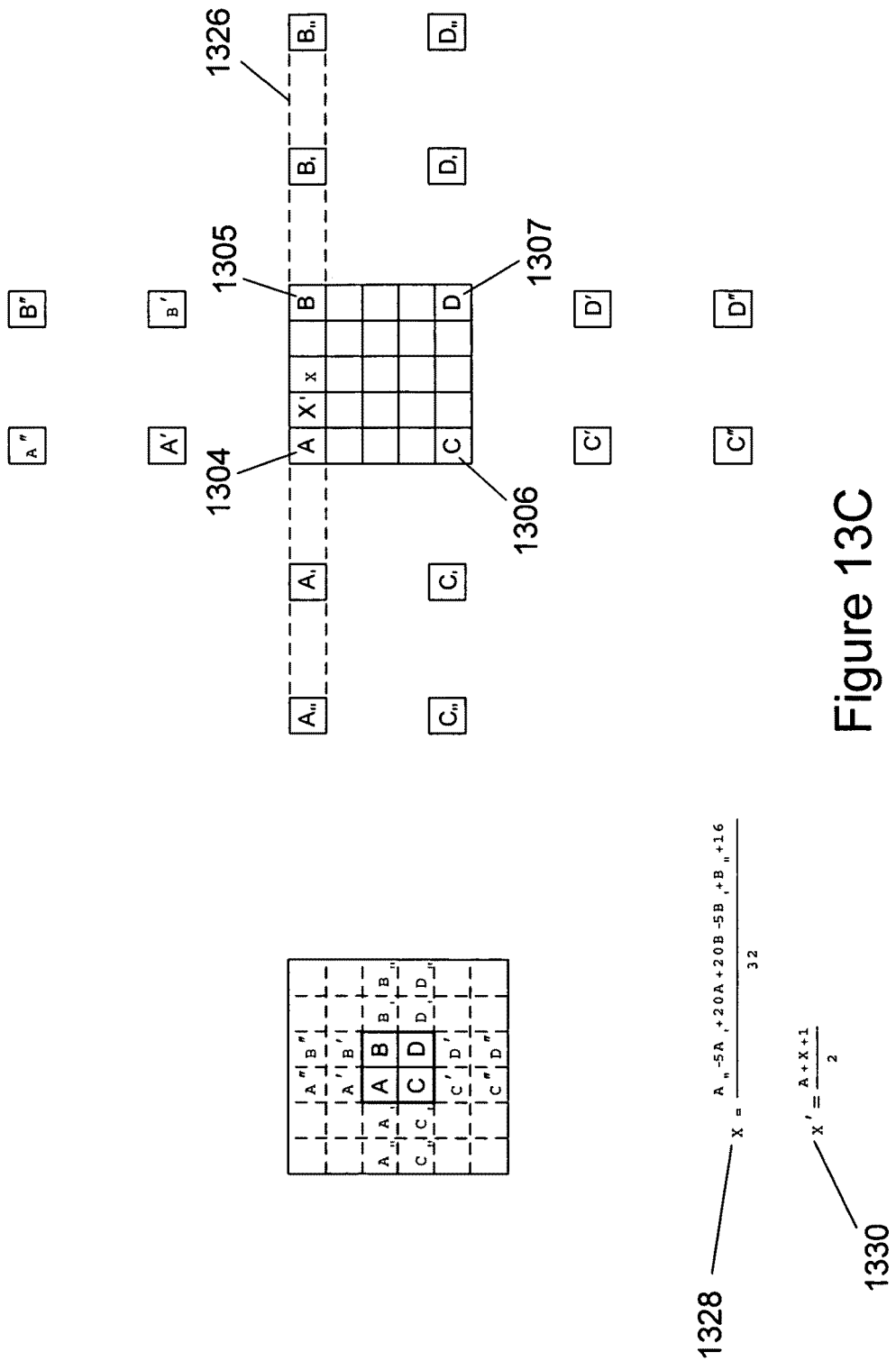
Figure 13D:
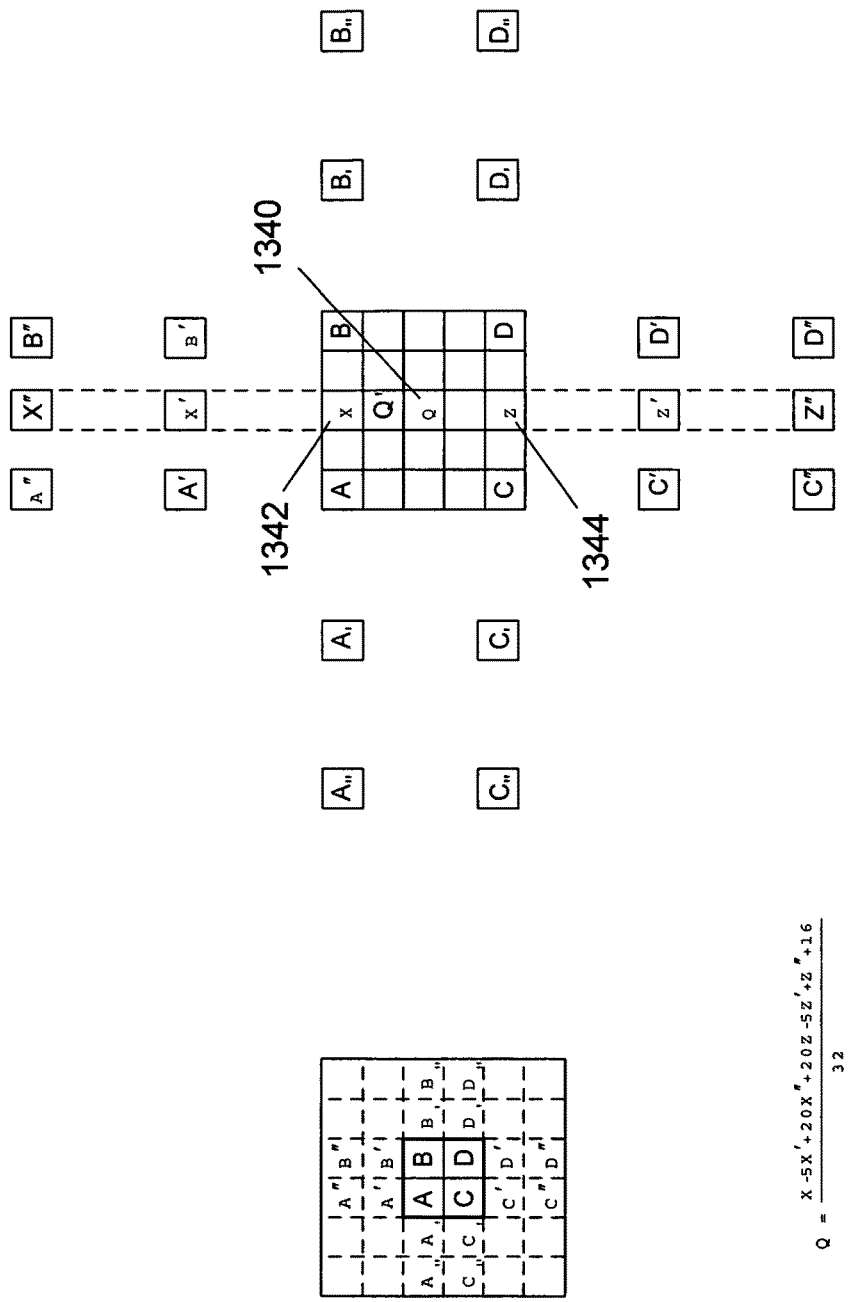

FIGS. 13A-D illustrate an interpolation process used to compute pixel values for blocks, within a search area of a reference frame, that can be thought of as occurring at fractional coordinates. The H.264 standard allows for a resolution of 0.25 with respect to integer pixel coordinates. Consider the 6×6 block of pixels 1302 to the left of FIG. 13A. The interpolation process can be considered as a translational expansion of the actual pixels in two dimensions and computation of interpolated values to insert between the expanded pixels. FIGS. 13A-D illustrate computation of the higher-resolution, inserted values between the central four pixels 1304-1307 in the 6×6 block of actual pixel values. The expansion is illustrated to the right of FIG. 13A 1310. In this example, pixel values 1304-1307 have been spatially expanded, in two dimensions, and 21 new cells have been added to form a 4×4 matrix with the original pixel values 1304-1307 at the corners. The remaining pixels of the 6×6 matrix of pixels 1302 have also been translationally expanded. FIG. 13B illustrates the interpolation process to produce interpolated value 1312, midway between actual pixel values 1304 and 1306. A vertical filter is applied along the column of pixel values that include original pixel values 1304 and 1306, shown in FIG. 13B by dashed lines 1314. Interpolated value Y 1312 is computed according to formula 1316. In this example, the value Y' 1320 is interpolated by linear interpolation of the two vertical adjacent values, according to formula 1322. The interpolation value 1324 can be similarly computed by linear interpolation between values 1312 and 1306. The vertical filter 1314 can be similarly applied to compute the interpolated values in the column containing original values 1305 and 1307. FIG. 13C illustrates computation of the interpolated values in horizontal rows between original values 1304 and 1305. In this example, a horizontal filter 1326 is applied to actual pixel values, similar to application of the vertical filter in FIG. 13B. The mid-point interpolation value is computed by formula 1328, and the quarter-point values on either side of the mid-point value can be obtained by linear interpolation according to formula 1330 and a similar formula for the right-hand interpolated value between the mid-point and original value 1305. The same horizontal filter can be applied to the final row containing original values 1306 and 1307. FIG. 13D illustrates computation of the central interpolated point 1340 and adjacent quarter-points between the interpolated mid-point values 1342 and 1344. All remaining values can be obtained by linear interpolation.

Figure 14A:
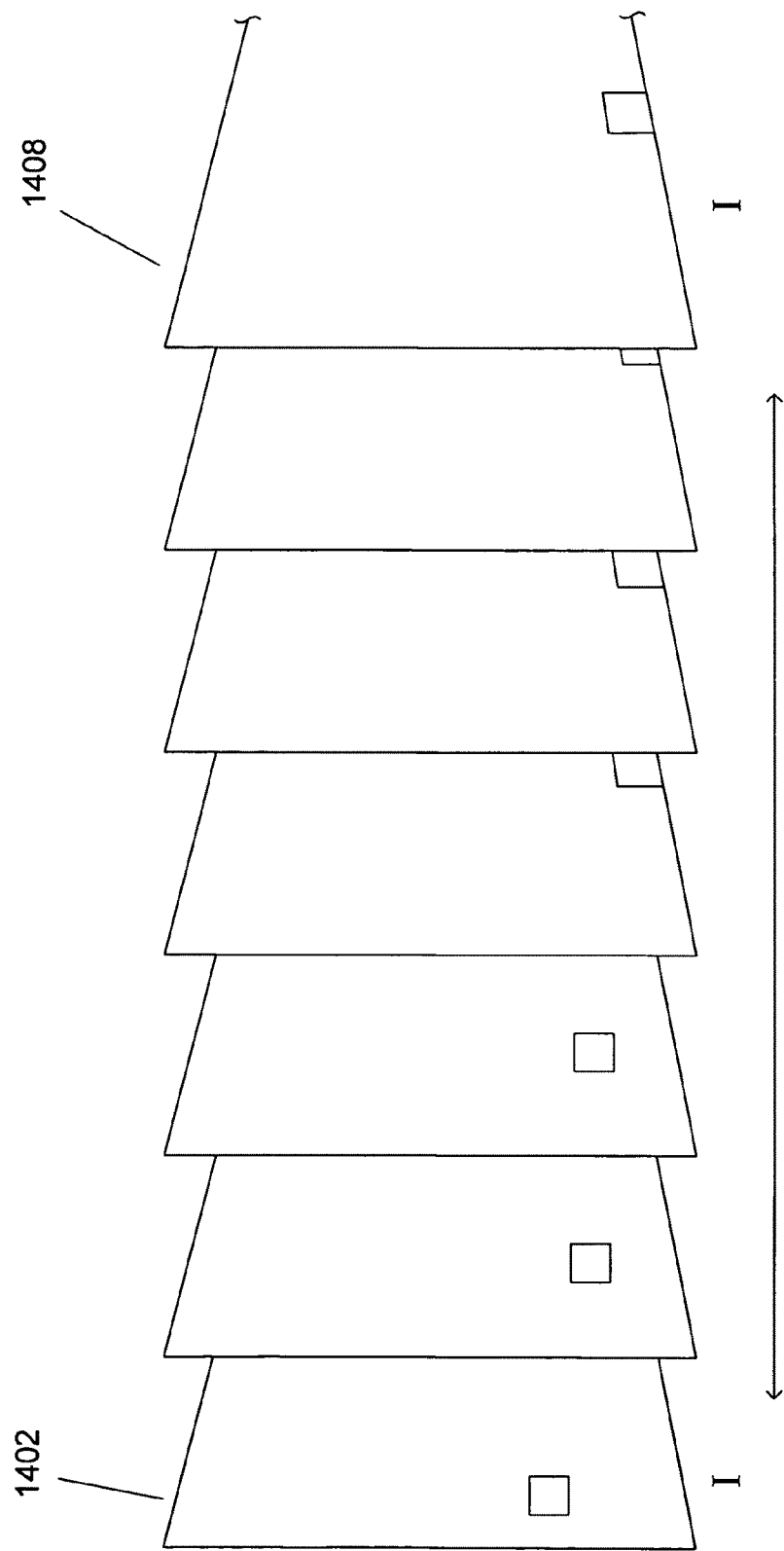
FIGS. 14A-C illustrate the different types of frames and some different types of inter prediction possible with respect to those frames.
Figure 14B:
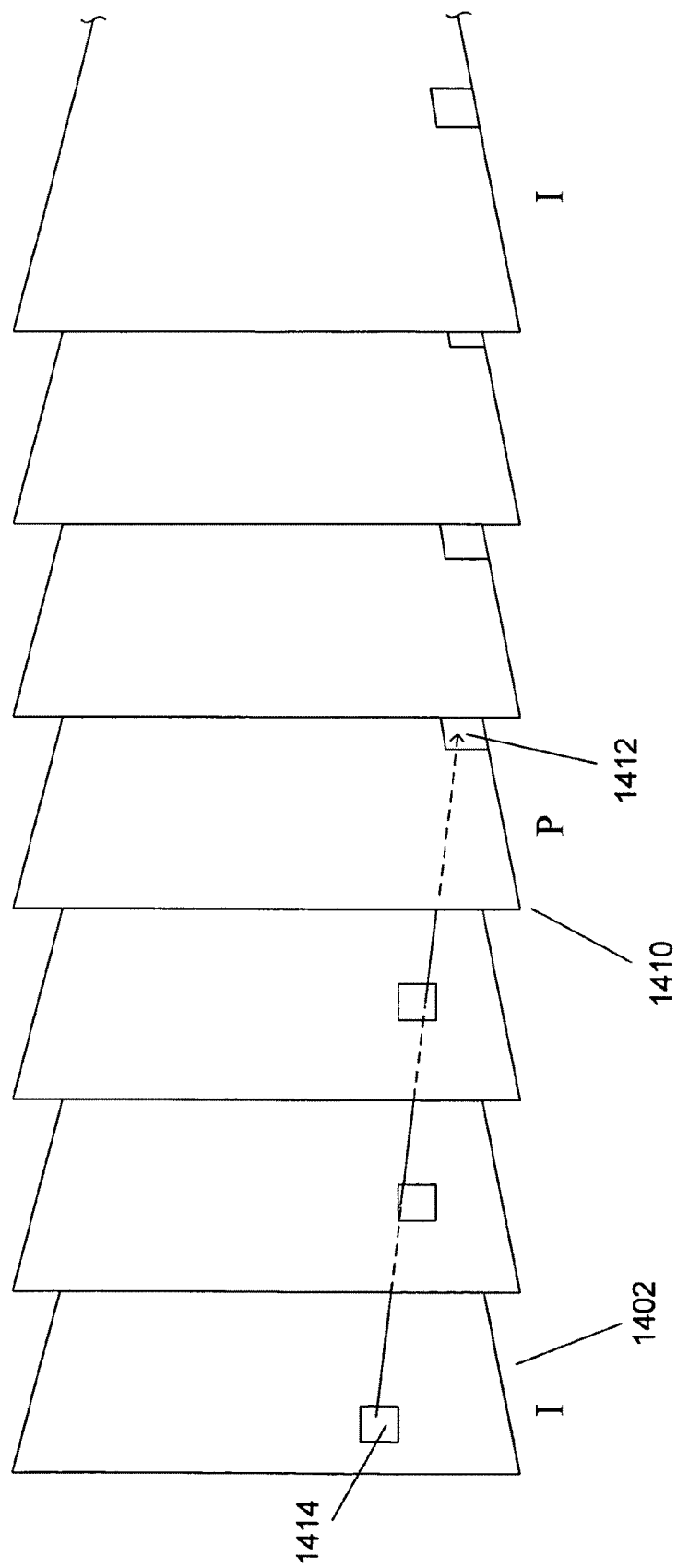
Figure 14C:
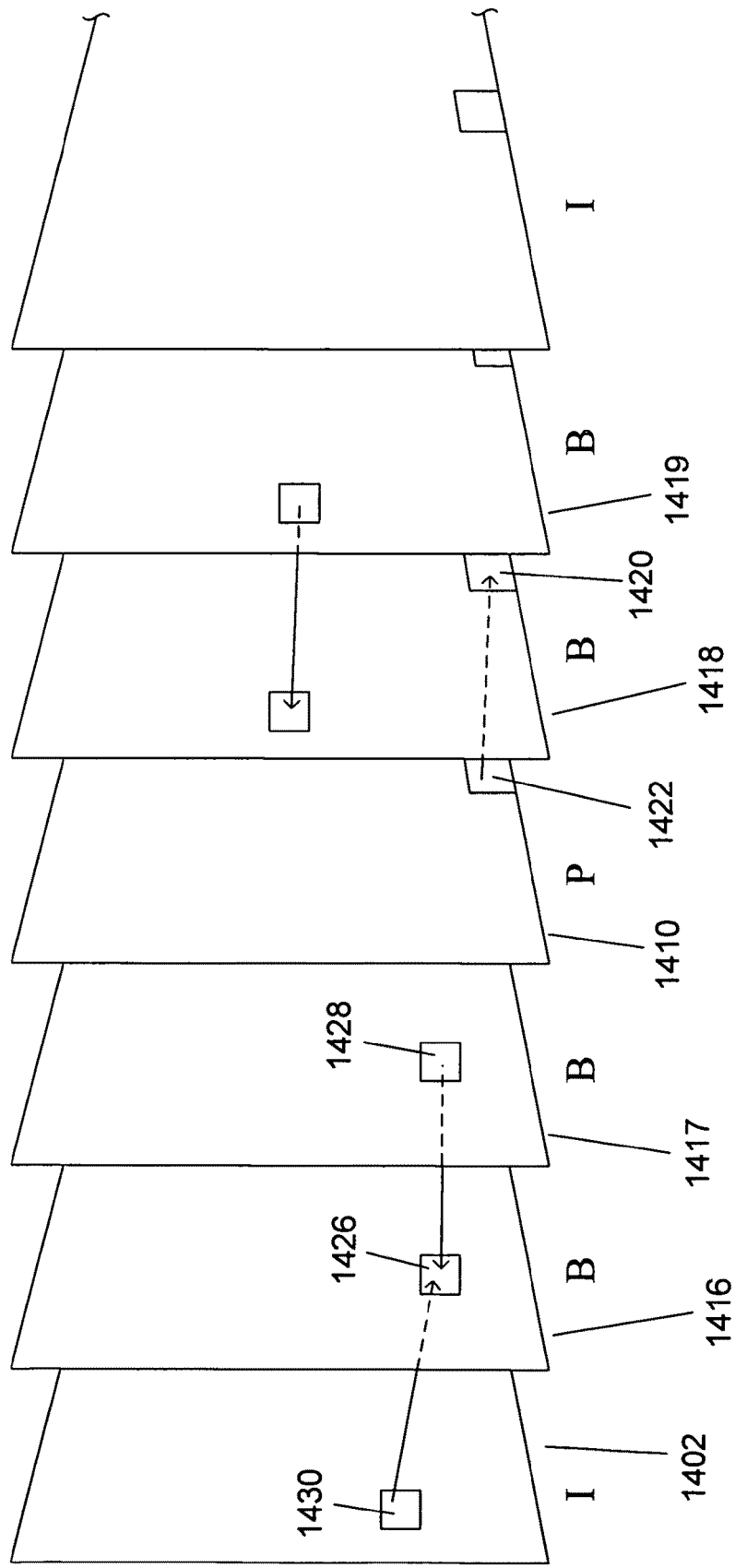

FIGS. 14A-C illustrate examples of different types of frames and the different types of inter prediction possible with respect to these different types of frames. As shown in FIG. 14A, a video signal comprises a linear sequence of video frames. In FIG. 14A, the sequence begins with frame 1402 and ends with frame 1408. A first type of frame in a video signal is referred to as an "I" frame. The pixel values of macroblocks of an I frame cannot be predicted by inter prediction. An I frame is a type of reference point within a decompressed video signal. The contents of an encoded I frame depend only on the contents of the raw-signal I frame. Thus, when systematic errors occur in decompression involving problems associated with inter prediction, the video-signal decompression can be recovered by jumping ahead to a next I reference frame and resuming decoding from that frame. Such errors do not propagate past the I-frame barriers. In FIG. 14A, the first and last frames 1402 and 1404 are I frames.

A next type of frame is illustrated in FIG. 14B. A P frame 1410 may contain blocks that have been inter predicted from an I frame. In FIG. 14B, the block 1412 has been encoded as a motion vector and an identifier for reference frame 1402. The motion vector represents temporal movement of block 1414 in reference frame 1402 to the position of block 1412 in P frame 1410. P frames represent a type of prediction-constrained frame containing blocks that may have been predicted by inter prediction from reference frames. P frames represent another type of barrier frame within an encoded video signal. FIG. 14C illustrates a third type of frame. A B frame 1416-1419 may contain blocks predicted, by inter prediction, from one or two other B frames, P frames, or I frames. In FIG. 14C, B frame 1418 contains a block 1420 that is inter predicted from block 1422 in P frame 1410. B frame 1416 contains a block 1426 that is predicted both from block 1428 in B frame 1417 and block 1430 in reference frame 1402. B frames can make best use of inter prediction, and thus achieve highest compression due to inter prediction, but also have a higher probability of various errors and anomalies that may arise in the decoding process. When a block, such as block 1426, is predicted from two other blocks, the block is encoded as two different reference-frame identifiers and motion vectors, and the predicted block is generated as a possibly weighted average of the pixel values in the two blocks from which it is predicted.

As mentioned above, were intra prediction and/or inter prediction completely accurate, extremely high compression ratios could be obtained. It is certainly far more concise to represent a block as one or two motion vectors and frame offsets than as 256 different pixel values. It is even more efficient to represent a block as one of 13 different intra-prediction modes. However, as can be appreciated by the vast number of different possible macroblock values, considering a macroblock value to be a 256-byte-encoded numerical value, neither intra nor inter prediction can possibly produce an exact prediction of the contents of blocks within a video frame, unless the video signal in which the video frame is contained contains no noise and almost no information, such as a video of a uniform, unchanging, solid-color background. However, even though intra and inter prediction cannot exactly predict the contents of macroblocks, in general, they can often relatively closely approximate the contents of macroblocks. This approximation can be used to generate difference macroblocks that represent the difference between an actual macroblock and the predicted values for the macroblock obtained by either intra or inter prediction. When the prediction is good, the resulting difference block generally contains only small or even zero pixel values.

Figure 15:
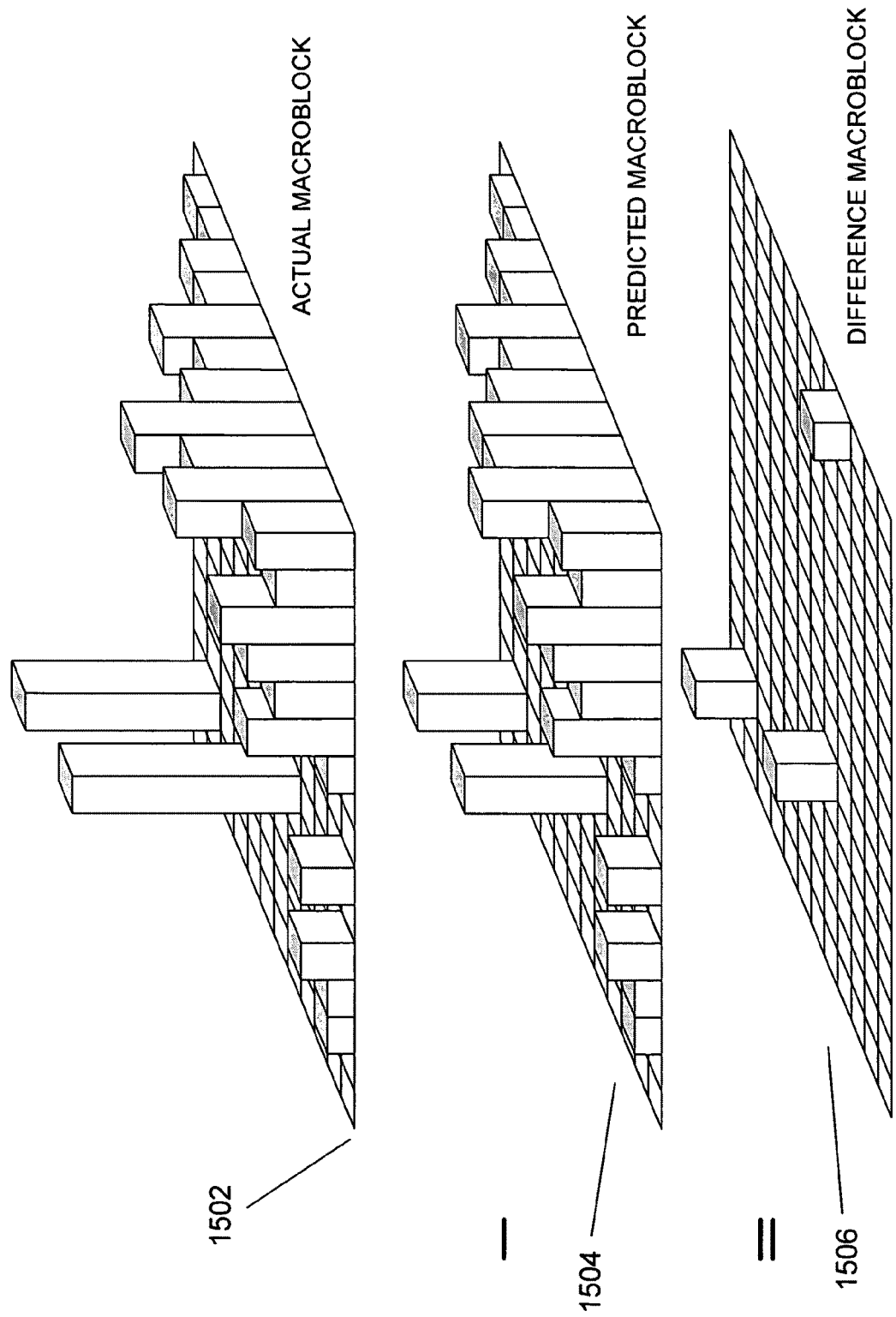
FIG. 15 illustrates generation of difference macroblocks.

FIG. 15 illustrates examples of generation of difference macroblocks. In the FIG. 15 example, macroblocks are shown as three-dimensional graphs, in which the height of columns above a two-dimensional surface of the macroblock represent the magnitudes of pixel values within the macroblock. In FIG. 15, the actual macroblock within a currently considered frame is shown as the top three-dimensional graph 1502. The middle three-dimensional graph represents a predicted macroblock obtained by either intra or inter prediction. Note that the three-dimensional graph of the predicted macroblock 1504 is quite similar to the actual macroblock 1502. FIG. 15 represents a case where either intra or inter prediction has generated a very close approximation of the actual macroblock. Subtraction of the predicted macroblock from the actual macroblock generates a difference macroblock, shown as the lower three-dimensional graph 1506 in FIG. 15. While FIG. 15 is an exaggeration of a best case prediction, it does illustrate that the difference macroblock not only generally contains smaller-magnitude values, but often fewer non-zero values, than the actual end-predicted macroblocks. Also note that the actual macroblock can be fully restored by adding the difference macroblock to the predicted macroblock. Of course, predicted pixel values may exceed or fall below actual pixel values, so that the difference macroblock may contain both positive and negative values. However, by way of example, shifting of the origin can be used to produce an all-positive-valued difference macroblock.

Figure 16:
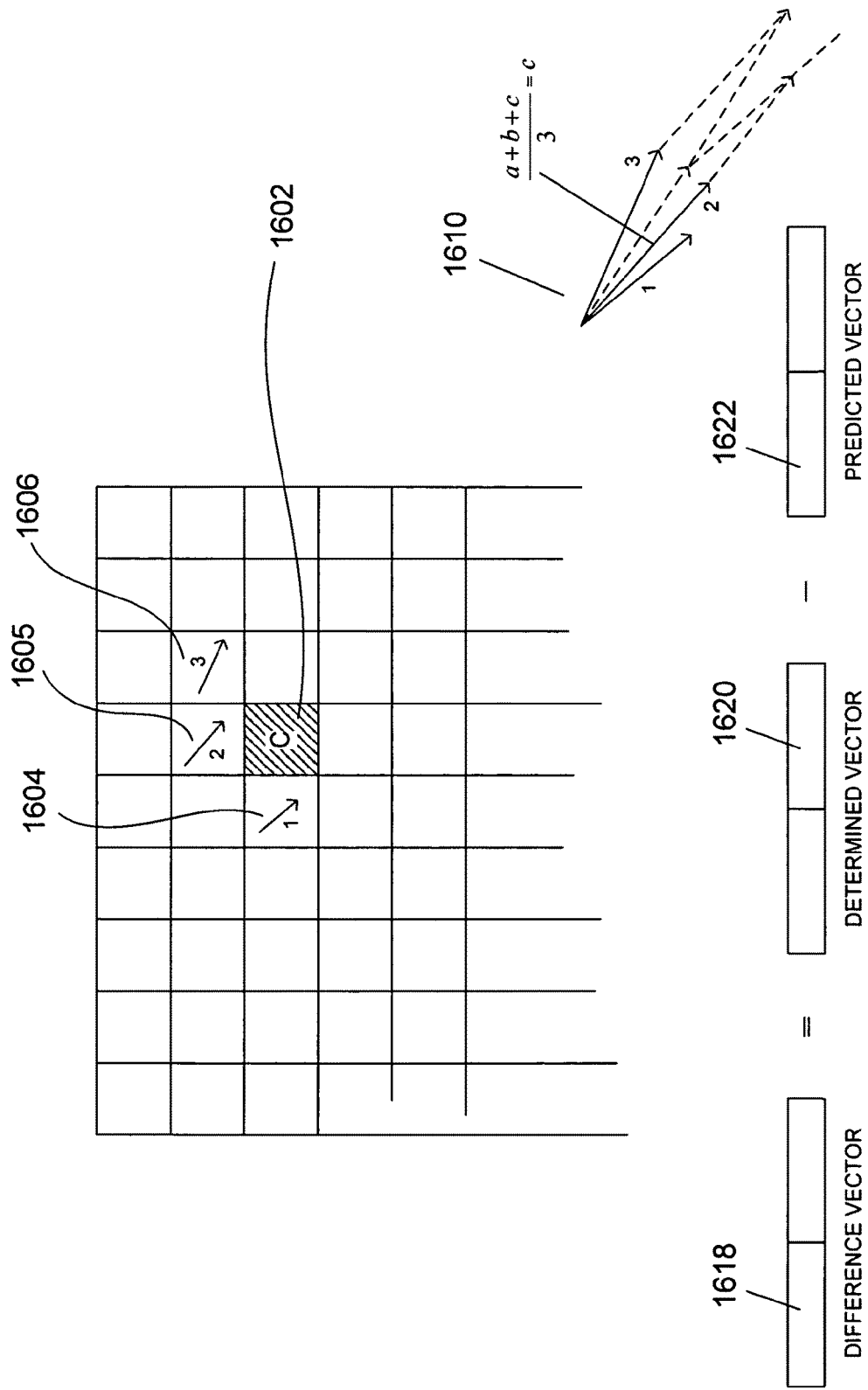
FIG. 16 illustrates motion-vector and intra-prediction-mode prediction.

Just as the pixel values within a macroblock can be predicted from the values in blocks spatially adjacent and/or temporally adjacent to the macroblock, the motion vectors generated by inter prediction and the modes generated by intra prediction, can also be predicted. FIG. 16 illustrates an example of motion-vector and intra-prediction-mode prediction. In FIG. 16, a currently considered block 1602 is shown within a grid of blocks of a portion of a frame. Adjacent blocks 1604-1606 have already been compressed by intra or inter prediction. Therefore, there is either an intra-prediction mode, which is a type of displacement vector, or a inter-prediction motion vector associated with these neighboring, already compressed blocks. It is therefore reasonable to assume that the spatial vector or temporal vector, depending on whether intra or inter prediction is used, associated with the currently considered block 1602 would be similar to the spatial or temporal vectors associated with the neighboring, already compressed blocks 1604-1606. In fact, the spatial or temporal vector associated with currently considered block 1602 may be predicted as the average of the spatial or temporal vectors of the neighboring blocks, as shown by the vector addition 1610 to the right of FIG. 16. Therefore, rather than coding motion vectors or inter-prediction modes directly, the H.264 standard computes a difference vector, based on vector prediction, as the predicted vector 1622 subtracted from the actual computed vector 1622. The temporal motion of blocks between frames and spatial homogeneities within a frame would be expected to be generally correlated, and, therefore, predicted vectors would be expected to closely approximate actual, computed vectors. The difference vector is therefore generally of smaller magnitude than the actual, computed vector, and therefore can be encoded using fewer bits. Again, as with a difference macroblock, the actual, computed vector can be accurately reconstituted by adding the difference vector to the predicted vector.

Once a difference macroblock is produced, by either inter or intra prediction, the difference macroblock is then decomposed into 4x4 difference blocks, according to a predetermined order, each of which is transformed by an integer transform to produce a corresponding coefficient block, the coefficients of which are then quantized to produce a final sequence of quantized coefficients. The advantage of intra and inter prediction is that the transform of the difference block generally produces a large number of trailing zero coefficients, which can be quite efficiently compressed by a subsequent entropy-coding step.

Figure 17:
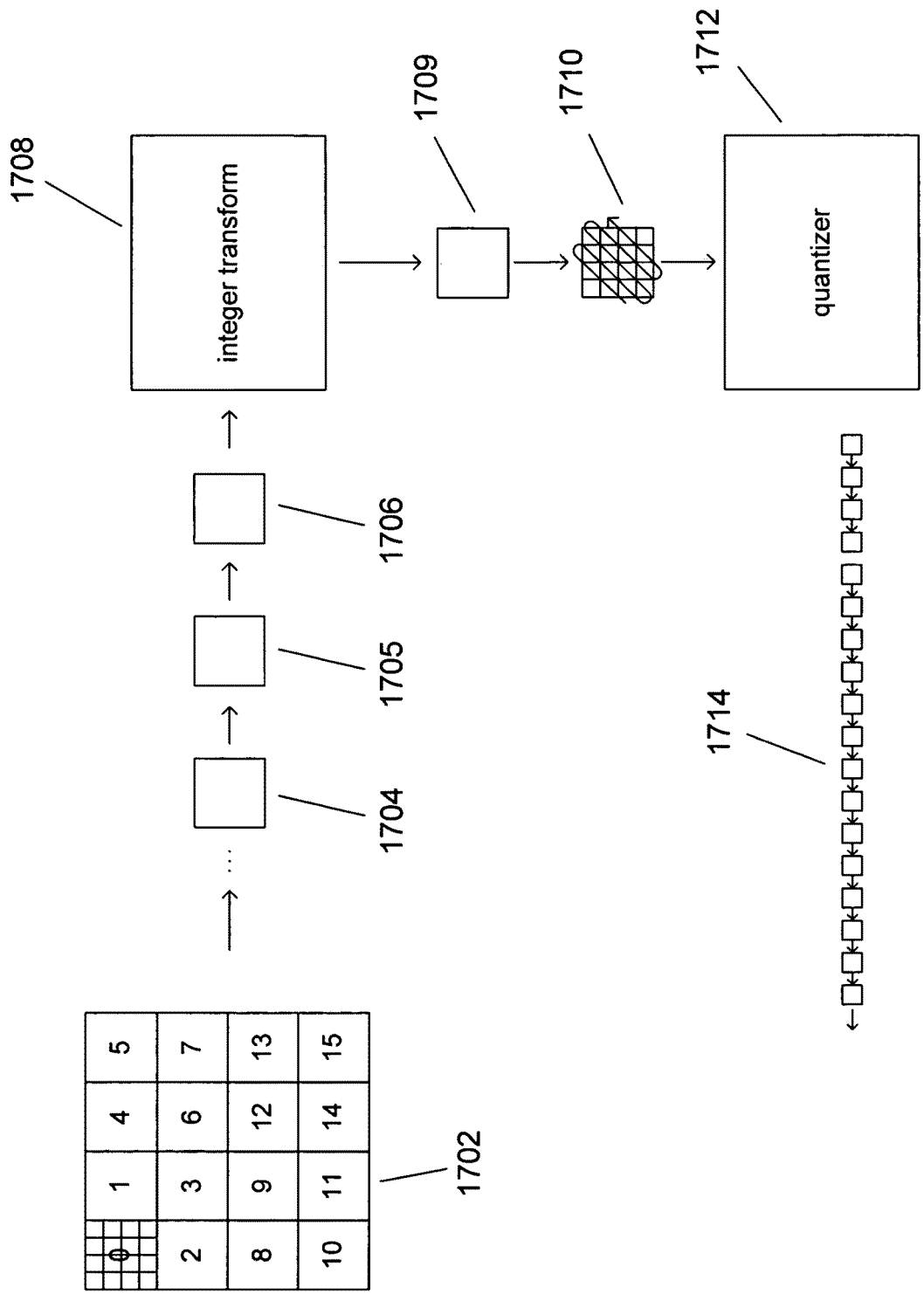
FIG. 17 illustrates decomposition, integer transformation, and quantization of a difference macroblock.

FIG. 17 illustrates one example of decomposition, integer transformation, and quantization of a difference macroblock. In this example, the difference macroblock 1702 is decomposed into 4x4 difference blocks 1704-1706 in the order described by the numerical labels of the cells of the difference macroblock in FIG. 17. An integer transform 1708 computation is performed on each 4×4 difference block to produce a corresponding 4×4 coefficient block 1708. The coefficients in the transformed 4×4 block are serialized according to a zig-zag serialization pattern 1710 to produce a linear sequence of coefficients which are then quantized by a quantization computation 1712 to produce a sequence 1714 of quantized coefficients. Many of the already discussed steps in video-signal compression are lossless. Macroblocks can be losslessly regenerated from intra or inter prediction methods and corresponding difference macroblocks. There is also an exact inverse of the integer transform. However, the quantization step 1712 is a form of lossy compression in that, once quantized, an approximate value of the original coefficient can be regenerated by an approximate inverse of the quantization method, referred to as "resealing.". Chroma-plane decimation is another lossy compression step, in that the higher-resolution chroma data cannot be recovered from lower-resolution chroma data. Quantization and chroma-plane decimation are, in fact, the two lossy compression steps in the H.264 video-compression technique.

FIG. 18 provides derivation of the integer transform and inverse integer transform employed in H.264 video compression and video decompression, respectively. The symbol "X" 1802 represents a 4×4 difference, or residual, block (e.g. 1704-1706 in FIG. 17). A discrete cosign transform, a well-known discrete-Fourier-like transform, is defined by a first set of expressions 1804 in FIG. 18. The discrete cosign transform is, as shown expression 1806, a matrix-multiplication-based operation. The discrete cosign transform can be factored as shown in expression 1808 in FIG. 18. The elements of matrix C 1810 include a rational number "d" 1812. In order to efficiently approximate the discrete cosign transform, this number can be approximated as ½, leading to approximate matrix elements 1814 in FIG. 18. This approximation, with multiplication of two rows of matrix C in order to produce all-integer elements, produces the integer transform 1818 in FIG. 18 and a corresponding inverse integer transform 1820.

Figure 19:
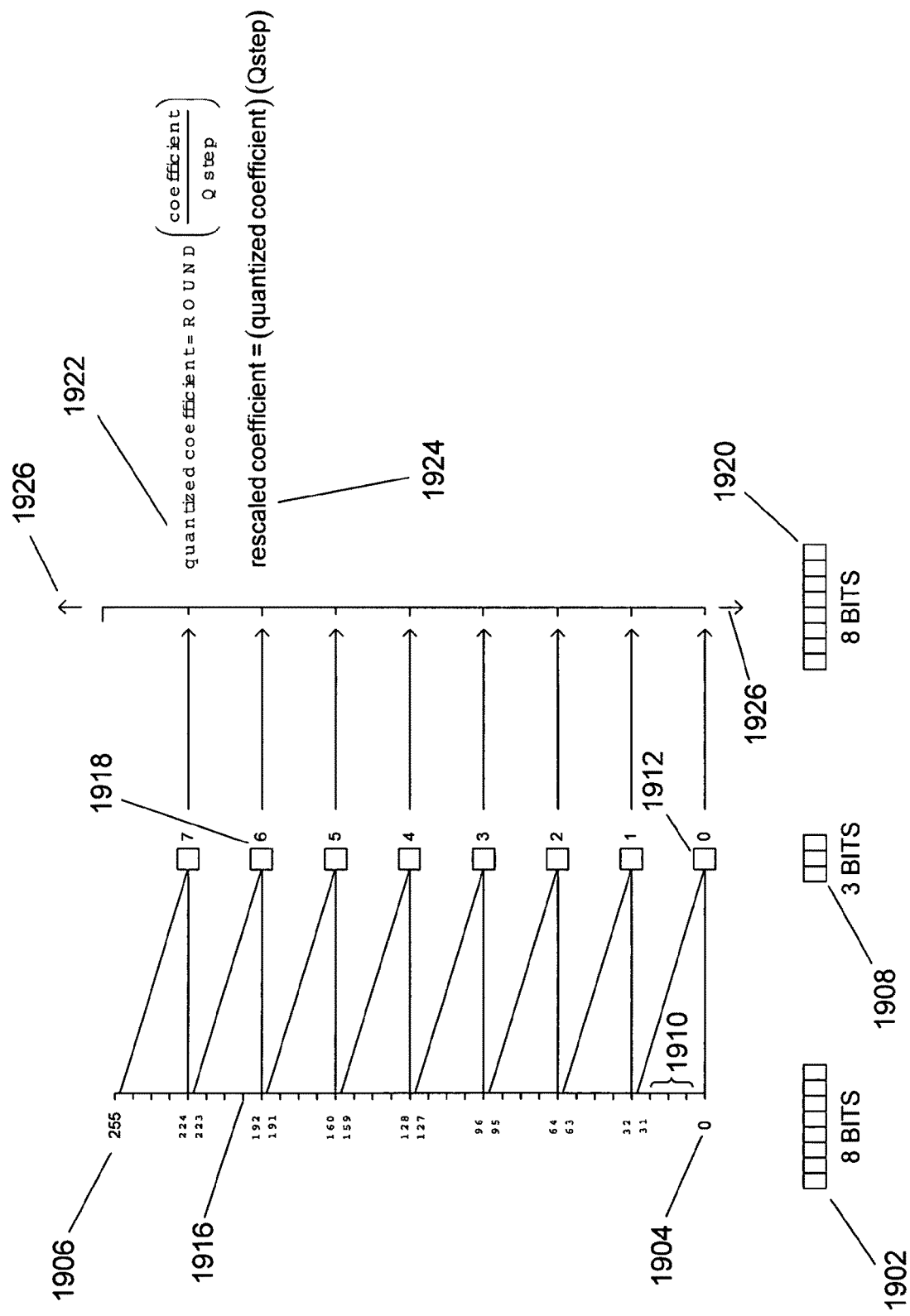
FIG. 19 illustrates the quantization process.

FIG. 19 illustrates the quantization process. Consider, as a simple example, a number encoded in eight bits 1902 that can therefore range in value between 0 (1904 in FIG. 19) and 255 (1906 in FIG. 19), potentially assuming any integer value in the range 0-255. A quantization process can be used to encode the eight-bit number 1902 in only three bits 1908 by an inverse linear interpolation of integers in the range 0-255 to integers in the range 0-7, as shown in FIG. 19. In this case, integer values 0-31 represented by an eight-bit-encoded number are all mapped to the value 0 (1912 in FIG. 19). Successive ranges of 32 integer values are mapped to the values 1-7. Thus, for example, quantization of the integer 200 (1916 in FIG. 19) produces the quantized value 6 (1918 in FIG. 19). Eight-bit values can be regenerated from the three-bit quantized values by simple multiplication. The three-bit quantized value can be multiplied by 32 to produce an approximation of the original eight-bit number. However, the approximate number 1920 can have only one of the values 0, 32, 64, . . . , 224. In other words, quantization is a form of numeric-value decimation, or loss of precision. A resealing process, or multiplication, can be used to regenerate numbers that approximate the original values that were quantized, but cannot recover the precision lost in the quantization process. In general, quantization is expressed by formula 1922, and the inverse of quantization, or rescaling, is expressed by formula 1924. The value "Qstep" in these formulas controls the degree of precision lost in the quantization procedure. In the example illustrated on the left side of FIG. 19, Qstep has the value "32." A smaller value of Qstep provides a smaller loss in precision, but also less compression, while larger values provide greater compression, but also greater loss of precision. For example, in the example shown in FIG. 19, had Qstep been 128 rather than 32, the eight-bit number could have been encoded in a single bit, but rescaling would produce only the two values 0 and 128. Note also that the rescaled values can be vertically shifted, as indicated by arrows 1926 and 1928, by an additional addition step following rescaling. For example, in the example shown in FIG. 19, rather than generating values 0, 32, 64, . . . , 224, addition of 16 to the rescaled values generates corresponding values of 16, 48, . . . , 240, leaving a less dramatic gap at the top of the rescaled vertical number line.

Following quantization of residual, or difference, blocks and collection of difference vectors and other objects produced as a stream of data from the steps upstream to entropy encoding, an entropy encoder is applied to the partially compressed data stream to produce an entropy-encoded data stream that comprises the payload of the NAL packets, described above with reference to FIG. 5. Entropy encoding is a lossless encoding technique that takes advantage of statistical non-uniformities in the partially encoded data stream. One well-known example of entropy encoding is the Morse code, which uses single-pulse encoding of commonly occurring letters, such as "E" and "T," and four-pulse or five-pulse encodings of infrequently encountered letters, such as "Q" and "Z."

Figure 20:
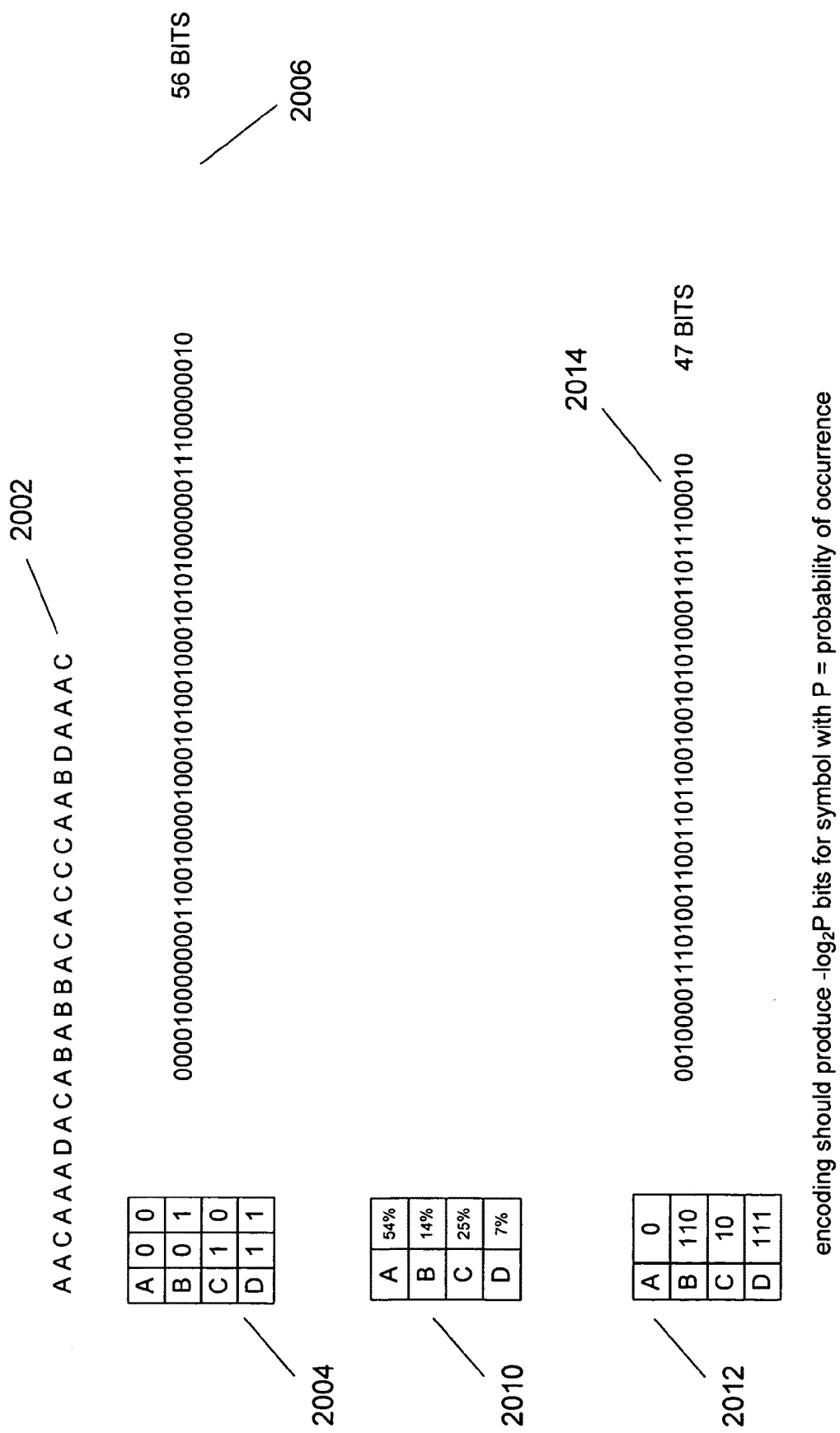
FIG. 20 provides a numerical example of entropy encoding.

FIG. 20 provides a numerical example of entropy encoding. Consider the four-symbol character string 2002 comprising 28 symbols, each selected from one of the four letters "A," "B," "C," and "D." A simple and intuitive encoding of this 28-symbol string would be to assign one of four different two-bit codes to each of the four letters, as shown in the encoding table 2004. Using this two-bit encoding, a 56-bit encoded symbol string 2006 equivalent to symbol string 2002 is produced. However, analysis of the symbol string 2002 reveals the percentage occurrence of each symbol, shown in table 2010. "A" is, by far, the most frequently occurring symbol, and "D" is, by far, the least frequently occurring symbol. A better encoding is represented by encoding table 2012, which uses a variable-length representation of each symbol. "A" being the most frequently occurring symbol, is assigned the code "0." The least-frequently occurring symbols "B" and "D" are assigned the codes "110" and "111," respectively. Using this encoding produces the encoded symbol string 2014, which uses only 47 bits. In general, a binary entropy encoding should produce an encoded symbol of $-\log_2 P$ bits for symbols with a probability of occurrence of P. While the improvement in encoding length is not spectacular, in the example shown in FIG. 20, for long sequences of symbols having decidedly non-uniform symbol-occurrence distributions, entropy encoding produces relatively high compression ratios.

Figure 21A:
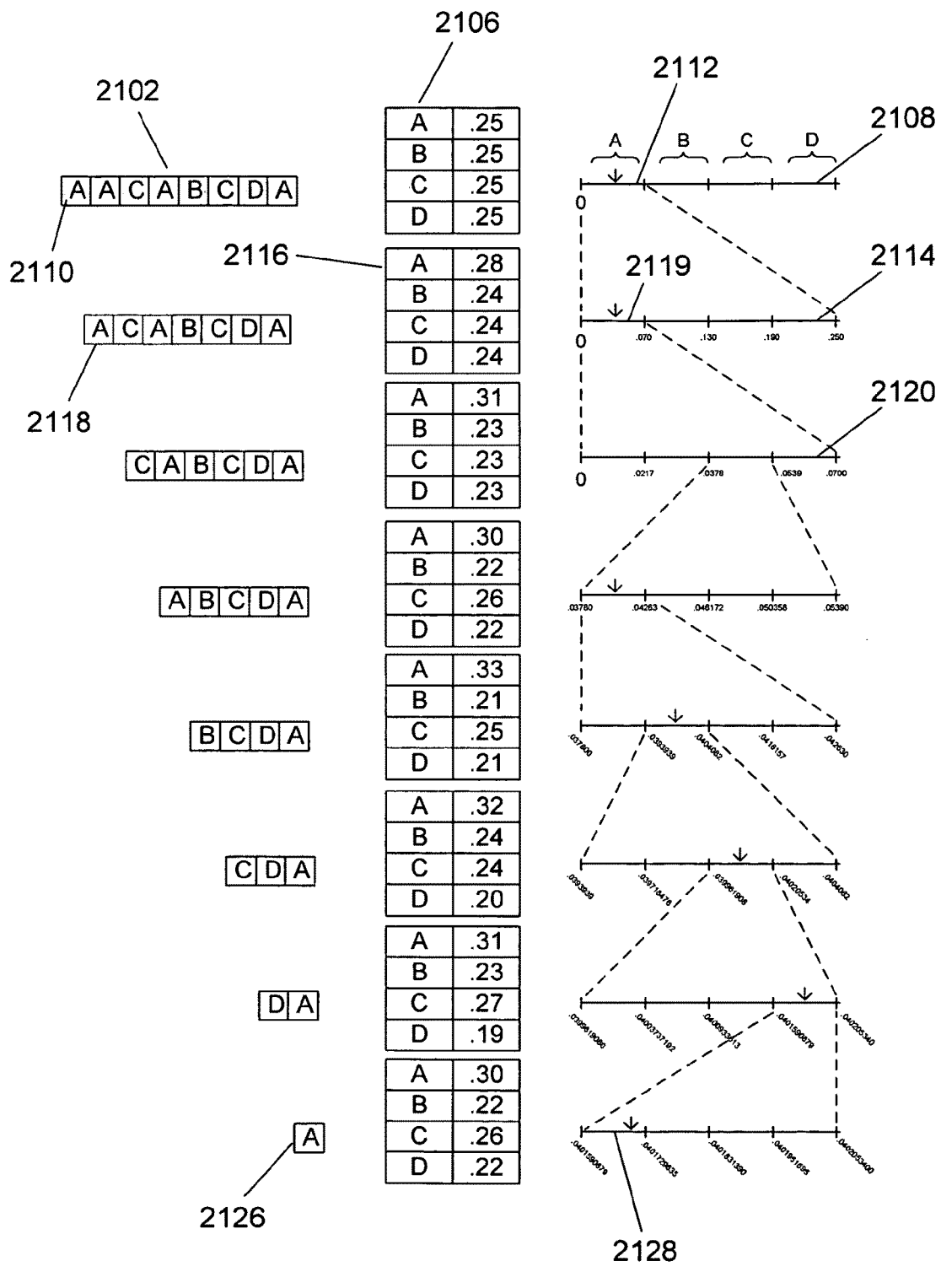
FIGS. 21A-B provide an example of arithmetic encoding.
Figure 21B:
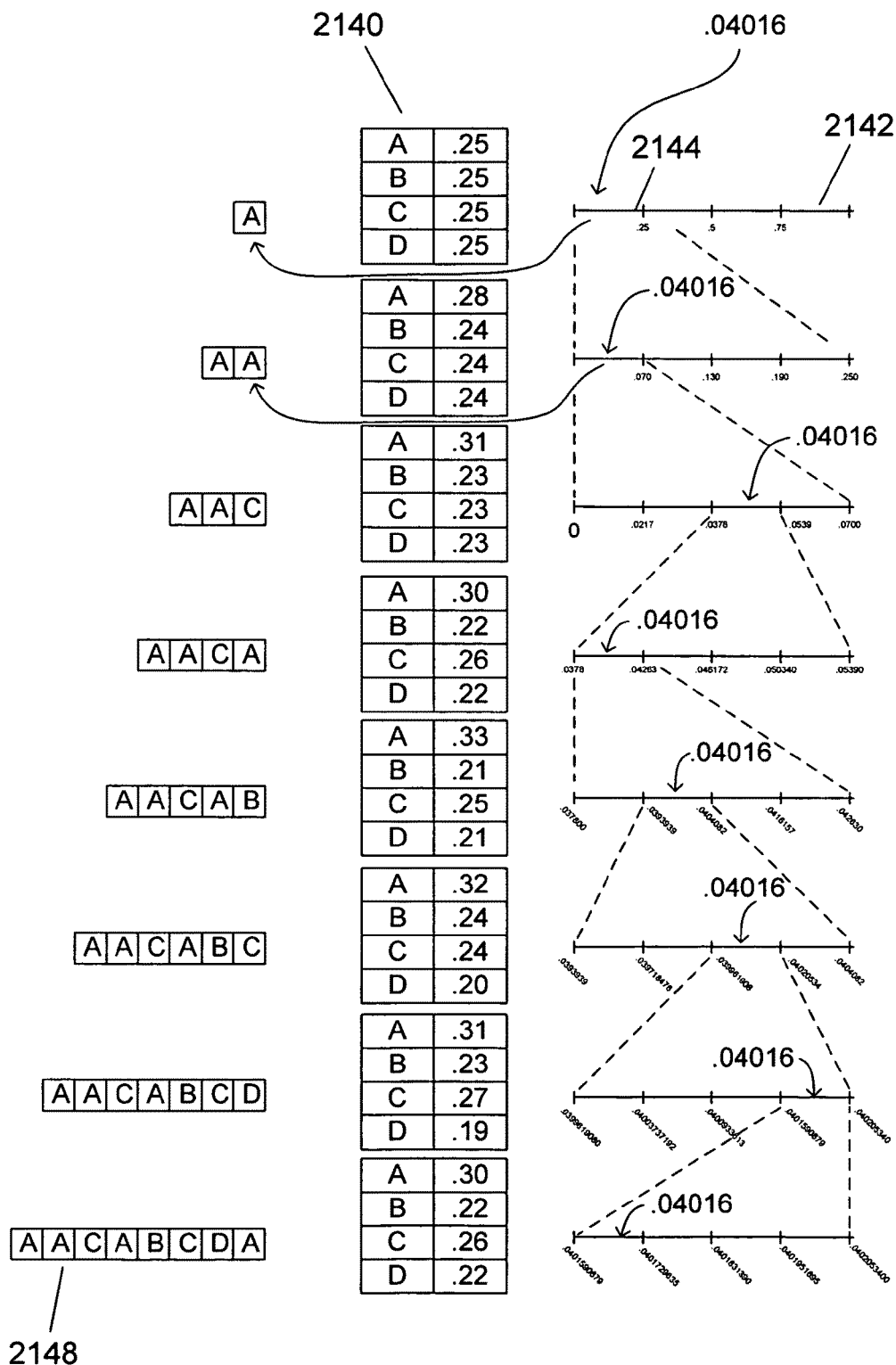

One type of entropy encoding is referred to as "arithmetic encoding." A simple example is provided in FIGS. 21A-B. The arithmetic encoding illustrated in FIGS. 21A-B is a version of a context-adaptive encoding method. In this example, an eight-symbol sequence 2102 is encoded as a five-place fractional value 0.04016 (2104 in FIG. 21A), which can be encoded by any of various known binary numerical encodings to produce a binary encoded symbol string. In this simple example, a symbol-occurrence-probability table 2106 is updated constantly during the coding process. This provides context adaption, since the encoding method dynamically changes, over time, as the symbol-occurrence probabilities are adjusted according to the symbol-occurrence frequencies observed during coding. Initially, for lack of a better set of initial probabilities, the probabilities for all symbols is set to 0.25. At each step, an interval is employed. The interval at each step is represented by a number line, such as number line 2108. Initially, the interval ranges from 0 to 1. At each step, the interval is divided into four partitions according to the probabilities in the current symbol-occurrence-frequency table. Because the initial table contains equal probabilities of 0.25, the interval is divided, in the first step, into four equal parts. In the first step, the first symbol "A" 2110 in the symbol sequence 2102 is encoded. The interval partition 2112 corresponding to this first symbol is selected as the interval 2114 for the next step. Furthermore, because the symbol "A" was encountered, the symbol-occurrence probabilities are adjusted in the next version of the table 2116 by increasing probability of occurrence for symbol "A" by 0.03, and decreasing probabilities of occurrence of the remaining symbols by 0.01. The next symbol is also "A" 2118, and so the first interval partition 2119 is again selected to be the subsequent interval 2120 for the third step. This process continues until all symbols in the symbol string have been consumed. The final symbol, "A," 2126, selects the first interval 2128 in the final interval computed in the procedure. Note that the intervals decrease in size with each step, and generally require a greater number of decimal places to specify. The symbol string can be encoded by selecting any value within the final interval 2128. The value 0.04016 falls within this interval, and therefore represents an encoding of the symbol string. The original symbol string can be regenerated, as shown in FIG. 21B, by starting the process again with an initial, equal-valued symbol-occurrence-frequency probability table 2140 and an initial interval of 0-1 2142. The encoding, 0.04016, is used to select a first partition 2144 which corresponds to the symbol "A." Then, in steps similar to the steps in the forward process, shown in FIG. 21A, the encoding 0.04016 is used to select each subsequent partition of each subsequent interval until the final symbol string is regenerated 2148.

While this example illustrates the general concept of arithmetic encoding, it is an artificial example, because the example assumes infinite precision arithmetic and because the symbol-occurrence-frequency-probability table adjustment algorithm would quickly lead to unworkable values. Actual arithmetic encoding does not assume infinite precision arithmetic, and instead employs techniques to adjust the intervals in order to allow for interval specification and selection within the precision provided by any particular computer system. The H.264 standard specifies several different encoding schemes, one of which is a context-adaptive arithmetic encoding scheme. Table-lookup procedures are used for encoding frequently occurring symbol strings produced by the up-stream encoding techniques, including various meta-data and parameters included in the partially compressed data stream to facilitate subsequent decompression.

Figure 22A:
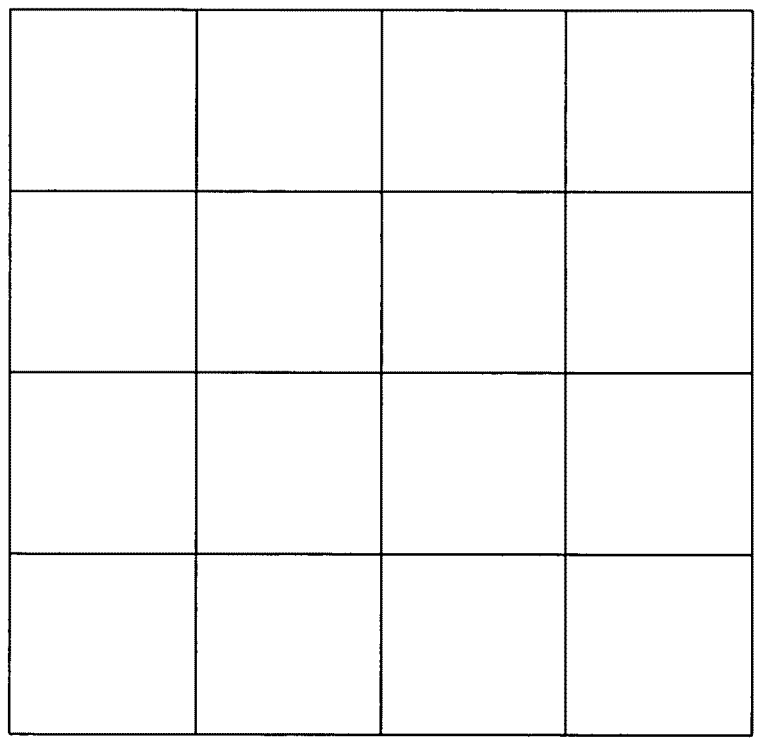
FIGS. 22A-B illustrate one commonly occurring artifact and a filtering method that is used, as a final step in decompression, to ameliorate the artifact.
Figure 22B:
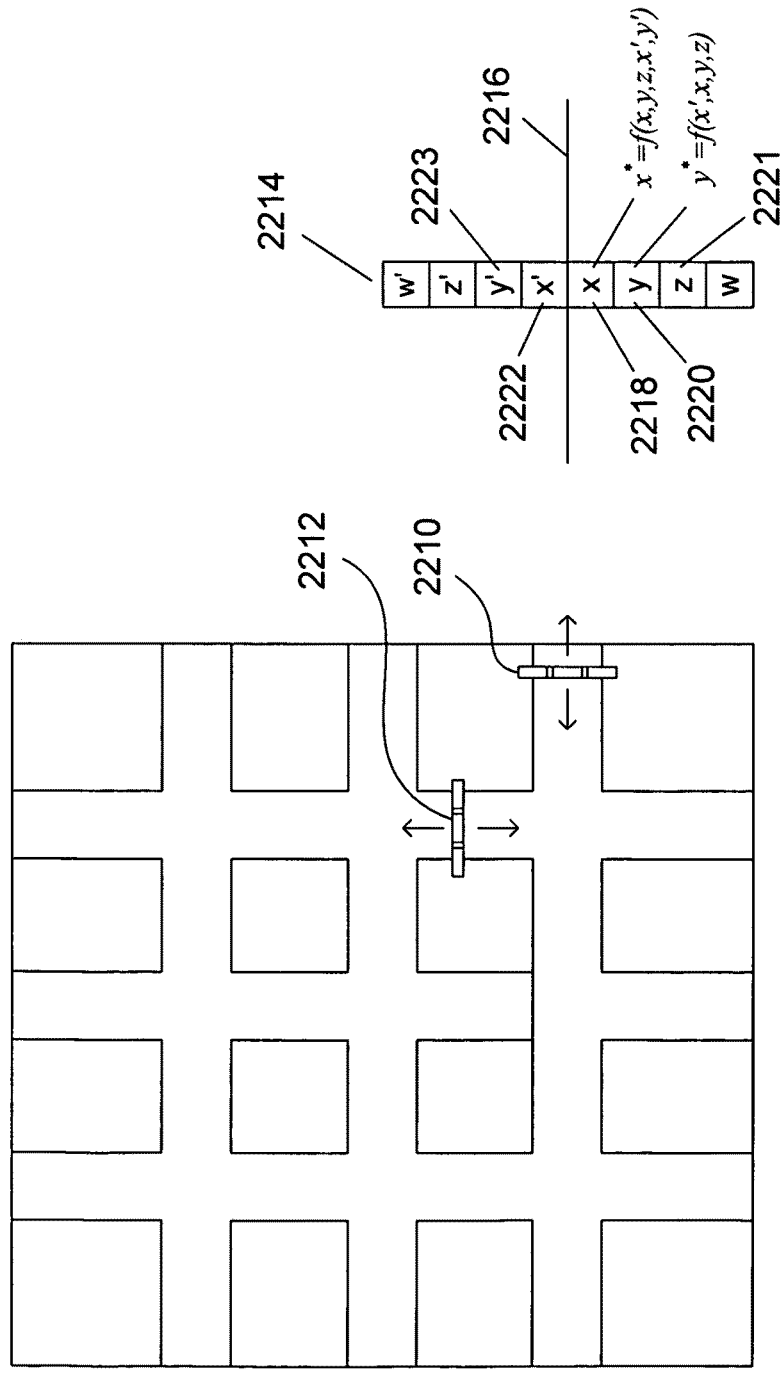

When video-data streams are compressed according to the H.264 technique, subsequent decompression may yield certain types of artifacts. By way of example, FIGS. 22A-B illustrate one commonly occurring artifact and a filtering method that is used, as a final step in decompression, to ameliorate the artifact. As shown in FIG. 22A, a decompressed video image, without filtering, may appear blocked. Because decompression and compression are carried out on a block-by-block basis, various block boundaries can represent significant discontinuities in compression/decompression processing, leading to a visually-perceptible blocking of a displayed, decompressed video image. FIG. 22B illustrates a deblocking-filter method, employed in H.264 decompression, to ameliorate the blocking artifact. In this technique, vertical 2210 and horizontal 2212 filters, similar to the filters used for pixel-value interpolation, discussed above with reference to FIGS. 13A-D, are passed along all block boundaries in order to smooth discontinuities in the pixel-value gradients across the block boundaries. Three pixel values on each side of the boundary may be affected by the block-filter method. On the right of FIG. 22B, an example of a deblocking-filter application is shown. In this example, the filter 2214 is represented as a vertical column containing four pixel values on either side of a block boundary 2216. Application of the filter produces filtered pixel values for the first three pixel values on either side of the block boundary. As one example, the filtered value for pixel 2218, $x^*$, is computed from the prefiltered values of pixels 2218, 2220, 2221, 2222, and 2223. The filter tends to average, or smear, pixel values in order to reestablish a continuous gradient across the boundary.

Figure 23:
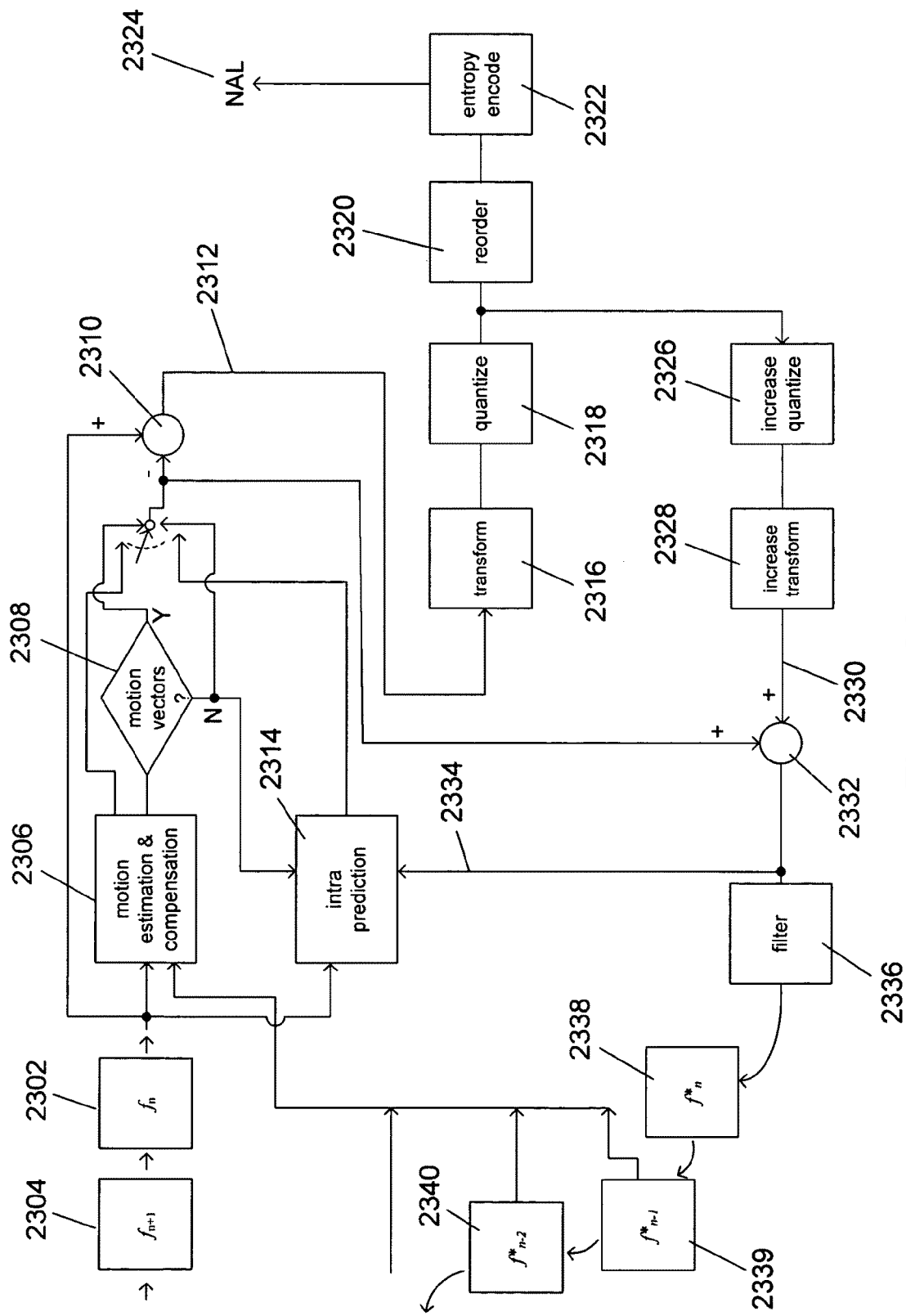
FIG. 23 summarizes H.264 video-data-stream encoding.

FIG. 23 summarizes H.264 video-data-stream encoding. FIG. 23 provides a block diagram, and a therefore high-level description of the encoding process. However, this diagram, along with the previous discussion and previously referenced figures, provides a substantial overview of H.264 encoding. Additional details are revealed, as necessary, to describe particular video-codec embodiments of the present invention. It should be noted that there are a plethora of fine points, details, and special cases in video encoding and video decoding that cannot be addressed in an overview section of this document. For ease of communication and simplification, the examples herein are largely based on the H.264 standard, however, in no way should it be construed that the invention presented herein is limited to H.264 applications. The official H.264 specification is over 500 pages long. These many details include, for example, special cases that arise from various boundary conditions, specific details, and optional alternative methods that can be applied in various context-related cases. Consider, for example, intra prediction. Intra prediction modes depend on the availability of pixel values in specific, neighboring blocks. For boundary blocks without neighbors, many of the modes cannot be used. In certain cases, unavailable neighboring pixel values may be interpolated or approximated in order to allow a particular intra-prediction mode to be used. Many interesting details in the encoding process are related to choosing optimal prediction methods, quantization parameters, and making other such parameter choices in order to optimize the compression of a video data stream. The H.264 standard does not specify how compression is to be carried out, but instead specifies the format and contents of an encoded video-data stream and how the encoded video data stream is to be decompressed. The H.264 standard also provides a variety of different levels of differing computational complexity, with high-end levels supporting more computationally expensive, but more efficient additional steps and methods. The current overview is intended to provide sufficient background to understand the subsequently provided description of various embodiments of the present invention, but is in no way intended to constitute a complete description of H.264 video encoding and decoding.

In FIG. 23, a stream of frames 2302-2304 are provided as input to an encoding method. In this example, the frames are decomposed into macroblocks or macroblock partitions, as discussed above, for subsequent processing. In a first processing step, a currently considered macroblock or macroblock partition is attempted to be inter predicted from one or more reference frames. When inter prediction is successful, and one or more motion vectors generated, as determined in step 2308, then the predicted macroblock generated by the motion estimation and compensation step 2306 is subtracted from the actual, raw macroblock in a differencing step 2310 to produce a corresponding residual macroblock which is output by the differencing step onto data path 2312. However, if inter prediction fails, as also determined in step 2308, then an intra prediction step 2314 is launched to carry out intra prediction on the macroblock or macroblock partition, which is then subtracted from the actual raw macroblock or macroblock partition, in step 2310, to produce a residual macroblock or residual macroblock partition output to data path 2312. The residual macroblock or residual macroblock partition is then transformed, by the transform step 2316, quantized by the quantize step 2318, potentially re-ordered for more efficient encoding in step 2320, and then entropy encoded in step 2322 to produce a stream of output NAL packets 2324. In general, compression implementations seek to employ the prediction method that provides closest prediction of a considered macroblock, while balancing the cost, in time and memory usage, of various prediction methods. Any of various different orderings and selection criteria for applying prediction methods can be used.

Continuing to follow the example of FIG. 23, following quantization, in step 2318, the quantized coefficients are input to the re-ordering and entropy-encoding stages 2320 and 2322, and also input to an inverse quantizer 2326 and an inverse transform step 2328 to regenerate a residual macroblock or residual macroblock partition that is output onto data path 2330 by the inverse transform step. The residual macroblock or macroblock partition output by the inverse transform step is generally not identical to the residual macroblock or residual macroblock partition output by the differencing step 2310 to data path 2312. Recall that quantization is a lossy compression technique. Therefore, the inverse quantizing step 2326 produces an approximation of the original transform coefficients, rather than accurately reproducing the original transform coefficients. Therefore, although the inverse integer transform would produce an exact copy of the residual macroblock or macroblock partition, were it applied to the original coefficients produced by the integer transform step 2316, because the inverse integer transform step 2328 is applied to rescaled coefficients, only an approximation to the original residual macroblock or macroblock partition is produced in step 2328. The approximate residual macroblock or macroblock partition is then added to the corresponding predicted macroblock or macroblock partition, in the addition step 2332, to generate a decompressed version of the macroblock. The decompressed, but not filtered, version of the macroblock is input to the intra prediction step 2312, via data path 2334, for intra prediction of a subsequently processed block. The deblocking filter 2336 step is performed on decompressed macroblocks to produce filtered, decompressed macroblocks that are then combined to produce decompressed images 2338-2340 that may be input to the motion estimation and compensation step 2306. One subtlety involves input of the decompressed frames to motion estimation and compensation step 2306 and decompressed, but nonfiltered macroblocks and macroblock partitions to the intra prediction step 2314. Recall that both intra prediction and most motion estimation and compensation use neighboring blocks, either in a current frame, in the case of spatial prediction, or in previous and/or subsequent frames, in the case of temporal, inter prediction, in order to predict values in a currently considered macroblock or macroblock partition. But, consider the recipient of a compressed data stream. The recipient will not have access to the original, raw video frames 2302 and 2304. Therefore, during decompression, the recipient of the encoded video data stream will use previously decoded or decompressed macroblocks for predicting the contents of subsequently decoded macroblocks. If the encoding process were to use the raw video frames for prediction, then the encoder would be using different data for prediction than is subsequently available to the decoder. This would cause significant errors and artifacts in the decoding process. To prevent this, the encoding process generates decompressed macroblocks and macroblock partitions, and decompressed and filtered video frames for use in the inter and intra prediction steps, so that intra and inter prediction use the same data for predicting contents of macroblocks and macroblock partitions as will be available to any decompressing procedure that can rely only on the encoded video data stream for decompression. Thus, the decompressed but unfiltered macroblock and macroblock partitions input through data path 2334 to the intra prediction step 2314 are the neighboring blocks from which a current macroblock or macroblock partition is subsequently predicted, and the decompressed and filtered video frames 2338-2340 are used as reference frames by the motion estimation and compensation step 2306 for processing other frames.

Figure 24:
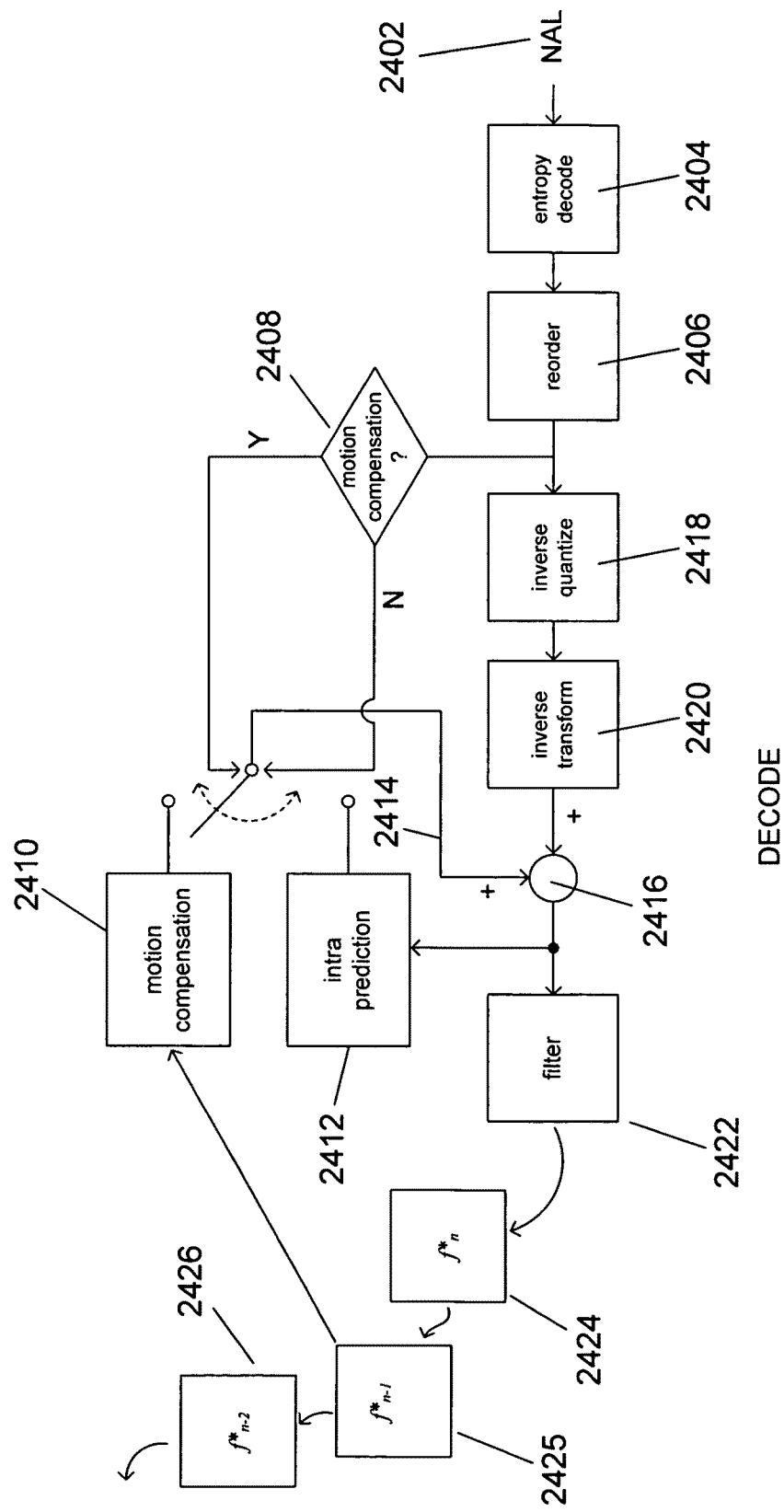
FIG. 24 illustrates, in a block diagram fashion similar to that used in FIG. 23, the H.264 video-data-stream decoding process.

FIG. 24 illustrates an example in a block diagram fashion similar to that used in FIG. 23, the H.264 video-data-stream decoding process. Decompression is more straightforward than compression. A NAL packet stream 2402 is input into an entropy decode step 2404 which applies an inverse entropy encoding to generate quantized coefficients that are reordered by a reordering step 2406 complementary to the reordering carried out by the reorder step 2320 in FIG. 23. Information in the entropy decoded stream can be used to determine the parameters by which the data was originally encoded, including whether or not intra prediction or inter prediction was employed during compression of each block. This data allows for selecting, via step 2408, either inter prediction, in step 2410, or intra prediction, in step 2412, for producing predicted values for macroblocks and macroblock partitions that are furnished along data path 2414 to an addition step 2416. The reordered coefficients are rescaled by an inverse quantifier, in step 2418, and an inverse integer transform is applied, in step 2420, to produce an approximation of the residual, or residual, macroblocks or macroblock partitions, which are added, in the addition step 2416, to predicted macroblocks or macroblock partitions generated based on previously decompressed macroblocks or macroblock partitions. The addition step produces decompressed macroblocks or macroblock partitions to which a deblocking filter is applied in order to produce final decompressed video frames, in step 2422, to produce the decompressed video frames 2424-2426. The decompression process is essentially equivalent to the lower portion of the compression process, shown in FIG. 23.

Subsection II: Principles of Parallel Integrated-Circuit Design for Addressing Complex Computational Tasks According to the Present Invention The problem of implementing a computational engine to carry out H.264 compression and decompression is an exemplary problem domain with which to illustrate the present invention. In this subsection, the principles for developing a parallel, pipelined, integrated-circuit computational engine for carrying out H.264 compression and decompression are described as an example of the general approach of computational-engine design that represent embodiments of the present invention. The present invention is in no way limited to H.264 implementations.

Figure 25:
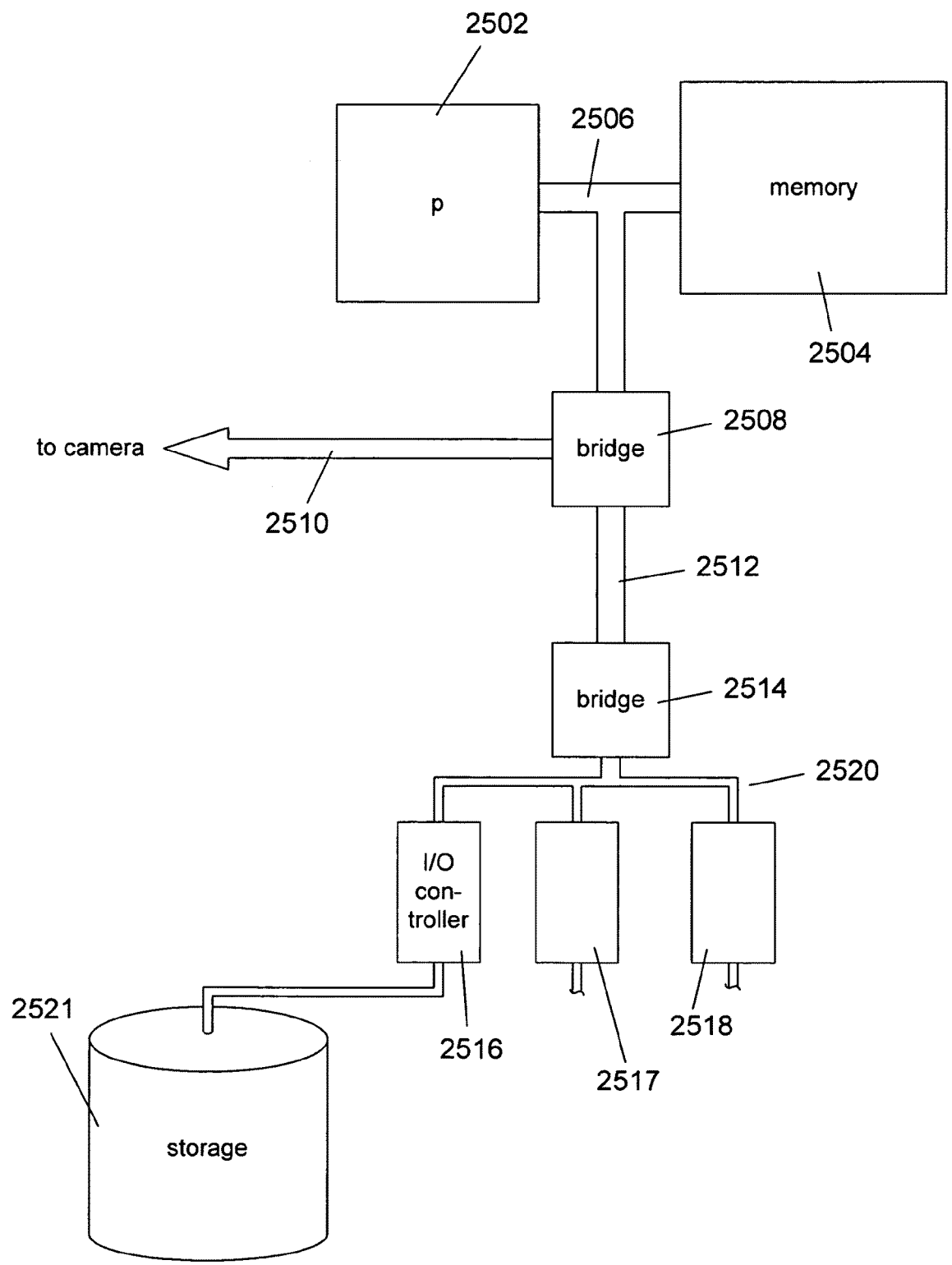
FIG. 25 is a very high-level diagram of a general purpose computer.

One way to implement a video codec that carries out the H.264 video compression and decompression, discussed in the first subsection, is to program the encoding and decoding processes in software, and execute the program on a general-purpose computer. FIG. 25 is a very high-level diagram of a general-purpose computer. The computer includes a processor 2502, memory 2504, a memory/processor bus 2506 that interconnects the processor, memory, and a bridge 2508. The bridge interconnects the processor/memory bus 2506 with a high-speed data-input bus 2510 and an internal bus 2512 that connects the first bridge 2508 with a second bridge 2514. The second bridge is, in turn, connected to various devices 2516-2518 via high-speed communications media 2520. One of these devices is an I/O controller 2516 that controls a mass-storage device 2520.

Consider execution of the software program that implements a video codec. In this example, the software program is stored on the mass-storage device 2520 and paged, on an as-needed basis, into memory 2504. Instructions of the software program are fetched, by the processor 2502, from memory for execution. Thus, execution of each instruction involves at least a memory fetch, and may also involve access, by the processor, to stored data in memory and ultimately in the mass-storage device 2520. A large percentage of the actual computational activity in the general-purpose computer system is devoted to transferring data and program instructions between the mass-storage device, memory, and the processor. Furthermore, with a video camera or other data-input device producing large volumes of data at high data-transfer rates, there may be significant contention for both memory and the mass-storage device among the video camera and the processor. This contention may carry over to saturation of the various busses and bridges within the general computer system. In order to carry out real-time video compression and decompression using a software implementation of a video codec, a very large portion of the available computational resources and power consumed by the computer are devoted to data transfer and instruction transfer, rather than on actually carrying out compression and decompression. A parallel-processing approach can be anticipated as a possible approach to increasing computational throughput of a software-implemented video codec. However, in a general-computing system, properly decomposing the problem to take full advantage of multiple processing components is a far from trivial task, and may not solve, or may even exacerbate, contention for memory resources and exhaustion of data-transfer bandwidth within the computer system.

A next implementation that might be considered would be to move the software implementation onto hardware, using any of various system-on-a-chip design methods. A system-on-a-chip-implemented video codec would offer certain advantages over a general-purpose computer system executing a software implementation of the video codec. In particular, program instructions may be stored on board, in flash memory, and various computational steps may be implemented in logic circuits rather than being implemented as sequential execution of instructions by a processor. However, the system-on-a-chip implementation of a video codec is nonetheless generally sequential, in nature, and does not provide a high-throughput parallel computational approach.

Figure 26:
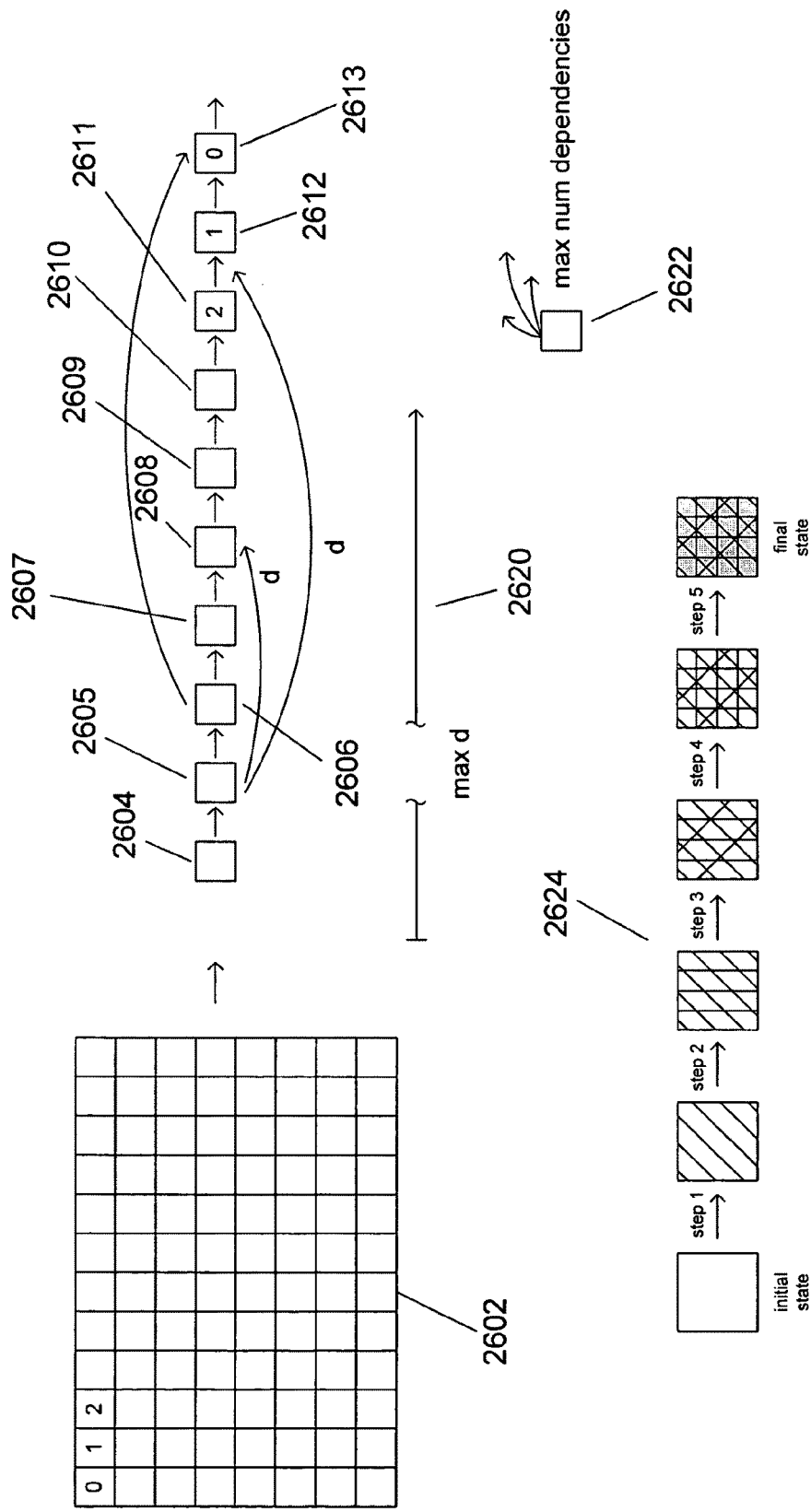
FIG. 26 illustrates a number of aspects of the video compression and decompression process that, when considered, provide insight into a new, and far more computationally efficient, approach to implementation of a video codec according to the present invention.

FIG. 26 illustrates a number of aspects of the video compression and decompression process that, when considered, provide insight into a new, and far more computationally efficient, approach to implementation of a video codec according to the present invention. First, the H.264 standard has provided for a high-level problem decomposition amenable to a parallel-processing solution. As discussed above, each video frame 2602 is decomposed into macroblocks 2604-2613, and macroblock-based or macroblock-partition-based operations are performed on macroblocks and macroblock partitions in order to compress a video frame, in the forward direction, and macroblocks are decompressed, in the reverse, decompression direction, to reconstitute decompressed frames. Certainly, as discussed above, there are dependencies between frames and between macroblocks during the encoding process and during the decoding process. However, as shown in FIG. 26, the macroblock-to-macroblock and macroblock-partition-to-macroblock-partition dependencies are generally forward dependencies. The initial macroblock in an initial frame of a sequence 2613 does not depend on subsequent macroblocks, and can be compressed based entirely on its own contents. As compression continues, frame-by-frame, via a raster-scan processing of macroblocks, subsequent macroblocks may depend on macroblocks in previously compressed frames, particularly for inter prediction, and may depend on previously compressed macroblocks within the same frame, particularly for intra prediction. However, the dependencies are well constrained. First, the dependencies are bounded by a maximum distance in sequence, space, and time 2620. In other words, only adjacent macroblocks within the current frame and macroblocks within a search area centered at the position of the current frame in a relatively small number of reference frames may possibly contribute to compressing any given macroblock. Were the dependencies not well constrained in time, space, and sequence, very large memory capacity would be required to contain intermediate results needed for compressing successive macroblocks. Such memories are expensive, and quickly begin to consume available computational bandwidth as memory-management tasks grow in complexity and size. Another type of constraint is that there are only a relatively small, maximum number of dependencies possible for a given macroblock 2622. This constraint also contributes to bounding the necessary size of memory, and contributes to a bound on computational complexity. As the number of dependencies grows, the computational complexity may grow geometrically or exponentially. Furthermore, parallel processing solutions to complex computational problems are only feasible and manageable when the necessary communications between processing entities is well bounded. Otherwise, communication of results between discrete processing entities quickly overwhelms the available computational bandwidth. Another characteristic of the video-codec problem is that processing of each macroblock, either in the forward, compression direction or in the reverse, decompression direction, is a stepwise process 2624. As discussed above, these sequential steps include inter and intra prediction, generation of residual macroblocks, major transform, quantization, object re-ordering, and entropy encoding. These steps are discrete, and, in general, the results of one step are fed directly into the following step. Thus, macroblocks can be processed in assembly-line fashion, just as cars or appliances can be manufactured in stepwise fashion along assembly lines.

The characteristics of video-codec implementation, discussed with reference to FIG. 26, that motivate the massively parallel-processing implementation of a video codec according to the present invention may be present within many different problem domains. In many cases, a computational problem can be decomposed in many different ways. In order to apply the methods of the present invention to any particular problem, a problem decomposition that produces some or all of the characteristics discussed above with reference to FIG. 26 needs to be selected, as a first step of the method. For example, the video-data-stream compression problem can be decomposed in alternative, unfavorable ways. For example, an alternative decomposition would be to analyze the entire video data stream, or significant blocks of frames, for motion detection in advance of macroblock processing. In certain respects, this larger granularity approach might provide significant advantages with respect to motion detection and motion-detection-based compression. However, this alternative problem decomposition requires significantly greater internal memory, and the motion-detection step would be too complex and computationally inefficient to be easily accommodated within a stepwise processing of computationally tractable and manageable data objects.

Again, it is emphasized that, while the present invention is described in the context of implementing a video codec, the methods of the present invention have applicability to a broad range of efficient computational engines designed to solve a wide variety of different computational problems. For those problems that can be decomposed and formulated to provide the characteristics discussed with reference to FIG. 26, the methods of the present invention provide efficiencies in computational bandwidth, cost, power consumption, and other important efficiencies that motivate and constrain computational-engine, device, and system development.

Figure 27:
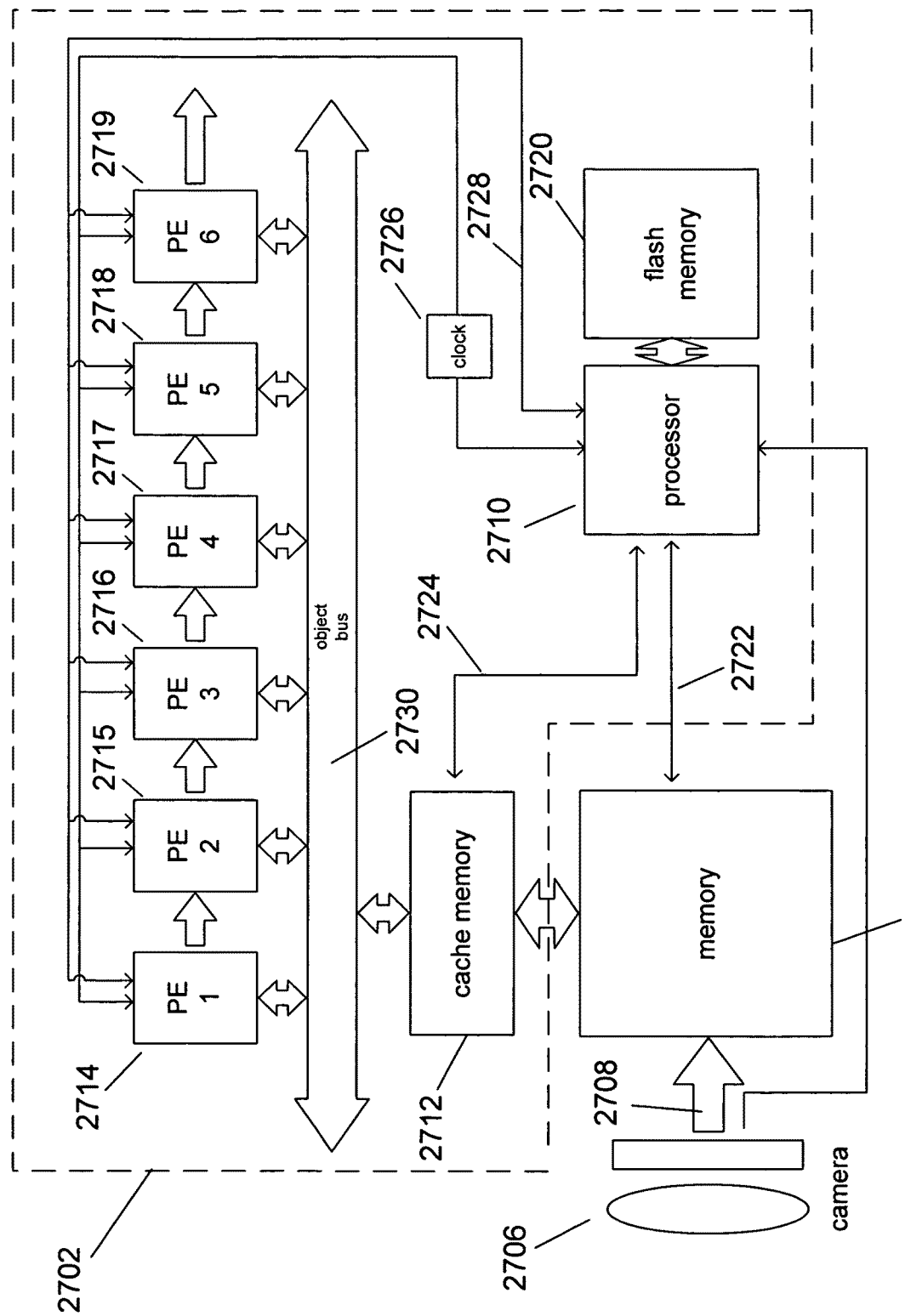
FIG. 27 illustrates the basic features of a integrated-circuit implementation of a video codec according to methods of the present invention.

FIG. 27 illustrates the basic features of a single-integrated-circuit implementation of a video codec according to methods of the present invention. Those components implemented within a single integrated circuit are shown within a large dashed block 2702. The video-codec implementation uses, in addition, an external memory 2704 and the external optics and electronics of a video camera 2706. Additional external components of a video-camera system include power supplies, various additional electromechanical components, a housing, interconnects for external devices, and other such components.

As discussed above, with reference to FIG. 4, the video camera provides a data-stream and electronic-timing-signal input 2708 to the video codec. The data stream is directed to the memory 2704 and a micro-processor-controller component 2710 within the integrated circuit that can access the timing-signal output of the video camera in order to coordinate activities of the video codec. The memory 2704 is dual ported so that, as video data streams in from the digital video camera 2706, previously stored raw video data can be extracted from the external memory into an internal cache memory 2712 for provision to each of a number of processing elements 2714-2719. In FIG. 27, six processing elements 2714-2719 are shown, although, in the specific implementation discussed below, there are in fact a greater number of processing elements. The number of processing elements is a problem-domain-determined and design-choice parameter. Distinct processing elements of one implementation may alternatively be combined together in another implementation.

In the FIG. 27 example, the micro-processor-controller 2710 executes instructions stored in a flash memory 2720. The micro-processor-controller communicates, via various signal paths, with the memory 2722, cache memory 2724, a system clock 2726, and the multiple processing elements 2728. Within the integrated circuit, the bulk of data flow occurs through an object bus 2730. The object bus delivers video-data-related objects, principally macroblocks and macroblock partitions, to the processing elements. In addition, the object bus may also deliver shared parameter-and-metadata containing objects that describe the macroblocks and macroblock-partition objects as well as the current frame and higher-order levels of structure within a video data stream.

In this example, each processing element carries out one step of the step-by-step processing of video data objects, principally macroblocks and macroblock partitions. The types of video objects input to a processing element and the types of video and data objects output by a processing element depend on the particular step in the compression process implemented by the processing element. The vast bulk of the computations carried out to compress video data are carried out by the processing elements. The approach to processing is very much a pipeline, assembly-line-like approach, in which a given raw-data macroblock enters the first processing element 2714 and is transformed, in step-by-step fashion, along the sequence of subsequent processing elements in the processing-element pipeline. The overall assembly-line processing is controlled by a relatively low-frequency clock-signal-implemented computational-step timing signal. The processing steps within each processing element are controlled by a relatively high-frequency clock signal. One important aspect of the single-integrated-circuit implementation of the video codec is that the low-frequency computational-step timing signal provides a timing signal for the micro-processor-controller, but does not provide absolute control of the assembly-line process. In general, each step in the step-wise, high-level processing should be carried out within a single, low-frequency computational-step timing-signal interval. However, there may be cases in which the processing element is unable to complete its task in one time interval. Those cases are detected by the high-level control logic provided by the micro-processor-controller 2710, in which case the micro-processor-controller may delay launching the following computational step, allowing the processing element to complete its task, even though the task has exceeded the low-frequency timing interval. Micro-processor-controller control thus provides an important level of flexibility in the overall control of the video-compression and video-decompression processes. Were this flexibility not provided, then the low-frequency interval would need to be set to at least the greatest possible time interval needed by any processing element within the system to complete the most computationally complex task that the processing element might encounter. In the case that the maximally complex task occurs only infrequently, such as once in every 1,000 macroblocks, then, during processing of the remaining 999 less-computationally demanding macroblocks, the processing elements would lie idle for significant periods of time within the low-frequency time interval. By providing more flexible, micro-processor-controller control of the overall assembly-line process, the low-frequency timing-signal interval can be set to a reasonable value, specifying a time interval during which the majority of macroblocks can be processed, and can be adjusted, in real time, in a context-dependent fashion, to accommodate relatively infrequent, computationally intensive macroblocks.

In this example, an on-board object cache 2712 provides a different type of flexibility. The cache memory provides a dynamic buffer for data objects which can accommodate varying amounts of data needed at particular points in video compression. Like the timing elasticity provided by micro-processor-controller control, a flexible cache memory allows for accommodation of particular, context-dependent memory requirements while efficiently handling less-memory-intensive, general processing tasks. The higher-frequency timing intervals provided by the clock 2726 allow for clock-controlled processing within the processing elements, which are implemented as logic circuits rather than as micro-processor-controller-executed instructions. It is this clock-controlled, logic-circuit-based implementation that provides the large computational bandwidth of the overall single-integrated-circuit implementation of the video codec. Were significant portions of the video compression and video-decompression processes carried out by instruction execution on processors, a significant fraction of the overall computational overhead would be consumed by instruction fetch cycles. An object memory controller is responsible for exchanging objects between the on-board object cache memory and an object memory.

Finally, the object bus 2730 facilitates the object-pipeline-based implementation. Were macroblocks and macroblock partitions transmitted within the integrated circuit as bit or byte streams, very high frequency communications processing would be needed for communicating macroblocks and macroblock partitions to and from the processing elements. By providing a broad, high-capacity object bus, the data transmitted to each processing element can be delivered from cache memory in a computational and time-efficient manner.

To summarize, implementation of a complex computational task, according to the present invention, involves the design and production of a single integrated circuit that embodies a problem-specific computational engine. The computational engine includes a micro-processor-controller that provides high-level control of processing within the integrated circuit, but also provides a large number of parallel, pipelined processing elements that carry out the bulk of the computational process. The processing elements operate in parallel to provide very high computational bandwidth, and are provided, by an object bus and by inter-processing-element data paths, data in units of objects, such as macroblocks and macroblock partitions, that are the natural objects on which the processing elements operate. High-frequency timing in processing elements is provided by a system clock, but lower-frequency high-level-computational-step control is provided by a micro-processor-controller, in turn providing flexibility in the overall timing of the assembly-like processing of computational tasks to increase the efficiency and throughput of the computational engine.

Figure 28:
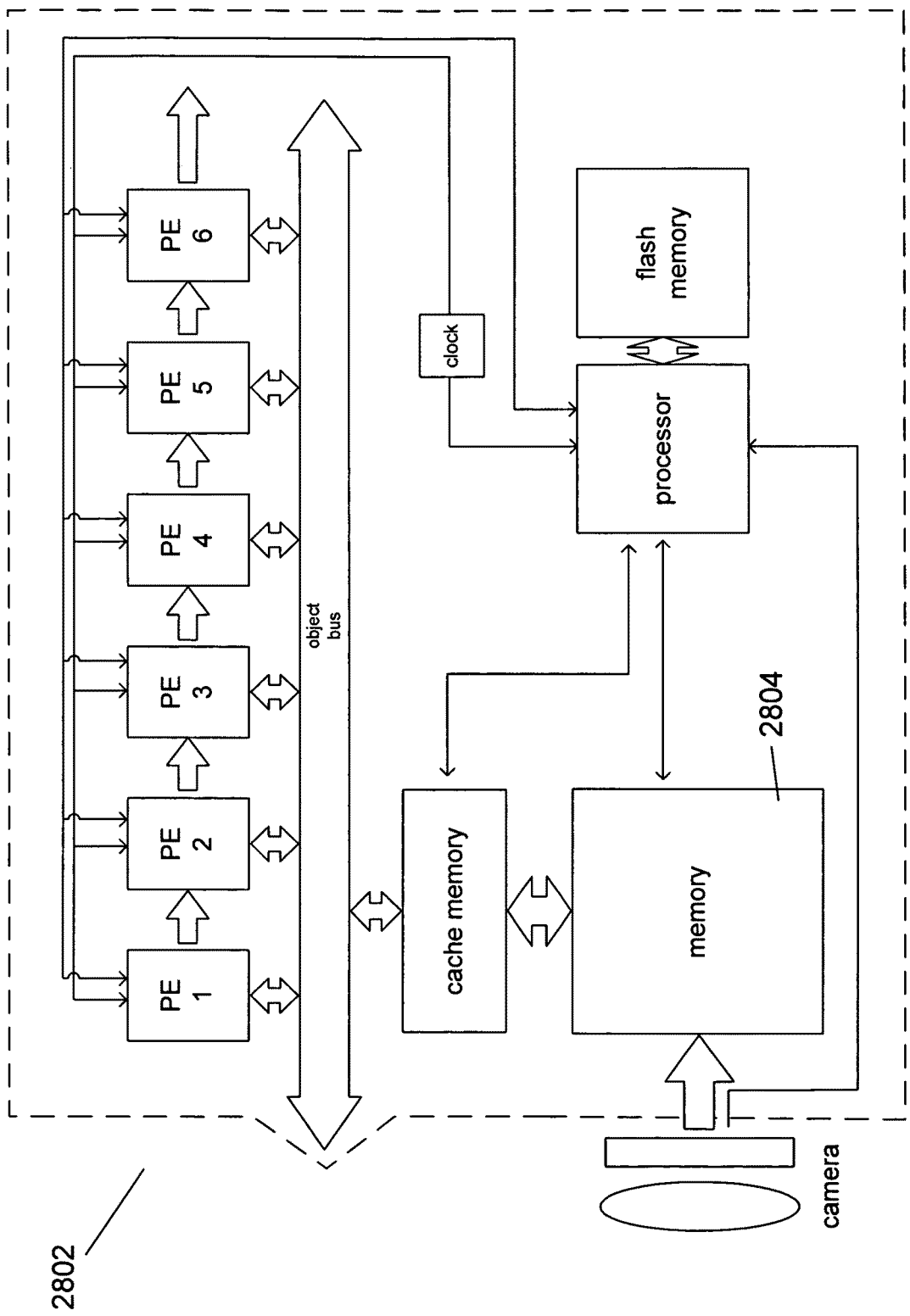
FIG. 28 illustrates an embodiment of the present invention in which the integrated circuit 2802 includes the memory 2804, which was external in the embodiment illustrated in FIG. 27.
Figure 29:
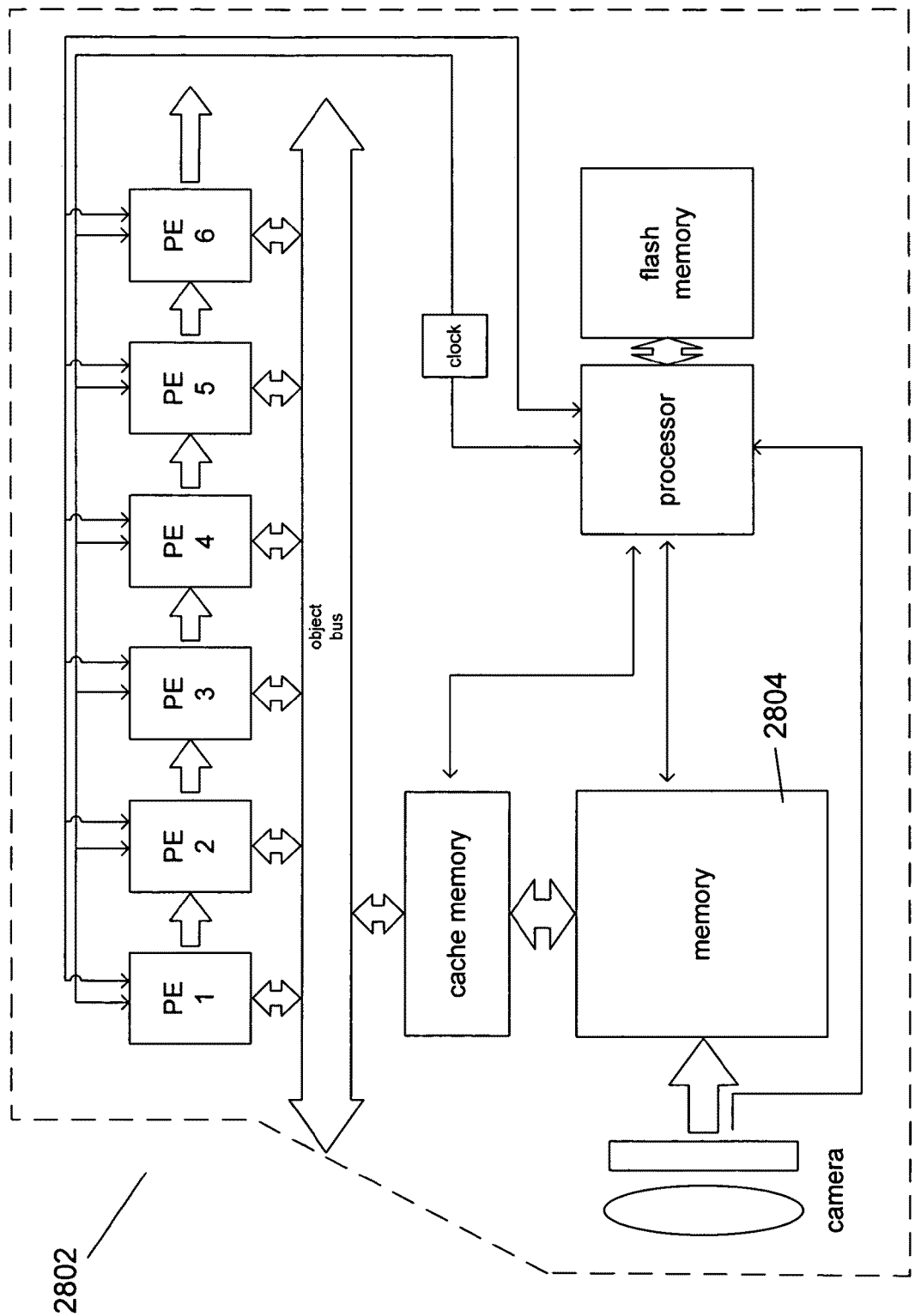
FIG. 29 illustrates an alternative embodiment of the present invention in which the digital video camera is included in a integrated-circuit implementation of a combined video camera and video codec.

Alternative embodiments of the video codec are shown in FIGS. 28 and 29. FIG. 28 illustrates an embodiment of the present invention in which the integrated circuit 2802 includes the memory 2804, which was external in the embodiment illustrated in FIG. 27. FIG. 29 illustrates an alternative embodiment of the present invention in which the digital video camera is included in a single-integrated-circuit implementation of a combined video camera and video codec.

Figure 30:
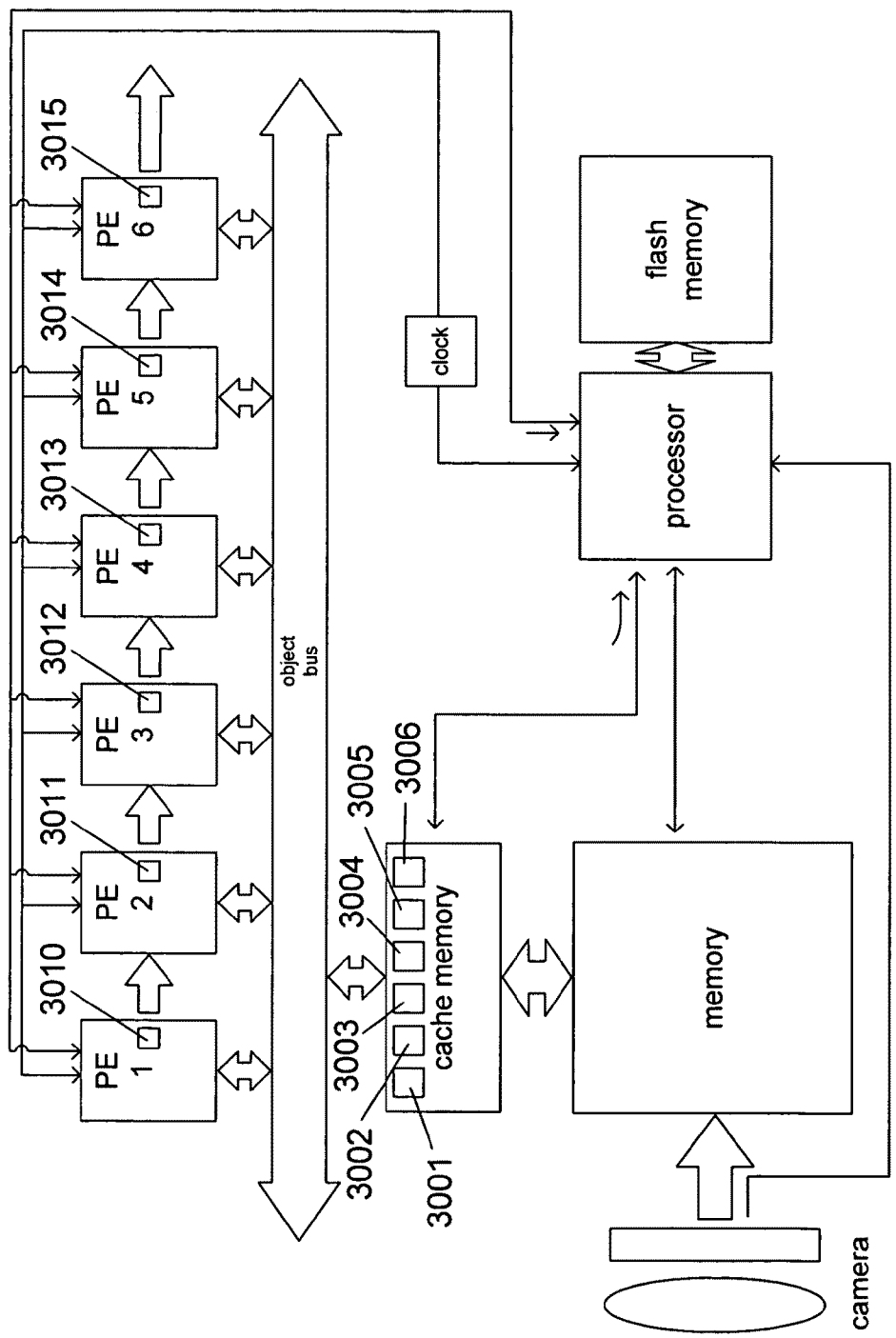
FIGS. 30-32 illustrate the overall timing and data flow within the integrated-circuit implementation of the video codec according to the present invention.
Figure 31:
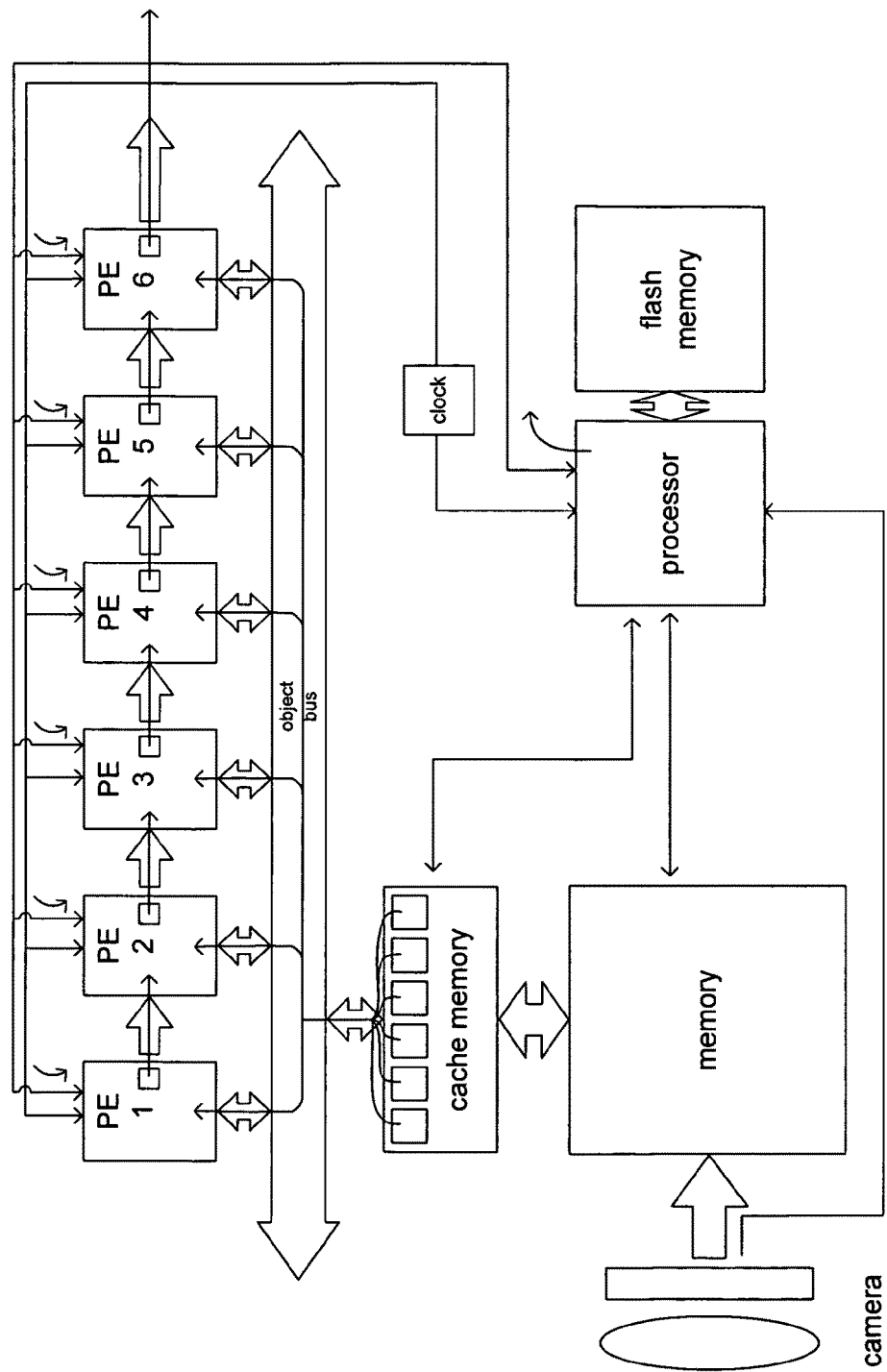
Figure 32:
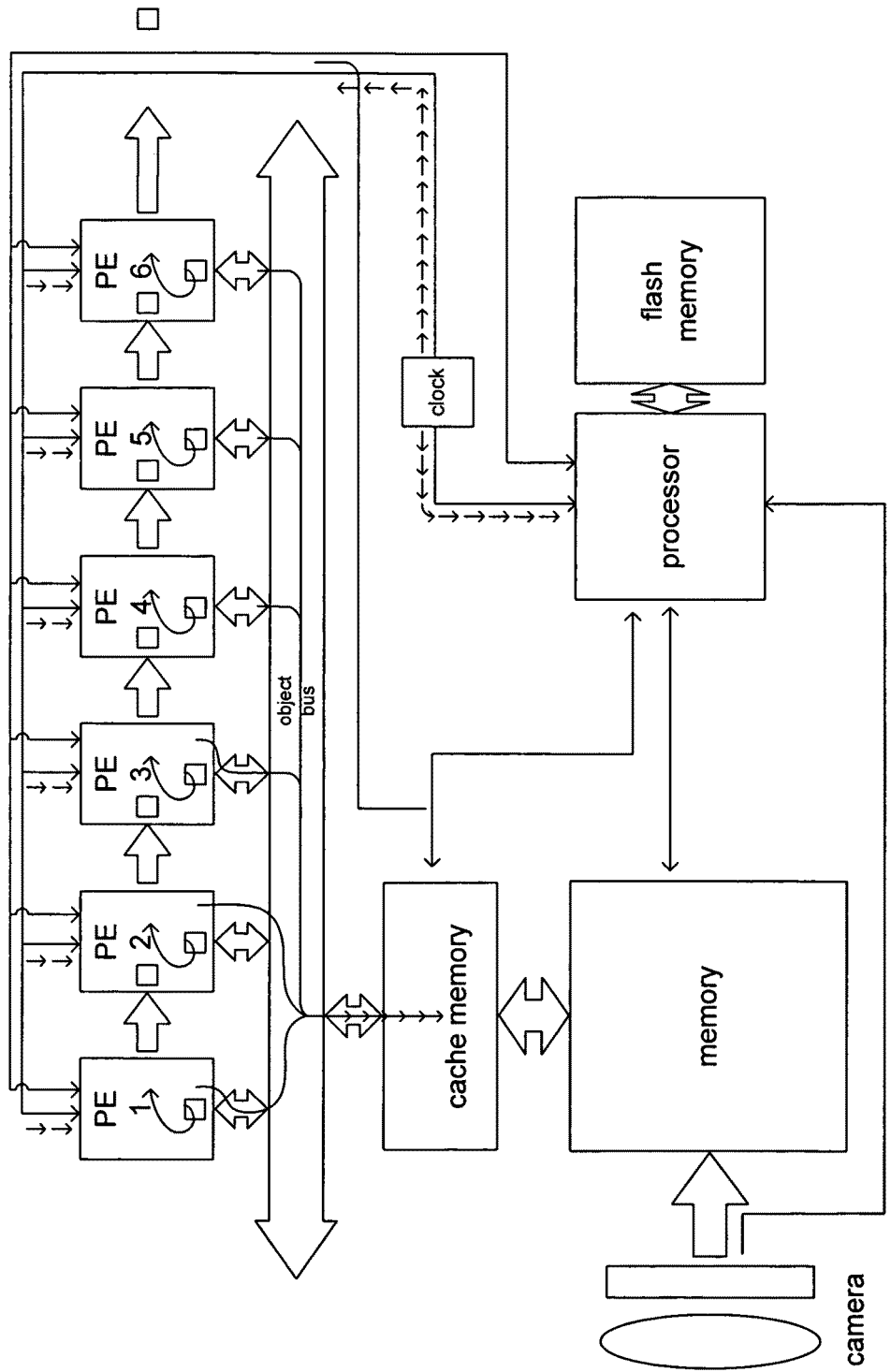

FIGS. 30-32 illustrate the overall timing and data flow within the single-integrated-circuit implementation of the video codec according to the present invention. At the completion of a preceding step, the micro-processor-controller checks the processing entities, cache memory, and, if necessary, memory to ensure that all of the data objects that are necessary for carrying out the next high-level computational step are available for transfer to the processing elements that need these data objects. Thus, the micro-processor-controller checks to make sure that data objects are available, and, when necessary, facilitates marshalling of data objects 3001-3005 in cache memory for access by processing elements in the next high-level computational step, and checks that each processing element has produced, and is currently storing, any data that need to be furnished to another processing element for the next high-level computational step.

Note that, here again, micro-processor-controller control provides a flexibility in the overall control of the integrated circuit. In many cases, whether or not a particular data object or objects needs to be ready for transfer, in the next step, depends on the position of the step in a sequence of steps in the overall video-encoding task. As one example, the initial macroblocks of an initial reference frame of a video stream are first processed by the first processing element, which has no results to provide to subsequent processing elements. As another example, reference frames within a video stream are not processed for inter prediction. Thus, in any given low-frequency timing interval, the data objects necessary for processing a subsequent high-level computational step may vary, in a context-dependent fashion. Moreover, in certain high-level computational steps, one or more of the processing elements may not be active. Embodying complexities of context-dependent and time-varying control within the processing elements themselves would require undesirably complex processing-element implementations. However, by providing the higher levels of control through an instruction-executing micro-processor-controller, the many levels of decision and time-dependent and context-dependent variations in control can be implemented in firmware, rather than in highly complex logic circuits.

In this example, once all the data objects are available for the next processing step, and all the processing elements are poised to begin executing the next step, the micro-processor-controller, as shown in FIG. 31, generates a start signal to launch processing of the next step by all of the processing elements. As shown in FIG. 31, the data objects are transferred to the processing elements that need them at the beginning of the next step. Then, as shown in FIG. 32, the processing elements carry out their respective tasks, generating output for the following step and making requests, to cache memory, for data objects that will be needed in the following step. At the completion of processing of the current high-level computational step, illustrated in FIG. 32, the state shown in FIG. 30 is reached, and the processing elements are then poised for launching of the following processing step. Again, it should be emphasized that, during each low-frequency time interval, each processing element is carrying out its computational task on a different data object than the data objects being processed by the other processing elements. For example, while one residual macroblock is being transformed by the integer transform, another macroblock is being analyzed for inter or intra prediction.

To summarize, the high-level conceptual components of a computational engine that represents one embodiment of the present invention include: (1) a problem decomposition that leads to stepwise processing of reasonably sized computational objects, each computational object having bounded dependencies on additional data, already processed computational objects, and subsequently processed computational objects, and each computational object essentially comprising a data-structure value, such as the values of elements of one-dimensional, two-dimensional, or higher-dimensional arrays or the values of fields in multi-field records or structures; (2) an assembly-line-like series of processing elements, each of which carries out a high-level step of stepwise processing of the computational objects, that execute in parallel on different computational objects; (3) an on-board object cache that buffers sufficient computational objects so that relevant data and objects for processing a computational object along the series of processing elements can be initially loaded into the object cache from memory, without repeated access to memory during stepwise processing of the computational object; (4) an object bus that allows processing elements to access objects, in object-level-access transactions, stored in the object cache; (5) a lower-frequency clock cycle for control of stepwise processing and one or more higher-frequency clock cycles for small-granularity control of computation of steps by processing elements; (6) a micro-processor controller or other control subcomponent for coordinating and synchronizing high-level step execution by the processing elements; and (7) an object-memory controller for loading objects into the object cache from memory and for storing objects in the object cache into memory.

For certain problem domains, a single-integrated-circuit implementation of a computational engine provides advantages in manufacturing, chip packaging, device footprint, power consumption, computing latencies, and other such advantages. For other problem domains, an over-all computational engine may be implemented as two or more separate computational engines, with the problem domain partitioned into higher-level sub-domains, each of which is carried out by a separate computational engine The sub-domains are further partitioned into tasks, each of which is carried out by a processing element within a computational engine. This approach may also provide manufacturing advantages, as well as for increased modularity. For certain additional types of problem domains, a single-integrated-circuit implementation of a computational engine may be combined with additional integrated circuits to implement a device, in order to, for example, make use of already developed integrated circuits.

In the specific example of an H.264 compression-and-decompression computational engine representing one embodiment of the present invention, computational objects include macroblocks and macroblock partitions, as discussed above with reference to FIG. 6, motion vectors, as discussed above with reference to FIG. 12, and various data and parameter objects that describe the video-stream context of macroblocks and macroblock partitions. Processing elements include an inter-prediction processing element, an intra-prediction processing element, a motion-estimation processing element, a direct-integer-transform processing element, an inverse-integer-transform processing element, a quantization-and-scaling processing element, a dequantization-and-descaling processing element, an entropy-encoding processing element, and an entropy-decoding processing element. The object cache stores the above-mentioned types of objects, including macroblocks and macroblock partitions. The object bus transfers macroblocks and macroblock partitions between processing elements and the object cache, relieving processing elements of needing to carry out byte-oriented or word-oriented communications protocols to access computational objects. A low-frequency clock cycle generally controls stepwise macroblock processing by the assembly-line-like series of processing elements, and higher frequency clock cycles control computational processing by processing elements. A micro-processor controller carries out over-all control and synchronization of stepwise macroblock processing, ensuring that necessary objects are available for each processing element for execution of a next processing step before launching the next processing step in the processing elements. Finally, a memory controller operates to exchange computational objects, including macroblocks and macroblock partitions, between a large-capacity random-access memory and the object cache.

Subsection III: An H.264 Video Codec Implemented as a Single Integrated Circuit According to One Embodiment of the Present Invention In this final subsection, a specific example of a computational engine that represents one embodiment of the present invention is discussed. Again, it is emphasized that embodiments of the present invention may be designed and implemented to carry out any of a large number of different computational tasks, including image-processing tasks, 3-dimensional-media compression and decompression, various types of computational filtering, pattern matching, and neural-network implementations. The discussion of the H.264 video codec computational engine that follows is intended to provide a detailed illustration of one example of the present invention, but is not intended to limit the scope of the following claims to computational engines designed to carry out H.264 video compression and/or decompression, to video applications in general, or to any other specific problem domain. This specific implementation is a single-integrated-circuit implementation of a video codec. Alternative embodiments may employ a multi-computational-engine approach, or may combine a single-integrated-circuit computational engine with additional integrated circuits.

Figure 33A:
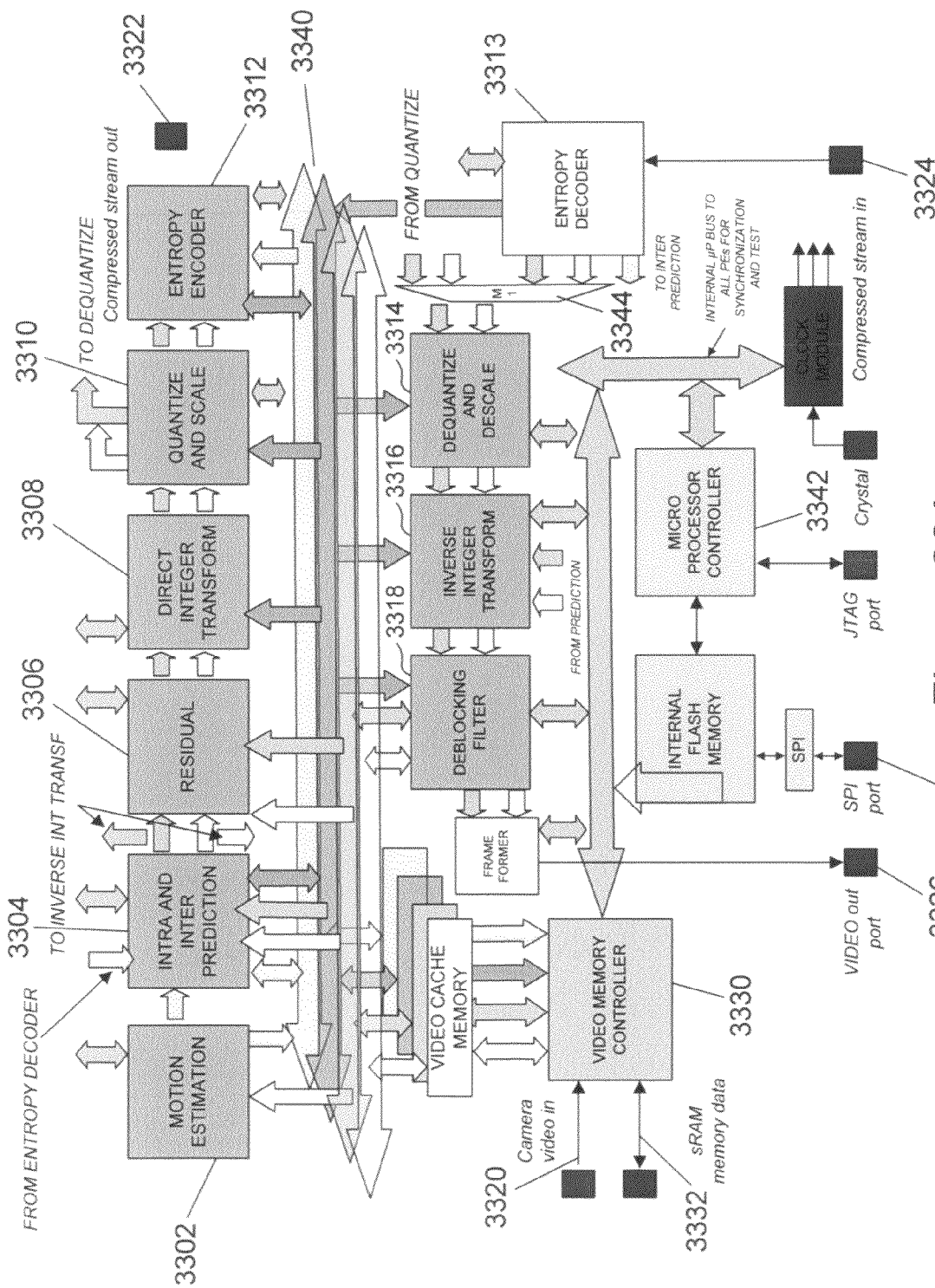
FIGS. 33A-B provide a block-diagram illustration of a single-integrated-circuit implementation of a video codec according to the present invention.
Figure 33B:
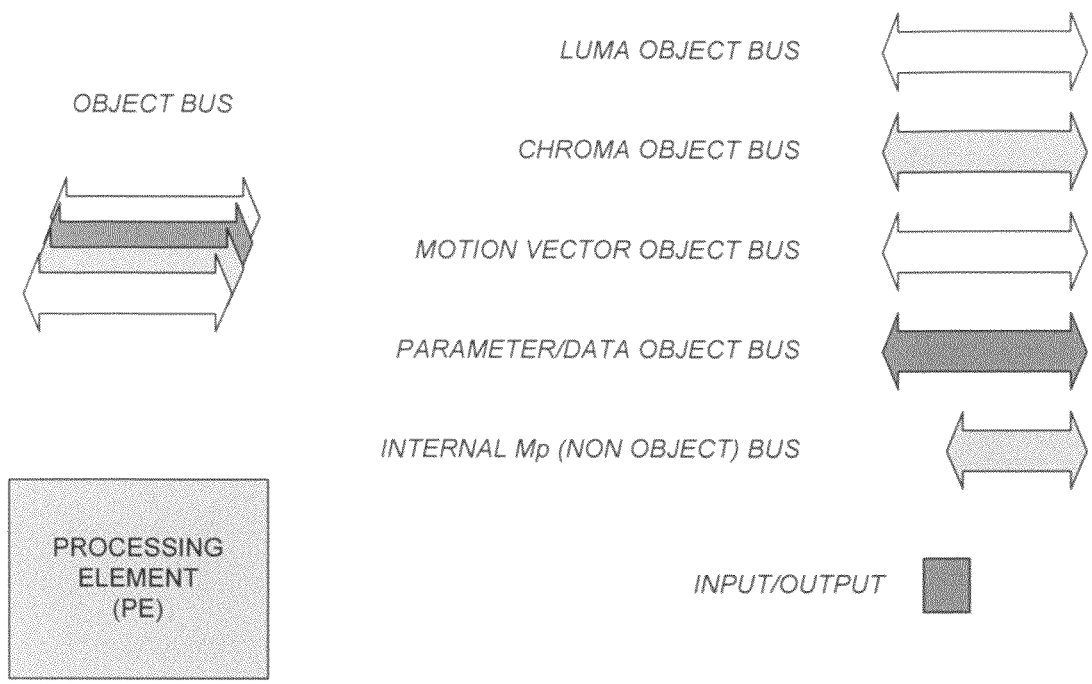

FIGS. 33A-B provide a block-diagram illustration of a single-integrated-circuit implementation of a video codec according to the present invention. Much of the diagram provided in FIG. 33A is essentially self-describing, in view of the above discussion with reference to FIGS. 27-32 and FIGS. 23-24. The single-integrated-circuit implementation of the video codec includes separate processing elements for motion estimation 3302, intra and inter prediction 3304, residual-block calculation 3306, the direct integer transform 3308, quantizing and scaling 3310, entropy encoding 3312, entropy decoding 3313, de-quantizing and de-scaling 3314, the inverse integer transform 3316, and the de-blocking filter 3318. Processing element 3302 corresponds to block 2306 in FIG. 23, processing element 3304 corresponds to blocks 2306 and 2314 in FIG. 23, processing element 3306 corresponds to operation 2310 in FIG. 23, processing element 3308 corresponds to block 2316 in FIG. 23, processing element 3310 corresponds to block 2318 in FIG. 23, processing elements 3312 and 3313 correspond to block 2322 in FIG. 23, processing element 3314 corresponds to block 2326 in FIG. 23, processing element 3316 corresponds to block 2328 in FIG. 23, and processing element 3318 corresponds to block 2336 in FIG. 23. Note that the video codec, as described with reference to FIG. 5, can receive raw video data 3320 from a video camera and produce compressed video data 3322 as output or can receive compressed video data 3324 as input and produce raw video data 3326 as output. The re-order block 2320 in FIG. 23 may be incorporated in either processing elements 3310 and 3314 of the video codec implementation or in processing elements 3312 and 3313. Note also that a video-memory controller 3330 is responsible, in the single-integrated-circuit implementation, for directing input video data to the external memory 3332 and for exchanging data objects between video-cache memory, the external memory, and the object bus 3340. FIG. 33B provides a key for FIG. 33A. Note that the object bus 3340 can be considered to comprise a separate luma-object bus, chroma-object bus, motion-vector-object bus, parameter/data-object bus, and an internal microprocessor-controller bus.

FIG. 33A provides detail on the inputs and outputs of each processing element in one embodiment of the present invention, and thus the interaction of each processing element with the object bus, video-cache memory, and the video-memory controller. The video-memory controller 3330 routes video data from the camera to external memory. The microprocessor controller 3342 makes memory requests on behalf of processing elements to the video-memory controller, which is satisfied by the video-memory controller by accessing requested data objects from external memory and storing the requested data objects in video-cache memory. Thus, much of the computational overhead associated with partitioning of the video data signal into frames, macroblocks, and macroblock partitions is carried out within the video-memory controller, another aspect of the massive parallel processing provided by the single-integrated-circuit implementation of the video codec.

The multiplexer 3344 provides a path from the quantizer processing element 3310 to the de-quantizer and de-scale processing element 3314, during video compression, and a path from the entropy decoder 3313 to the de-quantizer and de-scale processing element 3314 during video decompression. Motion-estimation processing element 3302 operates on luma macroblocks and macroblock partitions, while the remaining processing elements operate on both luma and chroma macroblocks and/or macroblock partitions. The SPI port 3350 in FIG. 33A is a serial-parallel interface that permits writing and/or reading of the flash memory through SPI interface signals.

Figure 34:
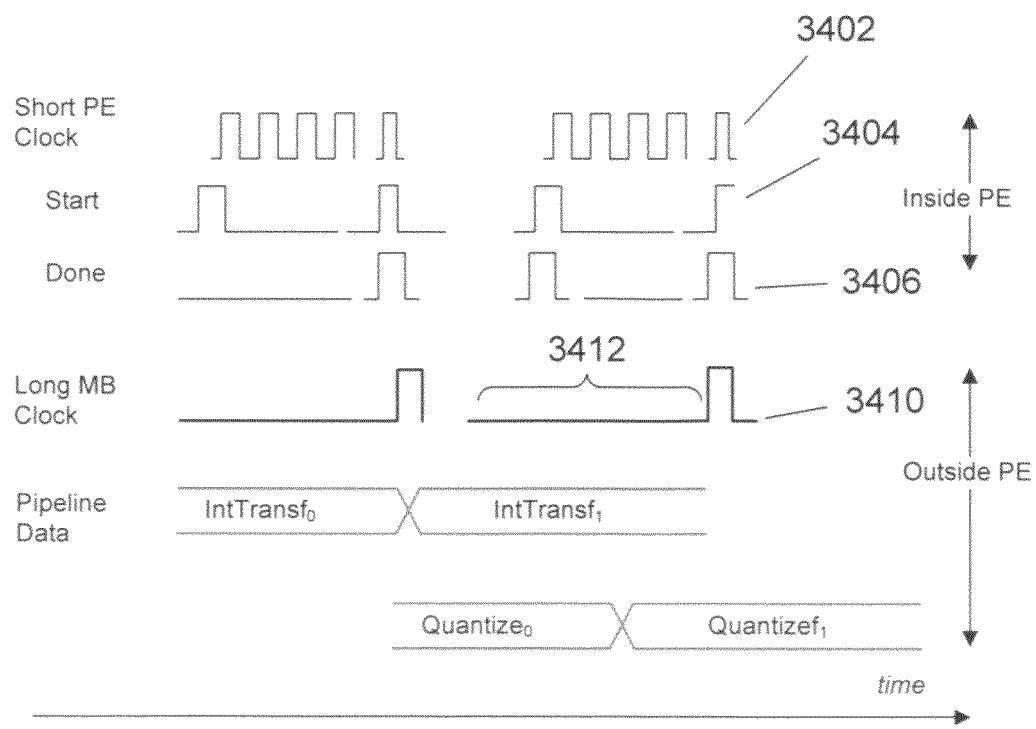
FIG. 34 illustrates the overall system timing and synchronization of the single-integrated-circuit implementation of a video codec according to the present invention.

FIG. 34 illustrates the overall system timing and synchronization of the single-integrated-circuit implementation of a video codec according to one embodiment of the present invention. As discuss above, a short-interval clock-pulse signal 3402 controls execution steps within a processing element during processing of each overall step in the assembly-line-like processing of macroblocks and macroblock partitions. As discussed above, the processing elements begin execution of the next high-level computational step upon receipt of a start signal 3404 from the microprocessor controller and produce a done-signal pulse 3406 upon completion of each high-level computational step. As discussed above, a long-interval clock-pulse signal 3410 generally controls the high-level step-by-step pipelined processing of macroblocks and macroblock partitions along the assembly line of processing elements via the micro-processor controller. In general, during each low-frequency interval 3412, a next overall step in processing is carried out by each processing element. However, as also discussed above, in certain cases, the next processing step may not start on the low-to-high transition of the low-frequency clock signal in the case that a processing element has failed to finish its task, since processing elements begin processing each high-level computational step upon receiving a start signal from the processor.

FIG. 35 provides a table showing examples of various types of objects that may be transferred from video cache memory along the object bus to processing elements in the single-integrated-circuit implementation of a video codec according to the present invention. The table shows two main classes of objects: (1) video objects 3502; and (2) data objects 3504. Video objects include macroblocks and macroblock partitions from both luma and chroma planes, as discussed above with reference to FIG. 3, as well as motion-vector objects, as discussed above with reference to FIG. 12. The data objects include various types of information regarding the current context of a currently processed macroblock or macroblock partition, the slice to which the macroblock or macroblock partition belongs, the nature of the frame in which the macroblock or macroblock partition is included, and other such information. The objects may also contain parametric information, such as the quantization parameter, discussed above with reference to FIG. 19. Computational bandwidth is significantly increased by employing the object bus 3340, which is tailored to providing the objects needed by processing elements as discrete objects, rather than requiring processing elements to carry out a byte-based or word-based protocol for accessing data objects from memory cache and memory. A wide data-object bus provides extremely high internal data-transfer rates within the integrated circuit.

Figure 36A:
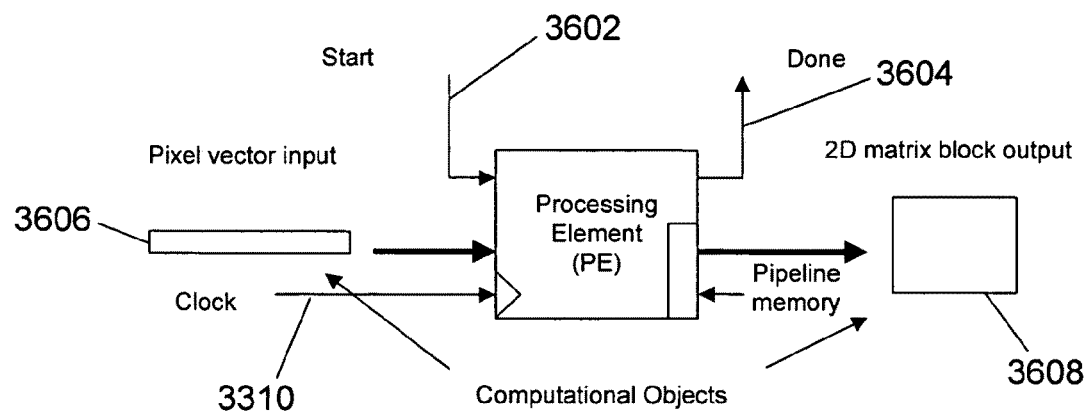
FIGS. 36A-B illustrate, at an abstract level, operation of a processing element within the video-codec single-integrated-circuit implementation that represents one embodiment of the present invention.
Figure 36B:
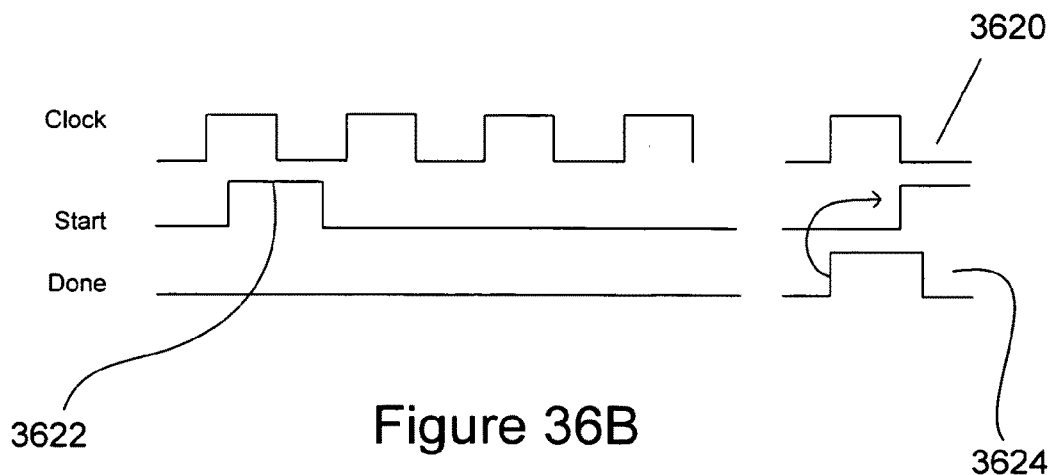

FIGS. 36A-B illustrate, at an abstract level, operation of a processing element within the video-codec integrated-circuit implementation that represents one embodiment of the present invention. As discussed above, a processing element receives a start pulse 3602 from the microprocessor controller and outputs a done pulse 3604 to the microprocessor controller, for overall synchronization of the low-frequency high-level-step processing cycle. The processing element receives one or more objects and other data 3606 from a previous processing element in the pipeline and/or the object bus and outputs one or more objects and/or other data 3608 to a next processing element in the processing-element pipeline and/or the object bus. Of course, the first processing element in the pipeline does not receive objects from preceding processing elements, and the last processing element in the pipeline produces output from the integrated-circuit implementation of the video codec, rather than outputting an object or other data to a processing element. As discussed above, a processing element receives a high-frequency clock-pulse signal for controlling the logic circuitry within the processing element to carry out complex computational tasks. Note that processing elements communicate data and results along the pipeline through pipeline memory, which is distinct from the object bus.

FIG. 36B illustrates a synchronization and timing control of processing elements. As discussed above, processing elements carry out computational tasks according to a high-frequency clock signal 3620. A task begins upon reception of a start-signal pulse 3622 and the processing element announces completion of a task through a done-signal pulse 3624.

Figure 37:
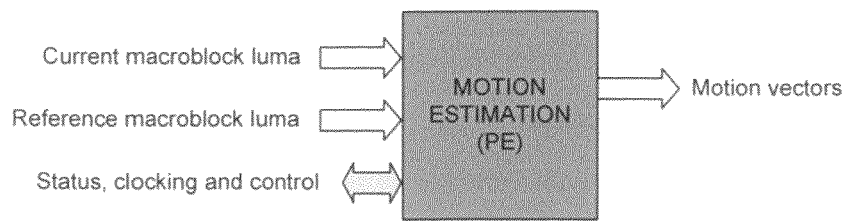
FIG. 37 illustrates the motion-estimation processing element that represents one embodiment of the present invention.

FIG. 37 illustrates the motion-estimation processing element that represents one embodiment of the present invention. The motion-estimation processing element receives a luma object corresponding to the current macroblock, as input, plus one or more luma objects that represent reference macroblocks from a reference frame stored in memory. The motion-estimation processing element produces motion-vector objects, as output.

Figure 38:
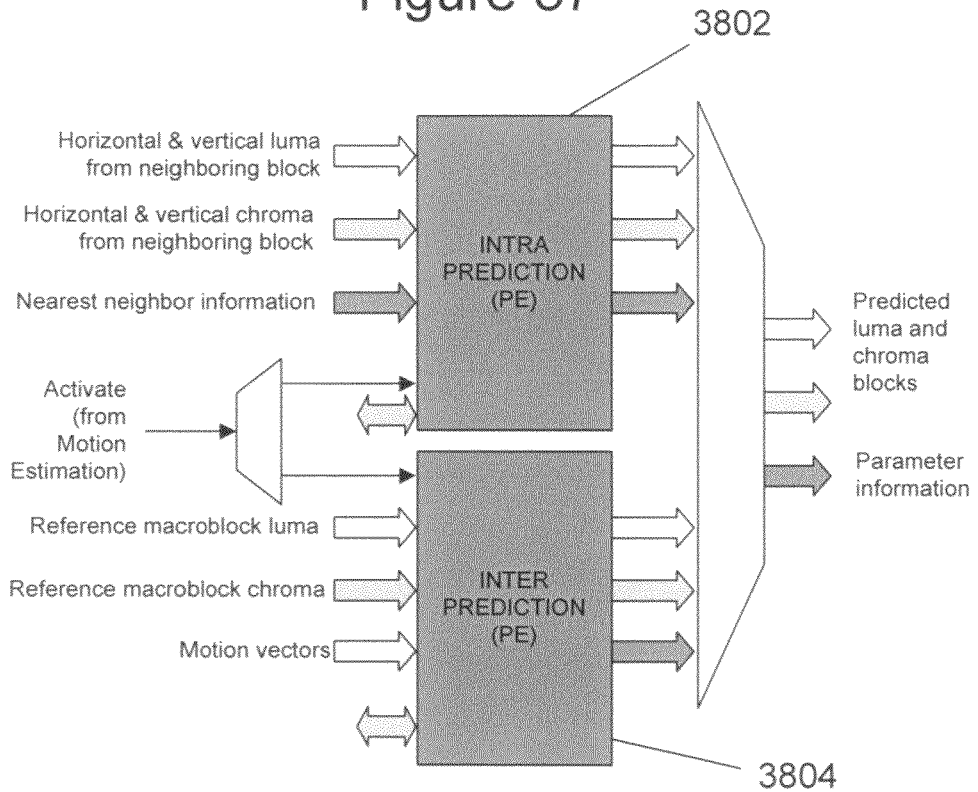
FIG. 38 illustrates the intra-prediction and inter-prediction processing element, which comprises a pair of processing elements and which represents one embodiment of the present invention.

FIG. 38 illustrates the intra-prediction and inter-prediction processing element, which comprises a pair of processing elements and which represents one embodiment of the present invention. The intra-prediction processing element 3802 receives luma and chroma horizontal and vertical pixel vectors from neighboring blocks as well as data describing the nearest-neighbor blocks and produces, as output, one of the four 16×16 intra-prediction modes or nine 4×4 intra-prediction modes for either an entire macroblock or for 16 4×4 macroblock partitions, respectively. One of four chroma-intra-prediction modes is produced for each chroma macroblock. As with inter prediction, the intra-prediction processing element chooses the mode that provides the best estimation of the currently considered macroblock. Depending on the level of compression complexity implemented by the video codec, a macroblock may be partitioned in many different ways, as discussed with reference to FIG. 6, in order to find a particular partitioning that provides the most effective prediction. The inter-prediction processing element 3804 receives reference macroblocks, both luma macroblocks and chroma macroblocks, and motion vectors, and generates a predicted macroblock or macroblock partition as output.

The two-processing-element implementation of the intra- and-inter-prediction processing element (3304 in FIG. 33A) illustrates one design parameter. The number and complexity of processing elements may vary, depending on many different design considerations, as well as the complexity of the task carried out by the processing element. For example, when very high-bandwidth implementations are needed, it may be necessary to implement any particular task as a number of parallel processing elements, Within the processing-element pipeline. In lower-bandwidth implementations, these parallel processing elements may be combined together in a single processing element. Another important point is revealed in the implementation of the intra-and-inter-prediction processing element. As discussed above, there are various levels of compression and decompression encompassed by the overall H.264 standard. Higher levels provide better compression, but at the expense of greater computational complexity. A particular single-integrated-circuit implementation of a video codec may implement higher levels of the standard as well as intermediate and lower levels, and actual operation may be controlled by parameters input to the single-integrated circuit and stored in flash memory. Thus, a single integrated-circuit implementation may provide for flexible operation according to multiple parameters.

Figure 39:
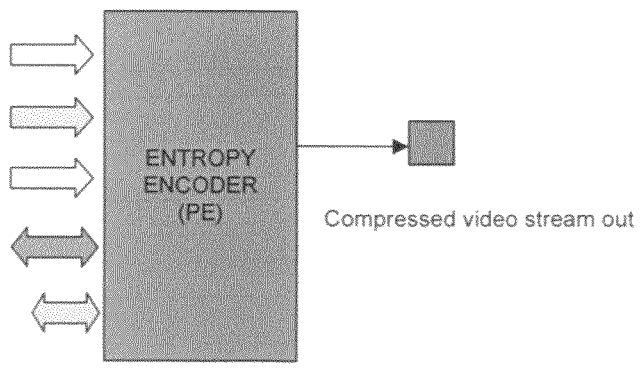
FIG. 39 shows a block diagram of the entropy-encoded processing element that represents one embodiment of the present invention.

FIG. 39 shows a block diagram of the entropy-encoded processing element that represents one embodiment of the present invention. This processing element receives luma, chroma, and motion-vector objects as well as various types of data objects, and applies various different entropy-encoding schemes, as discussed above, to produce the final encoded output packaged into NAL data units.

Figure 40:
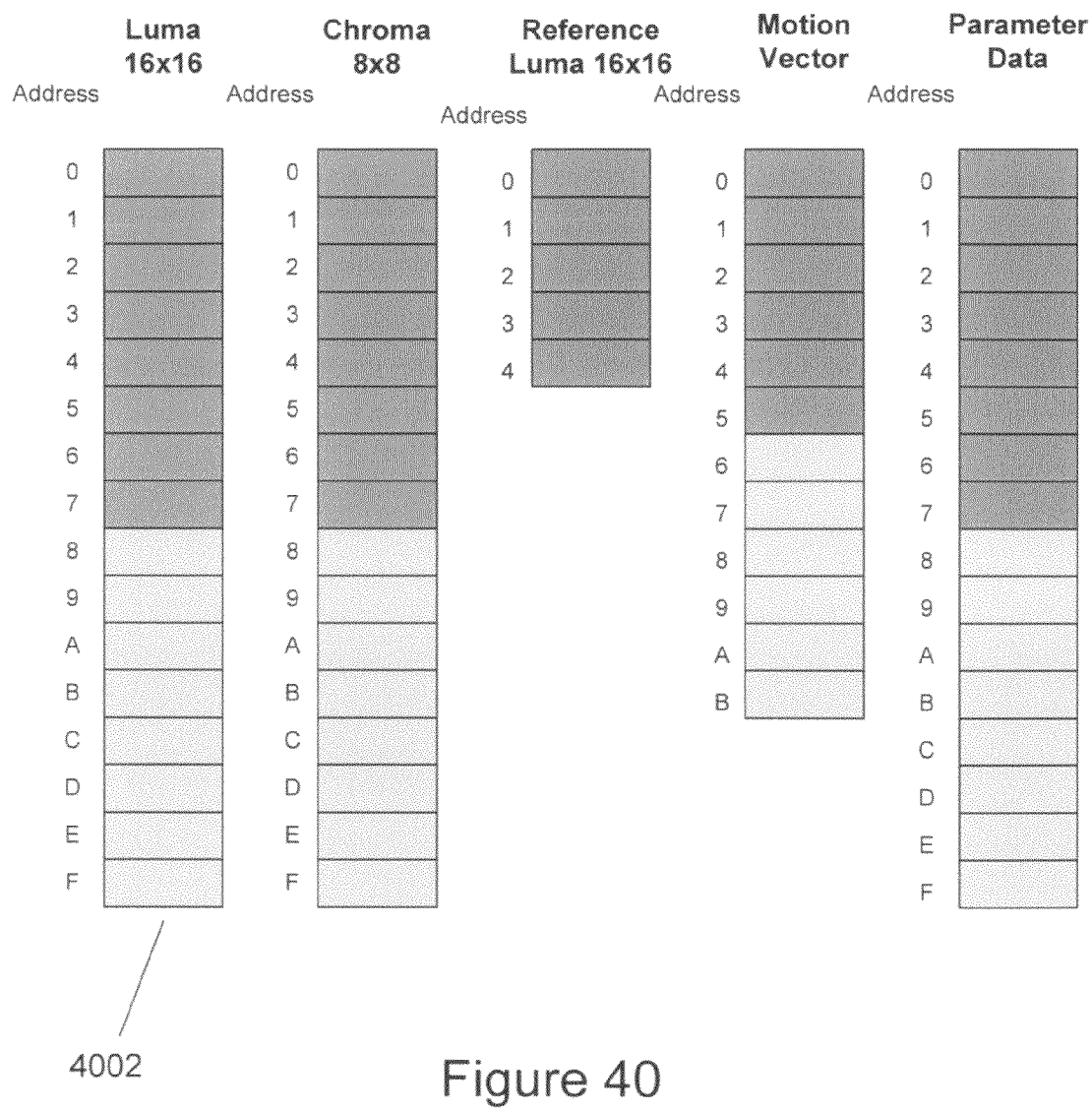
FIG. 40 illustrates one example of the storage needs for video cache memory in the video codec implementation illustrated in FIG. 33A.

FIG. 40 illustrates one example of the storage needs for video cache memory in the video codec implementation illustrated in FIG. 33A. In one embodiment, the video-cache memory contains sufficient macroblocks, macroblock partitions, and motion-vector objects so that a given object need not be exchanged between video-cache memory and external memory during a sequence of operations carried out as sequential steps starting from the first processing element and proceeding to the last processing element. The various types of objects are stored in circular queues within the video-cache memory, with many of the queues partitioned to contain currently considered macroblock information, in one partition, and neighboring-macroblock information, in the other partition. Thus, for example, the video-cache memory includes a circular queue 4002 containing 16 luma macroblocks, partitioned into two partitions of eight macroblocks each.

Figure 41:
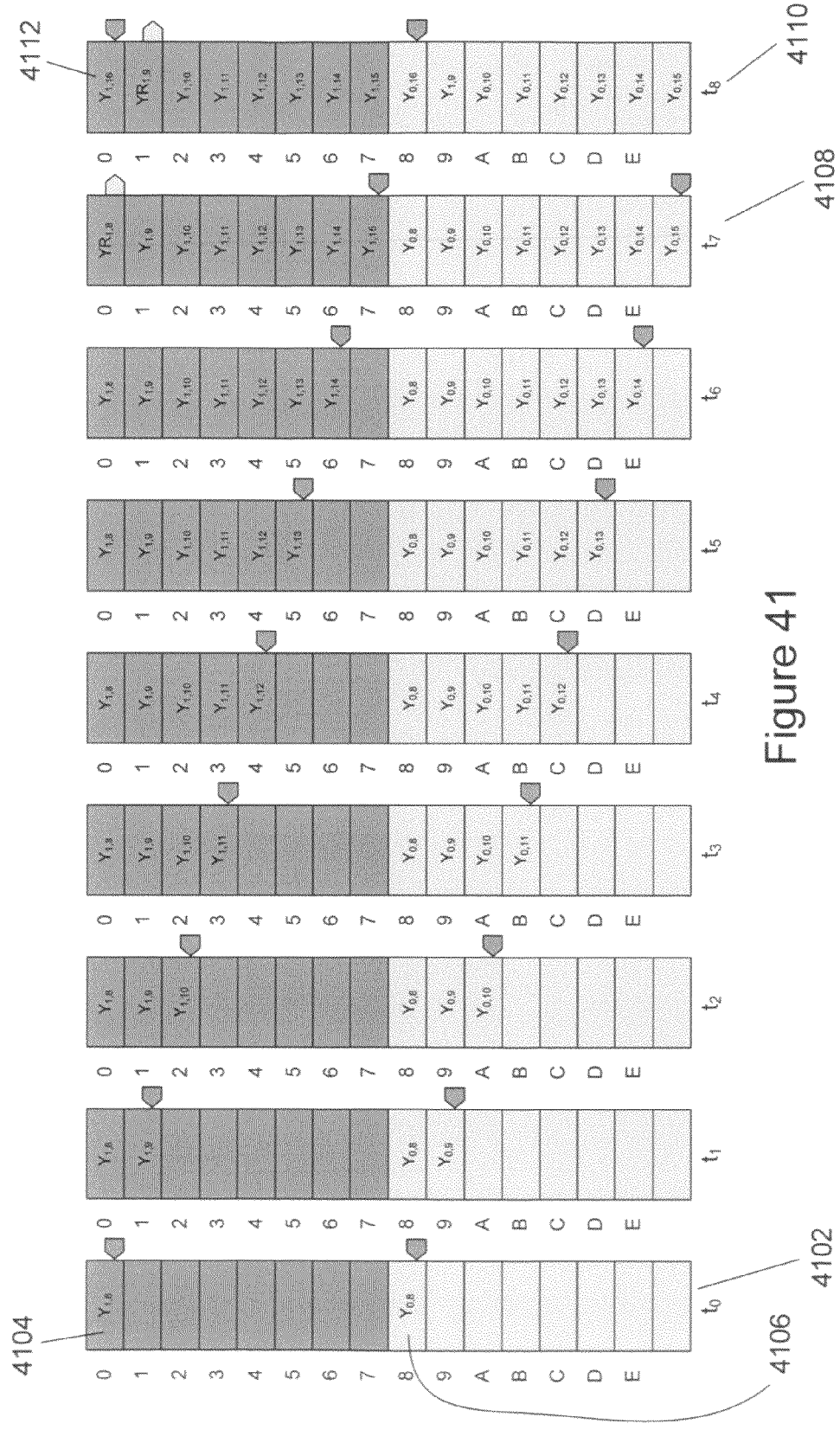
FIG. 41 illustrates operation of the luma-macroblock circular queue (4002 in FIG. 40) during nine high-level processing cycles.

FIG. 41 illustrates operation of the luma-macroblock circular queue (4002 in FIG. 40) during nine high-level computational-step intervals. During time interval to 4102, a next raw-video-data luma macroblock is input into slot 0 4104 and a corresponding neighbor reference macroblock from a reconstructed frame is placed into slot 8 4106. During each successive time interval, additional raw-data macroblocks and reference macroblocks are input into successive slots within the circular queue. The contents of the macroblock in slot 0 4104 changes progressively, over the time intervals, as it is accessed and modified by subsequent processing elements. Finally, during interval $t_7$ 4108, the contents of the macroblock are encoded and output by the final processing element so that, during interval $t_8$ 4110, a new raw-data macroblock can be placed into slot 0 4112. Thus, a circular queue contains macroblock data video-cache memory for assembly-like processing by all the processing elements, and then replaces the macroblock with a new raw-data macroblock and reference macroblocks after a final processing element has consumed the macroblock. During each low-frequency timing-signal time interval, all encoding or decoding steps are carried, but each processing element carries out its task on a different macroblock or macroblock partition during a low-frequency timing-signal time interval.

Figure 42:
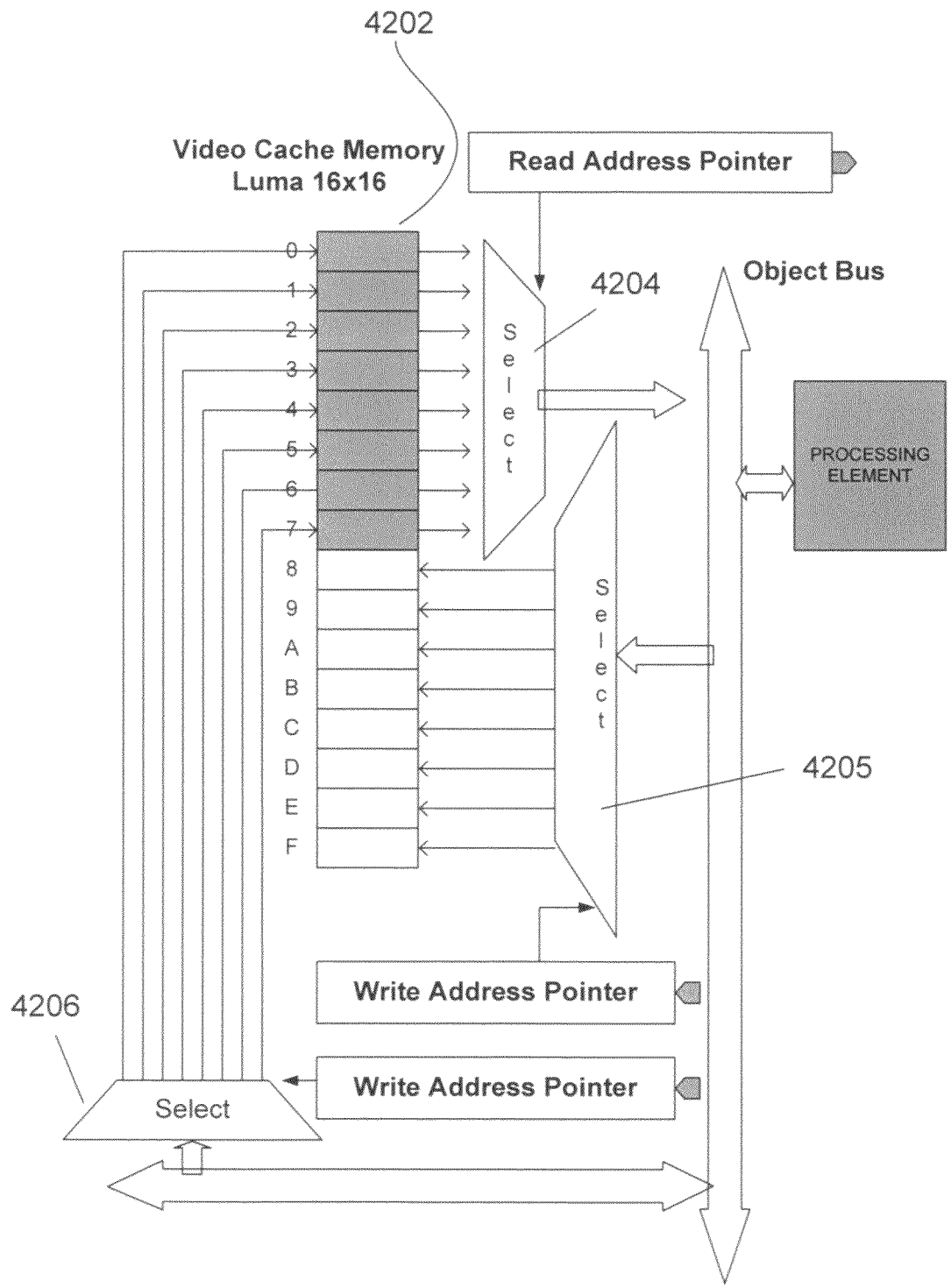
FIG. 42 illustrates implementation of the video-cache controller of a video codec that represents one embodiment of the present invention.

FIG. 42 illustrates implementation of the video-cache controller of a video codec that represents one embodiment of the present invention. Video-cache memory 4202 is accessed via multiplexers 4204-4206 controlled by circular-buffer read-and-write address pointers. Thus, each processing element may store a different read-and-write address pointer, at a given point in time, from other processing elements so that each processing element accesses the appropriate slot in the circular queue. As blocks progress through the pipeline of processing elements, the read address pointer and write address pointer associated with a block is incremented, from processing element to processing element, to ensure that the processing elements access the appropriate slots within the circular queues without requiring the data to be internally transferred within the video-cache memory for transfer between the video-cache memory and external memory.

FIG. 43 provides a table that indicates the overall computational processing carried out by each of certain of the processing elements of a video codec that represents one embodiment of the present invention. From this table, the magnitude of computational bandwidth provided by massive parallel processing within the single-integrated-circuit implementation of the video codec according to one embodiment of the present invention can be appreciated. In order to implement a computational engine and software that would provide equivalent computational bandwidth, the processor executing the software would need to operate at a fantastic speed, far above clock speeds supported by currently available processors.

One popular integrated-circuit design language is the Very-High-Speed-Integrated-Circuit Hardware Description Language ("VHDL"). FIGS. 44A-E provide high-level VHDL definitions of the various processing elements in the single-integrated-circuit implementation of a video codec, according to one embodiment of the present invention, as shown in FIG. 33A. In FIG. 44A, definitions of various objects are first provided 4402. Then, under bold names of the various processing elements, a VHDL definition of the input and output of the processing element is provided. For example, in the lower portion of FIG. 44A, the input and outputs for the motion-estimation processing element are provided 4404. The motion-estimation processing element receives four logic-signal inputs 4406, a luma macroblock 4408, and a luma reference macroblock 4410, and produces, as output, three logic signals 4412-4414 and a motion-vector object 4416.

Subsection IV: Video-Codec Implementations that Feature Increased Integration with the Memory-Subsystem Integration According to Various Embodiments of the Present Invention In this and the following two subsections, a variety of different memory subsystems that represent embodiments of the present invention are discussed. This subsection focuses on various implementations of the single-integrated-circuit-implemented video codec, described in previous subsections, which feature increased integration fully integrated camera, video codec, and memory. The different implementations provide different characteristics that may find particular use in various different market niches and for different types of imaging systems. For example, the integrated lens, sensor, memory, and codec embodiment, discussed below, may provide efficiency and cost advantages, while the less-integrated embodiments of the present invention may provide an advantage of greater modularity and lower initial design and manufacturing costs.

Figure 45:
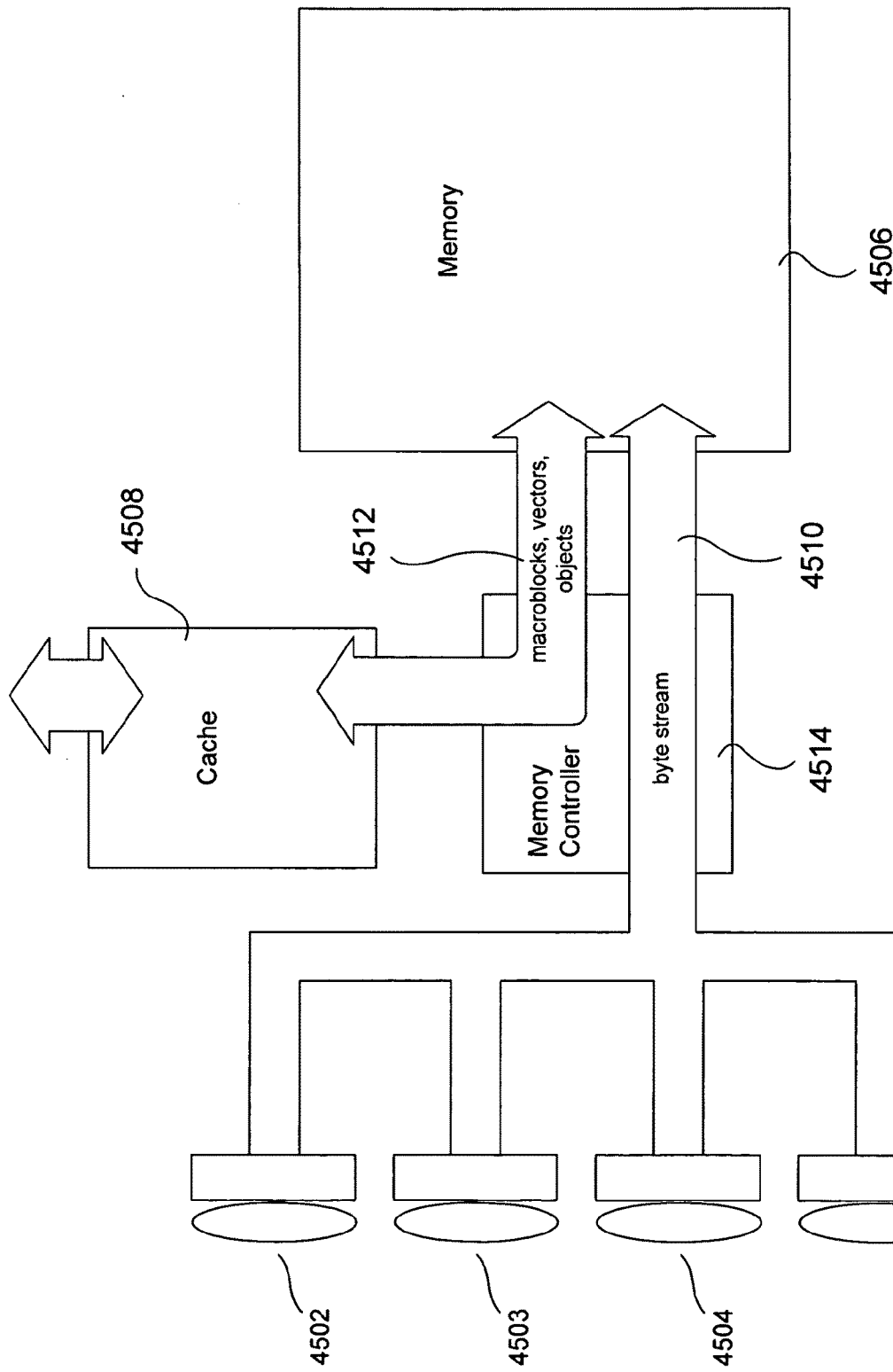
FIG. 45 illustrates components and functionalities of the memory subsystem of a video camera that represents various embodiments of the present invention.

FIG. 45 illustrates components and functionalities of the memory subsystem of a video camera that represents various embodiments of the present invention. A video-camera system may include one or more video cameras, shown in FIG. 45 as pairs of lenses and sensors 4502-4505, which transfer data, in a stream of information-encoding units, such as bytes, to an electronic memory 4506.

As discussed above, a video camera may produce a large amount of data, and may do so asynchronously with respect to other video cameras connected to the video-camera system and with respect to a video-camera-data processing subsystem, such as the previously described single-integrated-circuit video codec. The video data is stored in memory as frames, each frame, as discussed above, described by a position within a linear sequence of frames, by various video-camera parameters, including a frame width and frame height, and by a large number of data values, each encoding color and brightness information, in a generally fixed, small number of bits, for a different pixel within the frame. Single pixels, vectors of pixels, blocks of pixels, and various other data objects used by the video codec are retrieved from memory and placed into a memory cache 4508 for access by the various processing elements of a video codec, and may be returned from memory cache to memory, in altered form, during video-camera-data processing.

While the data paths 4510 from the video cameras 4502-4505 to memory 4506 are essentially unidirectional, the data path 4512 that interconnects cache 4508 with memory 4506 is bidirectional. In a number of embodiments of the present invention, a memory controller 4514 provides data formatting, data addressing, and arbitration functionalities that allow one or more video cameras 4502-4505 to concurrently and asynchronously access memory 4506 while the memory is concurrently accessed by a video codec via cache memory 4508.

FIGS. 46A-E illustrate a series of video systems that represent embodiments of the present invention and that represent a path of increasing integration between subsystems of the video systems. The first embodiment of the present invention, shown in FIG. 46A, features separate video-camera 4602, memory-bank 4604, and video-codec 4606 component subsystems, with the video codec including both the memory controller 4608 and cache memory as subcomponents. This embodiment of the present invention is discussed, at length, in preceding subsections. Advantages of this embodiment of the present invention include use of standard, off-the-shelf memory chips for the memory bank and a relatively high degree of modularity. As faster and more capable memory chips become available, the memory bank can be updated via memory-chip replacement and relatively straightforward re-parameterization of the video codec.

FIG. 46B shows a next embodiment of the present invention. In this embodiment, memory-controller functionality 4610 is incorporated directly into one or more of the memory chips 4612 of the memory bank, rather than being incorporated within the video codec. This embodiment of the present invention provides a simple interface between the video codec and the memory subsystem and, in certain embodiments, may lower the communications overhead between the video codec and the memory subsystem.

FIG. 46C illustrates a third embodiment of the present invention. In this embodiment of the present invention, video-camera data is input directly into the memory subsystem 4616, rather than through the video codec, as in the previously discussed embodiments of the present invention. The video codec is further simplified, in this embodiment, and the data-communications overhead is further decreased.

FIG. 46D illustrates a fourth embodiment of the present invention. In this embodiment of the present invention, the video codec and memory are combined together into a single integrated circuit 4618. By doing so, communications overhead is further decreased, since data traffic between the memory controller and video codec is internalized within the single integrated circuit, rather than requiring a high-speed data link or bus between the video codec and a memory subsystem.

FIG. 46E illustrates a fully integrated embodiment of the present invention. In this embodiment, shown both as viewed from above 4620 and from the side 4622, the camera is fully integrated with the memory subsystem and video codec to produce a single monolithic system. In this embodiment of the present invention, camera data is directly input into the integrated circuit, without the need for a high-speed bus or serial link connecting the camera to the integrated circuit. Furthermore, a two-dimensional or higher-dimensional memory architecture may allow two-dimensional camera data to be input directly into a corresponding, two-dimensional memory, without the need for serialization and deserialization, increasing the speed and improving the efficiency for storage of camera data into electronic memory. The final embodiment of the present invention may take advantage of many new developments in materials science, nanotechnology, and nanoelectronics, which offer much greater two-dimensional and three-dimensional memory densities. Full integration may also ameliorate numerous potential failure points and reduce subsystem-integration costs.

As mentioned above, the ordering of the various implementations illustrated in FIGS. 46A-E is not meant to suggest that one embodiment of the present invention necessarily supersedes another embodiment or is superseded by another embodiment. Each embodiment of the present invention shown in FIGS. 46A-E provides a different set of tradeoffs and balances between a variety of different costs, efficiencies, and desired characteristics. The fully integrated system, shown in FIG. 46E, may accommodate multiple cameras, but the underlying integrated circuit would generally be larger to accommodate additional cameras and may feature relatively rigid geometry constraints, although a two-camera embodiment, with the cameras rotated by several degrees with respect to one another, may provide stereo-image capture to facilitate depth determination in captured images. The first embodiment of the present invention, shown in FIG. 46A, allows for use of currently existing, off-the-shelf memory chips for relatively easy memory-subsystem update. It is expected that a variety of different families of embodiments of the present invention may be based on the various architectures shown in FIGS. 46A-E to provide a range of capabilities, costs, and tradeoffs.

Subsection V: A First Family of Memory Subsystems that Represents One Set of Embodiments of the Present Invention In a first set of embodiments of the present invention, a memory subsystem comprises a bank of off-the-shelf memory chips and a memory controller subsystem within the video codec integrated circuit, discussed above with reference to FIG. 46A, or various more highly integrated video-camera-based video-data-processing systems in which the memory controller is integrated within one or more memory chips, such as the embodiments of the present invention discussed above with reference to FIGS. 46B-C. In these embodiments of the present invention, the memory controller functions as an arbiter, to coordinate asynchronous, concurrent access to memory by the video cameras and the video codec, as well as a two-dimensional-data-to-one-dimensional-data serializer and a one-dimensional-data-to-two-dimensional-data deserializer. Memory subsystems of this first set of embodiments of the present invention may also be coupled to other types of computational engines, or included in other types of systems, which require efficient memory subsystems.

Figure 47:
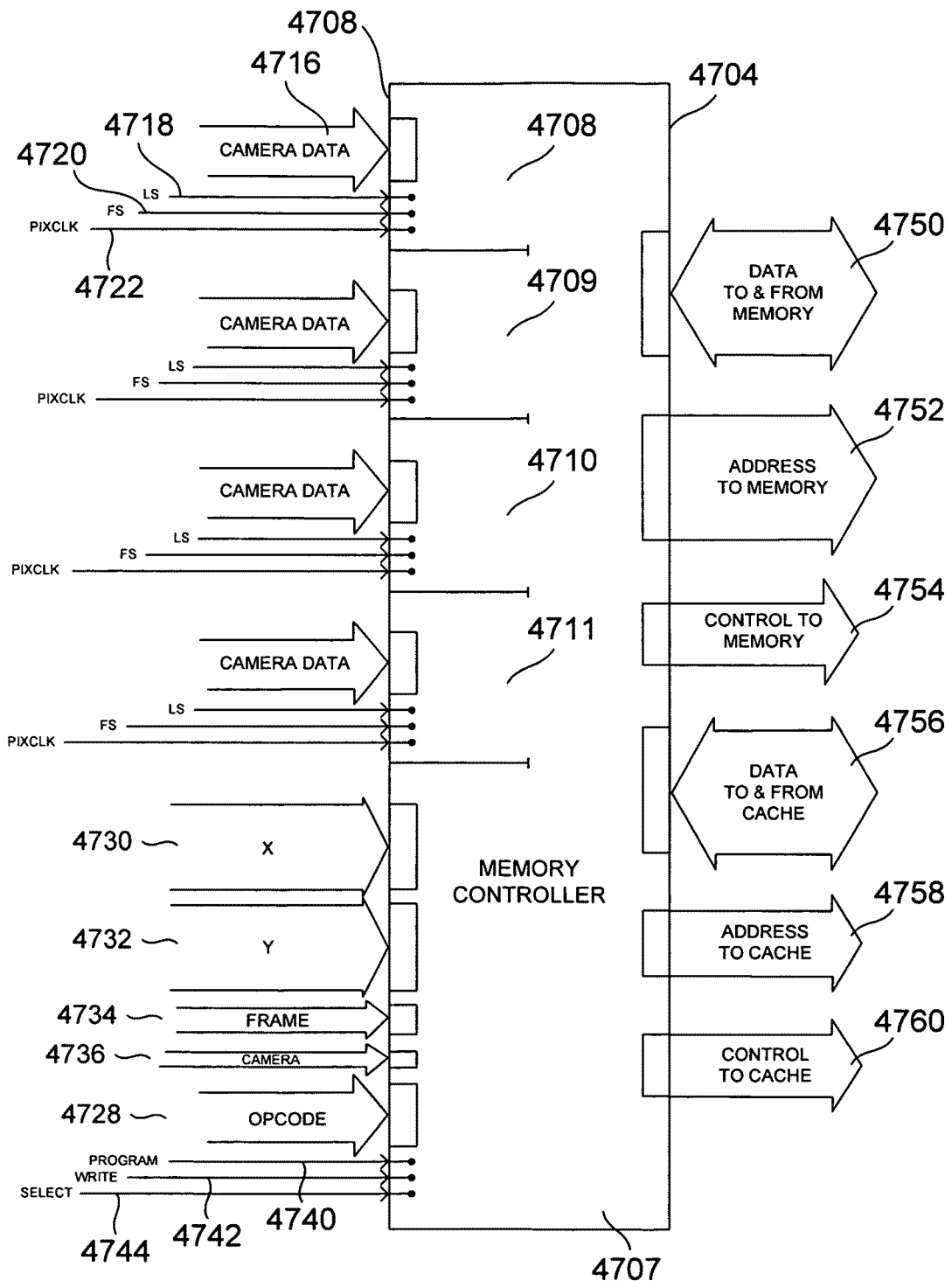
FIG. 47 illustrates a generalized interface provided by a memory-controller embodiment of the present invention to cameras, a video codec, and a memory.

FIG. 47 illustrates a generalized interface provided by a memory-controller embodiment of the present invention to cameras, a video codec, and a memory. In FIG. 47, the memory controller 4702 is represented by a rectangle. The memory and cache-memory interfaces are shown on the right-hand side 4704 of the rectangle and the video-camera and video-codec interfaces are shown on the left-hand side 4706 of the rectangle. The memory controller may interface to one or multiple video cameras. In FIG. 47, the memory controller is shown interfacing with four video cameras 4708-4711. Each video camera interfaces to an input data path, a line signal ("ls"), a frame signal ("fs"), and a pixel-clock signal ("pixclk"), such as input data path 4716, ls 4718, fs 4720, and pixclk 4722 for video camera 4708. The input data path 4716 comprises a set of parallel input signal lines, each input signal line corresponding to a bit within a larger information unit, such as a byte. The ls, fs, and pixclk signals 4718, 4720, and 4722 have been described in preceding sections. To briefly review, the ls indicates line boundaries and the fs indicates frame boundaries within serialized camera-data signals. The pixclk is a camera-supplied clock signal, with the camera generally inputting one pixel for each active transition, or, in other words, inputting one pixel per pixclk interval, or tick.

The memory controller that represents various embodiments of the present invention provides a somewhat more complex interface to the video codec, or video-processing subsystem, of a video system. This interface includes input of the x 4730 and y 4732 coordinates of a pixel or pixel block within a video frame stored in memory, input of a frame number 4734, input of an opcode 4738, program 4740, write 4742, and select 4744 signal inputs, and, when the memory controller supports input from two or more video cameras, input of the index of a camera 4736. It should be noted that the interfaces described with reference to FIG. 47 are exemplary interfaces, and that particular embodiments of the present invention may employ a variety of different, specific interfaces that include different data paths and signals and/or a greater number or a smaller number of data paths and signals. For example, rather than input of x 4730 and y 4732 coordinates to the memory controller, an alternative interface may provide for input of a linear pixel address within a linear sequence of pixels. In this case, the linear pixel address input would need twice as many signals lines as used for either the x or y coordinate input, in the previously discussed embodiment, when both embodiments support the same maximum frame size.

The x and y coordinates, in certain embodiments of the present invention, comprise the (x,y) coordinate pair that describes the location of the left-hand, uppermost point in a block or vector of pixels, or a particular pixel, within a video frame stored in memory. Both the x and the y coordinates are supplied over a set of parallel signal lines of sufficient width to represent, as a binary number, the largest possible coordinate within the largest possible frame size supported by the video system. Note that they coordinate corresponds to row indices within the frame and the x coordinate corresponds to column indices, opposite from the normal mathematical convention for coordinates x and y. Again, the pixels within a frame may be alternatively addressed by a linear index or position when the frame is considered to be a linear sequence of pixels, rather than a two-dimensional array of pixels.

The frame number 4734 is also supplied by a set of parallel signal lines of sufficient number to express, as a binary number, the largest possible frame index for frames stored in memory. For example, two signal lines are sufficient to express each of the frame numbers in the set {0, 1, 2, 3}. Similarly, the camera index 4736 is supplied by a set of parallel signal lines of sufficient number to express the index, or camera number, of each video camera connected to the memory controller. The opcode 4738 is also provided by a set of parallel signal lines of sufficient number to encode, as a binary number, all needed opcodes. The program, write, and select signal lines are, in one embodiment of the present invention, single signal lines that provide binary "0" or "1," also referred to as OFF and ON or low and high. Any possible encoding of binary signals may be employed within a particular memory-controller embodiment of the present invention. For example, Boolean value "0" input to the write signal line may indicate a WRITE operation, in certain embodiments of the present invention, and may indicate a READ operation, in alternative embodiments of the present invention. In any particular embodiment of the present invention, the convention employed is fixed. In one embodiment of the present invention, the memory controller is initialized by setting the program signal line 4740 high, and then supplying initialization data through certain of the remaining signal lines and data paths. For example, the maximum frame size may be specified as the product of the maximum possible values of x and y coordinates input through the x and y-coordinate signal paths 4730 and 4732. Similarly, the maximum number of frames that can be stored for each camera may be input using the frame-number signal line 4734. The maximum number of supported cameras may be input, via the camera-index signal path 4736, as a largest possible camera index. The video codec requests a memory-to-cache or cache-to-memory operation by setting the select signal line high while inputting an opcode via the opcode-signal path 4738, a frame number via the frame-number signal path, a camera index via the camera-index signal path, and x and y coordinates through the x and y signal paths. In a single-video-camera embodiment of the present invention, no camera index signal path is needed. A cache-to-memory operation is initiated, in one embodiment of the present invention, by setting the write signal line 4744 high, while a memory-to-cache operation is requested by setting the write signal line to low. The exact timing and sequences of the input signals may vary, from one embodiment of the present invention to another. In certain embodiments of the present invention, each opcode represents a different type of memory access, memory-access types including access to a pixel, vectors of pixels of various sizes, blocks of pixels of various sizes, and data objects, as discussed in preceding sections.

The generalized memory-controller interface, illustrated in FIG. 47, includes a first interface to memory, comprising a bi-directional data path 4750, an address path 4752, and a control path 4754. The memory-controller interface additionally contains a second interface to cache memory, also comprising a data path 4756, an address path 4758, and a control path 4760. Data is exchanged between memory and the memory cache via a set of parallel signal lines, 4750 and 4756, respectively. In certain embodiments of the present invention, the data path is bi-directional, and used both for writing data to memory and receiving data from memory. In other embodiments of the present invention, separate unidirectional data paths may be used for writing data to memory and reading data from memory. Each data path comprises a set of parallel signal lines of sufficient number to carry an information unit, such as a byte, word, longword, or much longer bit sequences. In many embodiments, each signal line in the data path corresponds to a separate plane within a memory bank or memory architecture. For example, an eightsignal-line data path may interconnect the memory controller to eight memory chips, with each byte received from a camera distributed out to the eight memory chips. A variety of other mappings and data-path sizes are possible, particularly including wider data paths and various types of interleaved mappings of data units to memory planes.

A memory address is supplied, to memory and to cache memory, through the address paths 4752 and 4758, as part of each access request. In certain embodiments of the present invention, the memory controller translates serialized camera data and related signals or two-dimensional-data-block specifications into linear memory addresses. Memory is generally also supplied with control signals, through control paths 4754 and 4760, such as the select and write signals supplied by the video codec to the memory controller (4742 and 4744).

FIGS. 48A-H illustrate the components, and operation of the components, of a memory controller that represents one embodiment of the present invention. These components are described, in greater detail, in subsequent paragraphs with reference to subsequent figures. FIGS. 48A-H all use similar illustration conventions, next discussed with reference to FIG. 48A.

The memory controller 4802 is represented as a rectangle. As discussed above, the memory controller may be implemented as a module or subsystem within a video codec, may alternatively be implemented as a subsystem or module within one or more memory chips, or may be implemented as a subsystem or module within a video-codec-and-memory integrated circuit. It may even be possible to implement the memory controller as a stand-alone component in certain, complex systems. The memory controller includes a camera block that corresponds to each video camera connected to the memory controller. In FIGS. 48A-H, three camera blocks 4804-4806 are shown. The camera blocks receive data and signals from the video cameras, and output control signals and data to memory, thus implementing data-stream interfaces that allow video cameras to transmit data to the memory controller. A memory sequencer 4808 implements the video-codec-to-memory-controller interface discussed with reference to FIG. 47. Although a single memory sequencer is shown in FIGS. 48A-H, alternative embodiments may employ multiple memory sequencers, to facilitate a higher degree of parallelism in the interconnect between the video codec and the memory controller.

The memory subsystem is illustrated as a rectangle 4810, connected to the memory controller through a data-in path 4812, a data-out path 4814, an address-path 4816, and a control path 4818. As discussed above, certain memory subsystems may combine the data-in and data-out paths 4812 and 4814 into a single bi-directional data path. The memory controller additionally includes an arbiter 4820, a clock input 4822, three multiplexers 4824-4826, and an address-translation unit 4828. Finally, the memory controller includes data-in and data-out ports 4829 and 4830 for receiving data from, and transmitting data to, cache memory. These ports may be combined in a bidirectional data port, in certain embodiments of the present invention. The same, or a separate, address translation component may be used for specifying cache-memory accesses, or cache-memory accesses may be specified by another subsystem, such as the video codec.

Figure 48A:
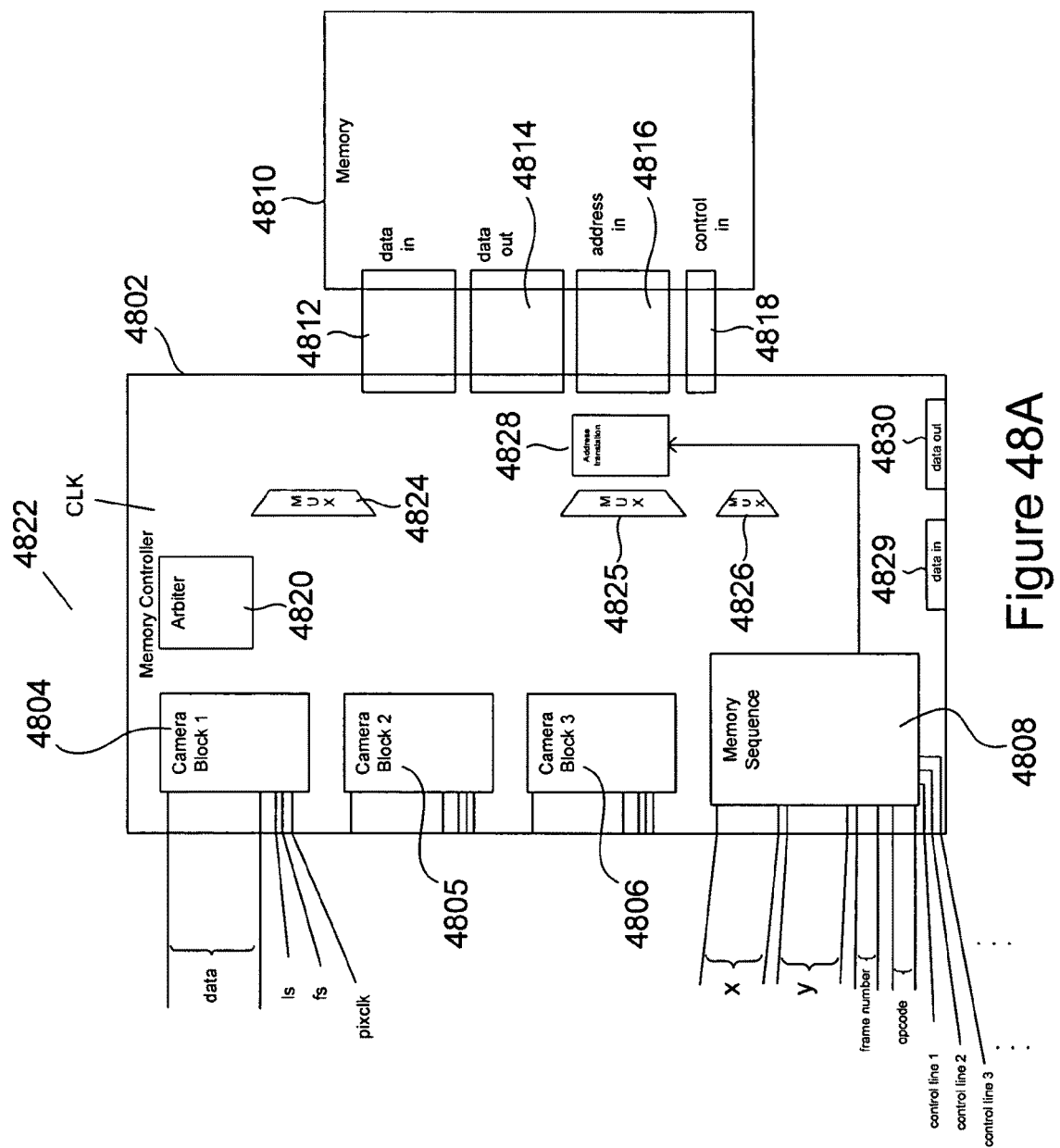
Figure 48B:
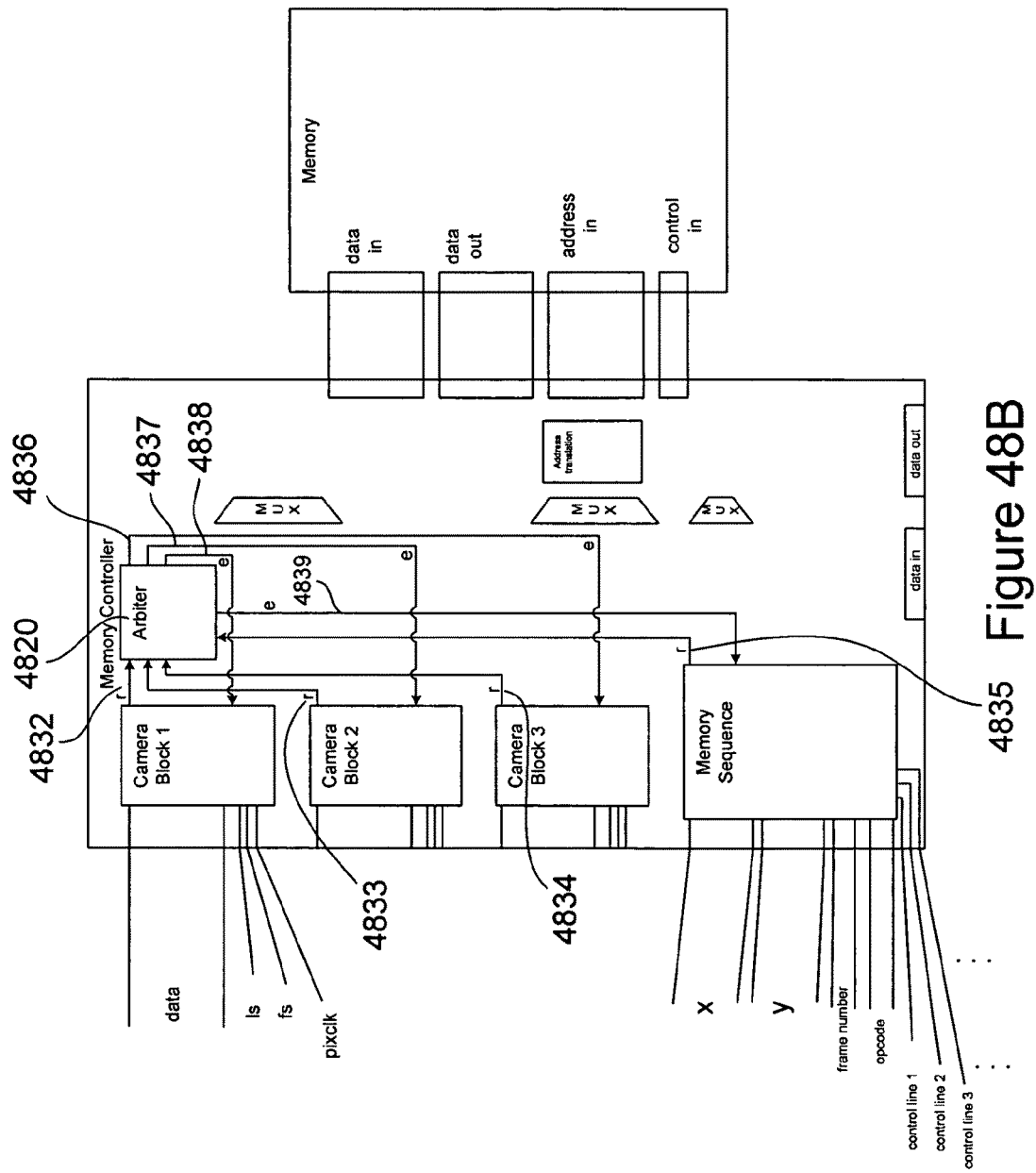
Figure 48C:
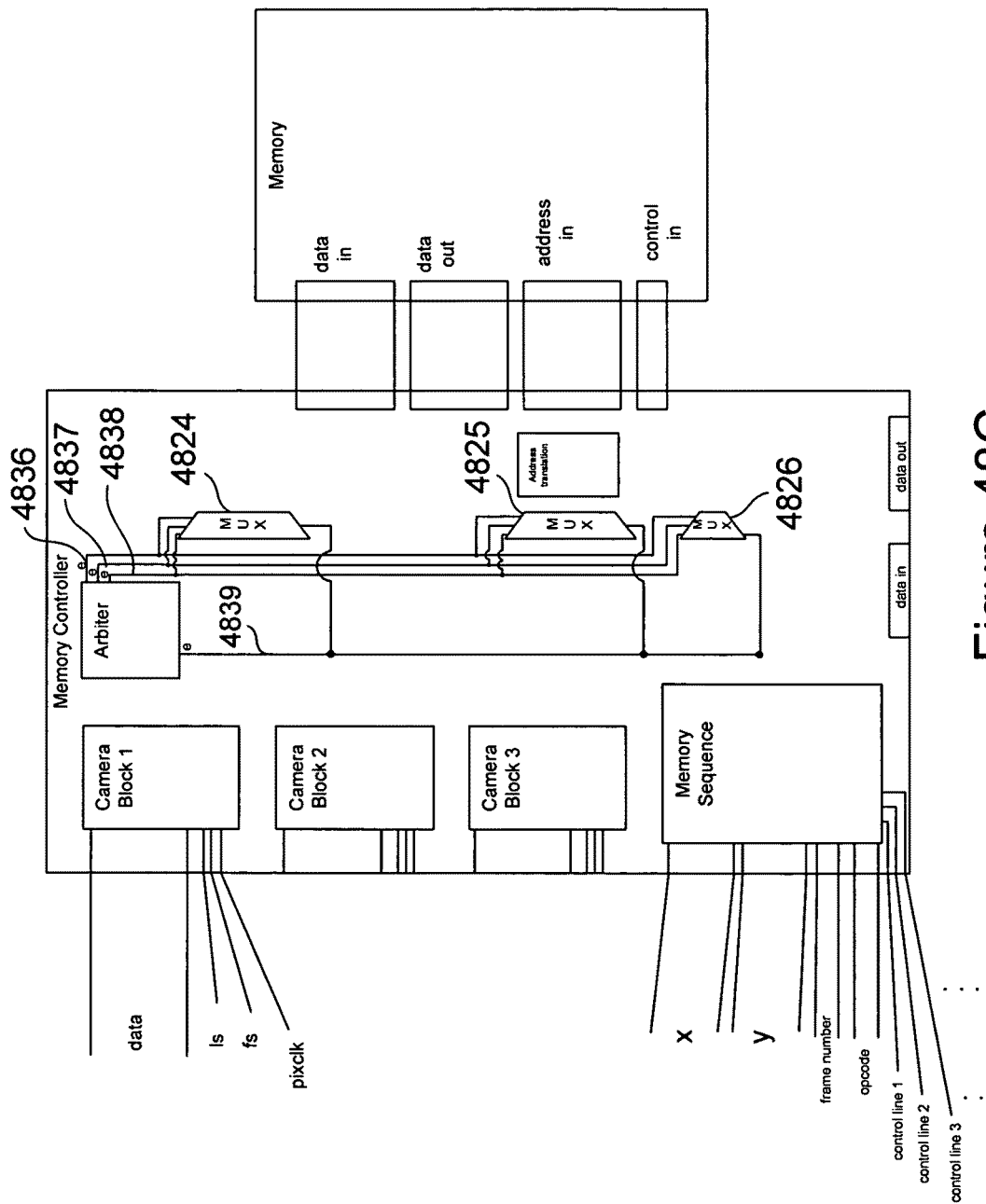

FIGS. 48B-C illustrate the function of the arbiter (4820 in FIG. 48A). As shown in FIG. 48B, the arbiter receives request signals from each of the camera blocks and memory sequencers. A camera block or the memory sequencer initiates a memory operation by setting the request signal line interconnecting the camera block or memory sequencer and the arbiter to "1." The arbiter 4820 arbitrates between the asynchronous and concurrent requests received from the camera blocks and memory-sequencer block, selecting, at each point in time, a single one of the camera blocks and memory-sequencer block for which to service a next request. In other words, the arbiter continuously receives indications of pending requests from cameras and the memory sequencer, and serializes the stream of incoming requests by allowing only a single camera or the memory sequencer to carry out a memory transaction at each point in time. The arbiter transmits enable signals, encoded as binary value "1" in the currently discussed embodiment of the present invention, via enable signal lines 4836-4839 to each of the camera blocks in the memory-sequencer block. Only a single enable signal line is high, at any given point in time. The arbiter needs to ensure that only a single camera block or the memory-sequencer block is carrying out a memory transaction at any given point in time, and also that the requests made by the camera blocks and memory sequencer are handled fairly, over time, so that all of the camera blocks and the memory sequencer obtain sufficient memory bandwidth and that no input data fails to reach memory. As shown in FIG. 48C, the enable signal lines 4836-4839 also are input to the three multiplexers 4824-4826 to allow the multiplexers to select data-, pixel-, pixel-vector-, or pixel-block-coordinates, and control signals from the currently enabled camera block or the memory sequencer.

Figure 48D:
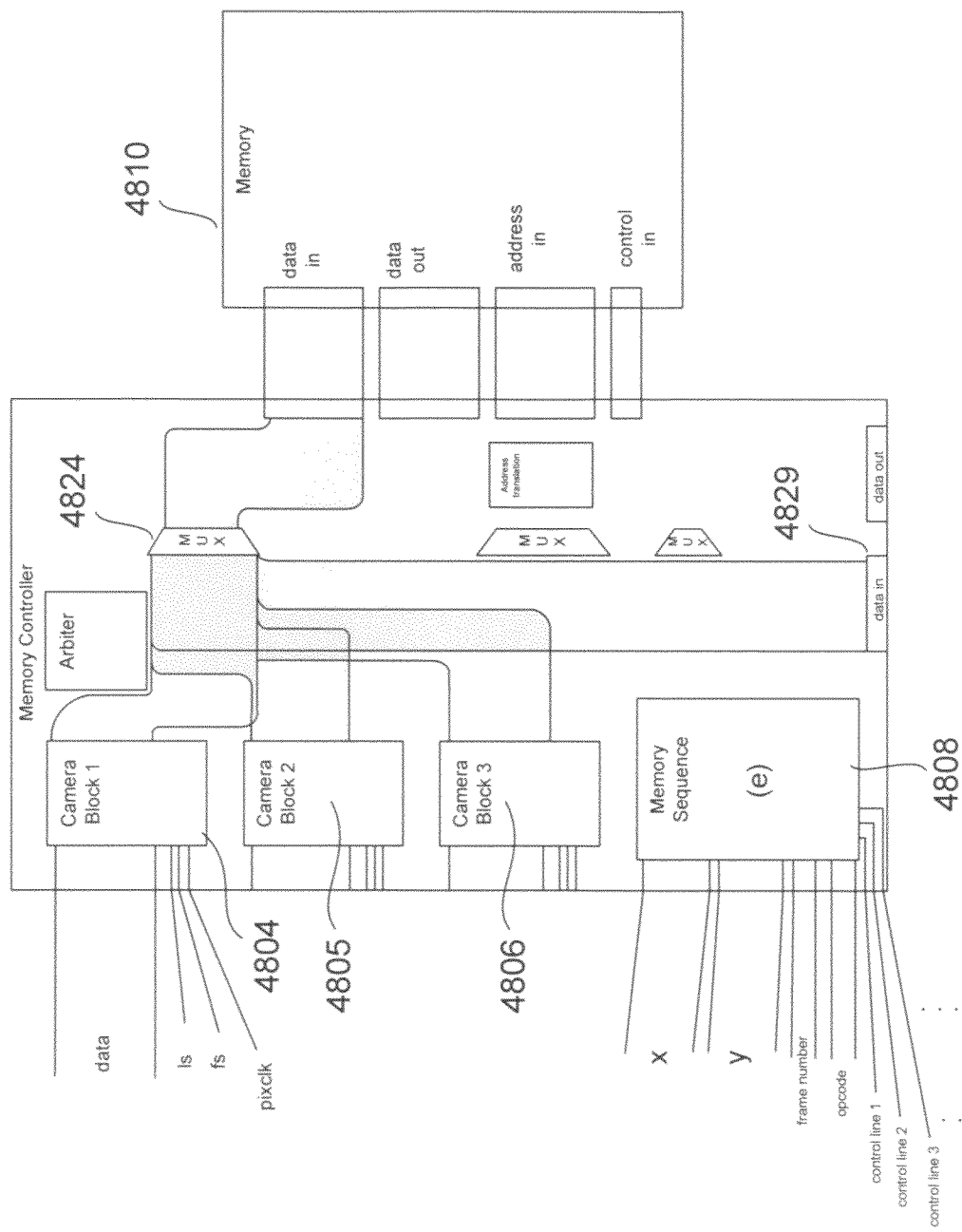
Figure 48G:
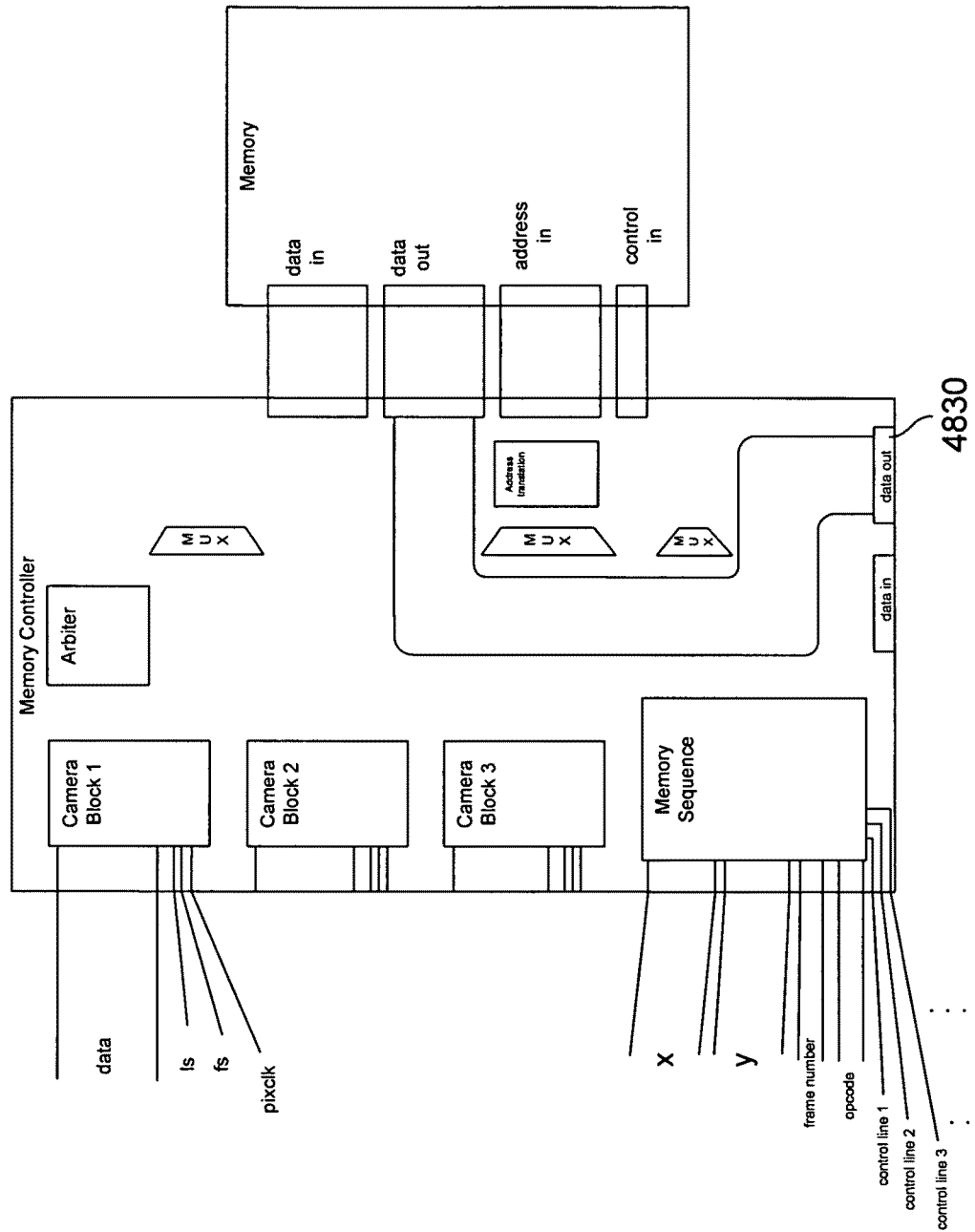

FIG. 48D illustrates the function of the first multiplexer 4824. Each of the camera blocks 4804-4806 and the memory-sequencer block 4808 can send data to memory 4810. Data paths output by each of the camera blocks and the data-in port 4829 controlled by the memory-sequencer block are connected to the first multiplexer 4824, which selects one of the four input data paths for receiving data that the first multiplexer forwards to memory 4810. In FIG. 48D, the memory-sequencer block is currently enabled by the arbiter, and, therefore, the data received by the first multiplexer 4824 via the data-in port 4829 from cache memory, is transmitted by the first multiplexer 4824 to memory. As shown in FIG. 48E, multiplexer 4825 transmits, at a given point in time, coordinates for data from one of the camera blocks or coordinates for a pixel, pixel vector, pixel block, or data object from the memory-sequencer block to the address-translation unit 4828, which translates the coordinates into a corresponding linear memory address which the address translation unit then forwards to memory. The linear memory address is computed, for camera input, as a position within a line of a frame added to the sum of a base offset for the camera and a frame offset. Similarly, as shown in FIG. 48F, multiplexer 4826 receives control signals from each of the camera blocks and the memory-sequencer block and transmits control signals from one of the camera blocks or the memory-sequencer block, currently enabled by the arbiter, to memory at any given point in time. As shown in FIG. 48G, data flows from memory back through the memory controller via the data-out port 4830 to memory cache, during a READ request made by the memory-sequencer block to memory when the memory-sequencer block is enabled by the arbiter.

Figure 48H:
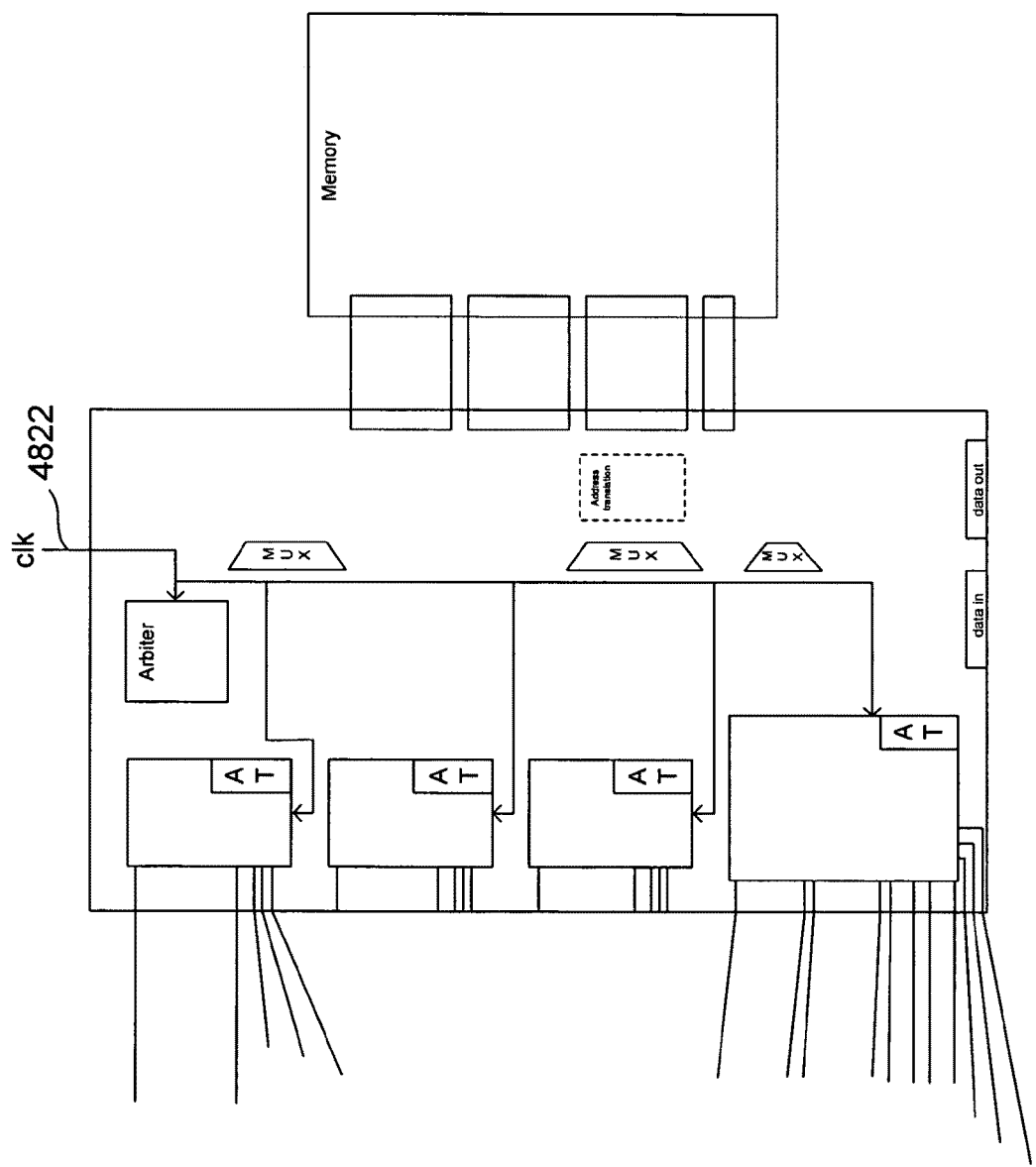

As shown in FIG. 48H, a clock input 4822 is input to the memory controller and routed to each of the camera blocks and memory sequencer, the arbiter, and to any other memory-controller components that use a clock synchronization signal. The clock signal, referred to within the memory controller as "fastclk," is generally a multiple of the fastest expected pixclk signal. The multiple n varies, depending on the number of camera blocks, and may be a configurable parameter in certain embodiments of the present invention. In one embodiment of the present invention, a multiple n=16 is used when four camera blocks are interconnected through the memory controller to memory. The internal-memory-controller clock signal, referred to below as "fastclk," needs to be of sufficiently high frequency that the memory controller can concurrently service all memory-access requests made by the camera blocks and the memory-sequencer block. For example, in the case of four video cameras connected to the memory controller, when all four cameras are transmitting data at the fastest possible rate of one pixel per pixclk interval, four pixels are being transmitted through the memory controller, on average, during the span of 16 fastclk intervals. Because the memory controller carries out internal operations, including memory-access operations, according to the fastclk frequency, the memory controller provides sufficient fastclk cycles, and, therefore, memory bandwidth, to the video codec via the memory-sequencer block, even under a full data-transfer load supplied by all four video cameras.

Figure 49A:
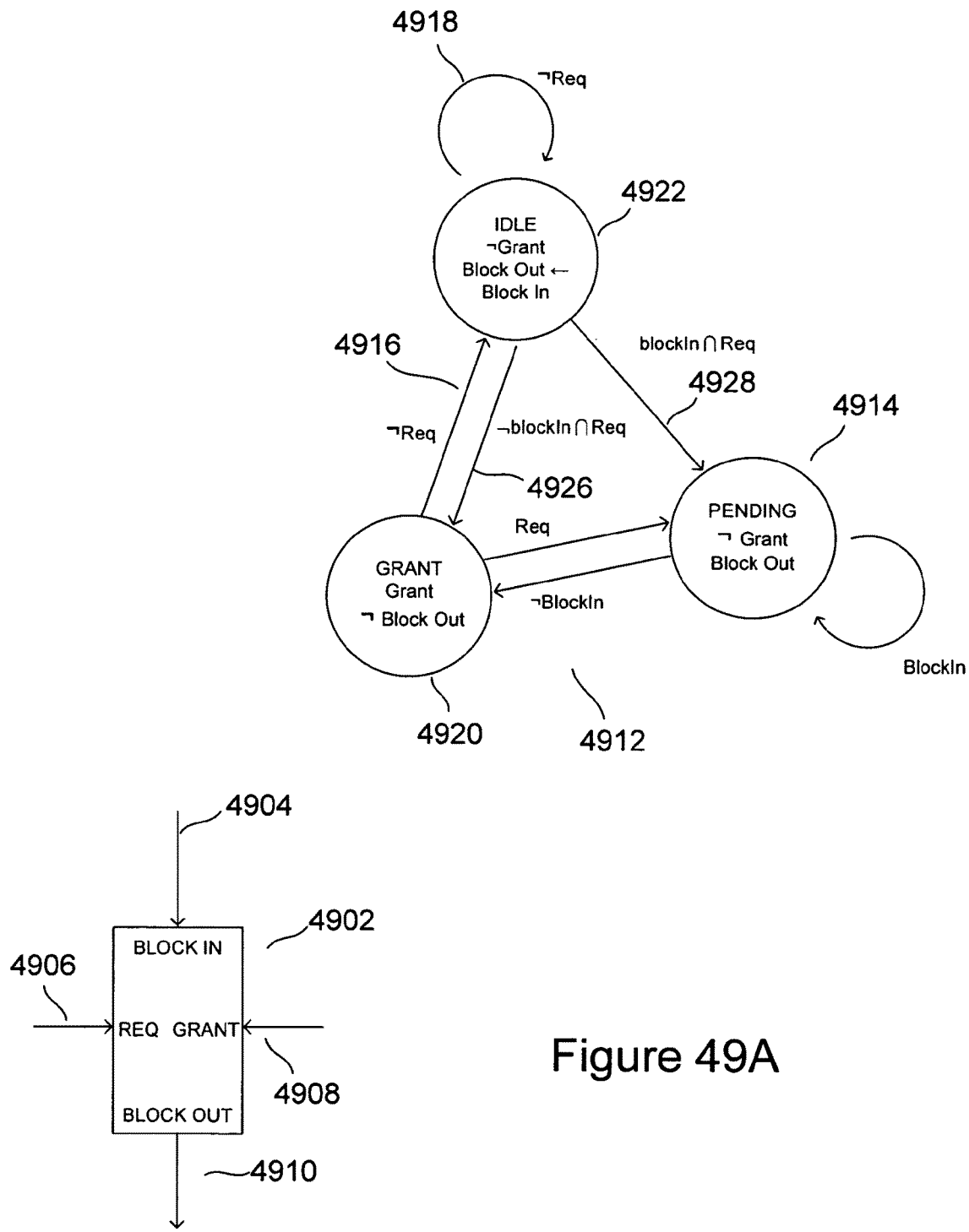
FIGS. 49A-C illustrate an embodiment of the arbiter, discussed with reference to FIGS. 48B-C, that is a component of a memory controller that represents one embodiment of the present invention.
Figure 49B:
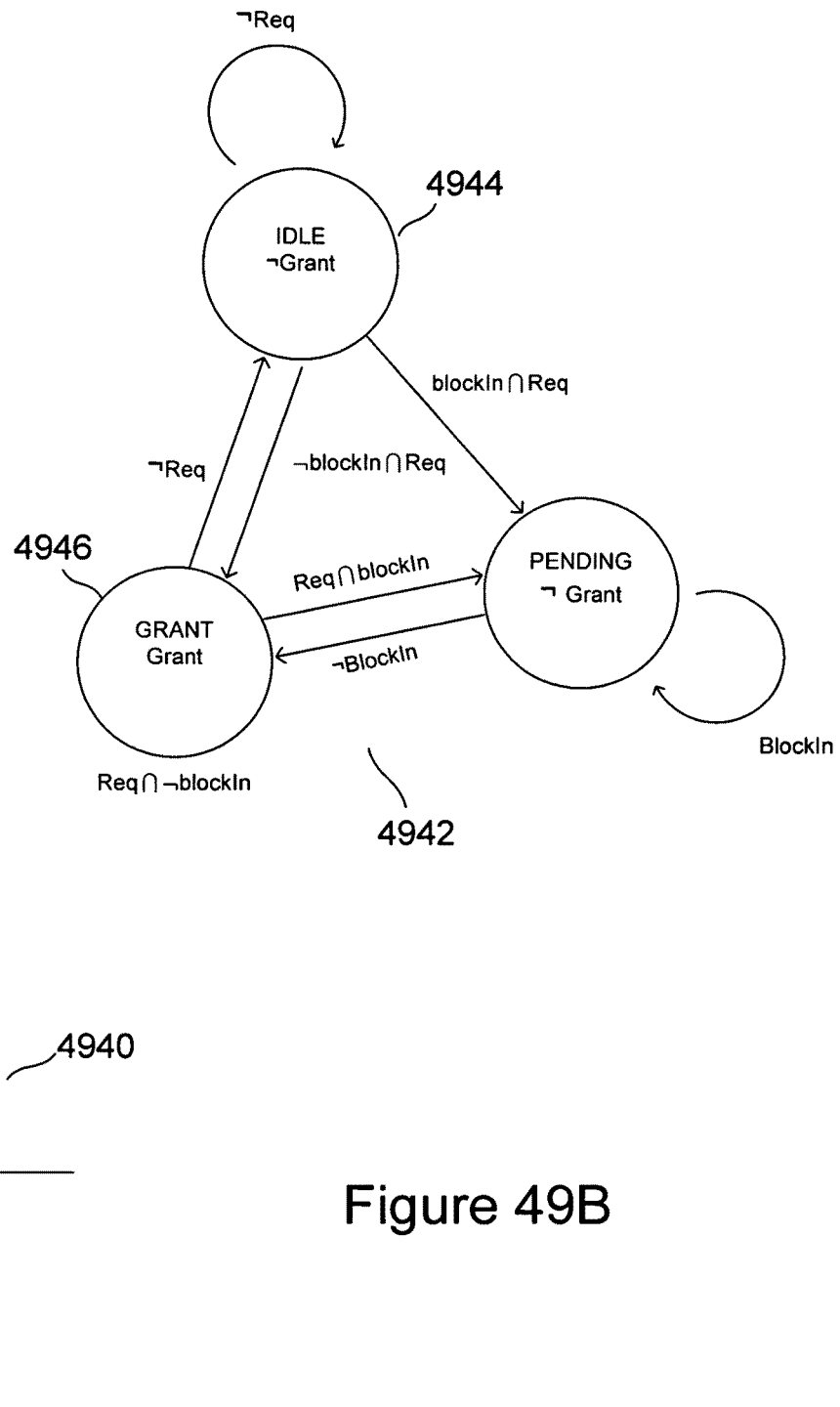
Figure 49C:
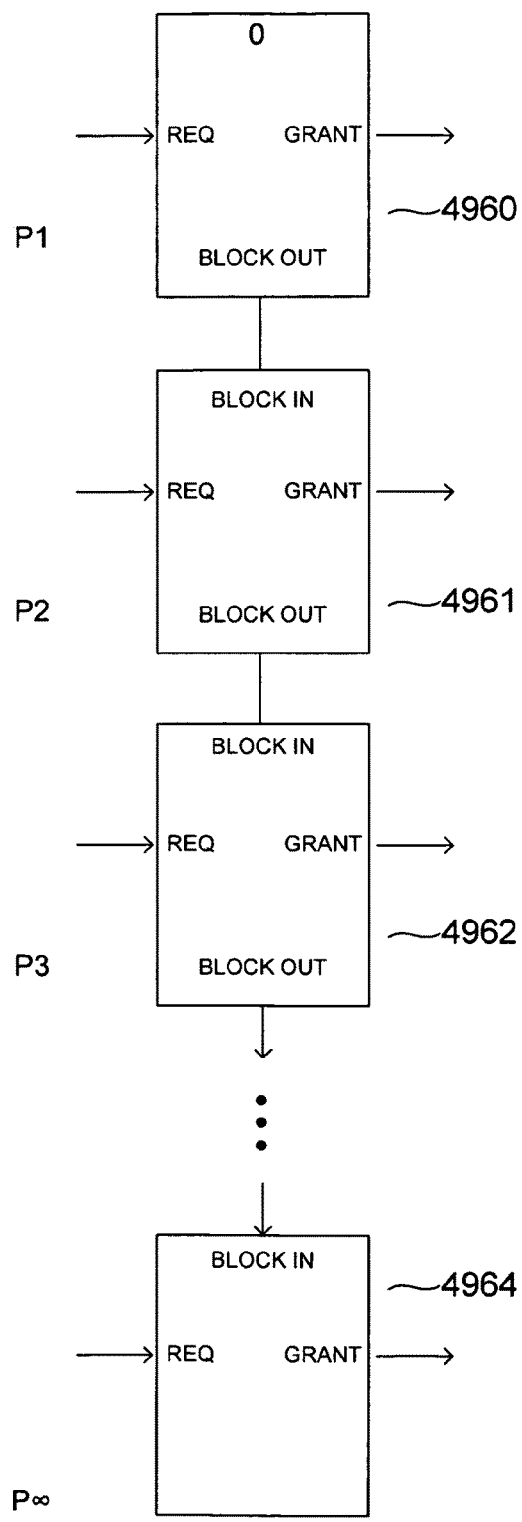

FIGS. 49A-C illustrate an embodiment of the arbiter, discussed with reference to FIGS. 48B-C, which is a component of a memory controller that represents one embodiment of the present invention. FIG. 49A provides a state-transition diagram and a symbolic representation of a camera-block arbiter block that is a component of the memory-controller arbiter and that is implemented as a state machine. The symbolic representation 4902 of the camera arbiter block indicates that the camera arbiter block receives two input signals and outputs two output signals. The input signals include a Block-In signal 4904 and a Req signal 4906. The camera arbiter block outputs a Grant signal 4908 and a Block-Out signal 4910. Input and output signals are single-signal-line signals that each carry, at any particular point in time, one of two binary values "0" and "1." The state of a camera arbiter block is therefore expressible as four Boolean terms or quantities corresponding to the values currently input to the camera arbiter block via the two input signal lines and output by the camera arbiter block via the two output signal lines. The state is re-evaluated, and may change, at each fastclk interval.

FIG. 49A also provides a state-transition diagram 4912 which represents the operational characteristics of the camera arbiter block. In the state-transition diagram 4912, each circle, such as circle 4914, represents a different, stable state of the camera arbiter block. The straight arrows interconnecting states represent state transitions, such as state-transition-arrow 4916, and the curved arrows, such as curved arrow 4918, represent no state transition, or, in other words, represent the camera arbiter block remaining in a single state over two or more fastclk intervals. Each state, such as state 4914, is designated by a name, such as the name "PENDING" by which state 4914 is designated, and also includes an indication of the current output of the two output signals. In state PENDING 4914, for example, the camera arbiter block outputs "0" to the Grant output and outputs "1" to the BlockOut output. State transitions occur for specific values of one or both input signals. For example, the camera arbiter block transitions from state 4920 to state 4922 when the Req input signal 4906 is low or, as is expressed in FIG. 49A, when the Boolean expression "¬Req" has the value TRUE. When a state transition is specified in a single-variable Boolean expression, the state transition occurs as a result of a particular value input via a single input signal line. When a state transition is specified by a two-variable Boolean expression, then both input signal lines need to have specific values for the state transition to occur.

A camera arbiter block may be in any of three states: (1) an IDLE state 4922; (2) a PENDING state 4914; and (3) a GRANT state (4920). In the IDLE state, the associated camera is not requesting control of memory to carry out a memory-access operation. In the PENDING state, the associated camera is transmitting data for writing to memory, but is blocked from gaining control of memory by another camera or the video codec. In the GRANT state, the camera associated with the camera arbiter block is enabled to access memory.

The initial state of a camera arbiter block, upon power on, is "IDLE" 4922, with the camera arbiter block outputting Boolean "0" to the Grant output signal line and outputting the opposite value from that received through the Block-In input signal line to the Block-Out output signal line. When the Req input signal line is low, the camera arbiter block remains in the IDLE state 4922. When the Req input signal transitions to high, or inputs the value "1," the camera arbiter block transitions 4926 to the GRANT state 4920 when the Block-In input signal line is low, or transitions 4928 to the PENDING state 4914 when the Block-In input signal line is high. In the IDLE state 4922, the camera associated with the camera arbiter block is currently not making a memory request and no other camera is currently making a memory request. When a higher-priority camera has requested a memory transaction, the currently considered camera arbiter cannot transition to the GRANT state, but instead transitions to the PENDING state to wait until no higher-priority camera is requesting a memory transaction. The PENDING state 4914 thus represents a state in which the camera associated with the camera arbiter block is requesting a memory transaction, but the memory transaction cannot be enabled because a higher-priority camera is currently carrying out a memory transaction with memory. In the PENDING state, the camera arbiter block outputs Boolean value "1" to the block-out signal line, to prevent lower-priority cameras or the memory sequencer from being granted access to memory until the camera associated with the camera arbiter block has had a chance to carry out a requested memory transaction. The GRANT state 4920 represents a camera arbiter block state in which the associated camera is enabled to carry out a memory transaction. In the GRANT state 4920, the camera associated with a camera arbiter block is enabled, as represented by output of "1" by the camera arbiter block to the grant signal 4908. Note that a camera cannot remain in the GRANT state 4932 for more than a singlefastclk interval. Thus, cameras are allowed only a single data-unit transfer to memory before relinquishing control of memory to another currently requesting block.

FIG. 49B shows a state-transition diagram and symbolic representation of the memory-sequencer arbiter block within a memory-controller arbiter that represents one embodiment of the present invention. The symbolic representation 4940 for the memory-sequencer arbiter block indicates that the memory-sequencer arbiter block receives two input signals, identical to those received by the camera arbiter block, and outputs only the Grant output signal, rather than both the Grant output signal and the Block-Out output signal output by the camera arbiter block. The state transition diagram 4942 for the memory-sequencer arbiter block is therefore simpler than the state-transition diagram for the camera arbiter block. The memory-sequencer arbiter block features only a single IDLE state 4944 in the state-transition diagram and, significantly, may remain in the GRANT state 4946 over multiple fastclk intervals. In multiple-memory-sequencer implementations, all but the final memory-sequencer arbiter block includes a Block-out output signal, and a slightly different state transition diagram than that shown in FIG. 48B.

FIG. 49C illustrates implementation of the memory-controller arbiter within a memory controller that represents one embodiment of the present invention. The arbiter comprises a series of camera-arbiter blocks 4960-4962 and a single memory-sequencer block 4964. The cameras associated with the camera arbiter blocks 4960-4962 are prioritized, in descending order, according to the order of the associated camera arbiter blocks in the sequence of camera-arbiter blocks. Thus, the camera associated with camera arbiter block 4960 has highest priority. The memory sequencer, associated with memory-sequencer arbiter block 4964, therefore has lowest priority. However, as discussed above, the memory sequencer may remain in the GRANT, or enabled, state for multiple fastclk intervals, while the higher-priority cameras can control memory for only a single fastclk interval. Higher-priority blocks are connected to lower-priority blocks through the Block-Out output signal line of the higher-priority block and the Block-In input signal line of the lower-priority block. When a particular block is in either the PENIDNG or GRANT state, all lower-priority blocks are prevented from transitioning from the PENDING state to the GRANT state.

FIG. 50 provides a simple illustration of timing considerations for a memory-controller arbiter implemented within a memory controller that represents one embodiment of the present invention. In FIG. 50, a complete circuit of circle 5002 represents one pixclk clock intervals. Each increment along the circle, such as increment 5004, represents one fastclk intervals. When all of four cameras are transmitting data at a maximum data-transfer rate, each camera transmits one data unit per pixclk interval, or, in FIG. 50, during the span of time represented by one full circle. Even were the memory controller, in FIG. 50, to carry out a memory transfer on behalf of a camera in two fastclk intervals, then regardless of the timing or order of the data units received from the cameras, at least one-half of the memory-controller bandwidth, unshaded in FIG. 50, remains available to the memory sequencer, or video codec. In FIG. 50, a memory transfer is shown to occur in one fastclk interval, so that ¾ of the fastclk intervals are available for video-codec memory operations. As the multiple n of fastclk intervals per pixclk interval is increased, an increasing portion of the memory-controller bandwidth is available to the video codec. The number of fastclk intervals n within a pixclk interval can therefore be adjusted to balance between servicing of video-codec memory-access requests and servicing of camera memory-access requests as well as to maintain the memory-controller clock rate at a lowest possible level, in order to dissipate as little power as possible as well as to ensure that memory accesses do not exceed a maximum access rate for the memory.

Figure 51:
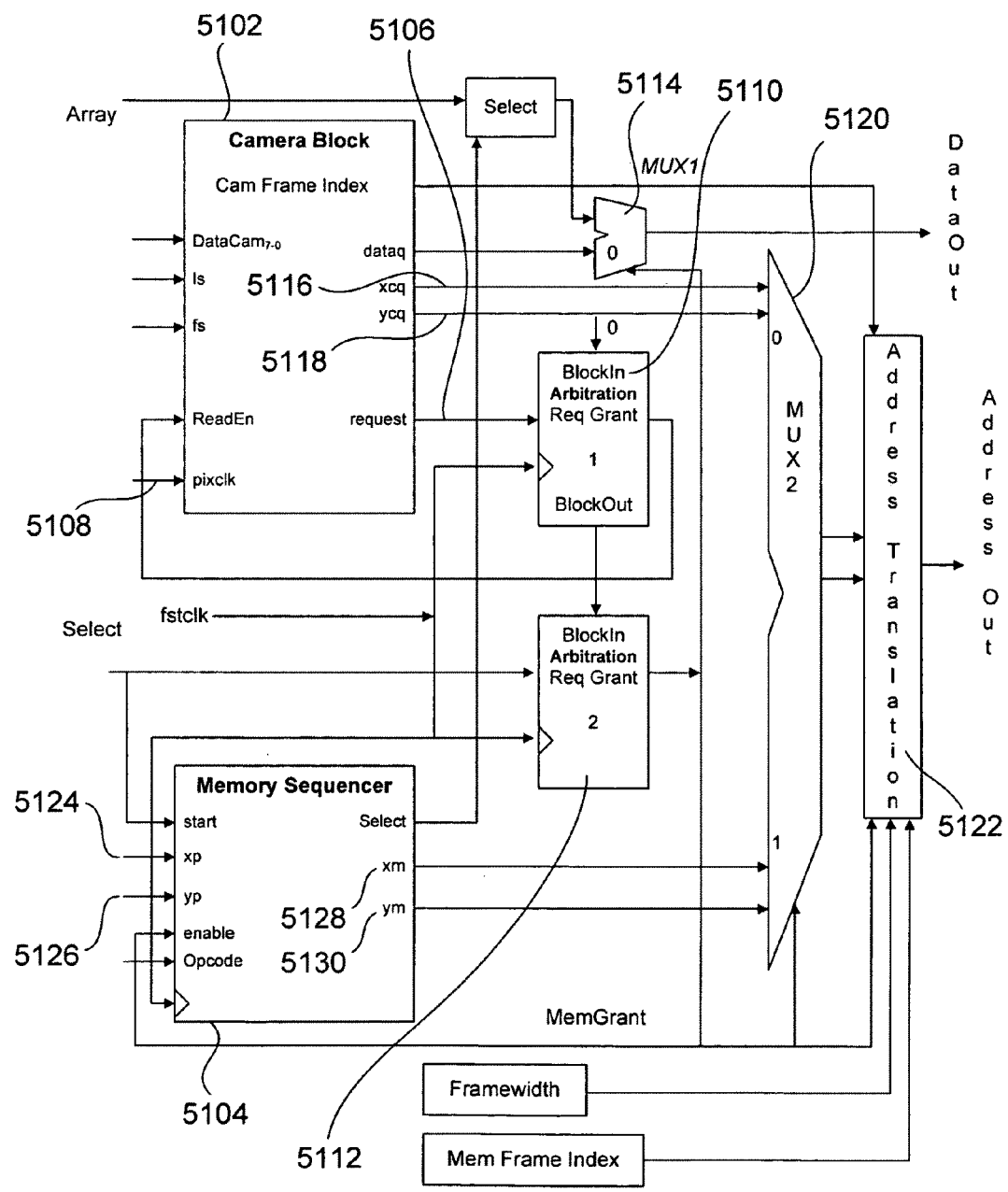
FIGS. 51-54 provide schematic diagrams for a memory controller that represents one embodiment of the present invention.

FIGS. 51-54 provide schematic diagrams for a memory controller that represents one embodiment of the present invention. FIG. 51 provides a schematic diagram for a single-camera memory controller that represents one embodiment of the present invention. In this embodiment, there is a single camera block 5102 in addition to the memory-sequencer block 5104. The memory controller is driven by a fastclk signal 5106 that oscillates n times more rapidly than the camera pixclk 5108 signal. The arbiter comprises a camera arbiter block 5110 and a memory-sequencer arbiter block 5112. In the embodiment illustrated in FIG. 51, memory-control signals are generated directly, through logic gates, from arbiter output signals and signals input to the memory controller, rather than by a separate control multiplexer. A first multiplexer 5114 transmits either camera data or memory-cache data to the memory, depending on whether the camera block or memory sequencer is currently enabled by a Grant signal from a respective arbiter block. The camera block 5012 translates camera input signals ls, fs, and pixclk into x and y coordinates that are output 5116 and 5118 to a coordinate multiplexer 5120, which passes input coordinates onto an address-translation unit 5122 that generates memory addresses which the address-translation unit transmits to the memory. The memory-sequencer block 5104 translates input x and y coordinates 5124 and 5126 into memory x and y coordinates, 5128 and 5130, respectively.

Figure 52:
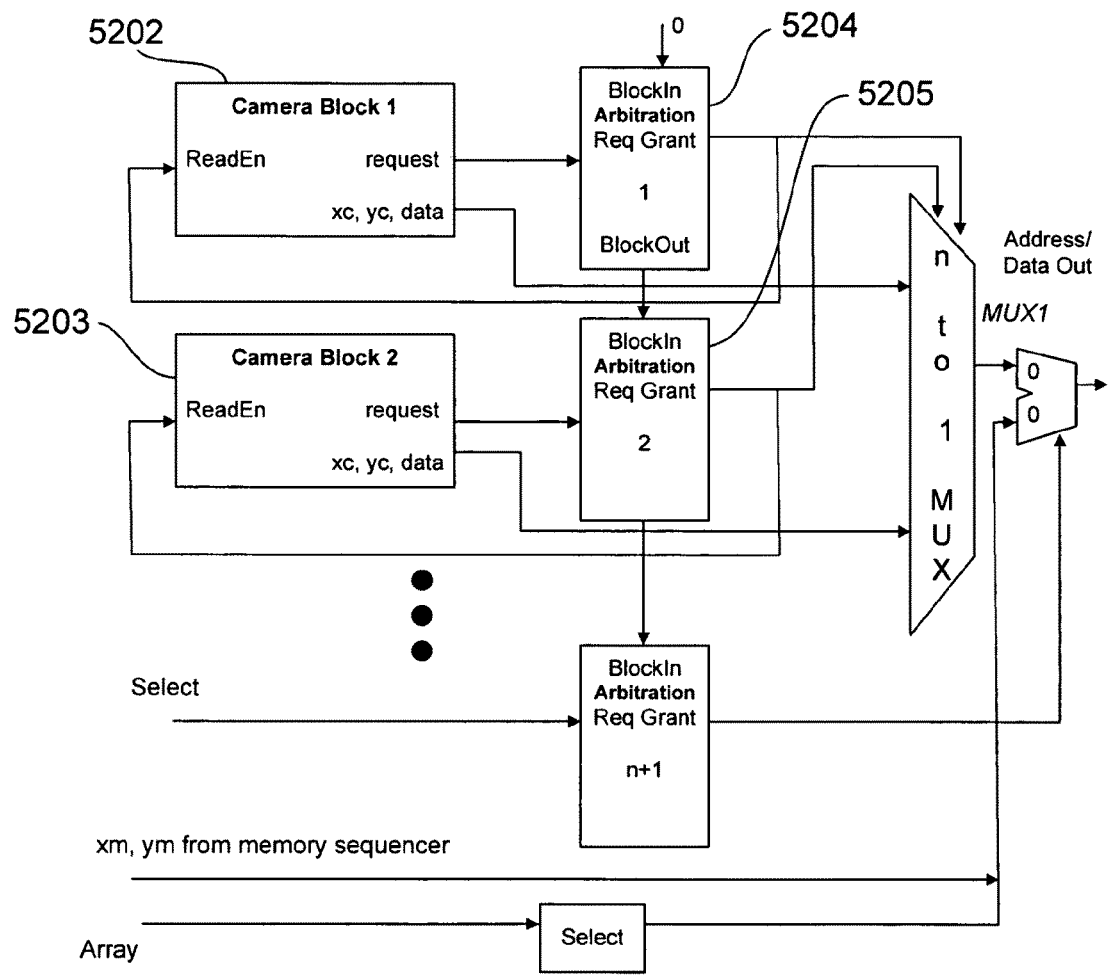

FIG. 52 shows a schematic that illustrates a multi-camera memory controller that represents one embodiment of the present invention. In this embodiment, multiple camera blocks 5202-5203 are associated with multiple camera arbiter blocks 5204 and 5205, respectively.

Figure 53:
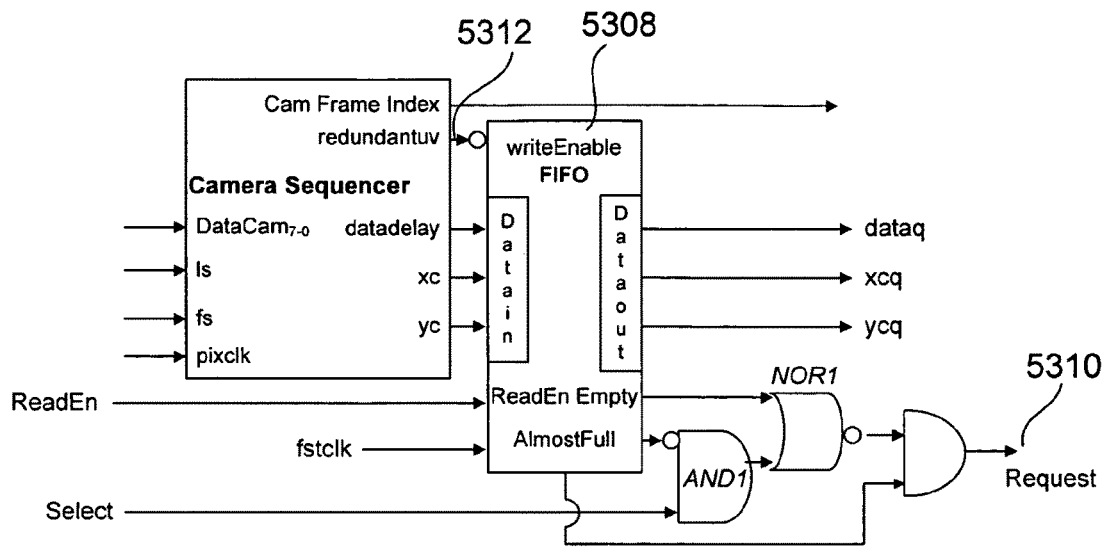

FIG. 53 provides a schematic that illustrates a camera block included in the memory controller embodiments shown in FIGS. 51 and 52. The camera block includes a first-in-first-out ("FIFO") buffer 5308 in which information units input by the associated video camera are temporarily stored for output to the memory. This FIFO buffer provides sufficient elasticity in data-transfer timing to allow the arbiter to balance competing requests from multiple cameras as well as from the memory sequencer. In the embodiment shown in FIG. 53, the camera block generates a request signal 5310 only when the FIFO buffer is nearly full. Otherwise, the camera block defers to other camera blocks and the memory-sequencer block, allowing the memory sequencer, in particular, to carry out video-codec-initiated memory transactions to the fullest possible extent, but ensuring that all camera data is transferred to memory, in timely fashion, to prevent any camera-data loss. In one embodiment of the present invention, the FIFO for each camera block includes space for storing four data units. The camera block also detects redundant data in the data stream input by the camera and transmits a redundant-UV signal 5312 when redundant data is detected. The output of redundant data by a camera is discussed in a preceding section. This redundant-UV signal allows the redundant data in a camera-transmitted data stream to be dropped, rather than inserted into FIFO, in order to prevent needless power dissipation and allocation of memory-controller cycles for transmission of redundant camera data to memory. In alternative embodiments, the FIFO queue may contain entries of sizes sufficient to accommodate multiple information units, which are ordered with respect to the FIFO entry as well as within the FIFO queue. In certain embodiments of the present invention, the camera block may also transform the order of information units in the data stream by reordering received information units within the FIFO queue; As discussed, an information unit may be a byte, a word, or another fixed-size binary information unit.

In certain embodiments of the present invention, a more complex, content-addressable FIFO ("CAM FIFO") block is employed. The CAM FIFO includes multiple slots, each slot containing multiple entries, and each slot associated with x and y coordinates, as well as Y, U, or V indications and a counter. The CAM FIFO allows for reordering camera input for output to memory, as well as output of larger data units that each contains multiple camera-input data units. As one example, the FIFO can be implemented to output 32-bit words, although the camera block receives 8-bit pixel values from the camera. In this embodiment, the request signal is raised when the FIFO is nearly full and when the next slot to be transferred is full, as indicated internally by the counter associated with the slot having a maximum counter value and as indicated by a read-OK signal used, along with an enable and almost-full signal, to determine output to the request signal, as shown in FIG. 53.

Figure 54:
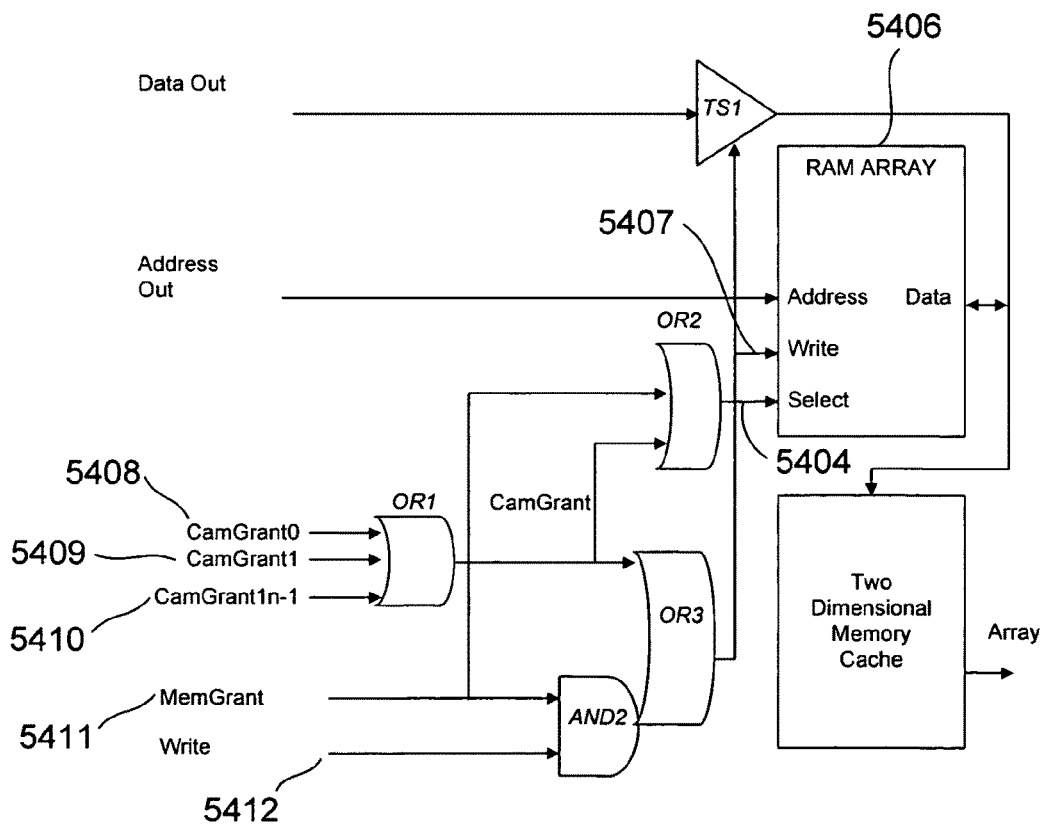

FIG. 54 provides a schematic for the memory-controller-to-memory interface in one embodiment of the present invention. The write 5402 and select 5404 inputs to memory 5406 are generated from the arbiter Grant signals 5408-5411 and the write signal that is input 5412 to the memory sequencer.

The memory-controller embodiments of the present invention, discussed in this subsection, thus provide a number of advantages for video-processing systems. As discussed above, the memory controller provides fair arbitration, without starvation or data loss, to multiple cameras that input data streams into memory as well as to a video codec that processes data input from the cameras. Video-camera data is filtered, by the memory controller, so that memory-controller cycles are not wasted to transfer redundant data to memory, and so that the memory bandwidth otherwise wasted on redundant data can be instead used for video-codec-initiated memory-access operations. The memory controllers that represent embodiments of the present invention provide a simple interface to the video codec via the memory-sequencer subsystem, so that two-dimensional data, including macroblocks and vectors, can be exchanged between memory and the memory cache as a result of single, high-level memory operations. The high clock frequencies needed for processing input data from cameras as well as memory requests from the video codec can be concentrated within the memory controller, rather than propagated throughout the video codec, reducing energy dissipation as well as the cost of video-codec design and fabrication.

Memory subsystems of the currently discussed family of memory subsystems can be used, in general, for a variety of applications in which one or more data sources concurrently transmit data streams through a memory-controller data-stream interface to memory, while, at the same time, a computational engine or other device reads data from, and transmits data to, memory in a random-access fashion, and, in particular, exchanges two-dimensional data objects with memory in single two-dimensional random-access memory operations.

Subsection VI: A Second Family of Memory Subsystems that Represents a Second Set of Embodiments of the Present Invention As discussed in preceding subsections, embodiments of the present invention that feature separate, standard memory-chip-implemented memory banks are made possible by a memory controller that executes at a relatively high clock rate to carry out memory-exchange operations between video cameras and memory and between a video codec and memory via a memory cache. Significant data-communications overhead is incurred by a need for serializing and de-serializing data between the memory cache and memory and the need to exchange data through a number of data-communications interfaces. Furthermore, because standard-memory chips can service only a single memory request at each point in time, the memory controller operates at a relatively high frequency, in order to provide sufficient arbiter cycles to fairly arbitrate memory accesses among concurrently transmitting cameras and the video codec.

A new type of memory disclosed in this subsection, referred to as a "multi-access memory," can be used in video-processing systems and many other types of computational systems to provide parallel access to multiple memory-accessing devices without the need for arbitration and or multiplexing. This multi-access memory may provide a far more efficient data-storage medium than traditional RAM memories, and can be tailored to provide access rates, operational speeds, and capacities that match the requirements of a video-processing system or other types of computational systems.

Figure 55:
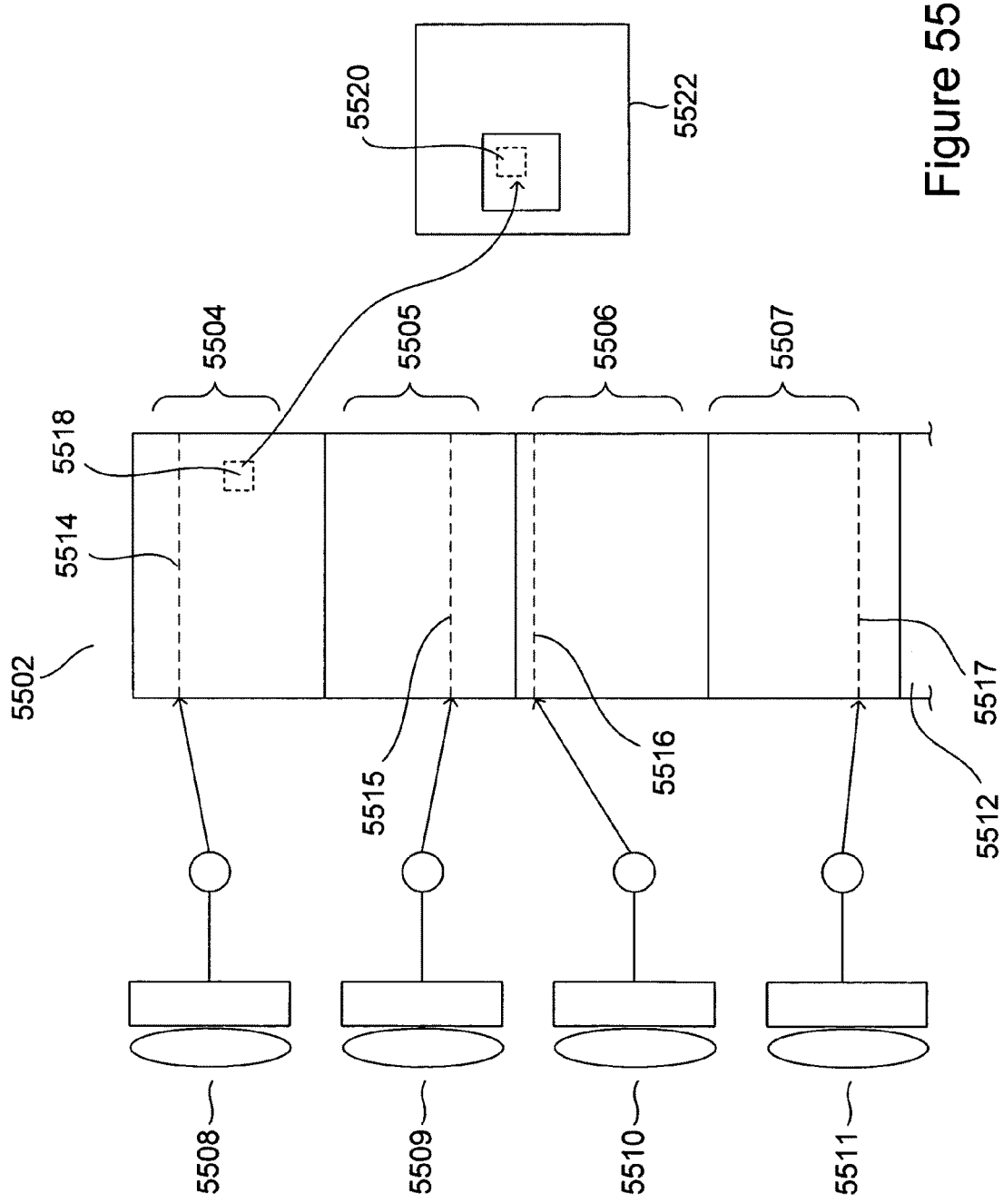
FIG. 55 illustrates operation of a multi-access memory that represents one embodiment of the present invention.

FIG. 55 illustrates operation of a multi-access memory that represents one embodiment of the present invention. In a video-processing-system application, such as the video-processing systems discussed in previous subsections, the memory 5502 is partitioned into multiple partitions 5504-5507, each partition associated with a particular video camera 5508-5511, respectively. The memory may include additional partitions 5512 for storing video-codec-exclusive data. Each camera may simultaneously write a line of a frame 5514-5517 to the memory without interfering with other cameras, and without being interfered with by other cameras. At the same time, the video codec can access any portion of the memory not currently being written to by a camera, such as a macroblock 5518, for writing or reading. In FIG. 55, macroblock 5518 is written from memory to a corresponding macroblock 5520 in cache memory 5522. Thus, the multi-access memory supports simultaneous access by each of multiple video cameras as well as by a video codec, via a memory cache. The only constraint on multiple, parallel access is that a single line within a frame stored in memory cannot be simultaneously accessed by multiple entities.

Figure 56:
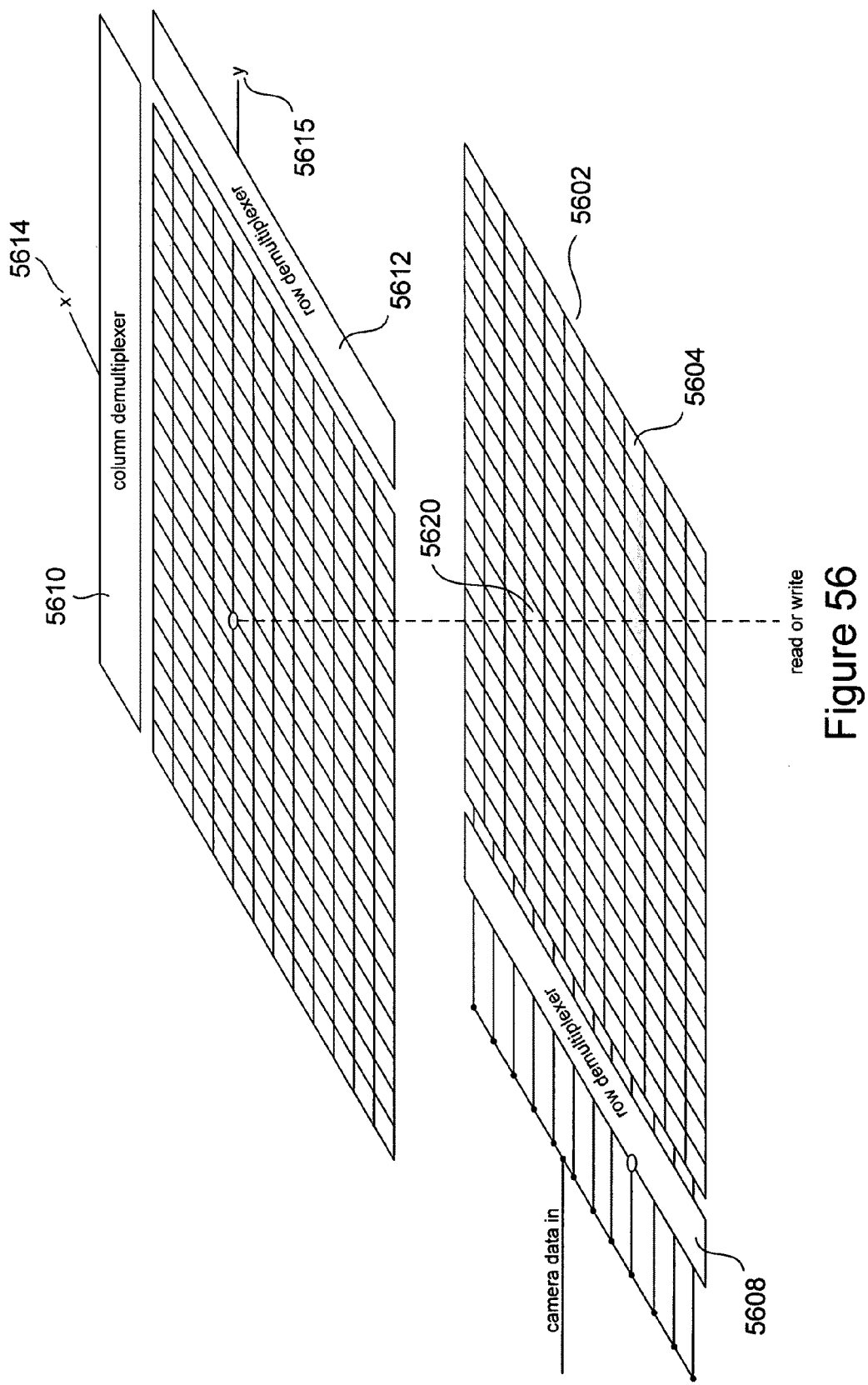
FIG. 56 abstractly illustrates operation of the multi-access memory that represents one embodiment of the present invention.

FIG. 56 abstractly illustrates operation of the multi-access memory that represents one embodiment of the present invention. The memory comprises a grid 5602 of memory-storage elements, each element, also referred to as a "unit" or "cell," storing a single bit. Multiple grids can be combined as multiple planes within a memory subsystem, with information units, such as bytes, distributed across the planes, or distributed according to a more complex distribution pattern. In a video-data-processing system, lines of video frames are stored in horizontal rows of the grid, such as the horizontal row 5604 shaded in FIG. 56. Camera data is input to the memory through a row demultiplexer 5608 via a sequential shift operation, discussed below. Camera data, as discussed above, is a serial stream of information units that can be interpreted, using the ls and fs signals supplied by a camera, as information units within lines of video frames. The row demultiplexer 5608 demultiplexes the camera data stream into rows of frames, filling each row serially, one at a time, during memory-write operations by repeated, sequential shift operations. The memory can also be accessed in random fashion via a column demultiplexer 5610 and row demultiplexer 5612 that together provide for two-dimensional random access to the multi-access memory. An x coordinate 5614 is input to the column multiplexer 5610 and a y coordinate 5615 is input to the row multiplexer 5612, as shown in FIG. 56, in order to select a particular memory cell 5620 for read or write access. Thus, the memory supports two-dimensional random access by a video codec in a video-processing-system application as well as an essentially one-dimensional WRITE access used for writing frame lines, from data streams input from cameras, into memory. Because each camera in a multi-camera video-processing system is provided a different and separate memory partition and row demultiplexer, cameras do not interfere with one another, and can write to memory simultaneously. The video codec, which accesses the memory via the column and row multiplexers 5614 and 5612, may access any portion of memory, provided that the accessed portion of memory is not simultaneously written by a camera. Simultaneous access to a particular memory cell by a camera and the video codec can be prevented by a collision-detection subsystem, or can be alternatively prevented by the video codec, by monitoring camera input activity and ensuring that no accesses are directed to video frames that are currently being input from camera data streams.

Figure 57:
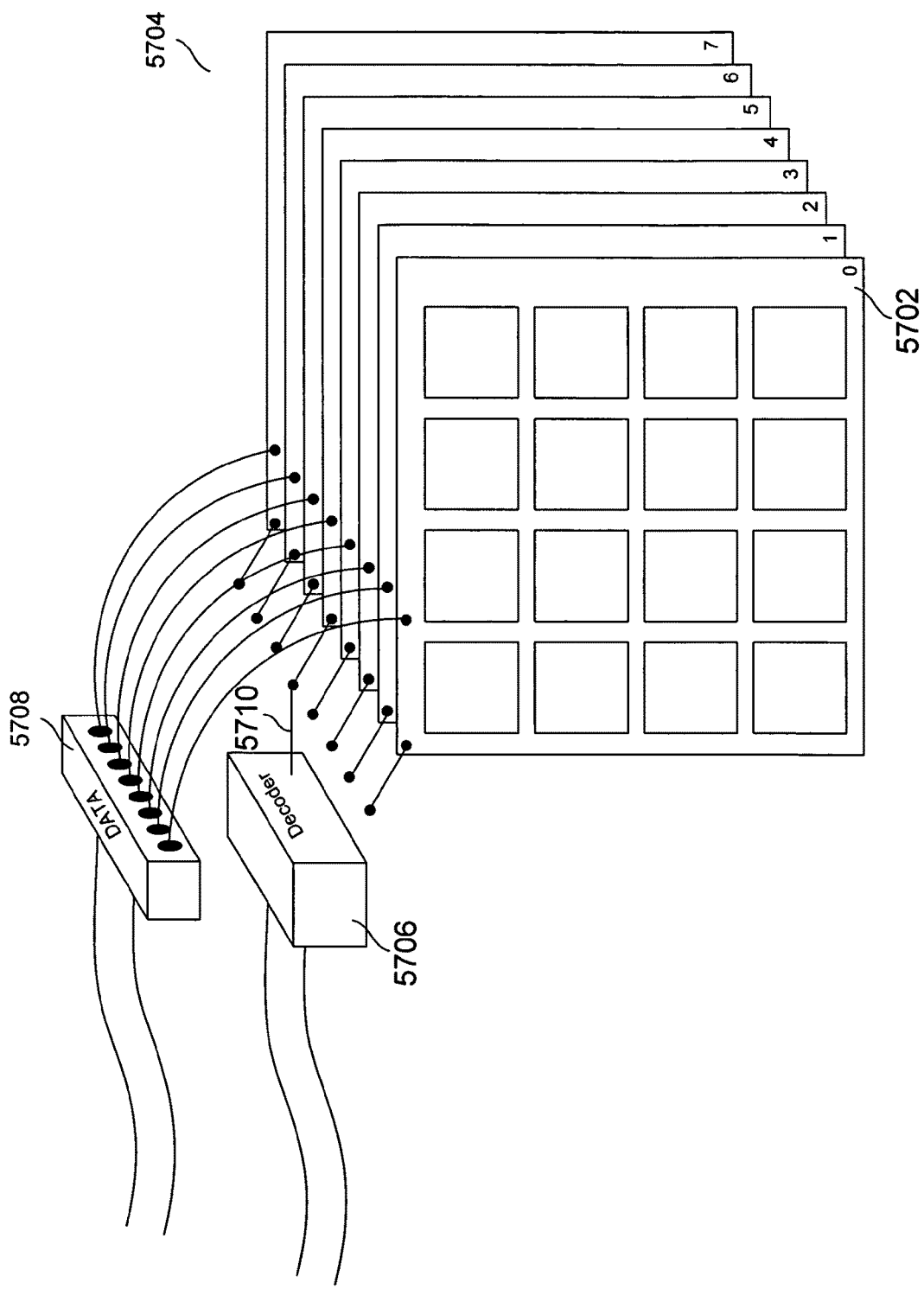
FIG. 57 illustrates a multi-plane memory system according to one embodiment of the present invention.

FIG. 57 illustrates a multi-plane memory system according to one embodiment of the present invention. In FIG. 57, each plane, such as plane 5702, of a bank 5704 of memory planes is a memory grid, such as the memory grid 5602 shown in FIG. 56. Each of the cameras and the video codec accesses the memory via a decoder 5706 and data channel 5708. A common signal 5710 output from the decoder drives memory-access operations in all of the memory planes. By contrast, the data input from the data channel is distributed across the memory planes. In the embodiment shown in FIG. 57, each bit of a byte of data is transmitted to, and stored within, a separate memory plane. Thus, FIG. 57 shows eight memory planes to which the bits of each received byte are written, and from which bits for each byte transmitted from the memory are retrieved. As mentioned above, information units other than bytes can be received by the multi-access memory and distributed according to various distribution schemes, including more complex interleaving schemes.

Figure 58:
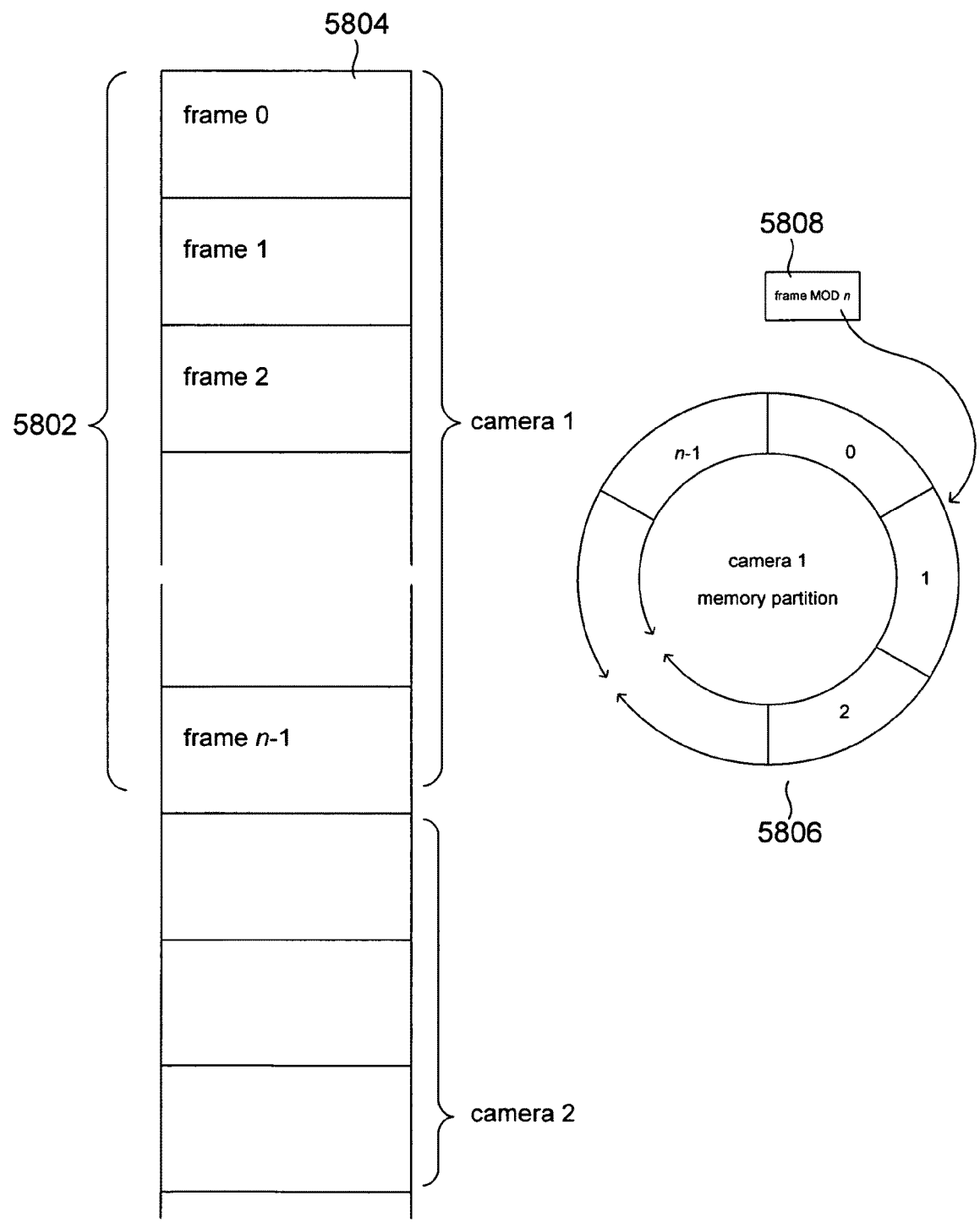
FIG. 58 illustrates partitioning of the memory partition associated with each camera, according to embodiments of the present invention, in a multi-access memory.

FIG. 58 illustrates partitioning of the memory partition associated with each camera, according to embodiments of the present invention, in a multi-access memory. In FIG. 58, the memory partition 5802 associated with a first camera is further partitioned into frame-sized memory regions, such as memory region 5804. The frames, consecutively ordered in memory, are treated as a memory FIFO by the memory system. These frames essentially form a circular FIFO queue 5806 to which video-camera data is continuously streamed. A current frame pointer 5808 indicates the current frame within the memory partition to which the camera is currently transmitting, or will next transmit, data. The frame pointer is incremented by detection of edges in thefs signal output from the camera to memory.

Figure 59:
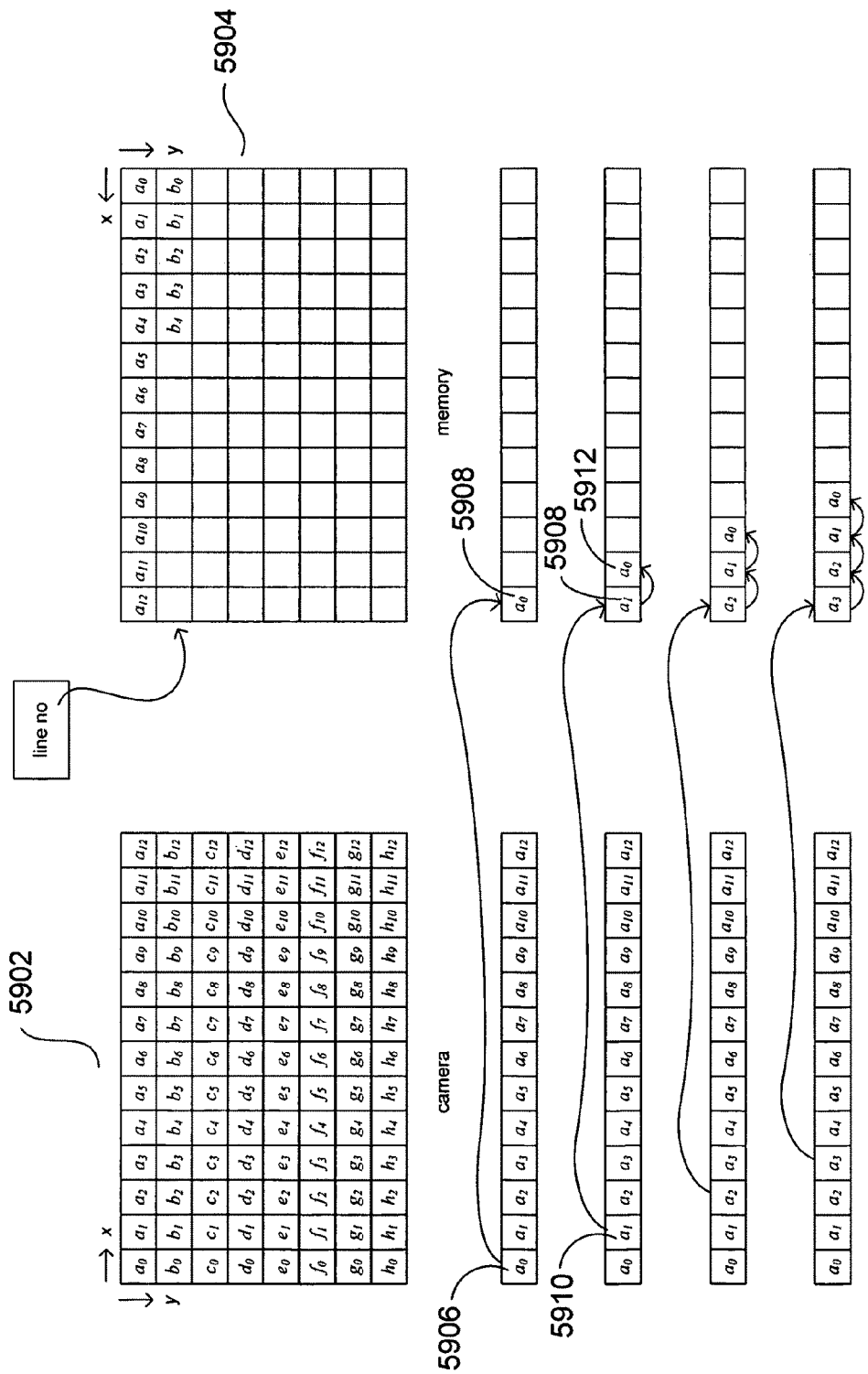
FIG. 59 illustrates writing of a frame to a multi-access memory, according to various embodiments of the present invention.

FIG. 59 illustrates writing of a frame to a multi-access memory, according to various embodiments of the present invention. In FIG. 59, a two-dimensional representation of frame data 5902 is shown as a rectilinear grid, indexed by column index x and a row index y. Data is written to the multi-access memory 5904 in mirror-reflection fashion, inverting the column index x, as shown in FIG. 59. In the lower portion of FIG. 59, the first four data-transfer shift operations during transfer of a row of data to the multi-access memory are illustrated. A first data unit 5906 in the row is transferred to the first data-storage unit 5908 of a corresponding row of the multi-access memory. A next data unit 5910 is transferred to the first data-storage element 5908 of the memory row, with the value residing in that first memory element simultaneously transferred to the second data-storage unit 5912 within the row. In other words, each data-unit is input via a shift operation, with the entire multi-access memory row operating as a very long shift register. Each subsequent data value is transferred to the first data-storage unit of the memory row, with shifting of all data values currently stored in the row rightward by one place. This produces the mirror-reflection of a video frame in the multi-access memory. The multi-access memory contains rows of sufficient size to accommodate video frames of maximum possible width. Narrower video frames can be stored into the multi-access memory using fewer shift operations. Video frame may be read from the multi-access memory, in row-by-row fashion, by shifting the video frames out from the opposite side of the memory by additional shift operations. This shift-based video-frame reading operation may be used, for example, to transmit decompressed video data to a display device for display.

Figure 60:
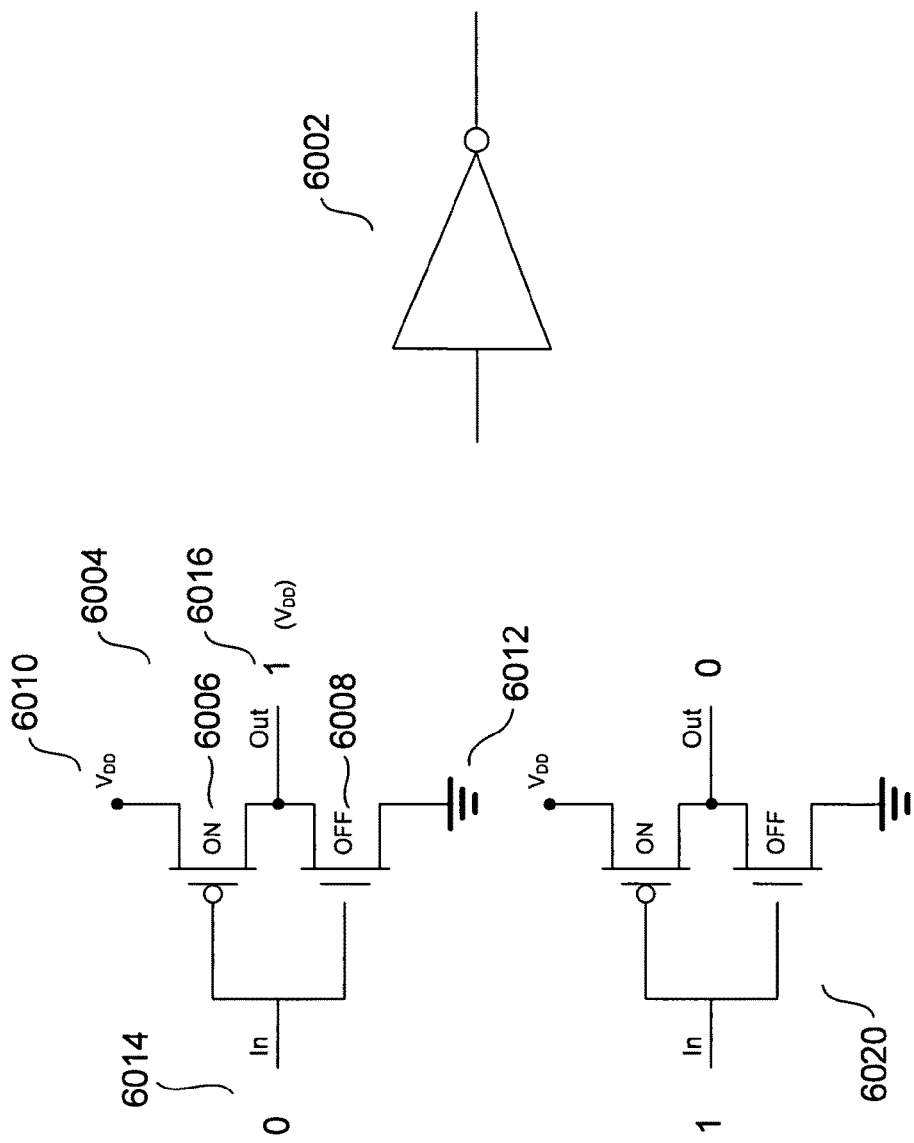
FIG. 60 illustrates a signal inverter.

Next, an implementation of the multi-access memory, discussed above with reference to FIGS. 55-59, is provided. FIG. 60 illustrates a signal inverter. The symbolic representation of a signal inverter 6002 is provided in the center of FIG. 60. A signal inverter transforms an input "1" digital signal to "0," and transforms an input "0" digital signal to "1." A signal inverter can be implemented using two complementary metal-oxide semiconductor ("CMOS") transistors, as shown in schematic 6004 in FIG. 60. A p-type transistor 6006 is serially connected with an n-type transistor 6008. The source of the p-type transistor is connected to a voltage corresponding to Boolean value "1" 6010 and the drain of the n-type transistor is connected to ground 6012. Input of Boolean value "0" 6014 activates the p-type transistor 6006 and deactivates the n-type transistor 6008, resulting in output 6016 of Boolean value "1." Similarly, input of Boolean value "1" results in output of Boolean value "0," as shown in schematic 6020 in FIG. 60.

Figure 61:
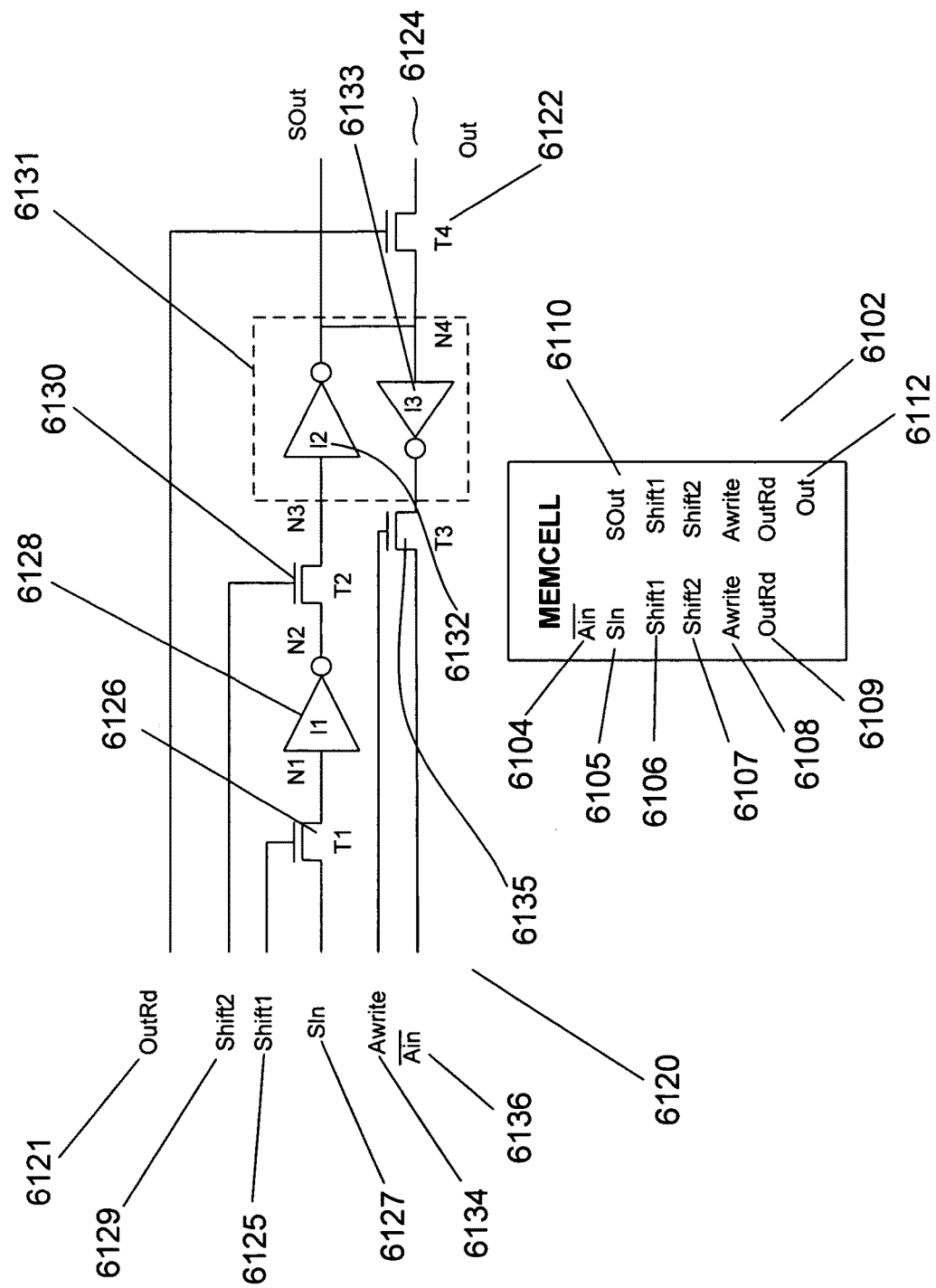
FIG. 61 shows a schematic of a memory unit, or memory cell, for a multi-access memory that represents one embodiment of the present invention along with a symbolic representation of the memory unit.

FIG. 61 shows a schematic of a memory unit, or memory cell, for a multi-access memory that represents one embodiment of the present invention along with a symbolic representation of the memory cell. The symbolic representation 6102 of the memory cell shows the memory cell receiving five input signals: (1) ¬Ain, the binary complement of a value input for storage in the memory cell by a random-access memory-access operation; (2) SIn, a value input to row demultiplexer 5608 in FIG. 56 for a shift-operation-based input to the memory cell; (3) Shift1 and Shift2 signals 6102-6107, which are used to shift the value input on signal line SIn into the memory cell; (4) Awrite, which controls writing of the value input on signal line ¬Ain 6104 into the memory cell; and (5) OutRd 6109, which controls output of the contents of the memory cell to the output signal line Out 6112. The memory cell continuously outputs the currently stored value to output signal line SOut 6110. As shown in the symbolic representation of the memory cell 6102 in FIG. 61, the input signals Shift1, Shift2, Awrite and OutRd are output, without alteration, by the memory cell. A schematic diagram 6120 for the memory cell is also provided in FIG. 61. Setting signal line OutRd high turns on the transistor T4 6122 and results in the data stored within the memory cell, in flip-flop 6131, being output to output signal line "Out" 6124. Input of Boolean value "1" to input signal line "Shift1" 6125 activates transistor T1 6126 to input the value on signal line SIn 6127 to inverter I1 6128. Input of Boolean value "1" to input signal line Shift2 6129 activates transistor T2 6130 to output the inverted SIn input to the flip-flop 6131 comprising invertors I2 6132 and I3 6133. The flip-flop stores the complement of an input value indefinitely, without need for incremental refresh. The flip-flop thus constitutes a static bit-storage unit. By contrast, inverter I1 6128 relies on dynamic charge transfer for inverting input signal SIn and transferring inverted signal 2 flip-flop 6131. In a memory-write shift-operation cycle, transistor T1 is first activated, by input of "1" to Shift1, to input signal SIn to inverter I1, and is then deactivated, or opened, while transistor T2 is subsequently activated in order to transfer the inverted SIn signal from inverter I1 to the flip-flop 6131. The interval of the shift operation is sufficiently fast that the value input to inverter I1 is not dissipated prior to output of the complement of the value to the flip flop. Input signal Awrite 6134 activates, or closes, transistor T3 6135 in order to input the value of signal ¬Ain 6136 into flip-flop 6131. Camera data is written into the memory cell using the SIn, Shift1, and Shift2 inputs, and data is written to, and retrieved from, the data unit of the video codec via the Awrite, OutRd, and ¬Ain inputs.

Figure 62A:
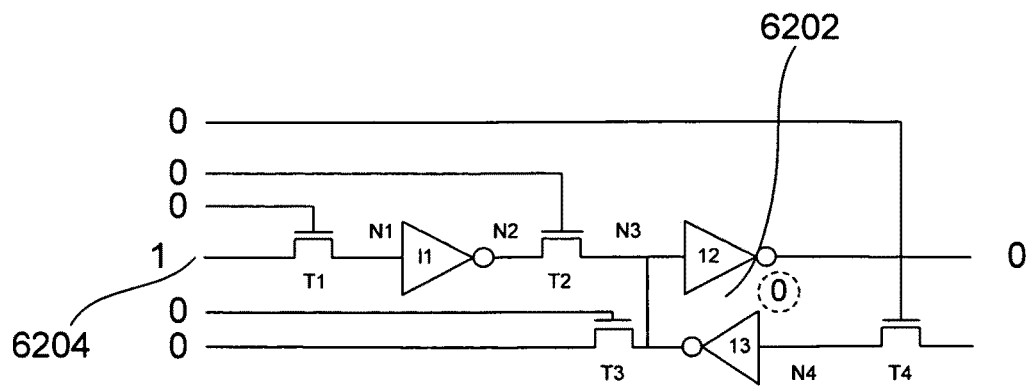
FIGS. 62A-C illustrate shifting of data into a memory cell of a multi-access memory that represents one embodiment of the present invention.
Figure 62B:
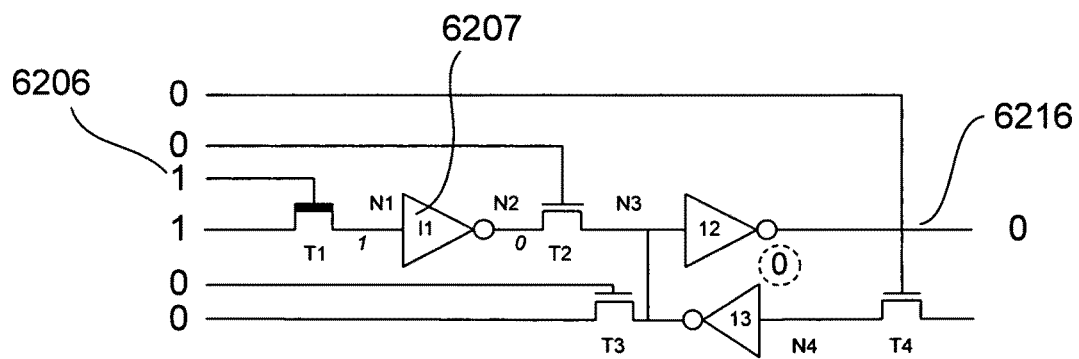
Figure 62C:
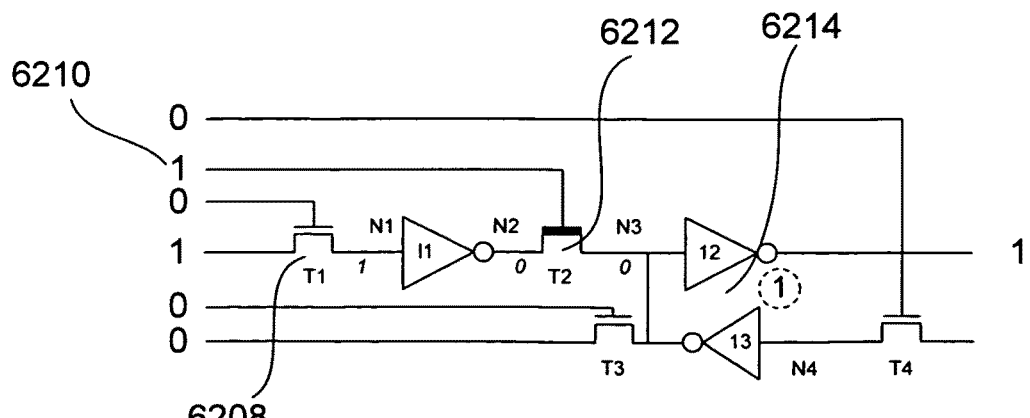

FIGS. 62A-C illustrate shifting of data into a memory cell of a multi-access memory that represents one embodiment of the present invention. Initially, as shown in FIG. 62A, the memory cell stores Boolean value "0" in the flip-flop 6202. A Boolean value "1" is currently input via input signal line SIn 6204. As shown in FIG. 62B, input signal line Shift1 6206 is raised to activate transistor T1 and pass the input value "1" from SIn to inverter I1 6207. Next, as shown in FIG. 62C, input signal line Shift1 is lowered, to deactivate transistor T1 6208, and input signal line Shift2 6210 is raised in order to activate transistor T2 6212 and input Boolean value "0" output by inverter I1 into flip-flop 6214, where the input value "0" is again inverted and stored as Boolean value "1." Note that, in FIG. 62B, were a second memory cell located to the right of the illustrated memory cell, with the SIn input of the second memory cell connected to the SOut output 6216 of the illustrated memory cell, and with Shift1 and Shift2 of the illustrated memory cell directly connected to Shift1 and Shift2 of the second memory cell, the current value in the illustrated memory cell would be shifted in the shift operation to the second memory cell for storage. Thus, interconnecting memory cells together in a row produces a shift register.

Figure 63A:
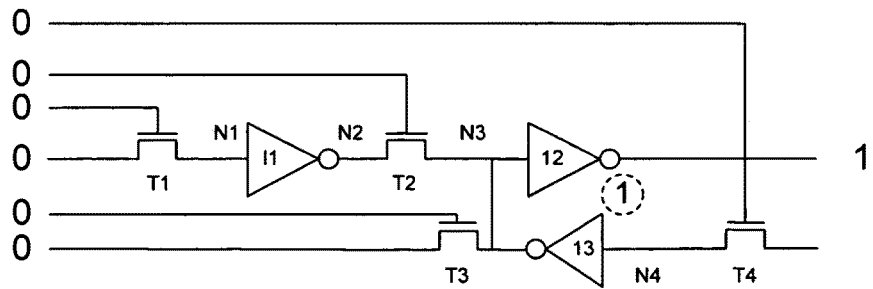
FIGS. 63A-C illustrate writing Boolean value "0" into a memory cell currently storing Boolean value "1" according to embodiments of the present invention.
Figure 63B:
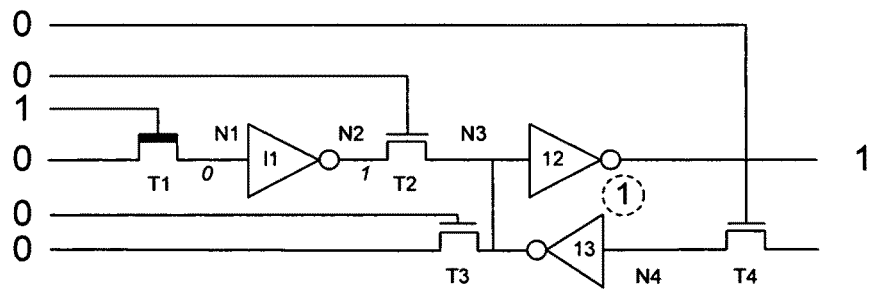
Figure 63C:
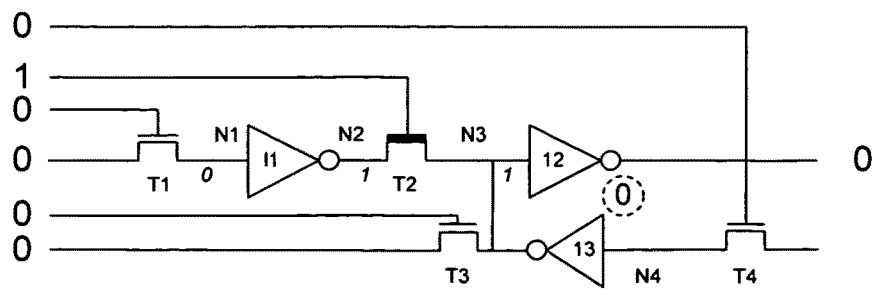

FIGS. 63A-C illustrate writing Boolean value "0" into a memory cell currently storing Boolean value "1" according to embodiments of the present invention. FIGS. 63A-C use the same illustration convention as used in FIGS. 62A-C.

Figure 64A:
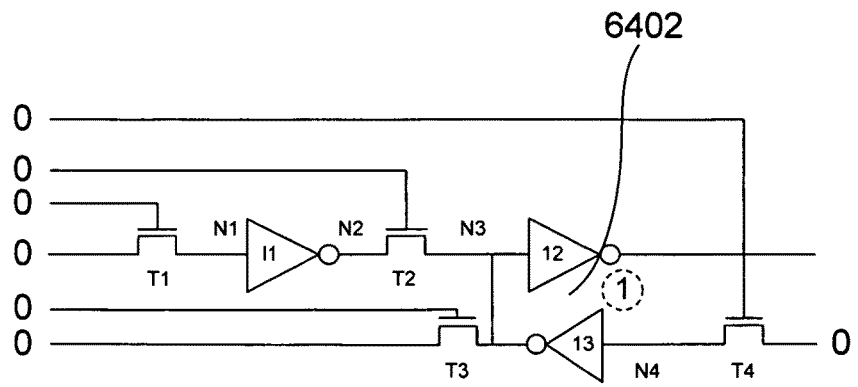
FIGS. 64A-B illustrate output of the value currently stored in a memory cell of a multi-access memory to an output signal line, according to embodiments of the present invention.
Figure 64B:
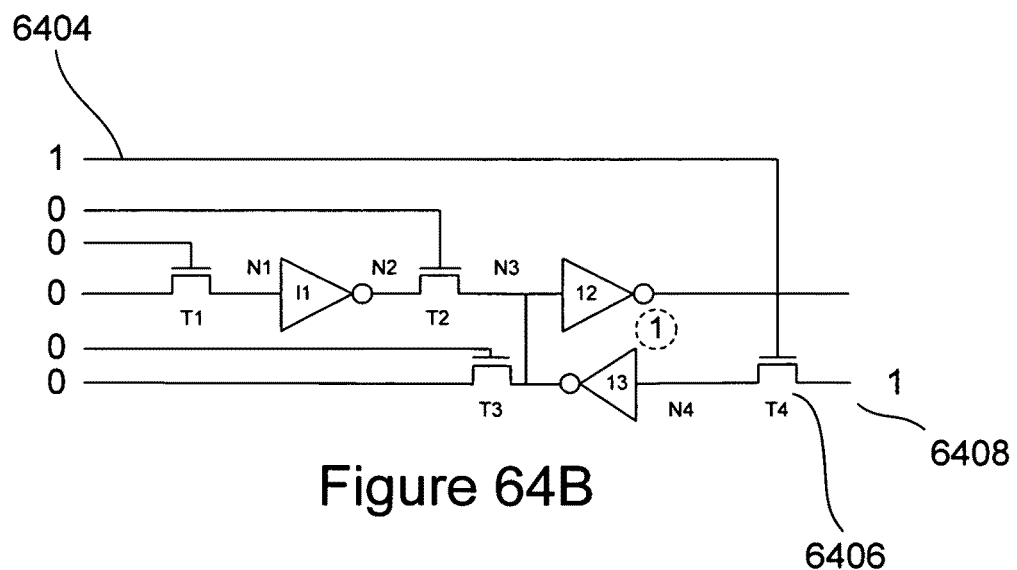
Figure 65A:
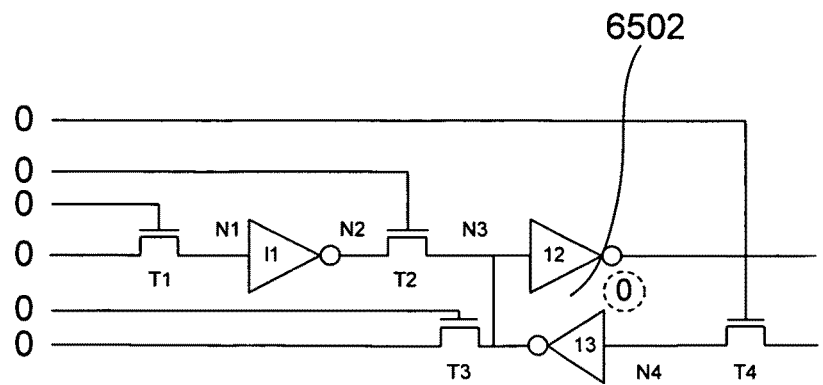
FIGS. 65A-B illustrate writing a value into a memory cell that represents one embodiment of the present invention via two input signal lines.
Figure 65B:
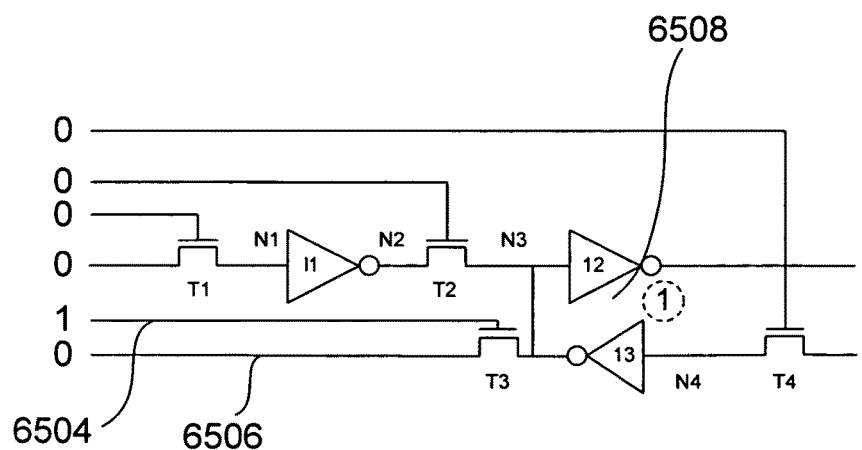

FIGS. 64A-B illustrate output of the value currently stored in a memory cell of a multi-access memory to an output signal line, according to embodiments of the present invention. In FIG. 64A, the memory cell currently stores Boolean value "1" 6402. Raising the OutRd signal line 6404, as shown in FIG. 64B, activates transistor T4 6406 and outputs stored Boolean value "1" to output signal line Out 6408. FIGS. 65A-B illustrate writing a value into a memory cell that represents one embodiment of the present invention via two input signal lines. As shown in FIG. 65A, the memory cell currently stores the Boolean value "0" 6502. Input of Boolean value "1" to signal line Awrite 6504 and input of Boolean value "0" to signal line ¬Ain 6506 results in storage of Boolean value "1" 6508 in the memory cell.

Figure 66A:
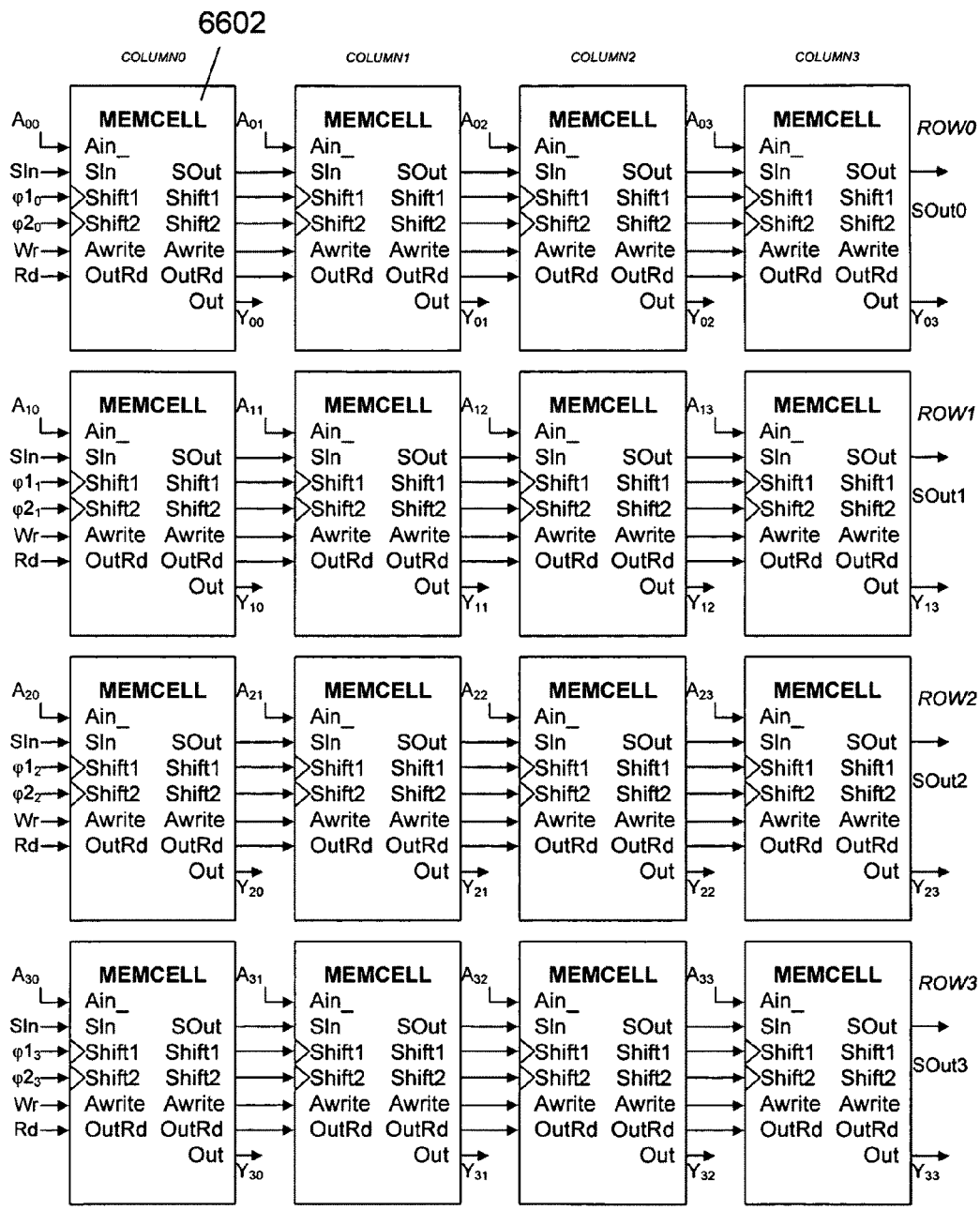
FIGS. 66A-B show implementation of a 4×4 memory-storage array using 16 memory cells of the type illustrated in FIG. 61 and a symbolic representation of the 4×4 memory-storage array.
Figure 66B:
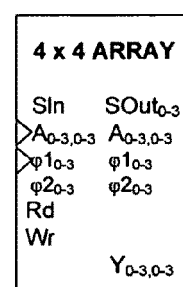

FIGS. 66A-B show implementation of a 4×4 memory-storage array using 16 memory cells of the type illustrated in FIG. 61 and a symbolic representation of the 4×4 memory-storage array. In FIG. 66A, 16 memory cells, including memory cell 6602, of the type illustrated in FIG. 61, are arranged in a two-dimensional grid to provide a 4×4 memory-storage array. Each memory cell stores a single bit of information. As discussed with reference to FIG. 56, above, each row of the 4×4 array can be written by a series of four shift operations, as discussed with reference to FIG. 59, as well as by two-dimensional random access, as discussed with reference to FIG. 56. Data is input to the ¬Ain input of a memory cell during a random-access WRITE. A memory cell is therefore individually accessed during a random-access WRITE. Similarly, the Out output of a particular memory cell outputs a value during a random-access READ operation. In FIG. 66A, the ¬Ain inputs are shown connected to a two-dimensional grid of input signal lines labeled "$A_{xy}$," where x and y are coordinates of the memory cell within the 4×4 array, and the Out outputs are connected to a two-dimensional grid of input signal lines labeled "$Y_{xy}$," where x and y are coordinates of the memory cell within the 4×4 array. FIG. 66B shows a symbolic representation of the 4×4 memory-cell array. The 4×4 memory-call array features Wr and Rd inputs, connected to the Awrite and OutRd inputs of the first memory cell in each row, and φ1 and φ2 inputs, connected to the Shift1 and Shift2 inputs of the first memory cell in each row, that are passed through to each memory cell in the row.

Figure 67:
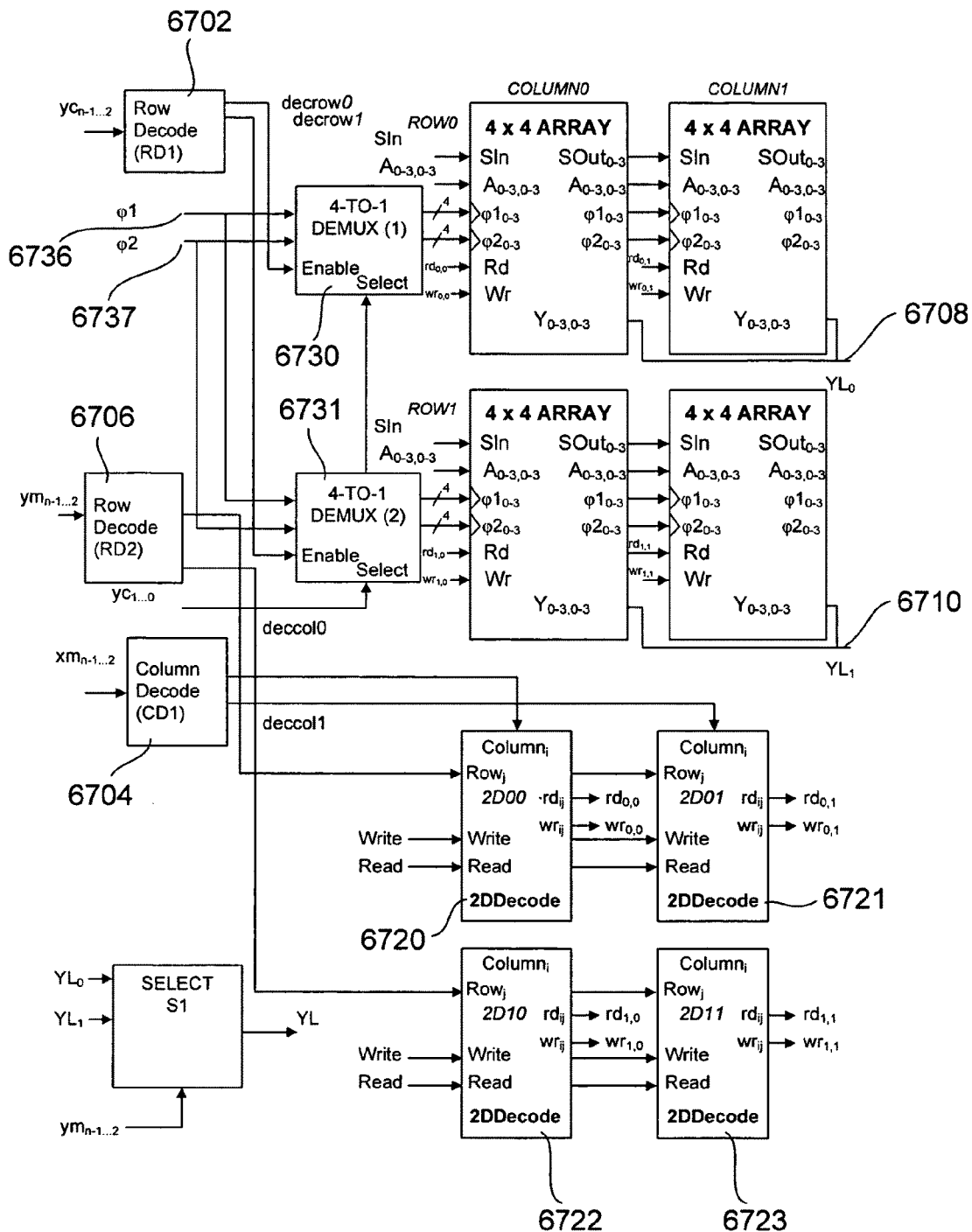
FIG. 67 shows a schematic diagram of a larger memory, according to embodiments of the present invention, based on 4×4 memory-storage arrays, such as the 4×4 memory-storage array shown in FIG. 66A.

FIG. 67 shows a schematic diagram of a larger memory, according to embodiments of the present invention, based on 4×4 memory-storage arrays, such as the 4×4 memory-storage array shown in FIG. 66A. The row decoder 6702 and demultiplexers 6730 and 6731 together operate as row demultiplexer 5608 in FIG. 56. Column decoder 6704 and row decoder 6706 together operate as column and row demultiplexers 5614 and 5612 in FIG. 56. Output values are collected from memory cells of each row on output-collection signal lines $YL_0$ 6708 and signal line $YL_1$ 6710. The output of a particular memory cell within a row is read from the common output-collection signal line for the row. A 2×2 block of two-dimensional-access decoder blocks ("2DDecode") 6720-6723 are driven by the row decoder 6706 and column decoder 6704 to output appropriate Wr and Rd signals to the 4×4 arrays. Note that only a single row of the multi-access memory, shown in FIG. 67, is selected, at any point in time, for shift-operation-based writing by the row decoder 6702 and demultiplexers 6730 and 6731. Thus, as discussed with reference to FIG. 56, the row demultiplexer comprising row decoder 6702 and demultiplexers 6730 and 6731 properly carries out shift-operation-based row WRITE operations by decoding x and y coordinates supplied by a camera block of a memory controller and by alternating raising and lowering of the φ1 6736 and φ2 6737 input signals within each interval of two consecutive pixclk ticks. FIG. 67 is intended to illustrate that large numbers of memory cells can be interconnected to form arbitrarily large memory planes, illustrated in FIG. 57, to implement a multi-access memory that allows for simultaneous, shift-register-based write access by multiple cameras and random access by a video codec of a video-processing-system application.

Figure 68:
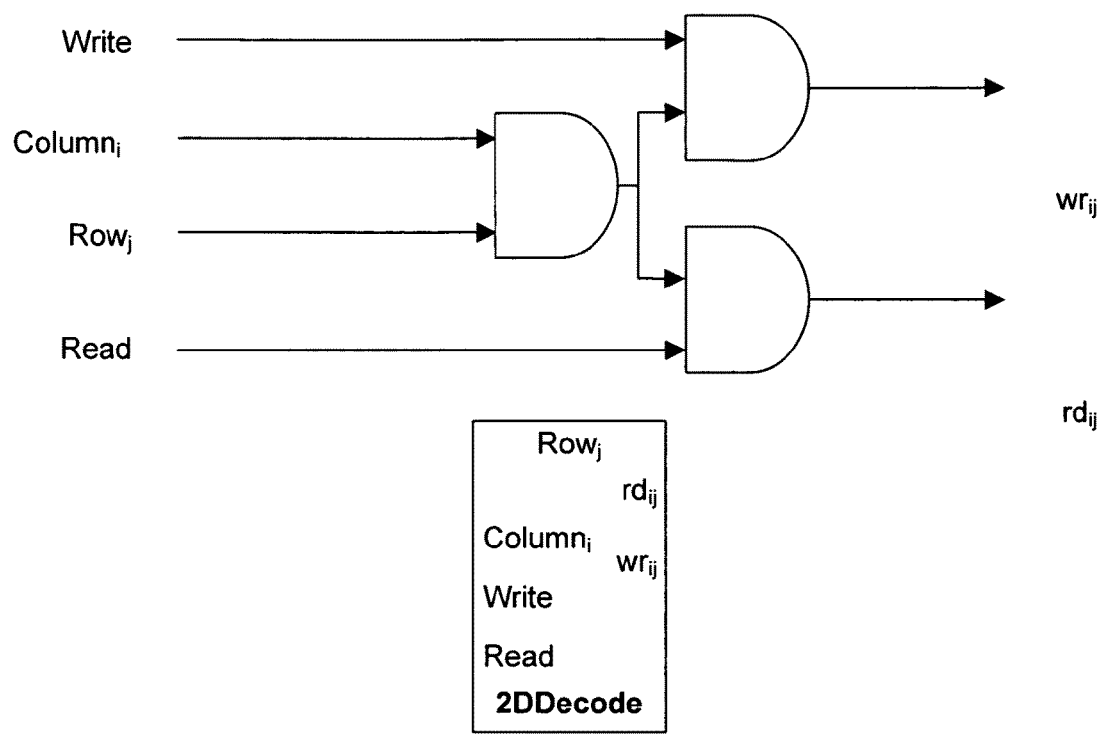
FIG. 68 illustrates a schematic for the two-dimensional-access decoder blocks shown in the memory-storage array illustrated in FIG. 67 as one embodiment of the present invention.

FIG. 68 illustrates a schematic for the two-dimensional-access decoder blocks shown in the memory-storage array illustrated in FIG. 67 as one embodiment of the present invention. Each two-dimensional-access decoder block outputs Wr and Rd signals to a corresponding 4×4 array. When the column and row output by the column decoder (6704 in FIG. 67) and row decoder (6706 in FIG. 67) match the indices of the 2DDecode, the 2DDecode outputs a Rd signal when input Read is high and outputs a Wr signal when input Write is high.

Figure 69:
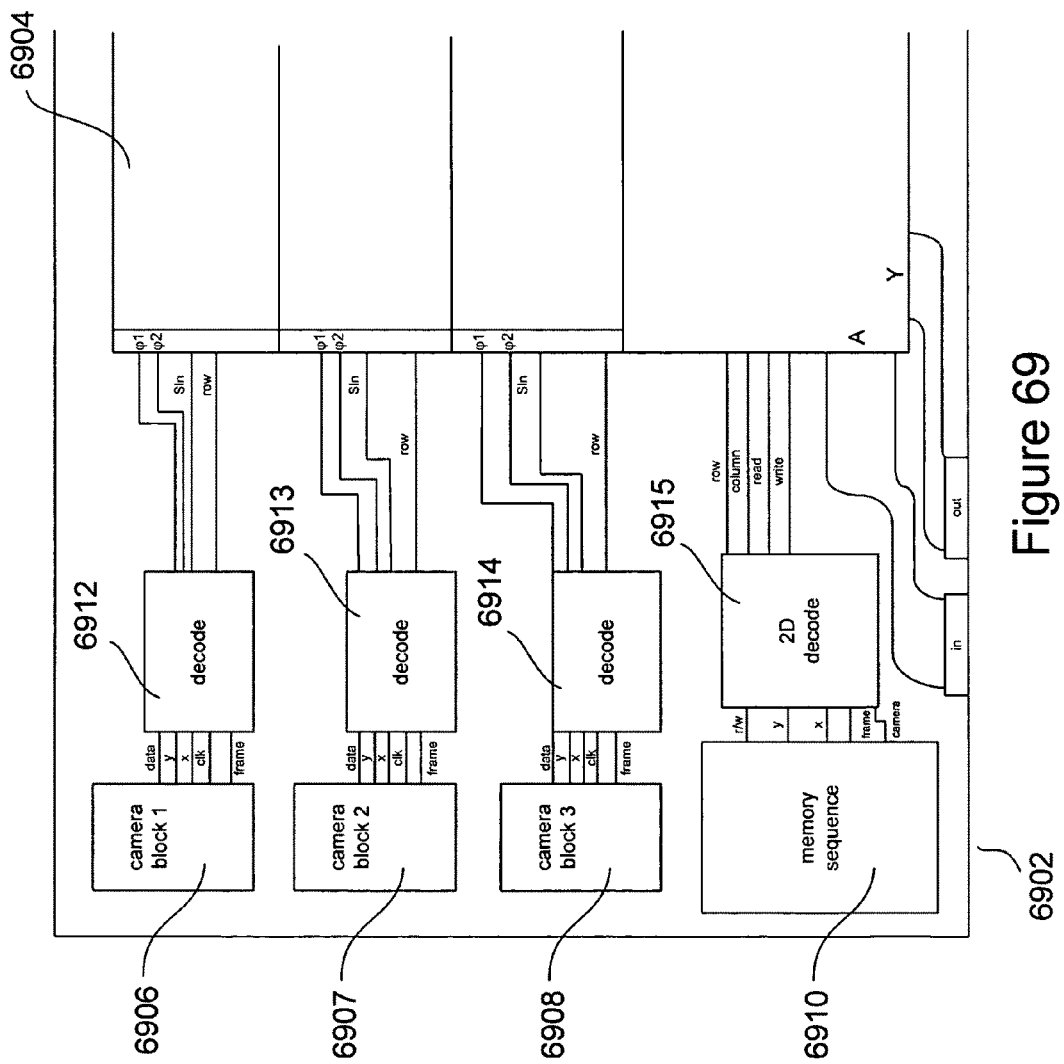
FIG. 69 illustrates a memory controller that interfaces to the multi-access memory discussed above with reference to FIGS. 65-68 and that represents one embodiment of the present invention.

FIG. 69 illustrates a memory controller that interfaces to the multi-access memory discussed above with reference to FIGS. 65-68 and that represents one embodiment of the present invention. As with the memory controller illustrated in FIGS. 48A-H, a memory controller 6902 that interfaces to the multi-access memory 6904 includes a camera block 6906-6908 associated with each camera and a memory-sequencer block 6910 associated with the video codec. As with the previously described memory controller, each camera block in the memory sequencer block output data, two-dimensional addresses, and a clock signal. However, the memory controller shown in FIG. 69 does not employ either an arbiter or multiplexers, instead passing the output signals directly into decoders 6912-6915 of the multi-access memory. Camera data can therefore be transmitted directly to memory, without arbitration or multiplexing, and data can be exchanged with the memory cache, via the memory sequencer, without arbitration or multiplexing. The video codec can monitor the current-frame pointers used by the camera blocks to ensure that the video codec does not issue memory access operations that collide with camera memory-access operations or, in alternative embodiments of the present invention, a simple collision-detection circuit can be included in the memory controller to ensure that memory-sequencer-initiated memory-access operations do not collide with camera write-access operations.

Although the present invention has been described in terms of particular embodiments, it is not intended that the invention be limited to these embodiments. Modifications within the spirit of the invention will be apparent to those skilled in the art. For example, memory controllers and a multi-access memory that represent embodiments of the present invention can be encoded in one of any of various integrated-circuitdesign-specification languages, including VHDL and Verilog. The meaning of binary signals may be arbitrarily assigned, and different embodiments of the present invention may employ different signal-encoding conventions. Memory subsystems of arbitrary size can be fabricated according to various embodiments of the present invention. Memory subsystems are discussed in the context of a video-system application, but can be used in other applications that feature concurrent data-stream writes and two-dimensional random access to a memory. Any of many different integrated-circuit fabrication technologies may be employed to implement various alternative embodiments of the present invention. Many alternative circuit and subsystem-component designs may be designed to implement the memory subsystems that represent embodiments of the present invention.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. A memory subsystem comprising:
    a memory; and
    a memory controller that
        provides one or more data-stream interfaces coupled to receive a data-stream input that includes a plurality of data organized according to a predetermined data structure,
        provides a random-access interface to individual memory cells and to two-dimensional memory regions within the memory, each individual memory cell and each two-dimensional memory region being associated with a (x, y) coordinate pair that describes a corresponding location within the memory,
        arbitrates among the data-stream interfaces and random-access interface to serialize concurrently requested memory accesses received through the data-stream interfaces and random-access interface,
        carries out memory accesses requested through the data-stream interfaces by writing the data-stream input to the memory, and
        carries out single-memory-cell and two-dimensional-memory-cell-region memory accesses requested through the random-access interface by reading values from, or writing values to, the individual memory cells and the two-dimensional memory-cell regions in the memory.

2. The memory subsystem of claim 1 implemented within a single-integrated-circuit computational engine.

3. The memory subsystem of claim 1 implemented within a computational engine chip set.

4. The memory subsystem of claim 1 implemented within a memory integrated circuit.

5. The memory subsystem of claim 1 wherein the memory subsystem is controlled by a fastclk clock signal with a frequency that is at least n times greater than the frequency of the fastest clock signal received by the memory controller through any of the one or more data-stream interfaces, wherein n is greater than 2 and wherein the clock signals received from data-stream interfaces facilitate synchronization of memory-controller reception of data units of the data streams received through the data-stream interfaces by the memory controller.

6. The memory subsystem of claim 5 wherein the frequency of the fastclk is sufficiently high to allow the memory subsystem to satisfy memory-access requests received through the random-access interface while storing the data-streams input through the one or more data-stream interfaces.

7. The memory subsystem of claim 5 wherein the memory subsystem includes an arbiter that arbitrates among the data-stream interfaces and the random-access interface to serialize concurrently requested memory accesses received through the data-stream interfaces and the random-access interface, the arbiter comprising a data-source arbiter block corresponding to each data-stream interface and a memory-sequencer block corresponding to the random-access interface.

8. The memory subsystem of claim 7 further including one or more data-source blocks that each implements a data-stream interface and that is each associated with a data-source arbiter block for the data-stream interface and a memory-sequencer block that implements the random-access interface that provides access to individual memory cells and to two-dimensional memory regions and that is associated with the memory-sequencer arbiter block.

9. The memory subsystem of claim 8 wherein each data-source block includes a FIFO queue for temporarily storing data units of the data stream input through the data-stream interface implemented by the data-source block.

10. The memory subsystem of claim 9 wherein redundant data units included in a data stream received through the data-stream interface implemented by the data-source block are dropped by the data-source block, rather than inserted into the FIFO queue.

11. The memory subsystem of claim 7 wherein the one or more data-source arbiter blocks and the memory-sequencer arbiter block are linked together in a sequence, the position of the data-source arbiter blocks and the memory-sequencer arbiter block within the sequence defining a priority for each of the data-source arbiter blocks and the memory-sequencer arbiter block, with the data-source arbiter block in a first position having highest priority, the remaining priorities decreasing with increasing position of the associated data-source arbiter blocks in the sequence, and the or memory-sequencer arbiter block having lowest priority.

12. The memory subsystem of claim 11 wherein the memory-sequencer arbiter block acquires control of memory until a potential for data loss from a data stream input through a data-stream interface forces the arbiter to revoke memory control from the memory-sequencer arbiter block and grant memory control to the data-stream interface.

13. The memory subsystem of claim 11 wherein a single data-source arbiter block or the memory-sequencer arbiter block is granted control of memory at any time, wherein higher-priority data-source arbiter blocks associated with data-stream interfaces through which memory access is currently requested prevent granting of control of memory to lower-priority data-source arbiter blocks, and wherein the highest-priority, memory-access-request-receiving data-source arbiter block or memory-sequencer arbiter block is next to be granted control of memory.

14. The memory subsystem of claim 11 wherein each data-source arbiter block acquires control of memory for a single write operation, but then relinquishes control of memory to allow other data-source arbiter blocks or the memory-sequencer arbiter block to acquire control of memory.

15. The memory subsystem of claim 1 wherein the memory comprises one or more memory integrated circuits.

16. The memory subsystem of claim 1 wherein the data-stream interfaces receive data streams from video cameras and the random-access interface receives random-access memory requests from a video codec.

17. A multi-access memory comprising:
   a rectilinear grid of memory cells, each memory cell storing a bit of information;
   a row demultiplexer that directs bits from a data stream into memory cells, by using data-transfer shift operations, the bits organized in the data stream according to a predetermined data structure and being transferred to a row of memory cells selected by the row demultiplexer within the rectilinear grid of memory cells; and
   a row-demultiplexer-and-column-demultiplexer pair that directs a bit received in a random-memory-access WRITE request into a memory cell selected by the row-demultiplexer-and-column-demultiplexer pair and that retrieves a bit requested by a random-memory-access READ request from a memory cell selected by the row-demultiplexer-and-column-demultiplexer pair, each request of the WRITE and READ requests being associated with a (x, y) coordinate pair that describes the address of the memory cell within the rectilinear grid of memory cells.

18. The multi-access memory of claim 17 wherein the multi-access memory includes one or more row demultiplexers that each directs bits from a data stream into memory cells by shift operations along a row of memory cells selected by the row demultiplexer, each row demultiplexer associated with a different region of the rectilinear grid of memory cells.

19. The multi-access memory of claim 18 wherein the multi-access memory is simultaneously accessed for writing at least one row, by shift operations, from a data stream and by a random-memory-access WRITE request and a random-memory-access READ request.

20. The multi-access memory of claim 17 wherein a memory cell includes an inverting data-storage unit that stores a complement of a data bit, received on a data-storage-unit input, statically, without update and that continuously output the stored complement of the data bit to a memory-cell shift output.

21. The multi-access memory of claim 20 wherein the data-storage unit is a flip flop comprising two inverters.

22. The multi-access memory of claim 21 wherein the memory cell further comprises:
   a first shift-operation transistor, a source input of which is connected to a memory-cell data-stream input and a gate of which is connected to a memory-cell Shift1 input;
   a second shift-operation transistor, a drain output of which is connected to the data-storage-unit input and a gate of which is connected to a memory-cell Shift2 input;
   an inverter connected, an input of which is connected to a drain output of the first shift-operation transistor and an output of which is connected to a source input of the second shift-operation transistor;
   a memory-cell-random-access output transistor, a gate of which is connected to a memory-cell memory-cell-random-access-read input, a source input of which is connected to the memory-cell shift output, and a drain output of which is connected to a memory-cell random-access read output; and
   a memory-cell-random-access input transistor, a gate of which is connected to a memory-cell memory-cell-random-access-write input, a source input of which is connected to a memory-cell random-access input, and a drain output of which is connected to the data-storage-unit input.

23. The multi-access memory of claim 22 wherein a bit is written into the memory cell from the memory-cell random-access input by raising the memory-cell random-access-write input.

24. The multi-access memory of claim 22 wherein a bit read from the data-storage unit on the memory-cell random-access read output by raising the memory-cell memory-cell-random-access-read input.

25. The multi-access memory of claim 22 wherein, in the rectilinear grid of memory cells, rows of memory cells function as shift registers, with the memory-cell shift output of all but the last memory cell in each row connected to the memory-cell data-stream input of a next memory cell in the row.

26. The multi-access memory of claim 22 wherein a bit is shifted into the memory cell from the memory-cell data-stream input by raising the Shift1 memory-cell input, lowering the Shift 1 memory-cell input, and raising the Shift2 memory-cell input.

27. The multi-access memory of claim 17 coupled to a memory controller to compose a memory subsystem.

* * * * *